United States Patent
Takahashi et al.

(10) Patent No.: US 9,120,288 B2
(45) Date of Patent: Sep. 1, 2015

(54) PATTERN FORMING METHOD, ACTINIC RAY-SENSITIVE OR RADIATION-SENSITIVE RESIN COMPOSITION, RESIST FILM, METHOD FOR PREPARING ELECTRONIC DEVICE, AND ELECTRONIC DEVICE

(75) Inventors: Hidenori Takahashi, Haibara-gun (JP); Shuhei Yamaguchi, Haibara-gun (JP); Shohei Kataoka, Haibara-gun (JP); Michihiro Shirakawa, Haibara-gun (JP); Fumihiro Yoshino, Haibara-gun (JP); Shoichi Saitoh, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 243 days.

(21) Appl. No.: 13/614,672

(22) Filed: Sep. 13, 2012

(65) Prior Publication Data
US 2013/0078432 A1 Mar. 28, 2013

(30) Foreign Application Priority Data
Sep. 22, 2011 (JP) .................................. 2011-207017

(51) Int. Cl.
| G03F 7/027 | (2006.01) |
| G03F 7/038 | (2006.01) |
| G03F 7/075 | (2006.01) |
| B32B 3/10 | (2006.01) |
| G03F 7/039 | (2006.01) |
| G03F 7/004 | (2006.01) |
| G03F 7/20 | (2006.01) |
| G03F 7/11 | (2006.01) |
| G03F 7/32 | (2006.01) |
| G03F 7/40 | (2006.01) |

(52) U.S. Cl.
CPC . *B32B 3/10* (2013.01); *G03F 7/004* (2013.01); *G03F 7/0045* (2013.01); *G03F 7/0046* (2013.01); *G03F 7/027* (2013.01); *G03F 7/039* (2013.01); *G03F 7/0382* (2013.01); *G03F 7/0392* (2013.01); *G03F 7/0397* (2013.01); *G03F 7/075* (2013.01); *G03F 7/0758* (2013.01); *G03F 7/11* (2013.01); *G03F 7/20* (2013.01); *G03F 7/2041* (2013.01); *G03F 7/325* (2013.01); *G03F 7/40* (2013.01); *Y10T 428/24802* (2015.01)

(58) Field of Classification Search
None
See application file for complete search history.

(56) References Cited

U.S. PATENT DOCUMENTS

| 8,790,860 B2* | 7/2014 | Koshijima et al. ......... 430/270.1 |
| 2002/0012872 A1 | 1/2002 | Kobayashi et al. |
| 2003/0113658 A1 | 6/2003 | Ebata et al. |
| 2003/0203309 A1 | 10/2003 | Mishimura et al. |
| 2009/0148790 A1 | 6/2009 | Nishimura et al. |
| 2010/0178608 A1 | 7/2010 | Sakakibara et al. |
| 2010/0221659 A1 | 9/2010 | Ebata et al. |
| 2011/0014569 A1 | 1/2011 | Kasahara et al. |
| 2012/0148957 A1 | 6/2012 | Enomoto et al. |
| 2012/0178024 A1 | 7/2012 | Maruyama et al. |

FOREIGN PATENT DOCUMENTS

| JP | 04-039665 A | 2/1992 |
| JP | 2002-072477 A | 3/2002 |
| JP | 2003-337419 A | 11/2003 |
| JP | 2006301304 A | 11/2006 |
| JP | 2007079589 A | 3/2007 |
| JP | 2008001906 A | 1/2008 |
| JP | 2008241931 A | 10/2008 |
| JP | 2008-281975 A | 11/2008 |
| JP | 2008299349 A | 12/2008 |
| JP | 2009-025707 A | 2/2009 |

(Continued)

OTHER PUBLICATIONS

English translation of JP, 2010-134126 , A (2010) from machine translation from AIPN Japan Patent Office National Center for Industrial Property Information and Training, generated Aug. 10, 2014, 34 pages.*

English translation of JP, 2008-299349, A (2008) from machine translation from AIPN Japan Patent Office National Center for Industrial Property Information and Training, generated Aug. 10, 2014, 24 pages.*

English translation of JP, 2006-301304, A (2006) from machine translation from AIPN Japan Patent Office National Center for Industrial Property Information and Training, generated Aug. 10, 2014, 27 pages.*

(Continued)

*Primary Examiner* — Cynthia Hamilton
(74) *Attorney, Agent, or Firm* — Sughrue Mion, PLLC

(57) ABSTRACT

The pattern forming method of the invention includes (i) forming a film using an actinic ray-sensitive or radiation-sensitive resin composition containing a resin (P) having a repeating unit (a) represented by the following general formula (I), a compound (B) capable of generating an organic acid upon irradiation with actinic rays or radiation, and a nitrogen-containing organic compound (NA) having a group capable of leaving by the action of an acid, (ii) exposing the film, and (iii) developing the film after the exposure using a developer including an organic solvent to form a negative type pattern,

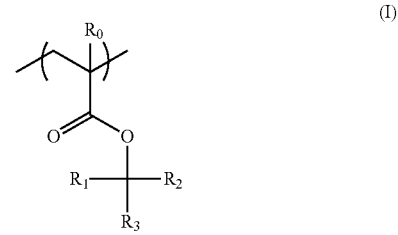

(I)

in the general formula (I), $R_0$ represents a hydrogen atom or a methyl group, and
each of $R_1$, $R_2$, and $R_3$ independently represents a linear or branched alkyl group.

14 Claims, No Drawings

(56) References Cited

FOREIGN PATENT DOCUMENTS

| | | | |
|---|---|---|---|
| JP | 2010-020204 A | | 1/2010 |
| JP | 2010-139996 A | | 6/2010 |
| JP | 2010134126 A | | 6/2010 |
| JP | 2010164958 A | * | 7/2010 |
| JP | 2011022348 A | | 2/2011 |
| JP | 2011-053363 A | | 3/2011 |
| JP | 2011100089 A | | 5/2011 |
| JP | 2011-141494 A | * | 7/2011 |
| JP | 2012-141458 A | | 7/2012 |
| WO | 2008/149701 A1 | | 12/2008 |
| WO | 2009/051088 A1 | | 4/2009 |
| WO | 2011040175 A1 | | 4/2011 |
| WO | 2012077433 A1 | | 6/2012 |

OTHER PUBLICATIONS

English translation of JP, 2008-241931, A (2008) from machine translation from AIPN Japan Patent Office National Center for Industrial Property Information and Training, generated Aug. 10, 2014, 33 pages and 16 pages.*

Notice of Reasons for Rejection, dated Feb. 12, 2014, issued in corresponding JP Application No. 2011-207017, 16 pages in English and Japanese.

Notice of Reasons for Rejection, mailed Aug. 27, 2013, issued in corresponding JP Application No. 2011-207017, 16 pages in English and Japanese.

Office Action dated Jan. 27, 2015, issued by the Japanese Patent Office in counterpart JP Application No. 2014-079581.

* cited by examiner

PATTERN FORMING METHOD, ACTINIC RAY-SENSITIVE OR RADIATION-SENSITIVE RESIN COMPOSITION, RESIST FILM, METHOD FOR PREPARING ELECTRONIC DEVICE, AND ELECTRONIC DEVICE

BACKGROUND OF THE INVENTION

1. Field of the Invention

The present invention relates to a pattern forming method, an actinic ray-sensitive or radiation-sensitive resin composition, a resist film, a method for producing an electronic device, and an electronic device. More specifically, the invention relates to a pattern forming method, an actinic ray-sensitive or radiation-sensitive resin composition, a resist film, a method for producing an electronic device, and an electronic device, each of which is suitably used in a process for preparing semiconductors such as ICs, a process for preparing liquid crystals or circuit boards such as a thermal head, and lithographic processes in other photo-fabrication. Particularly, the invention relates to a pattern forming method, an actinic ray-sensitive or radiation-sensitive resin composition, a resist film, a method for producing an electronic device, and an electronic device, each of which is suitably used in exposure by an ArF exposure apparatus, an ArF immersion-type projection exposure apparatus, or an EUV exposure apparatus, each using a light source that emits far ultraviolet light at a wavelength of 300 nm or less.

2. Description of the Related Art

Since the development of a resist for a KrF excimer laser (248 nm), a pattern forming method using a chemical amplification has been used so as to compensate for sensitivity reduction caused by light absorption. By way of an example, in a positive chemical amplification method, a photoacid generator included in the exposure apparatus is decomposed by irradiation with light to generate an acid. Further, an alkali-insoluble group contained in a photosensitive composition is converted into an alkali-soluble group by the catalytic action of the generated acid in PEB (Post Exposure Bake) process. Subsequently, development is carried out using, for example, an alkali solution, and thus, the exposure area is removed to obtain a desired pattern.

For the method, various kinds of alkali developers have been proposed. For example, as the alkali developer, water-based alkali developers such as a 2.38%-by-mass aqueous TMAH (tetramethylammonium hydroxide) solution has been widely used.

Due to miniaturization of a semiconductor device, there is a trend toward a shorter wavelength of the exposure light source and a higher numerical aperture (higher NA) of the projection lens and at the present time, an exposure machine using, as its light source, an ArF excimer laser having a wavelength at 193 nm has been developed. A method of filling a high refractive-index liquid (hereinafter sometimes referred to as a "liquid for liquid immersion") between the projection lens and the sample (that is, a liquid immersion method) has been proposed as a technique for further enhancing the resolution power. In addition, EUV lithography of performing the exposure to ultraviolet light at a shorter wavelength (13.5 nm) has also been proposed.

However, it is actually very difficult to find an appropriate combination of a resist composition, a developer, a rinsing liquid, and the like necessary for forming a pattern with overall good performance, and there is demand for further improvements.

Recently, a pattern forming method using a developer including an organic solvent has been developed (see, for example, JP2008-281975A, JP2010-139996A, JP2010-164958A, JP2009-25707A, and JP1992-39665 (JP-H04-39665A)). For example, in JP2008-281975A, JP2010-139996A, JP2010-164958A, and JP2009-25707A, a pattern forming method including developing a resist composition containing a resin having a repeating unit having a group capable of decomposing by the action of an acid to generate a polar group in a relatively high content using a developer including an organic solvent is described. It is described that by this method, a fine pattern having good line width variation (LWR, LER), exposure latitude (EL), focus latitude (DOF), dimensional uniformity, or the like can be formed.

Furthermore, in JP1992-39665 (JP-H04-39665A), patterning by an organic solvent (xylene) using a resist composition including a copolymer of adamantyl methacrylate and t-butyl methacrylate is described.

In addition, in JP2011-141494A and WO08/149,701, an amine compound having a specific structure inhibiting the diffusion of the generated acids from the viewpoint of improvement of line width variation, or the like, is described.

However, in the phenomenon requiring further fine patterns, for example, in the formation of a fine pattern such as a hole pattern with a pore diameter of 45 nm or less, there has been a demand for further improvement of EL, local pattern dimensional uniformity, and rectangularity and circularity of the cross-sectional shape.

SUMMARY OF THE INVENTION

It is an object of the invention to provide a pattern forming method having excellent exposure latitude (EL), local pattern dimensional uniformity, and rectangularity and circularity of the cross-sectional shape in the formation of a fine pattern such as a hole pattern with a pore diameter of 45 nm or less; and an actinic ray-sensitive or radiation-sensitive resin composition, a resist film, a method for producing an electronic device, and an electronic device, each used for the pattern forming method. In particular, it is an object of the invention to provide a pattern forming method suitable for liquid-immersion exposure; and an actinic ray-sensitive or radiation-sensitive resin composition, a resist film, a method for producing an electronic device, and an electronic device, each used for the pattern forming method.

The invention has the configurations below, thereby accomplishing the above-described objects of the invention.

[1] A pattern forming method including:

(i) forming a film using an actinic ray-sensitive or radiation-sensitive resin composition containing a resin (P) having a repeating unit (a) represented by the following general formula (I), a compound (B) capable of generating an organic acid upon irradiation with actinic rays or radiation, and a nitrogen-containing organic compound (NA) having a group capable of leaving by the action of an acid;

(ii) exposing the film; and (iii) developing the film after the exposure using a developer including an organic solvent to form a negative type pattern.

[Chem. 1]

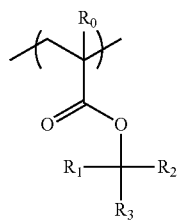
(I)

In the general formula (I), $R_0$ represents a hydrogen atom or a methyl group; and
each of $R_1$, $R_2$, and $R_3$ independently represents a linear or branched alkyl group.

[2] The pattern forming method according to [1], wherein the weight average molecular weight of the resin (P) is 10,000 or more.

[3] The pattern forming method according to [1] or [2], wherein the resin (P) is a resin containing the repeating unit (a) in a proportion of 45 mol % or more based on all the repeating units in the resin (P).

[4] The pattern forming method according to any one of [1] to [3], wherein the linear or branched alkyl group for $R_1$, $R_2$ and $R_3$ in the general formula (I) is an alkyl group having 1 to 4 carbon atoms.

[5] The pattern forming method according to any one of [1] to [4], wherein the resin (P) is a resin having an alicyclic hydrocarbon structure.

[6] The pattern forming method according to any one of [1] to [5], wherein the nitrogen-containing organic compound (NA) is represented by the following general formula (F).

[Chem. 2]

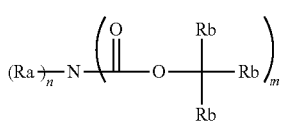
(F)

In the general formula (F), Ra represents a hydrogen atom, an alkyl group, a cycloalkyl group, an aryl group, an aralkyl group, or a group represented by the following general formula (a1);
n represents an integer of 0 to 2, m represents an integer of 1 to 3, and n+m=3;
when n is 2, two Ra's may be the same as or different from each other and the two Ra's may be bonded to each other to form a divalent heterocyclic hydrocarbon group or a derivative thereof; and
when m is 2 or 3, plural —C(Rb)(Rb)(Rb)'s may be the same as or different from each other.

[Chem. 3]

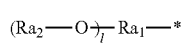
(a1)

In the general formula (a1), $Ra_1$ is a (l+1)-valent aliphatic hydrocarbon group, a benzene ring group, or a group formed by combination of these groups, and $Ra_2$ represents a monovalent group capable of leaving by the action of an acid; l represents 1 or 2, and when l is 2, two $Ra_2$'s may be the same as or different from each other; and
Rb's independently represent a hydrogen atom, an alkyl group, a cycloalkyl group, an aryl group, and an aralkyl group, provided that one or more Rb's in —C(Rb)(Rb)(Rb) are hydrogen atoms, at least one of the remaining Rb's is a cyclopropyl group, an aryl group, or a 1-alkoxyalkyl group, and two Rb's may be bonded to each other to form a ring.

[7] The pattern forming method according to any one of [1] to [6], wherein the compound (B) is a compound capable of generating an organic acid represented by the following general formula (II) or (III):

[Chem. 4]

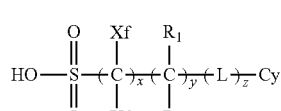
(II)

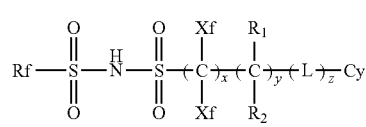
(III)

In the general formulae,
Xf's each independently represent a fluorine atom, or an alkyl group substituted with at least one fluorine atom;
each of $R_1$ and $R_2$ independently represents a hydrogen atom, a fluorine atom, or an alkyl group, and in case of y≥2, each of $R_1$'s and $R_2$'s independently represents a hydrogen atom, a fluorine atom, or an alkyl group;
L represents a divalent linking group, and in case of z≥2, a plurality of L's may be the same as or different from each other;
Cy represents a cyclic organic group;
Rf represents a group containing a fluorine atom;
x represents an integer of 1 to 20;
y represents an integer of 0 to 10; and
z represents an integer of 0 to 10.

[8] The pattern forming method according to any one of [1] to [7], wherein the actinic ray-sensitive or radiation-sensitive resin composition further includes a basic compound or ammonium salt compound (C), capable of decreasing basicity upon irradiation with actinic rays or radiation.

[9] The pattern forming method according to any one of [1] to [8], wherein the actinic ray-sensitive or radiation-sensitive resin composition further includes a hydrophobic resin having at least one of a fluorine atom and a silicon atom.

[10] The pattern forming method according to any one of [1] to [9], wherein the content of the organic solvent in the developer including an organic solvent is from 90% by mass to 100% by mass, based on the total mass of the developer.

[11] The pattern forming method according to any one of [1] to [10], wherein the developer is a developer including at least one organic solvent selected from a group consisting of a ketone-based solvent, an ester-based solvent, an alcohol-based solvent, an amide-based solvent, and an ether-based solvent.

[12] The pattern forming method according to any one of [1] to [11], further including (iv) washing with a rinsing liquid including an organic solvent.

[13] An actinic ray-sensitive or radiation-sensitive resin composition used in the pattern forming method according to any one of [1] to [12], which including: a resin (P) with a weight average molecular weight of 10,000 or more, having the repeating unit (a) represented by the general formula (I); a compound (B) capable of generating an organic acid upon irradiation with actinic rays or radiation; and a nitrogen-containing organic compound (NA) having a group capable of leaving by the action of an acid.

[14] The actinic ray-sensitive or radiation-sensitive resin composition according to [13], wherein the resin (P) is a resin containing the repeating unit (a) in a proportion of 45 mol % or more based on all the repeating units in the resin (P).

[15] The actinic ray-sensitive or radiation-sensitive resin composition according to [13] or [14], wherein the linear or branched alkyl group for $R_1$, $R_2$ and $R_3$ in the general formula (I) is an alkyl group having 1 to 4 carbon atoms.

[16] The actinic ray-sensitive or radiation-sensitive resin composition according to any one of [13] to [15], wherein the resin (P) is a resin having an alicyclic hydrocarbon structure.

[17] The actinic ray-sensitive or radiation-sensitive resin composition according to any one of [13] to [16], wherein the nitrogen-containing organic compound (NA) is represented by the general formula (F).

[18] The actinic ray-sensitive or radiation-sensitive resin composition according to any one of [13] to [17], wherein the compound (B) is a compound capable of generating an organic acid represented by the general formula (II) or (III).

[19] The actinic ray-sensitive or radiation-sensitive resin composition according to any one of [13] to [18], further including a basic compound or ammonium salt compound (C), capable of decreasing basicity upon irradiation with actinic rays or radiation.

[20] The actinic ray-sensitive or radiation-sensitive resin composition according to any one of [13] to [19], further including a hydrophobic resin having at least one of a fluorine atom and a silicon atom.

[21] A resist film formed with the actinic ray-sensitive or radiation-sensitive resin composition according to any one of [13] to [20].

[22] A method for producing an electronic device including the pattern forming method according to any one of [1] to [12].

[23] An electronic device produced by the method for producing an electronic device described in [22].

The invention preferably has the following configurations.

[24] The pattern forming method according to any one of [1] to [12], wherein the exposure in (ii) is liquid-immersion exposure.

[25] The pattern forming method according to any one of [1] to [12] and [24], wherein the resin (P) further contains a repeating unit having a hydroxyadamantyl group or a dihydroxyadamantyl group.

[26] The pattern forming method according to any one of [1] to [12], [24] and [25], wherein the resin (P) further contains a repeating unit having a lactone structure or a sultone structure.

[27] The actinic ray-sensitive or radiation-sensitive resin composition according to any one of [13] to [20], which is a chemically amplified resist composition for organic solvent development.

[28] The actinic ray-sensitive or radiation-sensitive resin composition according to any one of [13] to [20], and [26], for liquid-immersion exposure.

According to the invention, a pattern forming method having excellent exposure latitude (EL), local pattern dimensional uniformity, and rectangularity and circularity of the cross-sectional shape in the formation of a fine pattern such as a hole pattern with a pore diameter of 45 nm or less; and an actinic ray-sensitive or radiation-sensitive resin composition, a resist film, a method for producing an electronic device, and an electronic device, each used for the pattern forming method, can be provided. The pattern forming method, and the actinic ray-sensitive or radiation-sensitive resin composition and the resist film, each used for the pattern forming method, are particularly suitable for liquid-immersion exposure.

DESCRIPTION OF THE PREFERRED EMBODIMENTS

Hereinbelow, the embodiments of the invention will be described in detail.

In the description of a group (atomic group) in the present specification, when the group (atomic group) is described without specifying whether substituted or unsubstituted, the group includes both a group (atomic group) having no substituent and a group (atomic group) having a substituent. For example, the term "alkyl group" includes not only an alkyl group having no substituent (unsubstituted alkyl group) but also an alkyl group having a substituent (substituted alkyl group).

In the invention, the term "actinic ray" or "radiation" refers to, for example, a bright line spectrum of a mercury lamp, far ultraviolet rays typified by an excimer laser, extreme-ultraviolet rays (EUV light), X rays, an electron beam (EB), or the like. Further, the light in the invention means actinic rays or radiation.

Furthermore, unless otherwise specifically indicated, the term "exposure" in the present specification includes not only exposure to a mercury lamp, far ultraviolet rays typified by an excimer laser, X-rays, EUV light, or the like but also lithography with a particle beam such as an electron beam and an ion beam.

The pattern forming method of the invention includes:
(i) forming a film using an actinic ray-sensitive or radiation-sensitive resin composition containing a resin (P) having a repeating unit (a) represented by the following general formula (I), a compound (B) capable of generating an organic acid upon irradiation with actinic rays or radiation, and a nitrogen-containing organic compound (NA) having a group capable of leaving by the action of an acid;
(ii) exposing the film; and
(iii) developing the film after the exposure using a developer including an organic solvent to form a negative type pattern.

[Chem. 5]

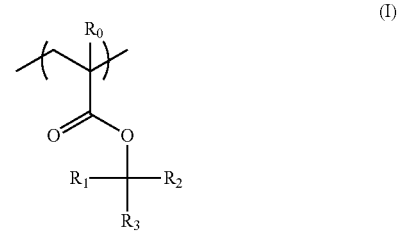

(I)

In the general formula (I), $R_0$ represents a hydrogen atom or a methyl group; and
each of $R_1$, $R_2$, and $R_3$ independently represents a linear or branched alkyl group.

The reason why the pattern forming method of the invention using an actinic ray-sensitive or radiation-sensitive resin composition containing a resin (P) having the repeating unit (a) represented by the general formula (I), and a nitrogen-containing organic compound (NA) having a group capable of leaving by the action of an acid is excellent in EL, local pattern dimensional uniformity, and rectangularity and circularity of the cross-sectional shape in the formation of a fine pattern such as a hole pattern with a pore diameter of 45 nm or less by negative type pattern forming with a developer including an organic solvent is not clear, but is presumed as follows.

In the case where development is carried out using a developer including an organic solvent, when the dissolution contrast in the resist film is low, the pattern boundary is partially dissolved, and EL, local pattern dimensional uniformity, and rectangularity and circularity of the cross-sectional shape are deteriorated. Thus, when the resin (P) having the repeating unit represented by the general formula (I) is used, the dissolution contrast for the organic solvent between the exposed area and the non-exposed area in the resist film can be increased. Further, the nitrogen-containing organic compound (NA) having a group capable of leaving by the action of an acid can inhibit the diffusion of the generated acids in the exposed area. As a result, the reason is not clear, but it is presumed that EL, local pattern dimensional uniformity, and rectangularity of the cross-sectional shape and circularity in the formation of a fine pattern such as a contact hole pattern with a pore diameter of 45 nm or less is improved.

For the pattern forming method of the invention, the developer is preferably a developer including at least one organic solvent selected from a group consisting of a ketone-based solvent, an ester-based solvent, an alcohol-based solvent, an amide-based solvent, and an ether-based solvent.

The pattern forming method of the invention preferably further includes (iv) washing with a rinsing liquid including an organic solvent.

The rinsing liquid is preferably a rinsing liquid including at least one organic solvent selected from a group consisting of a hydrocarbon-based solvent, a ketone-based solvent, an ester-based solvent, an alcohol-based solvent, an amide-based solvent, and an ether-based solvent.

The pattern forming method of the invention preferably includes (v) heating after the (ii) exposure.

For the pattern forming method of the invention, the resin (P) is a resin having an increased polarity by the action of an acid, and thus, having an increased solubility in an alkali developer, and the pattern forming method may further include (vi) developing using an alkali developer.

The pattern forming method of the invention may include (ii) exposure plural times.

The pattern forming method of the invention may include (v) heating plural times.

The resist film of the invention is a film formed by the actinic ray-sensitive or radiation-sensitive resin composition, and is also a film formed by, for example, coating a substrate with the actinic ray-sensitive or radiation-sensitive resin composition.

Hereinbelow, the actinic ray-sensitive or radiation-sensitive resin composition that can be used in the invention will be described.

Furthermore, the invention also relates to the actinic ray-sensitive or radiation-sensitive resin composition as described later.

The actinic ray-sensitive or radiation-sensitive resin composition according to the invention is used for negative type development (development in which the solubility in a developer decreases upon exposure, and thus, the exposed area remains as a pattern and the non-exposed area is removed). That is, the actinic ray-sensitive or radiation-sensitive resin composition according to the invention can be used as an actinic ray-sensitive or radiation-sensitive resin composition for organic solvent development, that is used for development using a developer including an organic solvent. Here, the use for an organic solvent development means a use for development using at least a developer including an organic solvent.

The actinic ray-sensitive or radiation-sensitive resin composition of the invention is typically a resist composition, and is preferably a negative type resist composition (that is, a resist composition for organic solvent development) from the viewpoint of obtaining particularly superior effects. In addition, the composition according to the invention is typically a chemically amplified resist composition.

The actinic ray-sensitive or radiation-sensitive resin composition of the invention is typically a resist composition, and particularly preferably a negative type resist composition (that is, resist composition for organic solvent development) from the viewpoint that a superior effect can be obtained. Further, the composition according to the invention is typically a chemically amplified resist composition.

[1] (P) Resin Having a Repeating Unit (a) Represented by the Following General Formula (I)

[Chem. 6]

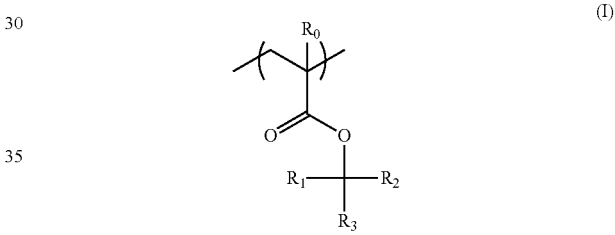

(I)

In the general formula (I), $R_0$ represents a hydrogen atom or a methyl group, and
each $R_1$, $R_2$, and $R_3$ independently represents a linear or branched alkyl group.

As the linear or branched alkyl group for $R_1$, $R_2$, and $R_3$, an alkyl group having 1 to 4 carbon atoms is preferred, and examples thereof include a methyl group, an ethyl group, an n-propyl group, an isopropyl group, an n-butyl group, an isobutyl group, and a tert-butyl group.

As $R_1$, a methyl group, an ethyl group, an n-propyl group, and an n-butyl group are preferred, a methyl group and an ethyl group are more preferred, and a methyl group is particularly preferred.

As $R_2$, a methyl group, an ethyl group, an n-propyl group, an isopropyl group, and an n-butyl group are preferred, a methyl group and an ethyl group are more preferred, and a methyl group is particularly preferred.

As $R_3$, a methyl group, an ethyl group, an n-propyl group, an isopropyl group, an n-butyl group, an isobutyl group, and a tert-butyl group are preferred, a methyl group, an ethyl group, an isopropyl group, and an isobutyl group are more preferred, and a methyl group, an ethyl group, and an isopropyl group are particularly preferred.

The repeating unit (a) represented by the general formula (I) is a repeating unit having a group that decomposes by the action of an acid to generate a polar group (carboxyl group) (hereinafter also referred to as an "acid-decomposable group").

A resin having the repeating unit (a) represented by the general formula (I) used in the actinic ray-sensitive or radiation-sensitive resin composition according to the invention (hereinafter also referred to as a "resin (P)") is a resin having an acid-decomposable group (hereinafter also referred to as an "acid-decomposable resin"), having an increased polarity by the action of an acid and a decreased solubility in a developer including an organic solvent.

Furthermore, the resin (P) is a resin having an increased polarity by the action of an acid, and thus, having an increased solubility in an alkali developer.

In the resin (P) in the invention, the content of the repeating unit (a) represented by the general formula (I) (the total content in the case of including plural kinds of the repeating units) is not particularly limited, but from the viewpoint of reliably attaining the effect of the invention, it is preferably 45 mol % or more, and from the viewpoint of improvement of a dissolution contrast, it is more preferably 50 mol % or more, and particularly preferably 55 mol % or more. Further, the upper limit is preferably 90 mol % or less, and more preferably 85 mol % or less, from the viewpoint of forming a good pattern.

Specific examples of the repeating unit (a) represented by the general formula (I) are shown below, but the invention is not limited thereto.

[Chem. 7]

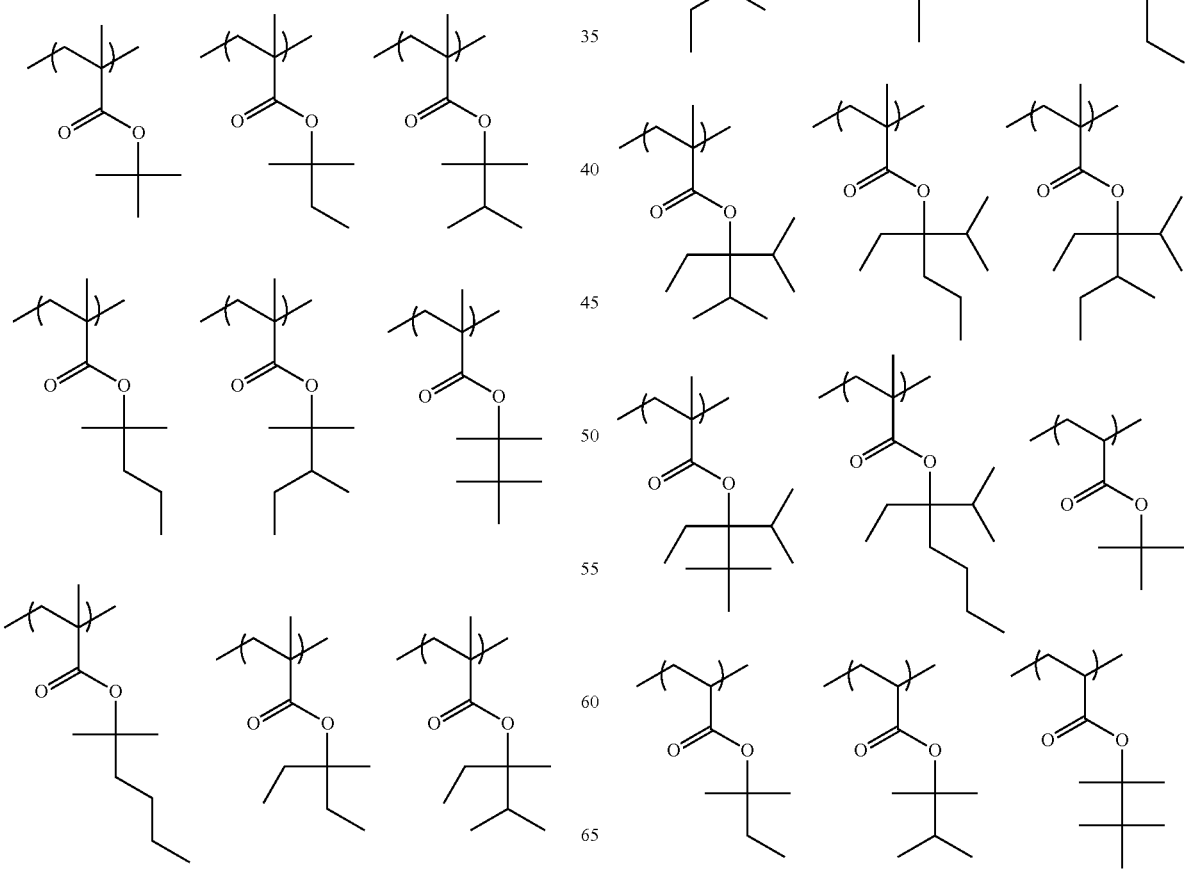

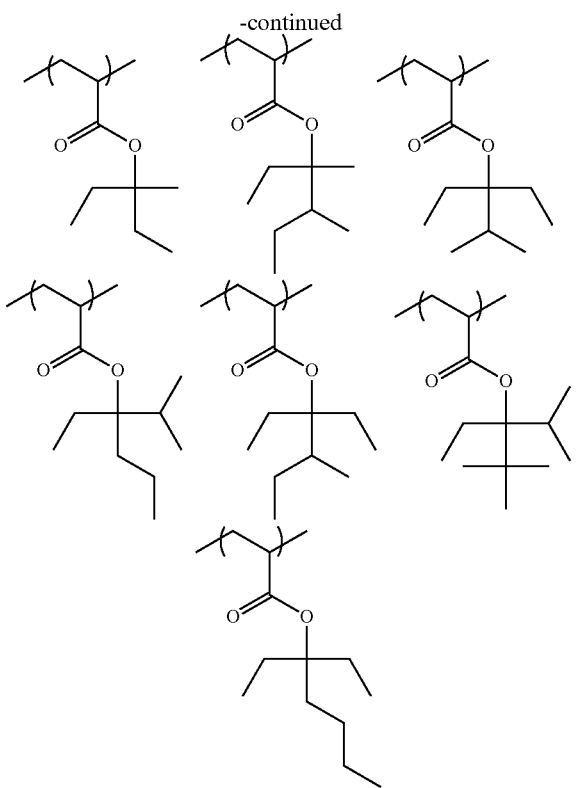

In the invention, the resin (P) may have a repeating unit (b) having an acid-decomposable group other than that of the repeating unit (a).

The acid-decomposable group other than that of the repeating unit (a) preferably has a polar group having a structure protected with a group that decomposes and leaves by the action of an acid.

The polar group is not particularly limited as long as it is a group that is sparingly soluble or insoluble in a developer including an organic solvent, but examples thereof include acidic groups such as a carboxyl group and a sulfonic acid group (groups that are dissociated in a 2.38%-by-mass aqueous tetramethylammonium hydroxide solution used as a developer for a resist), and an alcoholic hydroxyl group.

Herein, the alcoholic hydroxyl group refers to a hydroxyl group other than a hydroxyl group directly bonded to an aromatic ring as a hydroxyl group bonded to a hydrocarbon skeleton (phenolic hydroxyl group), excluding an aliphatic alcohol having the α-position substituted with an electron-withdrawing group such as a fluorine atom (for example, a fluorinated alcohol group (a hexafluoroisopropanol group or the like)). As the alcoholic hydroxyl group, a hydroxyl group having a pKa of 12 to 20 is preferred.

The acid-decomposable group is preferably a group formed by substituting a group which leaves by the action of an acid for a hydrogen atom of the above-described group.

Examples of the group which leaves by the action of an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the general formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The alkyl group of $R_{36}$ to $R_{39}$, $R_{01}$, and $R_{02}$ are preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$, and $R_{02}$ may be either monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, and a cyclooctyl group. The polycyclic cycloalkyl group is preferably a cycloalkyl group having 6 to 20 carbon atoms, and examples thereof include an adamantyl, a norbornyl group, an isobornyl group, a camphanyl group, a dicyclopentyl group, an α-pinel group, a tricyclodecanyl group, a tetracyclododecyl group, and an androstanyl group. Further, at least one carbon atom in the cycloalkyl group may be substituted with a heteroatom such as an oxygen atom.

The aryl group of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

The aralkyl group of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

The ring formed by the mutual bonding of $R_{36}$ and $R_{37}$ is preferably a cycloalkyl group (monocyclic or polycyclic). The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. A monocyclic cycloalkyl group having 5 or 6 carbon atoms is more preferred, and a monocyclic cycloalkyl group having 5 carbon atoms is particularly preferred.

The repeating unit (b) having an acid-decomposable group other than that of the repeating unit (a), which may be contained in the resin (P) is preferably a repeating unit represented by the following general formula (AI).

[Chem. 8]

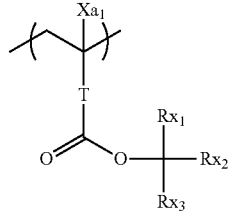

(AI)

In the general formula (AI), $Xa_1$ represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having 5 or less carbon atoms and an acyl group having 5 or less carbon atoms. Among these, an alkyl group having 3 or less carbon atoms is preferred, and a methyl group is more preferred. $Xa_1$ is preferably a hydrogen atom, a methyl group, a trifluoromethyl group, or a hydroxymethyl group.

T represents a single bond or a divalent linking group.

$Rx_1$ to $Rx_3$ each independently represent an alkyl group (linear or branched) or a cycloalkyl group (monocyclic or polycyclic).

Two members out of $Rx_1$ to $Rx_3$ may be bonded to each other to form a cycloalkyl group (monocyclic or polycyclic).

However, in the case where T represents a single bond, all of $Rx_1$ to $Rx_3$ do not represent alkyl groups.

Examples of the divalent linking group of T include an alkylene group, a —COO-Rt- group, a —O-Rt- group, and a phenylene group. In the formulae, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group of $Rx_1$ to $Rx_3$ is preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group of $Rx_1$ to $Rx_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

The cycloalkyl group formed by the combination of at least two members of $Rx_1$ to $Rx_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group, and particularly preferably a monocyclic cycloalkyl group having 5 to 6 carbon atoms.

An embodiment where $Rx_1$ is a methyl group or an ethyl group, and $Rx_2$ and $Rx_3$ are bonded to each other to form the above-described cycloalkyl group is preferred.

Each of the groups above may have a substituent, and examples of the substituent include an alkyl group (having 1 to 4 carbon atoms), a cycloalkyl group (having 3 to 8 carbon atoms), a halogen atom, an alkoxy group (having 1 to 4 carbon atoms), a carboxyl group, and an alkoxycarbonyl group (having 2 to 6 carbon atoms), and the substituent preferably has 8 or less carbon atoms. Among those, from the viewpoint of improvement of a dissolution contrast in a developer containing an organic solvent before and after acid decomposition, a substituent having no hetero atom such as an oxygen atom, a nitrogen atom, and a sulfur atom is more preferred (for example, more preferably, it is not an alkyl or the like substituted with a hydroxyl group), a group consisting of only a hydrogen atom and a carbon atom is still more preferred, and a linear or branched alkyl group, or a cycloalkyl group is particularly preferred.

Specific preferred examples of the repeating unit (b) having an acid-decomposable group other than that of the repeating unit (a) are shown below, but the invention is not limited thereto.

In the specific examples, Rx and $Xa_1$ each represent a hydrogen atom, $CH_3$, $CF_3$, or $CH_2OH$, and Rxa and Rxb each represent an alkyl group having 1 to 4 carbon atoms. Z represents a substituent containing a polar group, and when a plurality of Z's are present, they may be the same as or different from each other. p represents 0 or a positive integer.

Specific examples and preferred examples of Z are the same as specific examples and preferred examples of the substituent that each of $Rx_1$ to $Rx_3$ and the like may have.

[Chem. 9]

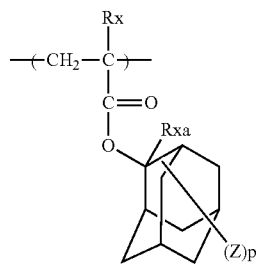

1

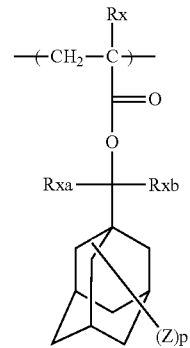

2

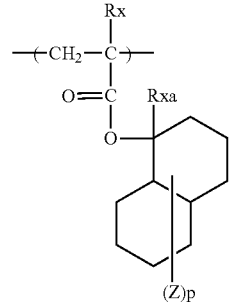

3

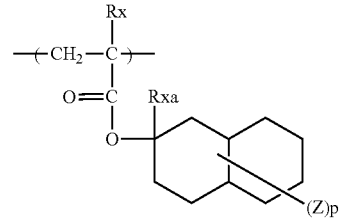

4

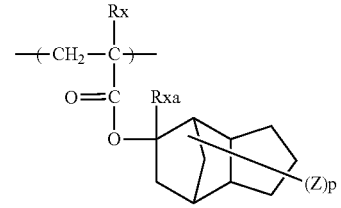

5

-continued
| | |
|---|---|
| 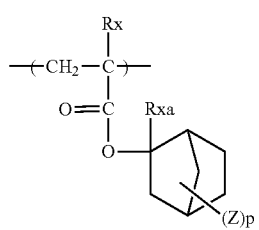 | 6 |
| 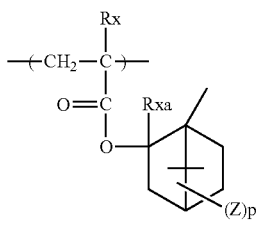 | 7 |
| 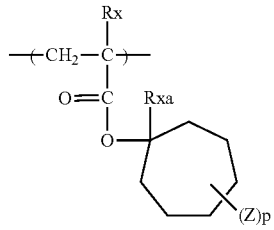 | 8 |
| 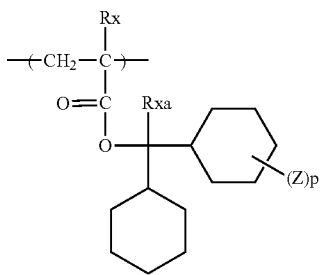 | 9 |
| 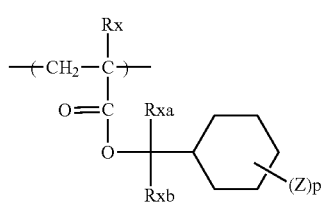 | 10 |
| 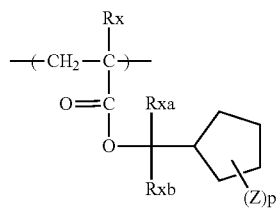 | 11 |
| 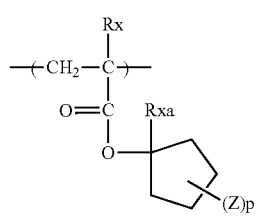 | 12 |
-continued
| | |
|---|---|
| 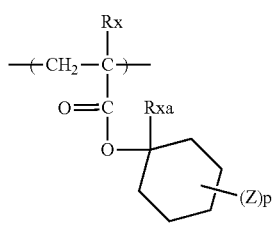 | 13 |
| 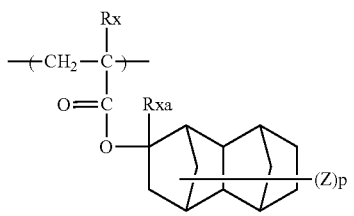 | 14 |
| 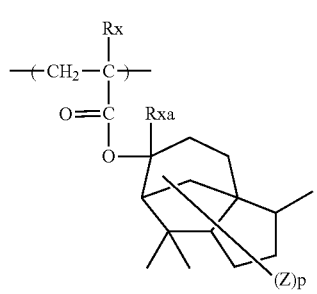 | 17 |
| 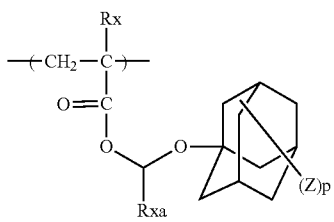 | 18 |
| 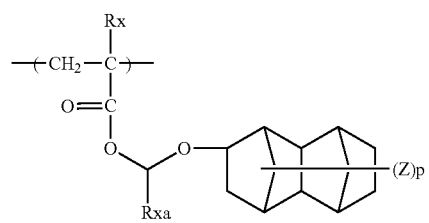 | 19 |
| 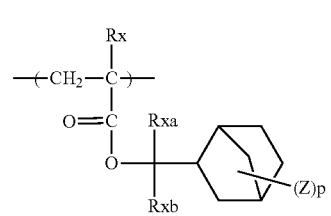 | 20 |

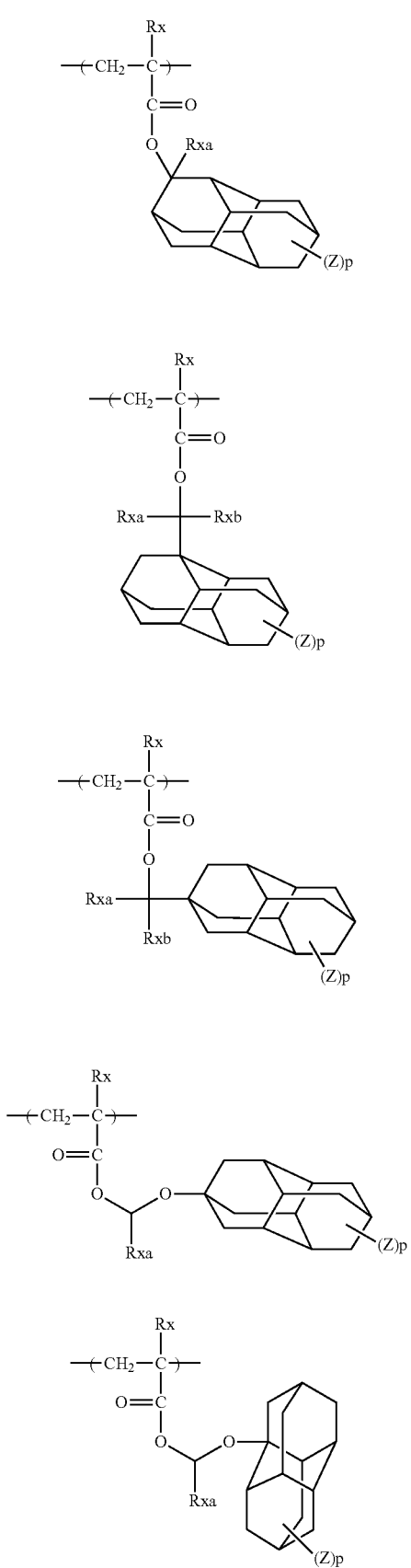
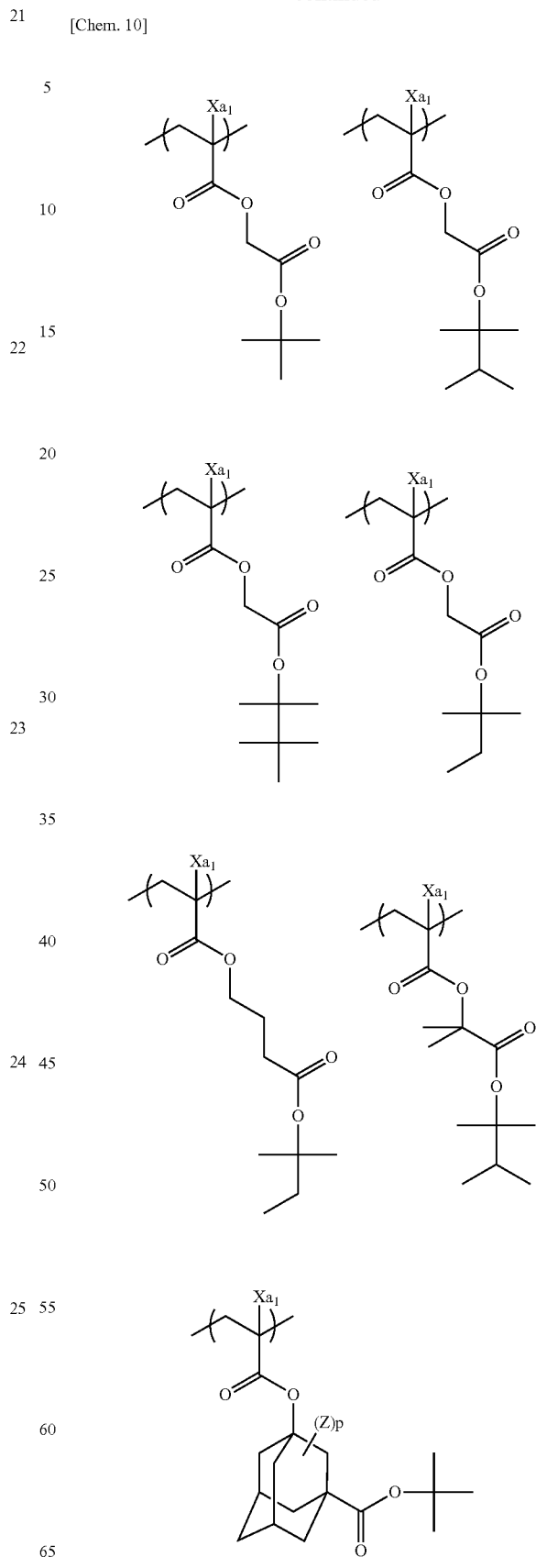

-continued
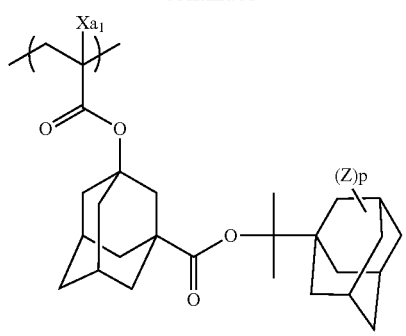
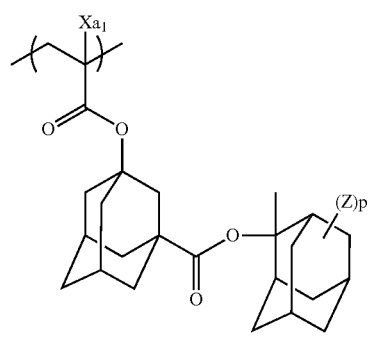
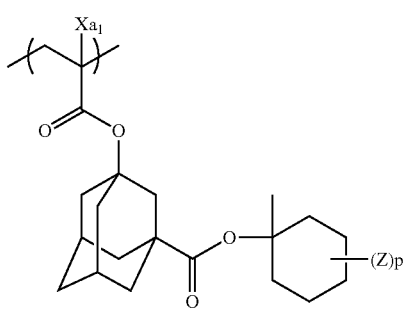
[Chem. 11]
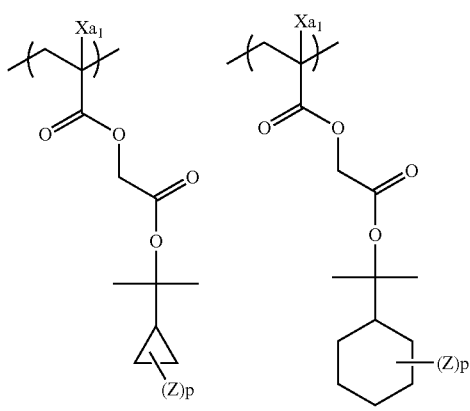
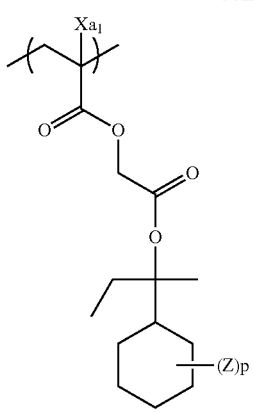 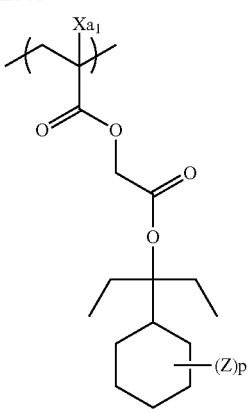
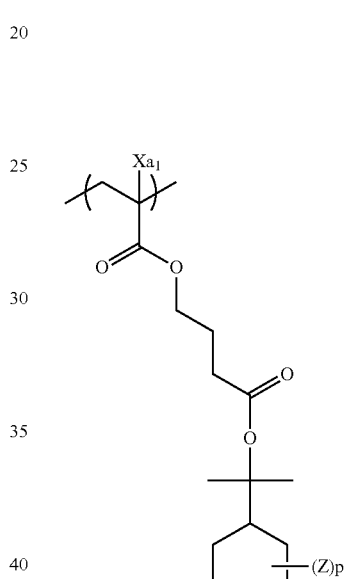 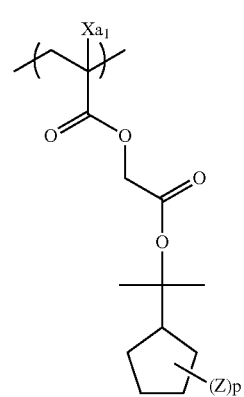
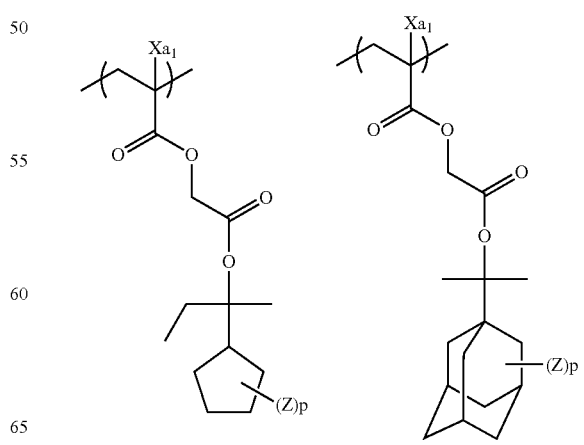

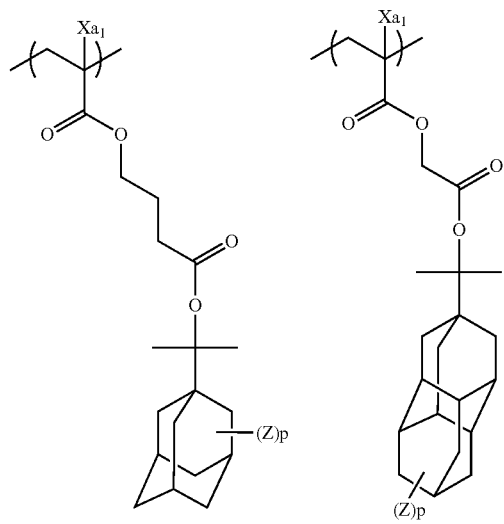
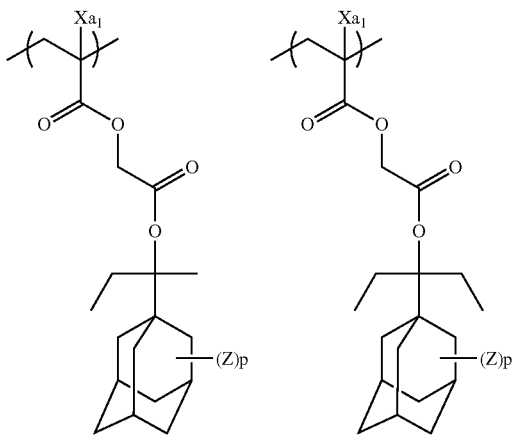
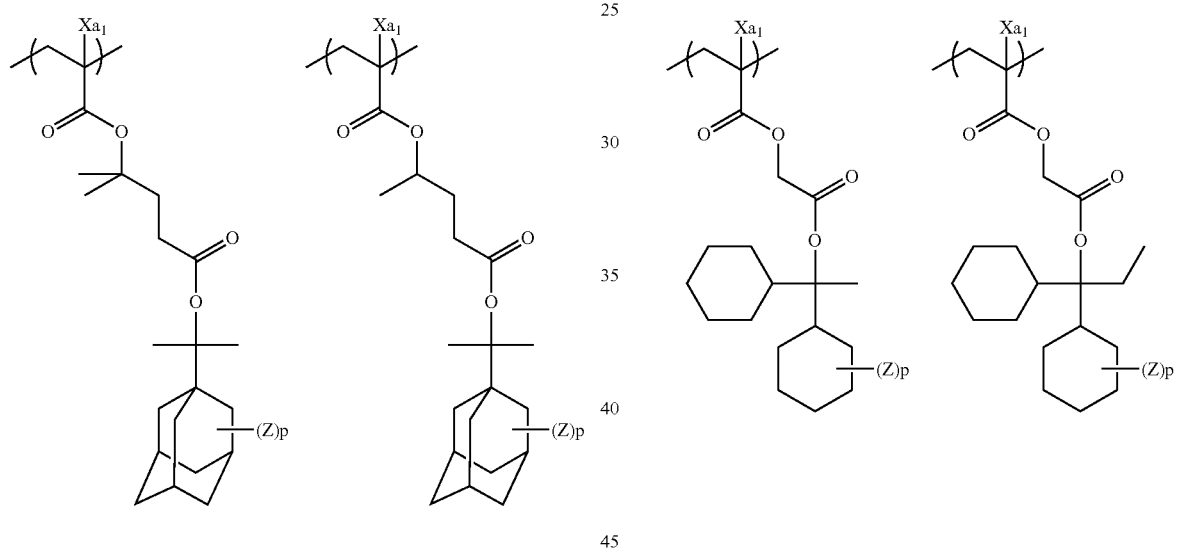
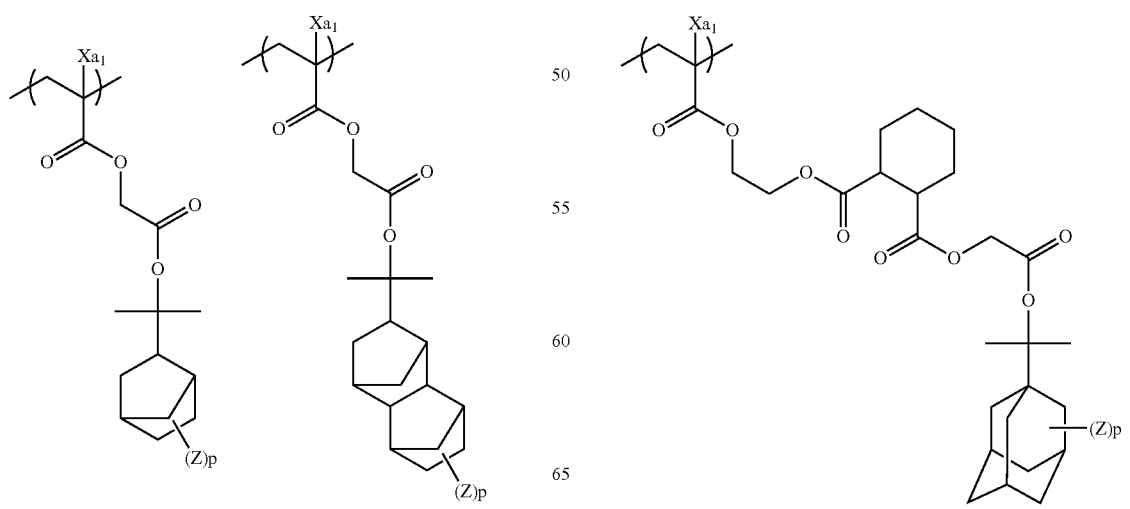

[Chem. 12]
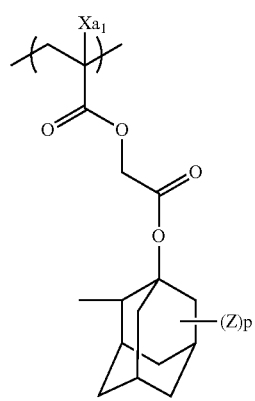 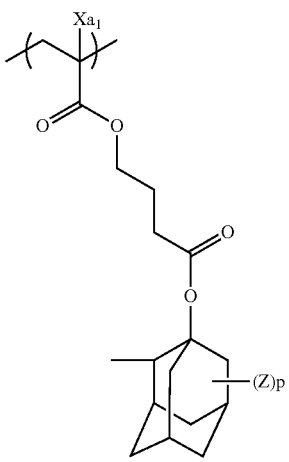 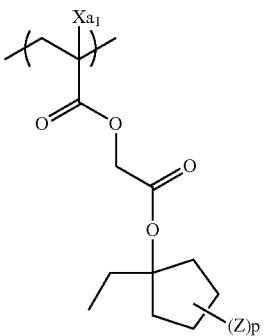 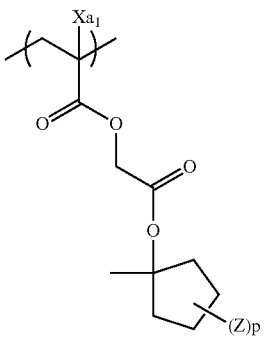
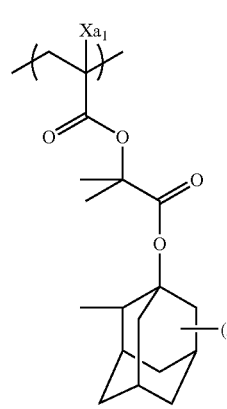 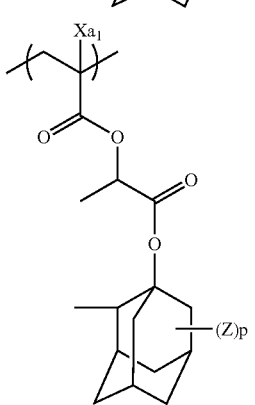 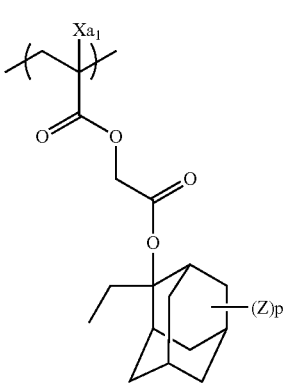 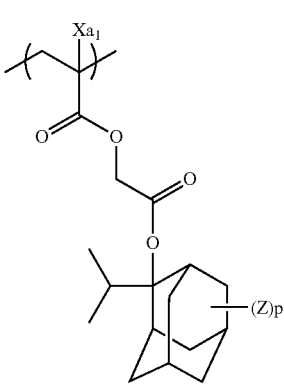
[Chem. 13]
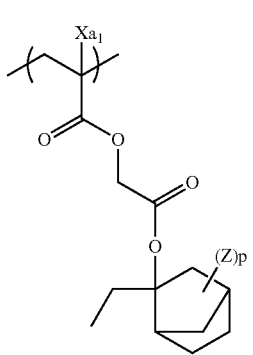 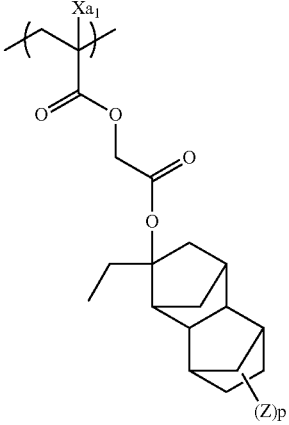 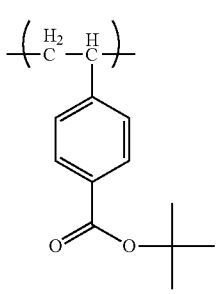 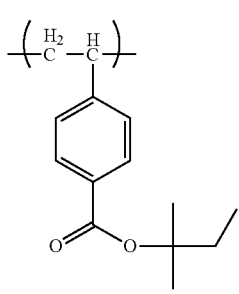
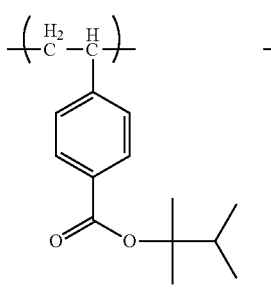 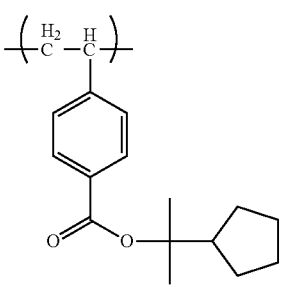
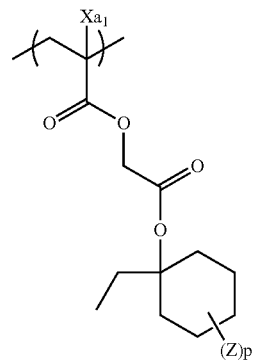 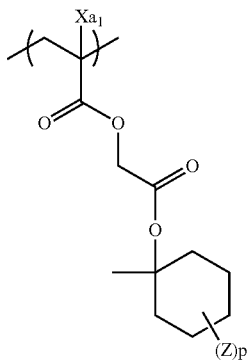 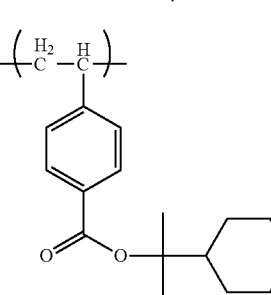 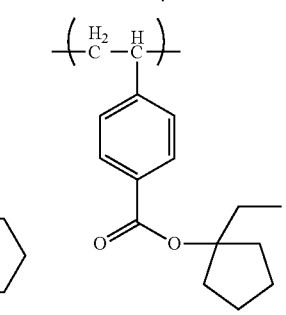

-continued
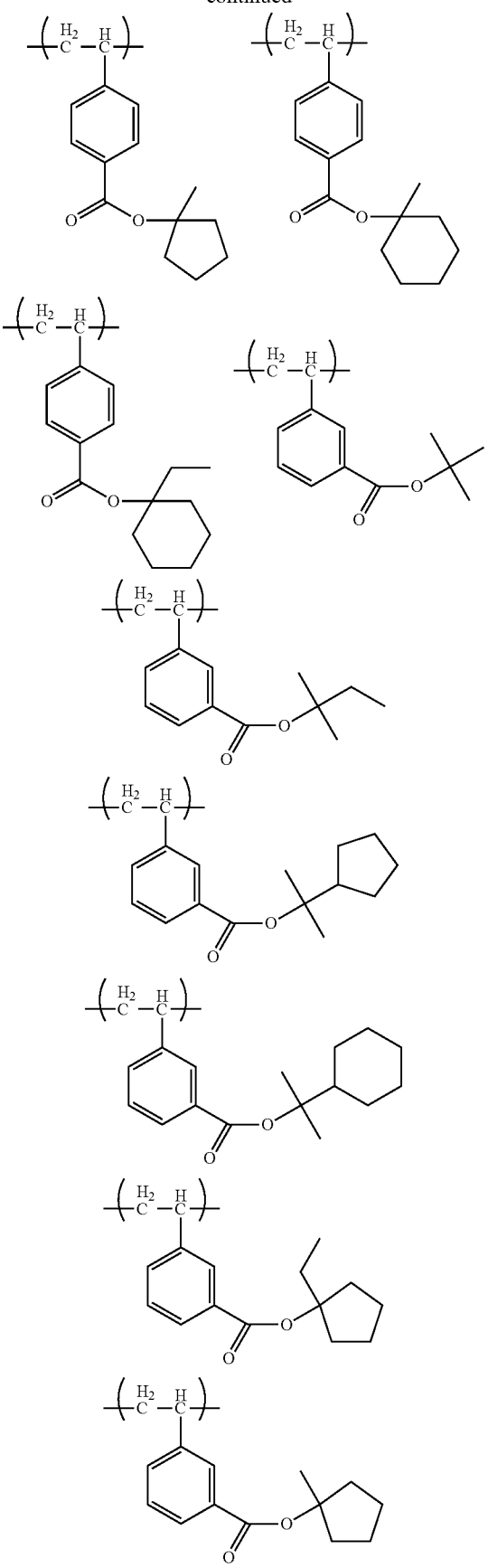
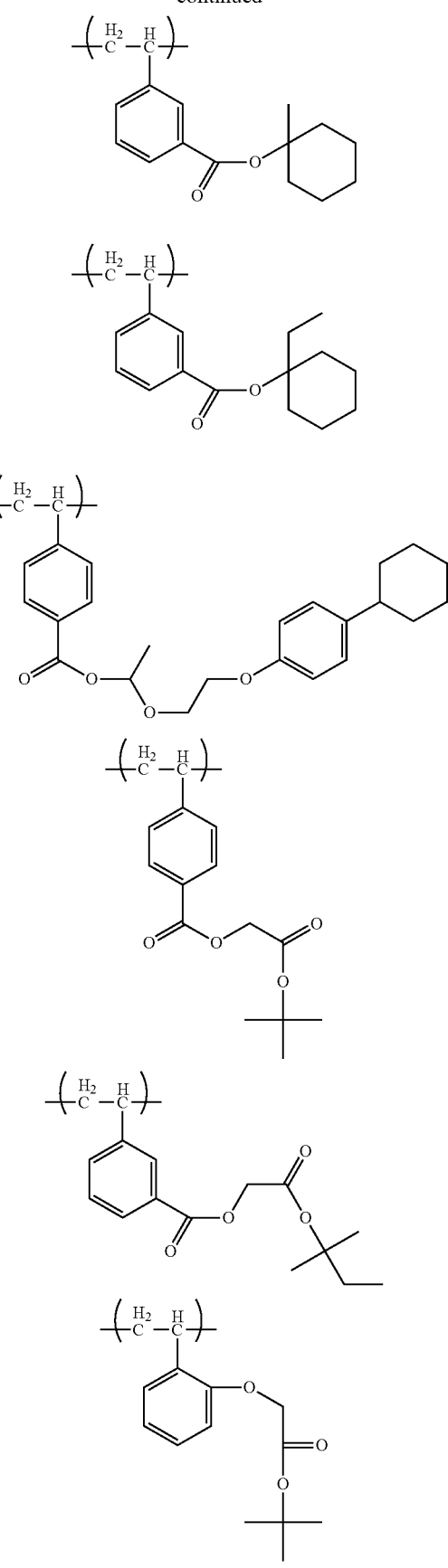

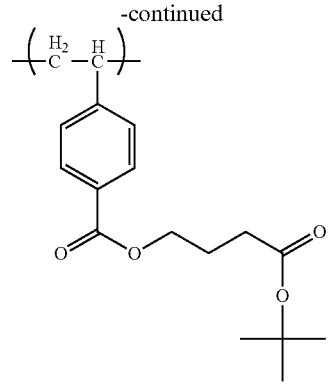
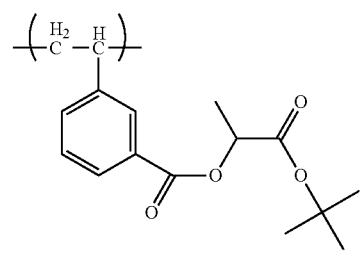
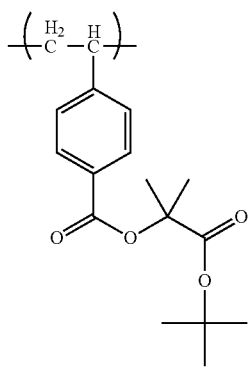
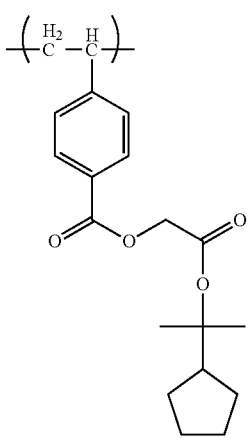
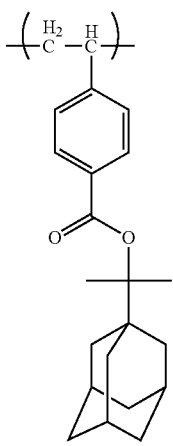
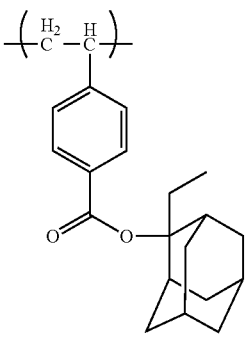
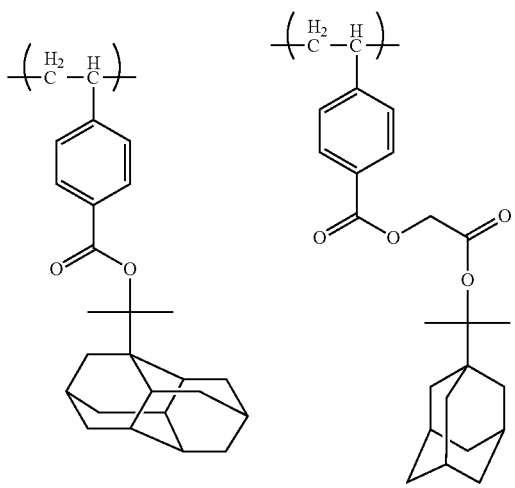
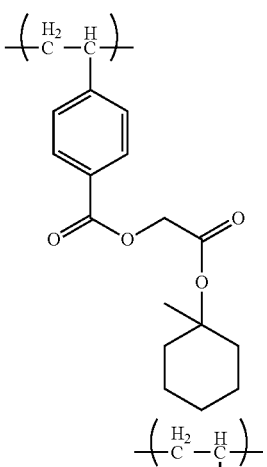
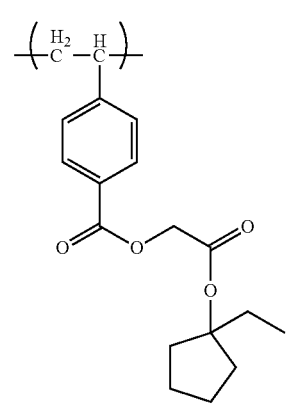
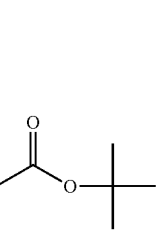
[Chem. 14]

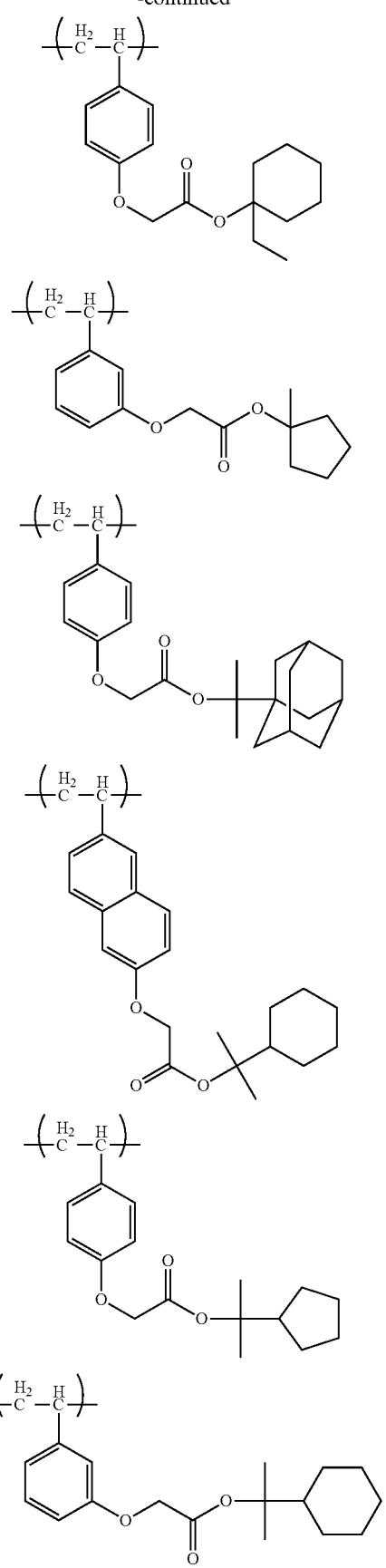

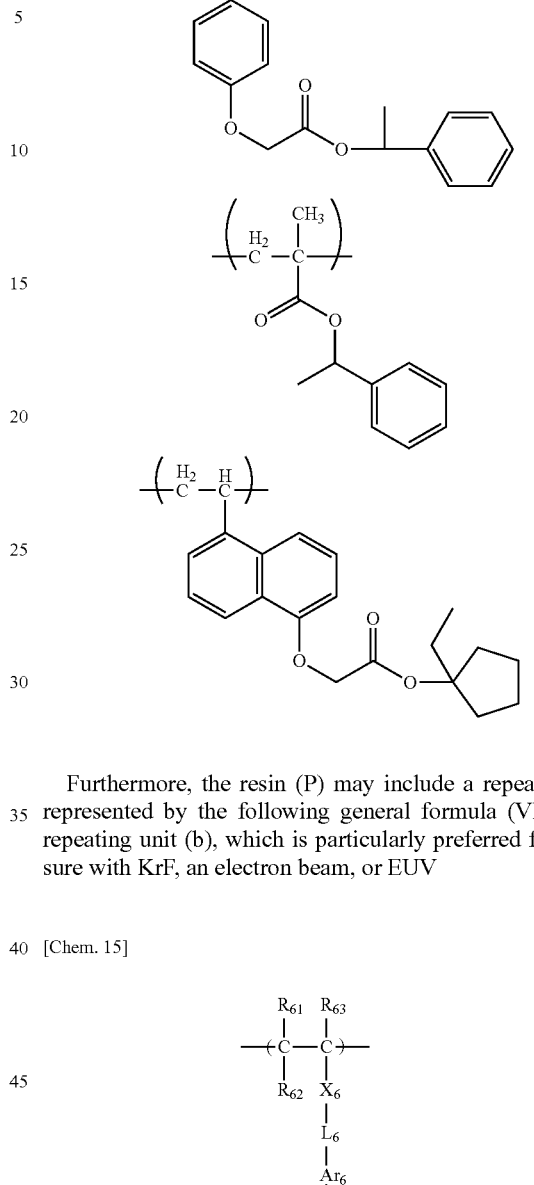

Furthermore, the resin (P) may include a repeating unit represented by the following general formula (VI) as the repeating unit (b), which is particularly preferred for exposure with KrF, an electron beam, or EUV

[Chem. 15]

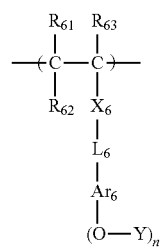

(VI)

In the general formula (VI), $R_{61}$, $R_{62}$, and $R_{63}$ each independently represent a hydrogen atom, an alkyl group, a cycloalkyl group, a halogen atom, a cyano group, or an alkoxycarbonyl group. $R_{62}$ may be bonded to $Ar_6$ to form a ring (preferably, a 5- or 6-membered ring), and in this case, $R_{62}$ is an alkylene group.

$X_6$ represents a single bond, —COO—, —CONR$_{64}$— ($R_{64}$ represents a hydrogen atom or an alkyl group). $L_6$ represents a single bond or an alkylene group. $Ar_6$ represents a divalent aromatic ring group. In the case where plural Y's are present, they each independently represent a hydrogen atom or a group which leaves by the action of an acid, provided that at least one of Y's is a group which leaves by the action of an acid. n represents an integer of 1 to 4.

As the repeating unit (b), a repeating unit represented by the following general formula (1) or a repeating unit represented by the following general formula (2) is preferred.

[Chem. 16]

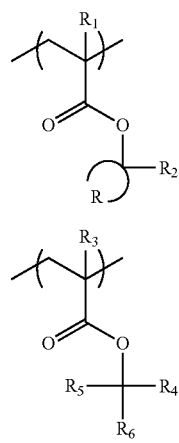

In the general formulae (1) and (2),
$R_1$ and $R_3$ each independently represent a hydrogen atom, a methyl group which may have a substituent, or a group represented by —$CH_2$—$R_9$. $R_9$ represents a hydroxyl group or a monovalent organic group;
$R_2$ represents an alkyl group or a cycloalkyl group;
$R_4$, $R_5$, and $R_6$ each independently represent an alkyl group or a cycloalkyl group, and at least one of $R_4$, $R_5$, and $R_6$ represents a cycloalkyl group; and
R represents an atomic group necessary for forming an alicyclic structure together with the carbon atom.

$R_1$ and $R_3$ each preferably represent a hydrogen atom, a methyl group, a trifluoromethyl group, or a hydroxymethyl group. Specific examples and preferred examples of the monovalent organic group in $R_9$ are the same as those described for $R_9$ in the general formula (AI).

The alkyl group in $R_2$ may be linear or branched and may have a substituent.

The cycloalkyl group in $R_2$ may be monocyclic or polycyclic, and may have a substituent.

$R_2$ is preferably an alkyl group, more preferably an alkyl group having 1 to 10 carbon atoms, and still more preferably an alkyl group having 1 to 5 carbon atoms, and examples thereof include a methyl group and an ethyl group.

R represents an atomic group necessary for forming an alicyclic structure together with the carbon atom. The alicyclic structure formed by R in combination with the carbon atom is preferably a monocyclic alicyclic structure, and preferably has 3 to 7 carbon atoms, more preferably 5 or 6 carbon atoms.

The alkyl group in $R_4$, $R_5$, and $R_6$ may be linear or branched and may have a substituent. The alkyl-group is preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group in $R_4$, $R_5$, and $R_6$ may be monocyclic or polycyclic and may have a substituent. The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

Furthermore, other embodiments having the repeating unit (b) other than the repeating unit as exemplified above may be embodiments of the repeating unit which generates the alcoholic hydroxyl group as shown below.

In the specific examples, $X_1$ represents a hydrogen atom, $CH_3$, $CF_3$, or $CH_2OH$.

[Chem. 17]

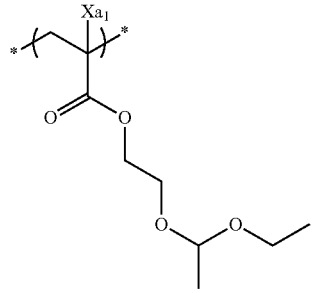

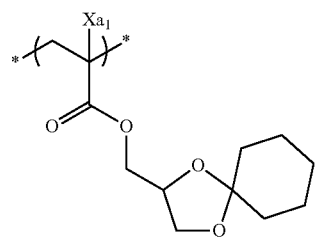

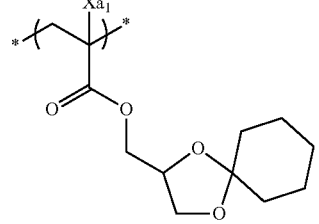

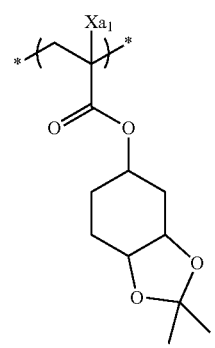

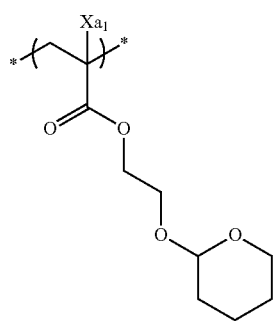

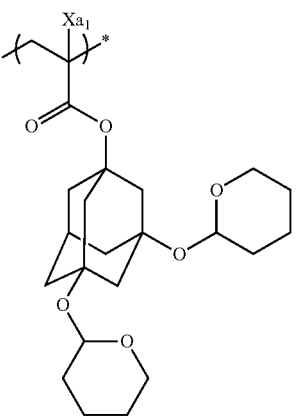

33
-continued
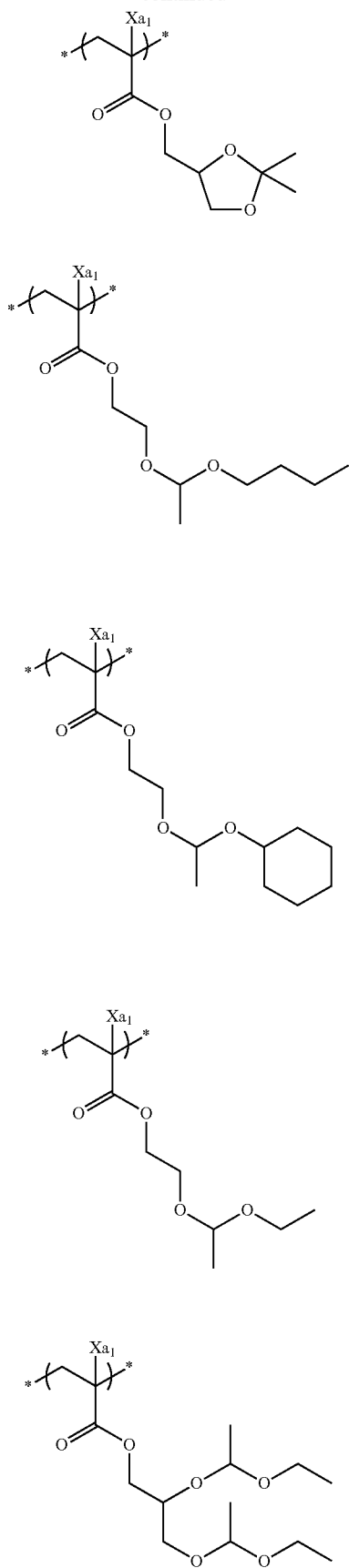
34
-continued
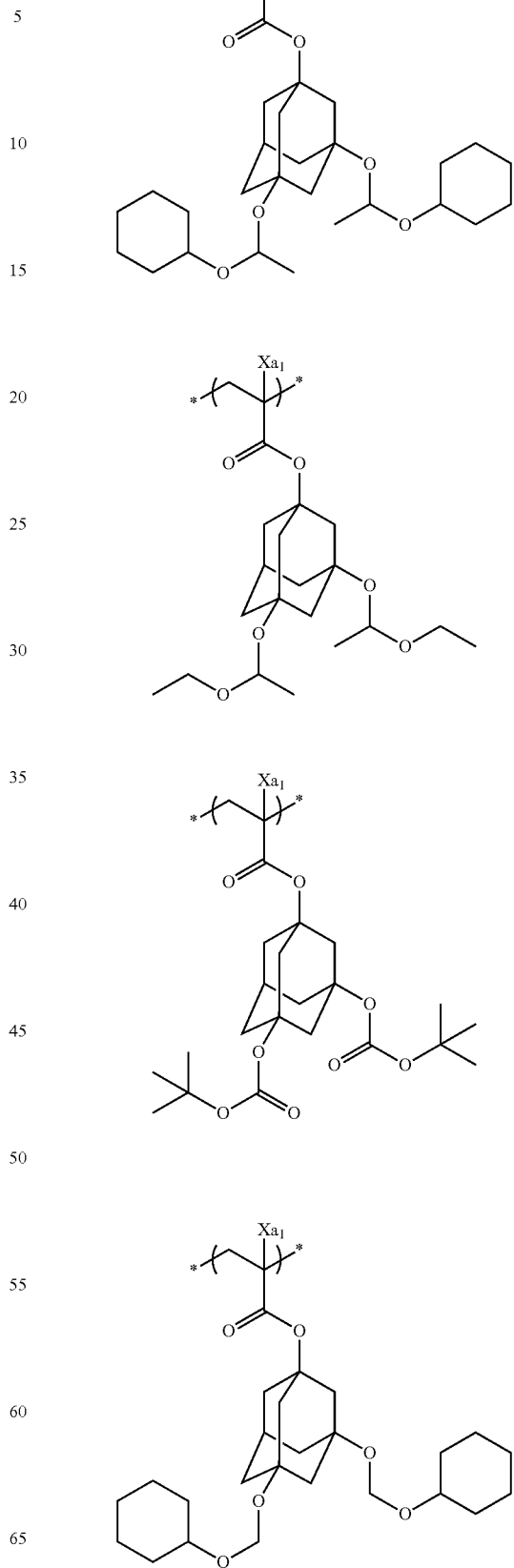

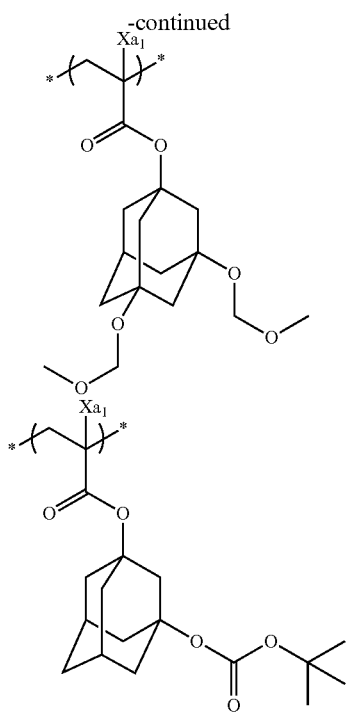

The resin (P) may contain the repeating unit (b) having an acid-decomposable group other than that of the repeating unit (a), but in the case where the resin (P) contains the repeating unit (b), the content of the repeating unit (b) is preferably from 1 to 30 mol %, more preferably from 1 to 20 mol %, and still more preferably from 1 to 15 mol %, based on all the repeating units in the resin (P). In the invention, the molar amount of the leaving products from the decomposition of the acid-decomposable group in the repeating unit (a) or (b) (a weight average value in the case where plural kinds of the leaving products are generated (hereinafter also referred to as a molar average value)) is preferably 140 or less. In this way, particularly in the case of forming a negative type image, the exposed area remains as a pattern, and therefore, reduction of the film thickness in the pattern portion can be prevented by reducing the molecular weight of the leaving product.

In the invention, the "leaving product that is generated by the decomposition of the acid-decomposable group" refers to a product that decomposes by the action of an acid corresponding to a group that decomposes and leaves by the action of an acid, and leaves. For example, in the case where $R_1$ to $R_3$ in the general formula (I) of the repeating unit (a) are all methyl groups, thus to form a t-butyl group, they refer to an alkene ($H_2C$=$C(CH_3)_2$) that is generated by the decomposition of the t-butyl moiety.

The resin (P) preferably has a repeating unit having a polar group. By virtue of containing the repeating unit having a polar group, the dissolution speed of the resin (composition) in the developer including an organic solvent is easily controlled to be in a suitable range.

The repeating unit having a polar group is not particularly limited, but specific examples thereof include a repeating unit having a lactone structure or a sultone structure (c), a repeating unit (d) having an acid group, and a repeating unit having a hydroxyl group or a cyano group (e), as described later.

As the repeating unit having a lactone structure or a sultone structure (c), a repeating unit represented by the following general formula (AII) is more preferred.

[Chem. 18]

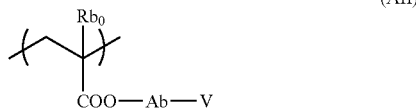

In the general formula (AII), $Rb_0$ represents a hydrogen atom, a halogen atom, or an alkyl group (having 1 to 4 carbon atoms), which may have a substituent.

Preferred examples of the substituent which the alkyl group of $Rb_0$ may have include a hydroxyl group and a halogen atom. Examples of the halogen atom of $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combination thereof, and is preferably a single bond or a divalent linking group represented by -$Ab_1$-$CO_2$—.

$Ab_1$ is a linear or branched alkylene group or a monocyclic or polycyclic cycloalkylene group, and is preferably a methylene group, an ethylene group, a cyclohexylene group, an adamantylene group, or a norbornylene group.

V represents a group having a lactone structure or a sultone structure.

Any group having a lactone structure or a sultone structure may be used as long as it has a lactone structure or a sultone structure, but a 5- to 7-membered ring lactone structure is preferred, and a 5- to 7-membered ring lactone structure to which another ring structure is fused to form a bicyclo structure or a spiro structure is preferred. It is more preferred to include a repeating unit having a lactone structure represented by any of the following general formulae (LC1-1) to (LCI-17) and a sultone structure represented by any of the following general formulae (SL1-1) to (SL1-3). Further, the lactone structure or the sultone structure may be bonded directly to the main chain. Preferred examples of the lactone structure include (LC1-1), (LC1-4), (LC1-5), (LC1-6), (LC1-8), (LC1-13), and (LC1-14).

[Chem. 19]

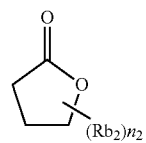

LC1-1

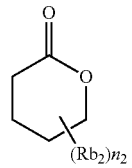

LC1-2

-continued

LC1-3

LC1-4

LC1-5

LC1-6

LC1-7

LC1-8

LC1-9

LC1-10

-continued

LC1-11

LC1-12

LC1-13

LC1-14

LC1-15

LC1-16

LC1-17

SL1-1

SL1-2

SL1-3

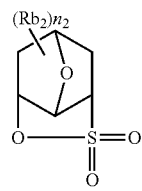

The lactone structure or sultone structure moiety may or may not have a substituent (Rb₂). Preferred examples of the substituent (Rb₂) include an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group and an acid-decomposable group are more preferred. $n_2$ represents an integer of 0 to 4. When $n_2$ is an integer of 2 or more, the substituents (Rb₂) may be the same as or different from each other, and the plurality of substituents (Rb₂) may be bonded to each other to form a ring.

The repeating unit having a lactone structure or a sultone structure usually has an optical isomer, but any optical isomer may be used. One optical isomer may be used singly or a mixture of a plurality of optical isomers may be used. In the case of mainly using one optical isomer, the optical purity (ee) thereof is preferably 90% or more, and more preferably 95% or more.

In the case where the resin (P) includes a repeating unit (c), the content of the repeating unit (c) in the resin (P) is preferably in the range of 0.5 to 80 mol %, more preferably 1 to 65 mol %, and still more preferably 3 to 50 mol %, based on all the repeating units. The repeating unit (c) can be used singly or in combination of two or more kinds thereof. By using a specific lactone structure, the pattern latitude (EL) and the local critical dimensional uniformity (CDU) are improved.

Specific examples of the repeating unit (c) in the resin (P) are shown below, but the invention is not limited thereto.

[Chem. 20]

(in the formulae, Rx represents H, CH₃, CH₂OH, or CF₃)

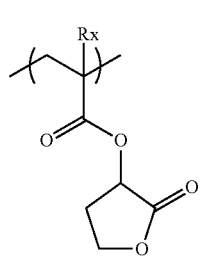

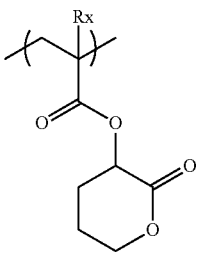 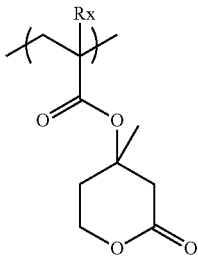

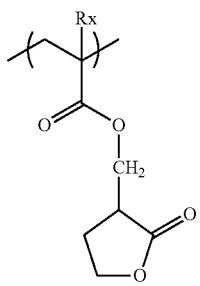 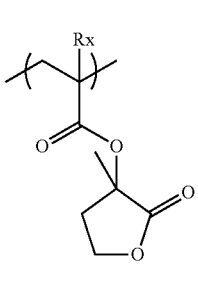

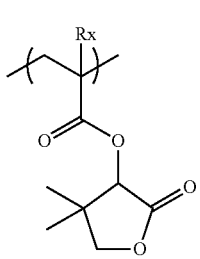 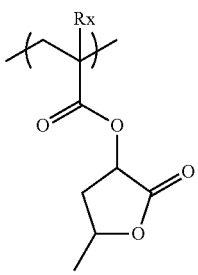

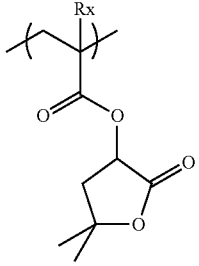 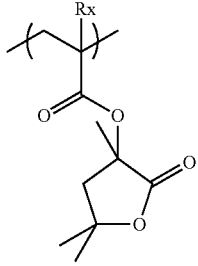

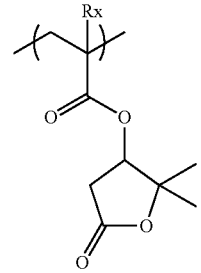 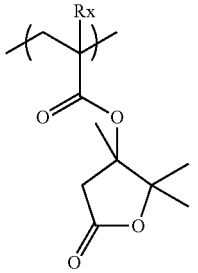

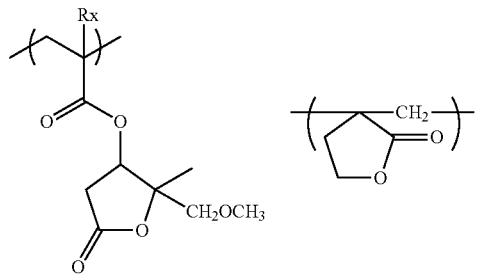

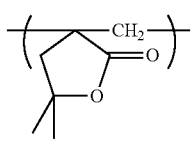
(in the formulae, Rx represents H, CH₃, CH₂OH, or CF₃)
[Chem. 21]
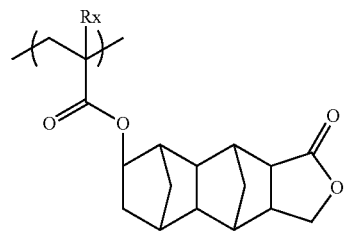
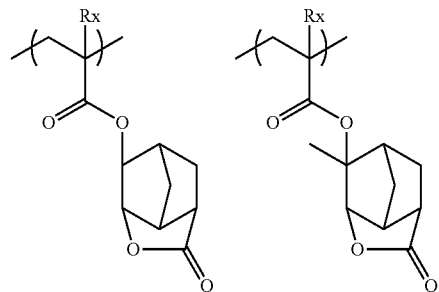
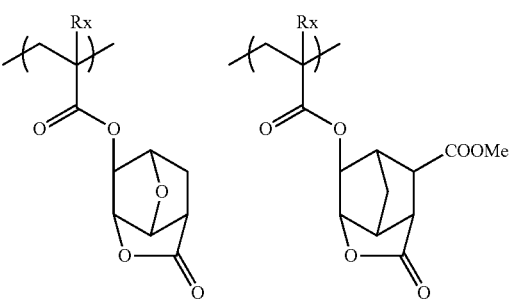
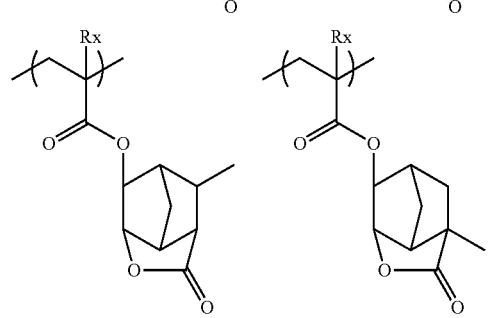
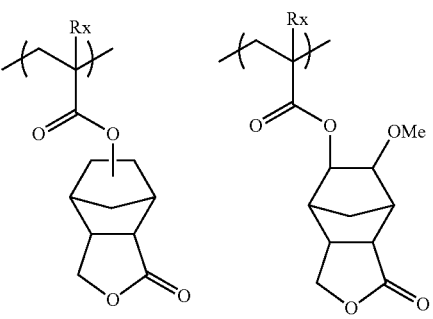
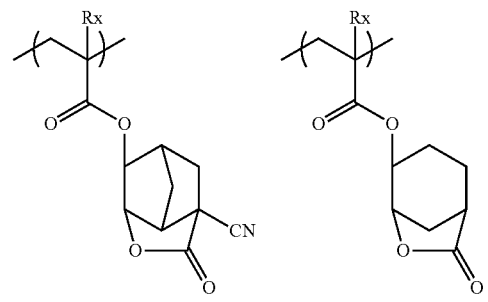
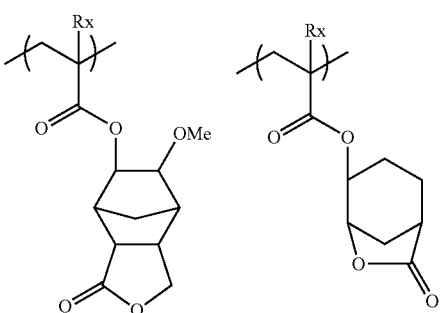
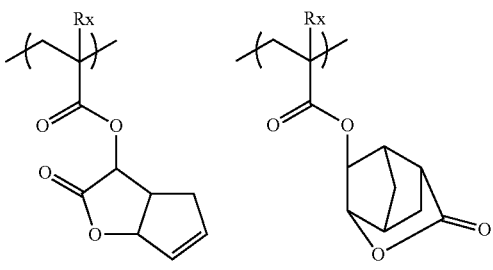
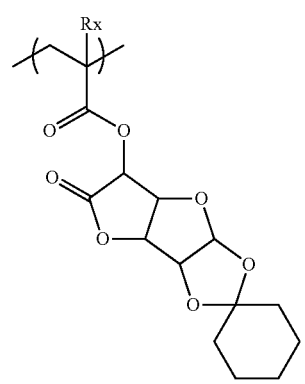

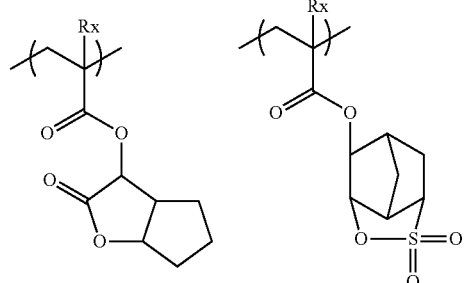
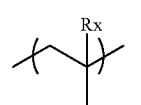
[Chem. 22]
(in the formulae, Rx represents H, CH₃, CH₂OH, or CF₃)
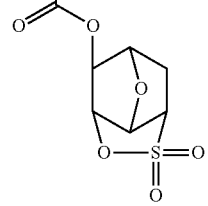
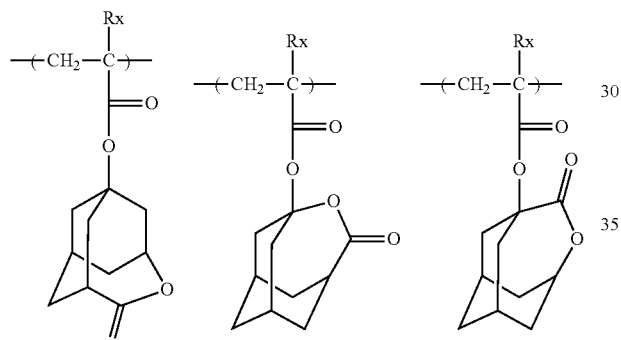
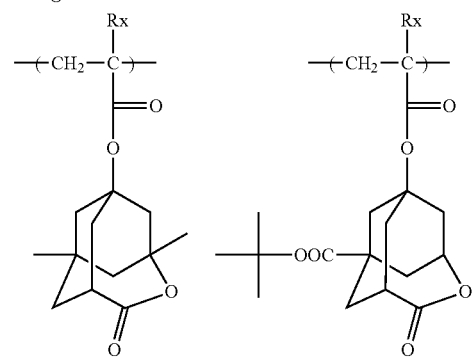
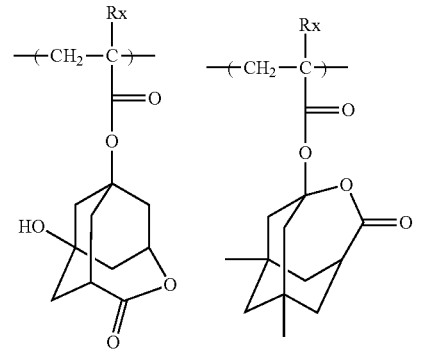
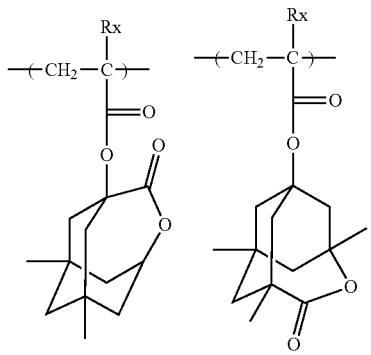
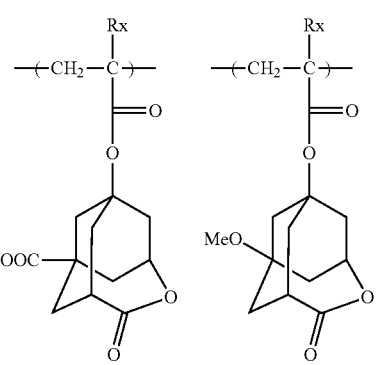
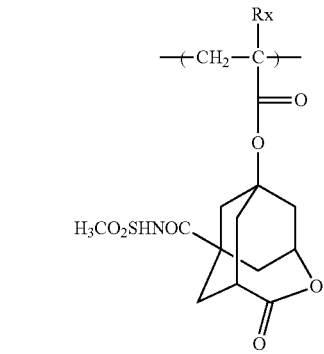
In the following specific examples, R represents a hydrogen atom, an alkyl group which may have a substituent, or a halogen atom, and preferably a hydrogen atom, a methyl group, a hydroxymethyl group, or an acetoxymethyl group.
[Chem. 23]
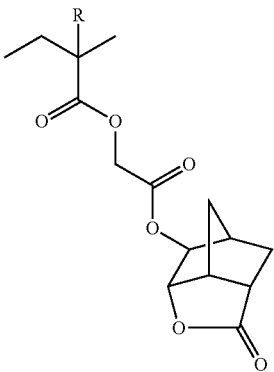

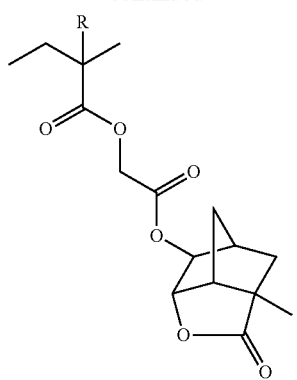
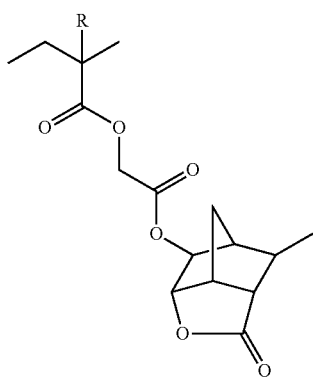
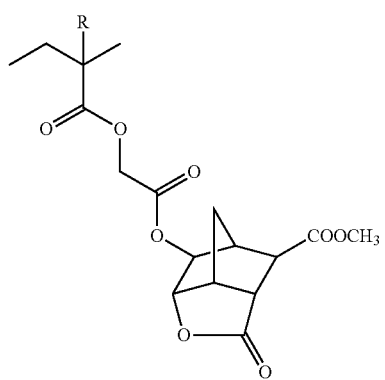
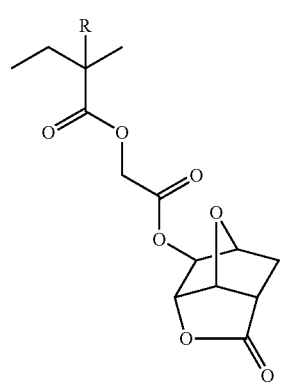
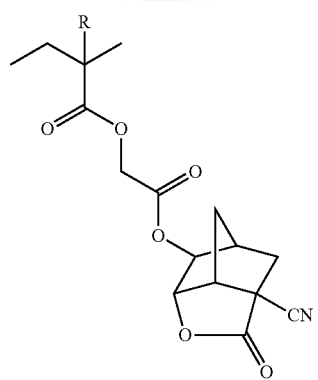
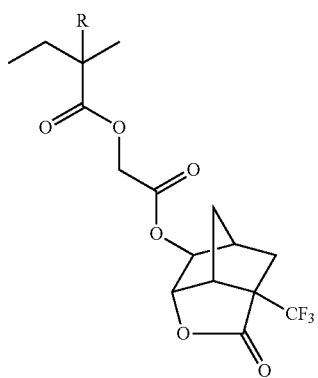
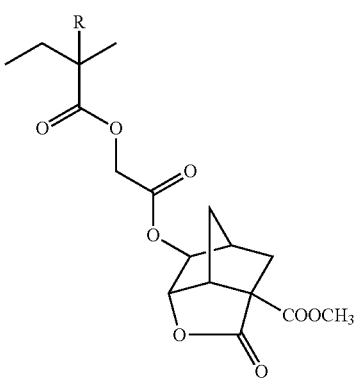
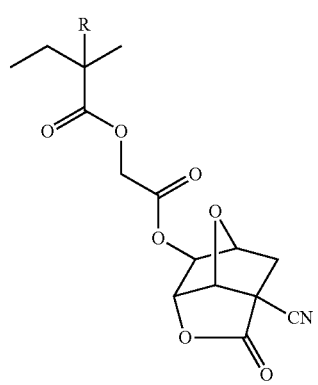

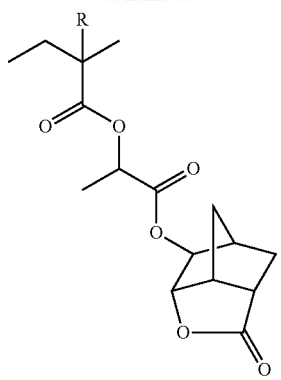
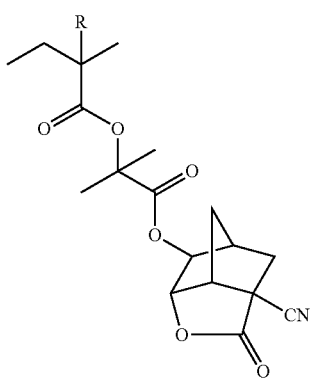
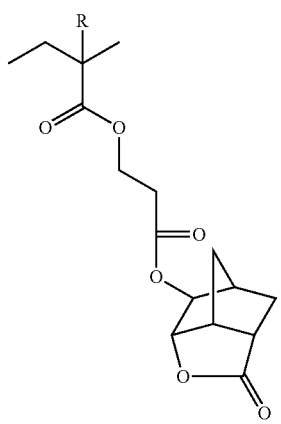
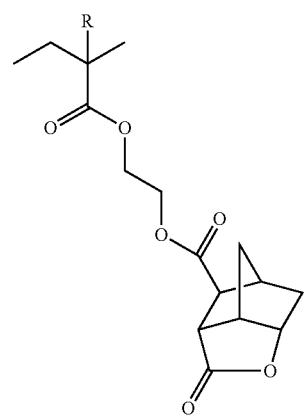
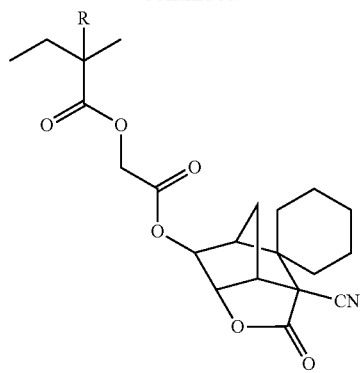
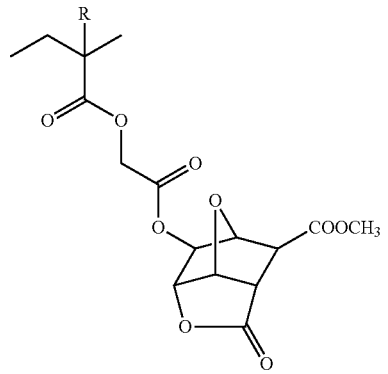
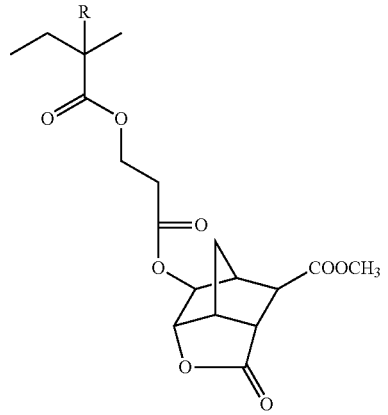
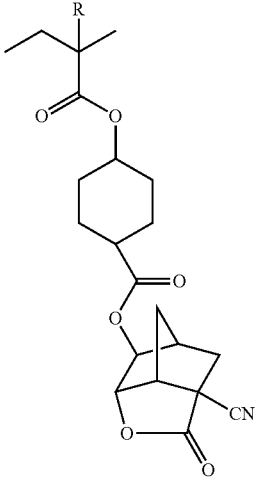

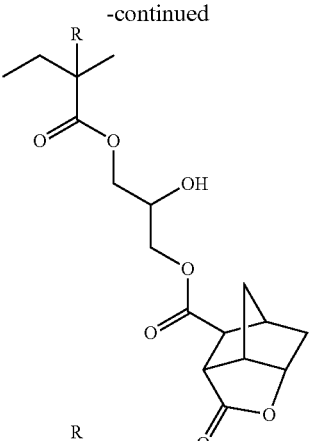
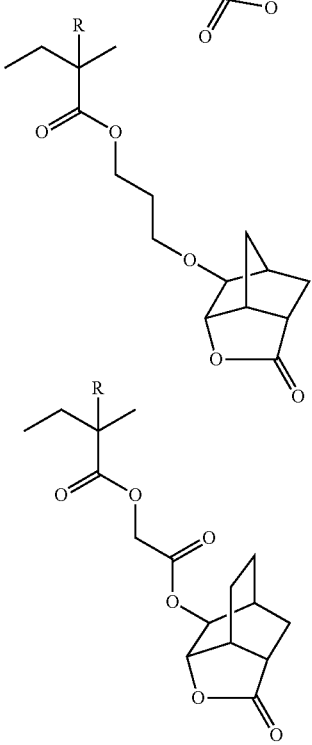
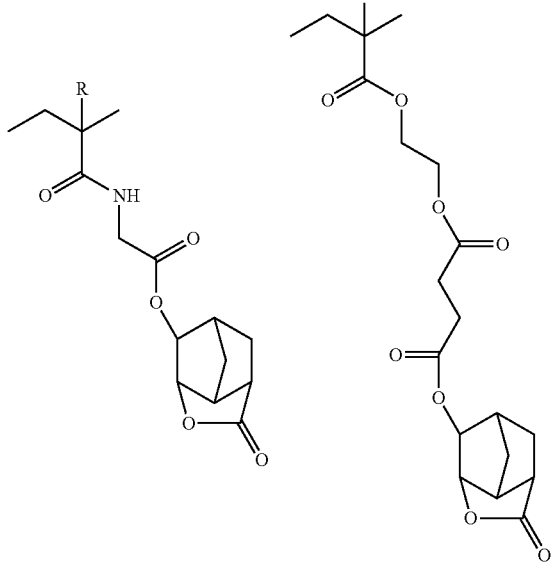

[Chem. 24]

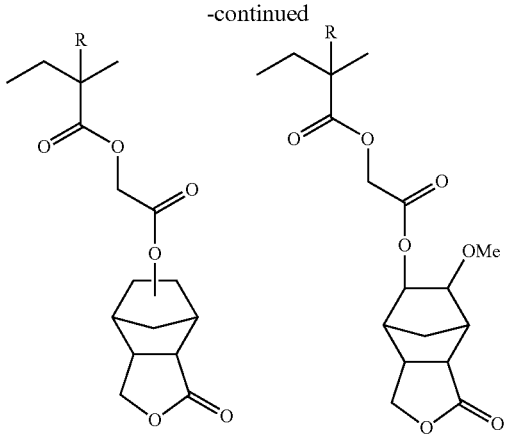

Examples of the acid group in the repeating unit (d) having an acid group include a carboxyl group, a sulfonic acid group, a sulfonamide group, a sulfonylimide group, a bissulfonylimide group, and an aliphatic alcoholic hydroxyl group substituted with an electron-withdrawing group at the α-position (for example, a hexafluoroisopropanol group), with repeating units having a carboxyl group being more preferred.

By virtue of containing the repeating units having an acid group in the resin (P), the resolution increases in the usage of forming contact holes. As for the repeating units having an alkali-soluble group, all of a repeating unit in which an alkali-soluble group is directly bonded to the main chain of the resin, such as a repeating unit of an acrylic acid or methacrylic acid, a repeating unit in which an alkali-soluble group is bonded to the main chain of the resin through a linking group, and a repeating unit in which an alkali-soluble group is introduced into the polymer chain terminal by using an alkali-soluble group-containing polymerization initiator or chain transfer agent during the polymerization, are preferred. The linking group may have a monocyclic or polycyclic cyclic hydrocarbon structure. In particular, a repeating unit of an acrylic acid or a methacrylic acid is preferred.

The repeating unit (d) having an acid group is preferably a repeating unit (d1) represented by following general formula (II).

[Chem. 25]

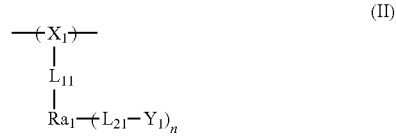

(II)

In the general formula (II),
$X_1$'s each independently represent a polymerization unit structure constituting the polymer main chain;
$Ra_1$ represents a (n+1)-valent alicyclic hydrocarbon group;
$L_{11}$ and $L_{21}$ each independently represent a single bond or a divalent linking group;
n represents an integer of 1 or more; and
$Y_1$ represents an acid group.

Examples of the acid group of $Y_1$ in the general formula (II) include a carboxyl group, a sulfonic acid group, an alcoholic hydroxyl group substituted with an electron-withdrawing group at the α-position (for example hexafluoroisopropanol group), with a carboxyl group being preferred.

The (n+1)-valent alicyclic hydrocarbon group $Ra_1$ may be a monocyclic hydrocarbon ring group such as a cyclopentane ring group and a cyclohexane ring group, and the polycyclic hydrocarbon group is preferred and the polycyclic hydrocarbon having 7 or more carbon atoms (preferably 7 to 30 carbon atoms) is more preferred.

Examples of the monocyclic hydrocarbon ring group for the alicyclic hydrocarbon group $Ra_1$ include groups formed by removal of any (n+1) hydrogen atoms from the monocyclic hydrocarbon ring.

The polycyclic hydrocarbon ring group for the alicyclic hydrocarbon group $Ra_1$ includes a ring system hydrocarbon ring group and a crosslinked cyclic hydrocarbon ring group, and examples thereof include groups formed by removal of any (n+1) hydrogen atoms from the ring system hydrocarbon ring, and groups formed by removal of any (n+1) hydrogen atoms from the crosslinked cyclic hydrocarbon ring.

Examples of the ring system hydrocarbon group include a bicyclohexyl group and a perhydronaphthalenyl group. Examples of the crosslinked cyclic hydrocarbon group include a bicyclic hydrocarbon group such as a pinane ring, a bornane ring, a norpinane ring, a norbornane ring, and a bicyclooctane ring (for example, a bicyclo[2.2.2]octane ring and a bicyclo[3.2.1]octane ring), a tricyclic hydrocarbon group such as a homobrendane ring, an adamantane ring, a tricyclo[5.2.1.0$^{2,6}$]decane ring, and a tricyclo[4.3.1.1$^{2,5}$]undecane ring, and a tetracyclic hydrocarbon ring such as a tetracyclo[4.4.0.1$^{2,5}$.1$^{7,10}$]dodecane ring and a perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring, and a perhydrophenalene ring.

Preferred examples of the crosslinked cyclic hydrocarbon ring include a norbornyl group, an adamantyl group, a bicyclooctanyl group, and a tricyclo[5.2.1.0$^{2,6}$]decanyl group. More preferred examples of the crosslinked cyclic hydrocarbon ring include a norbornyl group and an adamantyl group.

The alicyclic hydrocarbon group $Ra_1$ may have a substituent. Examples of the substituent which $Ra_1$ may have include an alkyl group and a cycloalkyl group.

The alkyl group and the cycloalkyl group as the substituent which $Ra_1$ may have may optionally further have a substituent, and examples of the substituent include a halogen atom (preferably a fluorine atom).

The carbon constituting the alicycle in the alicyclic hydrocarbon group $Ra_1$ (carbon contributing to ring formation) may be a carbonyl carbon. Further, the polycycle may have a hetero atom such as an oxygen atom and a sulfur atom, as described above. However, $Ra_1$ does not contain an ester bond as an atomic group constituting the alicycle.

Examples of the linking group represented by $L_{11}$ and $L_{21}$ include —COO—, —COO—, —CONH—, —NHCO—, —CO—, —O—, —S—, —SO—, —SO$_2$—, an alkylene group (preferably 1 to 6 carbon atoms), a cycloalkylene group (preferably 3 to 10 carbon atoms), an alkenylene group (preferably 2 to 6 carbon atoms) or a linking group formed by these plural groups, with a linking group having a total number of carbon atoms of 12 or less being preferred. The alkylene group, the cycloalkylene group, or the alkenylene group in the alkylene group, the cycloalkylene group, the alkenylene group, or the linking group formed by the combination may have a substituent, and examples of the substituent include an alkyl group (preferably having 1 to 4 carbon atoms).

$L_1$ is preferably a single bond, an alkylene group, —COO—, —COO—, —CONH—, —NHCO—, -alkylene group-COO—, -alkylene group-OCO—, -alkylene group-CONH—, -alkylene group-NHCO—, —CO—, —O—, —SO$_2$—, and -alkylene group-O—, and more preferably a single bond, an alkylene group, -alkylene group-COO—, or -alkylene group-O—.

$L_{21}$ is preferably a single bond, an alkylene group, —COO—, —COO—, —CONH—, —NHCO—, —COO-alkylene group-, —OCO-alkylene group-, —CONH-alkylene group-, —NHCO-alkylene group-, —CO—, —O—, —SO$_2$—, —O-alkylene group-, or —O-cycloalkylene group-, and more preferably a single bond, an alkylene group, —COO-alkylene group-, —O-alkylene group-, or —O-cycloalkylene group-.

In the method described above, the bond "—" on the left side means a bond to $X_1$ on the side of the main chain in $L_{11}$, or a bond to $Ra_1$ in $L_{21}$, and the bond "—" on the right side means a bond to $Ra_1$ on the side of the main chain in $L_{11}$, or a bond to $Y_1$ in $L_{21}$.

Incidentally, $L_{11}$ may be bonded to the same atom as the atom constituting the alicycle in $Ra_1$.

n is preferably an integer of 1 to 3, more preferably 1 or 2, and still more preferably 1.

The polymerization unit structure constituting the polymer main chain for $X_1$ is preferably a repeating unit derived from the polymerizable monomer. Examples of the polymerization unit structure $X_1$ constituting the polymer main chain include a polymerization unit structure represented by the following general formula (a), derived from a (meth)acrylate, a polymerization unit structure represented by the following general formula (b), derived from a styrene monomer, and a polymerization unit structure represented by the following general formula (a), derived from a vinyl monomer.

[Chem. 26]

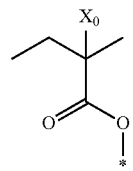

(a)

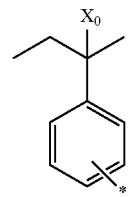

(b)

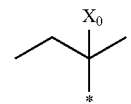

(c)

In the general formula, * represents the position bonded to $L_{11}$ in the general formula (II).

$X_0$ represents a hydrogen atom, an alkyl group, a cyano group, or a halogen atom.

The alkyl group of $X_0$ may have a substituent, and examples of the substituent include a hydroxyl group and a halogen atom (preferably, a fluorine atom).

The alkyl group of $X_0$ preferably has 1 to 4 carbon atoms, and examples thereof include a methyl group, an ethyl group, a propyl group, a hydroxymethyl group, and a trifluoromethyl group, with a methyl group being preferred.

$X_0$ is preferably a hydrogen atom or a methyl group.

In the invention, $X_1$ in the general formula (II) is preferably a polymerization unit structure derived from a (meth)acrylate. In the case where $X_1$ is a polymerization unit structure derived from a (meth)acrylate, the repeating unit (d1) represented by the general formula (II) may be represented by the following general formula (II').

[Chem. 27]

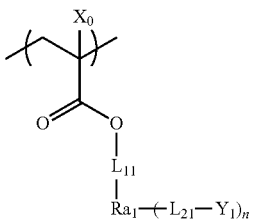

(II')

In the general formula (II'), $X_0$ has the same definition as $X_0$ in the general formula (a).

$Ra_1$, $L_{11}$, $L_{21}$, n, and $Y_1$ have the same definitions as $Ra_1$, $L_{11}$, $L_{21}$, n, and $Y_1$ in the general formula (II), respectively.

Specific examples of the repeating unit (d) having an acid group are shown below, but the invention is not limited thereto.

In the specific examples, Rx represents H, $CH_3$, $CH_2OH$, or $CF_3$. Xa represents a hydrogen atom, $CH_3$, $CF_3$, or $CH_2OH$.

[Chem. 28]

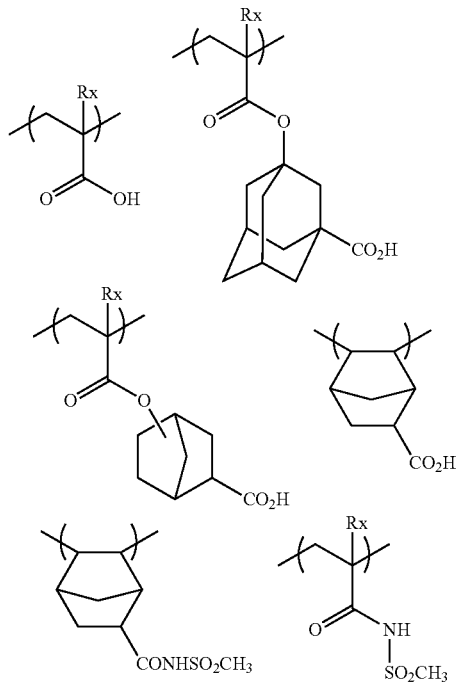

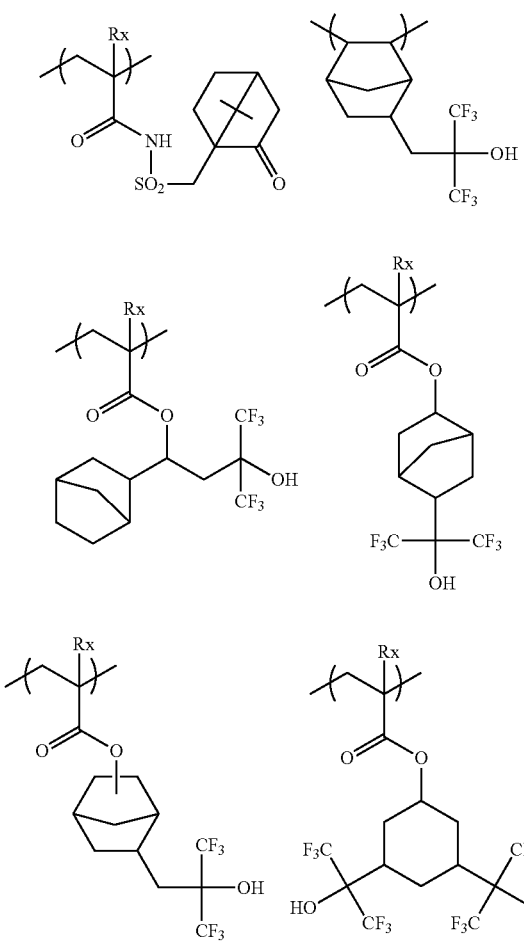

[Chem. 29]

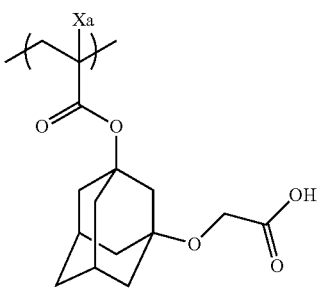

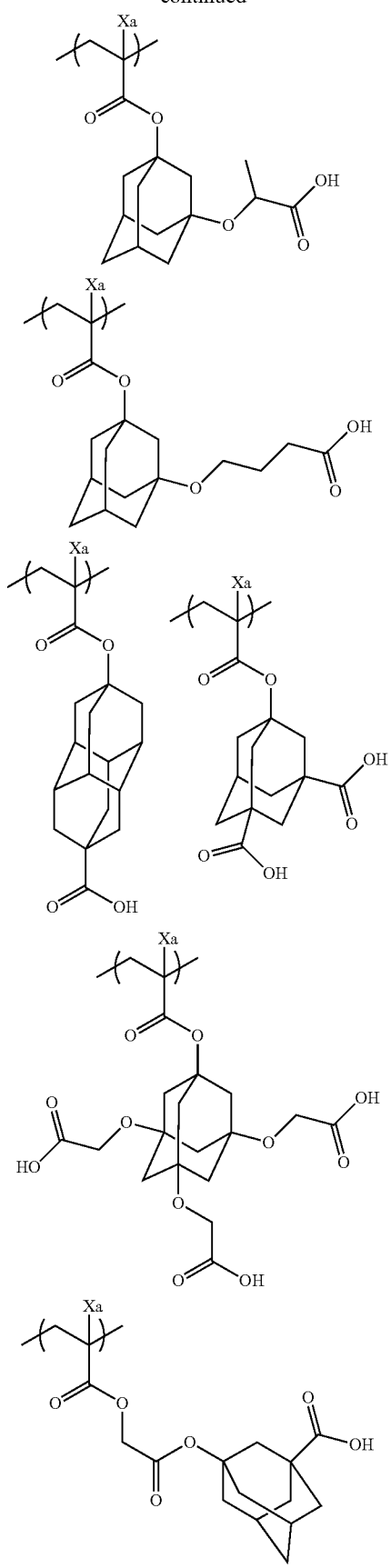
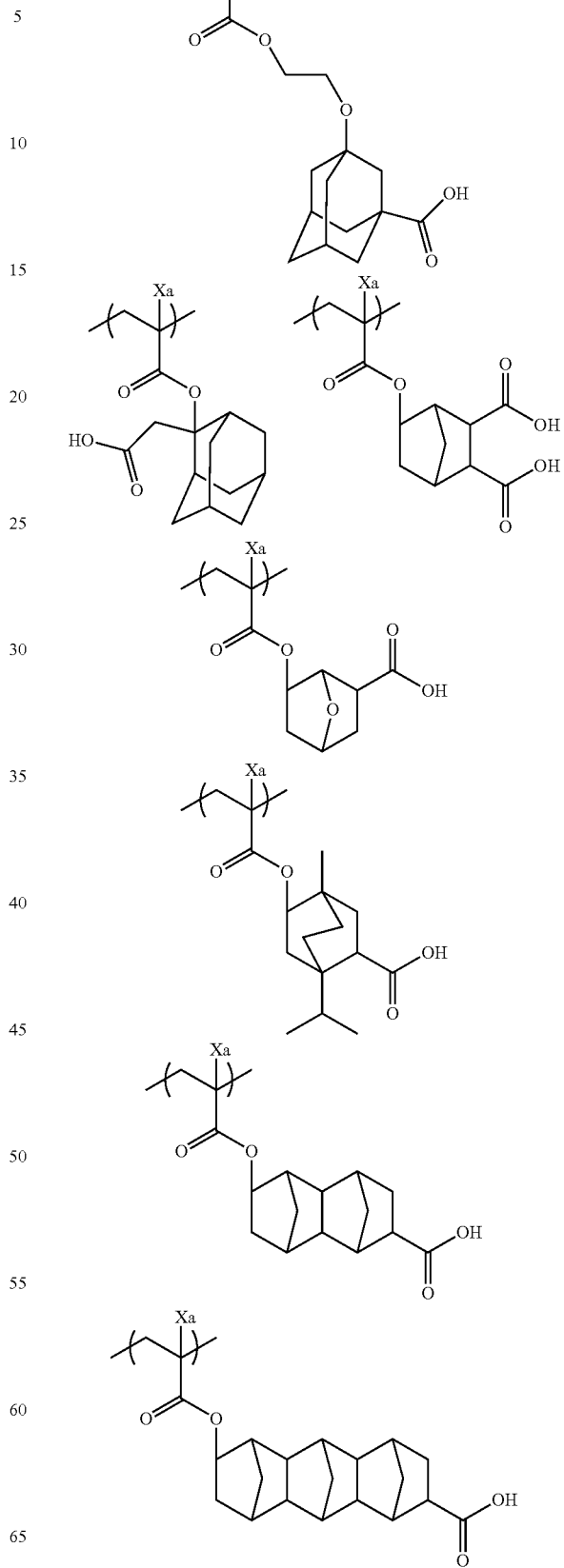

-continued

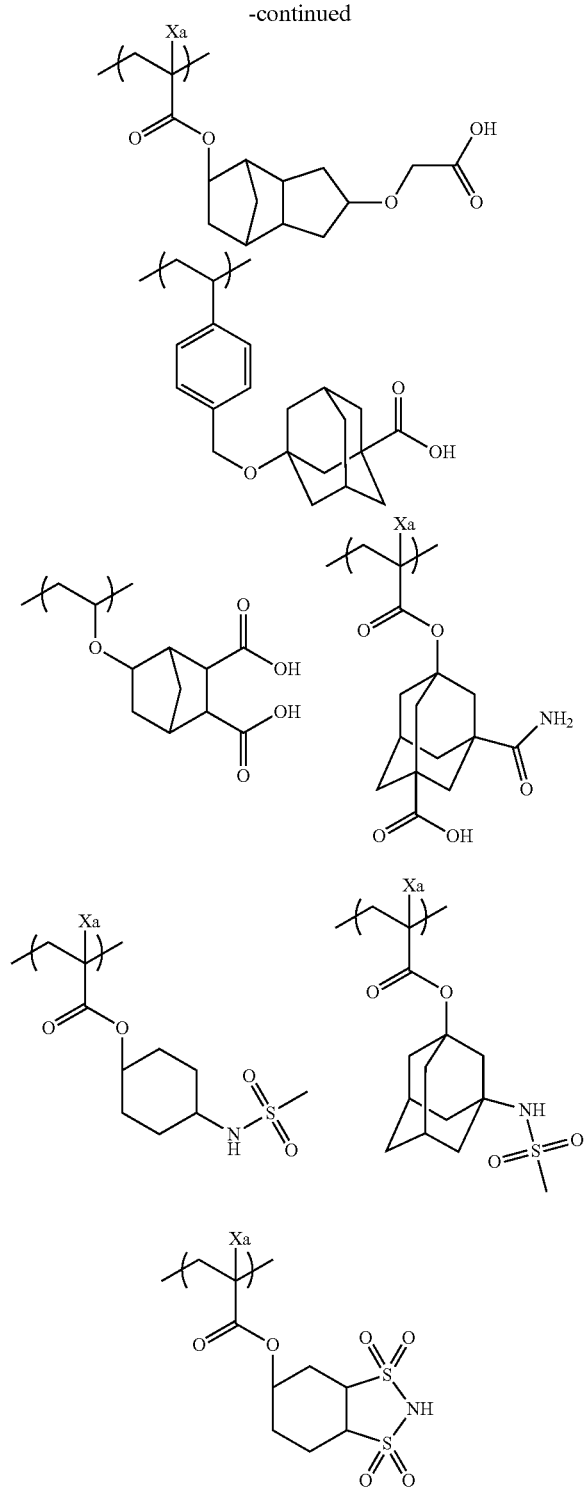

In the case of exposing the repeating unit (d) having an acid group to a KrF excimer laser beam, an electron beam, X rays or high-energy light rays of wavelength 50 nm or less (EUV or the like), the repeating unit (d) having an acid group is preferably an acid group having an aromatic ring group.

The repeating unit having an acid group may be used singly or in combination of two or more kinds thereof.

The resin (P) may or may not contain the repeating unit (d) having an acid group, but in the case where the resin (P) contains the repeating unit (d), the content of the repeating unit (d) having an acid group is preferably from 1 to 50 mol %, more preferably from 3 to 50 mol %, still more preferably from 3 to 45 mol %, and particularly preferably from 5 to 45 mol %, based on all the repeating units in the resin (P).

Particularly, also in the case where the resin (P) has a repeating unit (d1) represented by the general formula (II), the content of the repeating unit (d1) is preferably from 1 to 50 mol %, more preferably from 3 to 50 mol %, still more preferably from 3 to 45 mol %, and even still more preferably from 5 to 45 mol %, based on all the repeating units in the resin (P).

The resin (P) may further contain a repeating unit having a hydroxyl group or a cyano group (e), other than the above-described repeating units. This repeating unit can improve adhesion to a substrate and affinity for a developer. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group, or a norbornane group, and more preferably an adamantyl group. Further, the alicyclic hydrocarbon structure substituted with a hydroxyl group is preferred, and the alicyclic hydrocarbon structure having a repeating unit having an adamantyl group substituted with at least one hydroxyl group is more preferred.

Particularly, it is most preferable that the resin (P) contain a repeating unit having a hydroxyadamantyl group or a dihydroxyadamantyl group from the viewpoint of inhibition of diffusion of the generated acids.

As the alicyclic hydrocarbon structure substituted with a hydroxyl group or a cyano group, a partial structure represented by any of the following general formulae (VIIa) to (VIId) is preferred, and a partial structure represented by the following general formula (VIIa) is more preferred.

[Chem. 30]

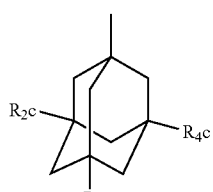

(VIIa)

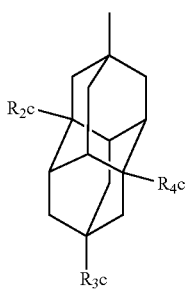

(VIIb)

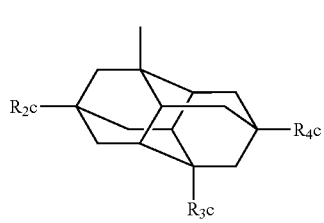
(VIIc)

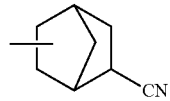
(VIId)

In the general formulae (VIIa) to (VIIc), $R_2c$ to $R_4c$ each independently represent a hydrogen atom, a hydroxyl group or a cyano group, provided that at least one of $R_2c$ to $R_4c$ represents a hydroxyl group or a cyano group. A structure where one or two members out of $R_2c$ to $R_4c$ are hydroxyl groups with the remaining being a hydrogen atom is preferred. In the general formula (VIIa), it is more preferable that two members out of $R_2c$ to $R_4c$ be hydroxyl groups and the remaining be a hydrogen atom.

The repeating unit having a partial structure represented by the general formulae (VIIa) to (VIId) includes repeating units represented by the following general formulae (AIIa) to (AIId).

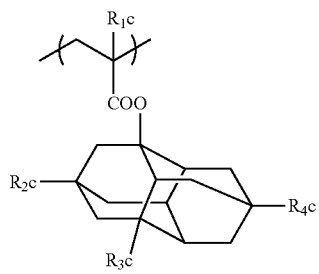
(AIIc)

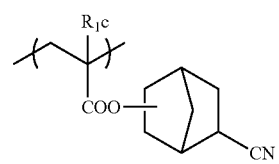
(AIId)

In the general formulae (AIIa) to (AIId), $R_1c$ represents a hydrogen atom, a methyl group, a trifluoromethyl group or a hydroxymethyl group; and $R_2c$ to $R_4c$ have the same meanings as $R_2c$ to $R_4c$ in the general formulae (VIIa) to (VIIc).

Specific examples of the repeating unit having a hydroxyl group or a cyano group (e) are shown below, but the invention is not limited thereto.

[Chem. 31]

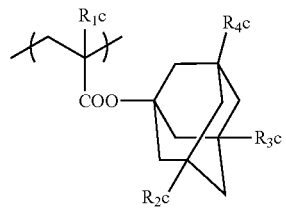
(AIIa)

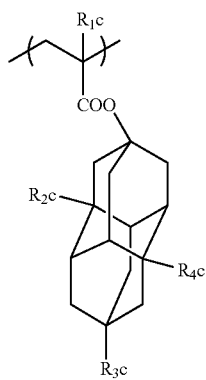
(AIIb)

[Chem. 32]

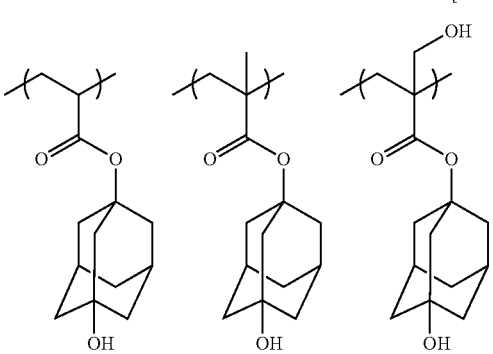

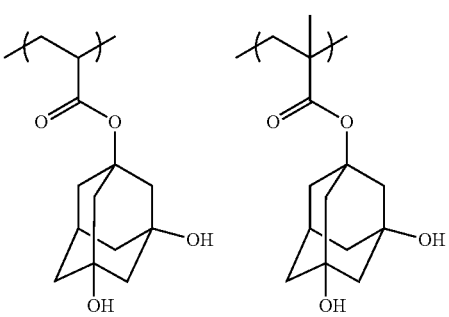

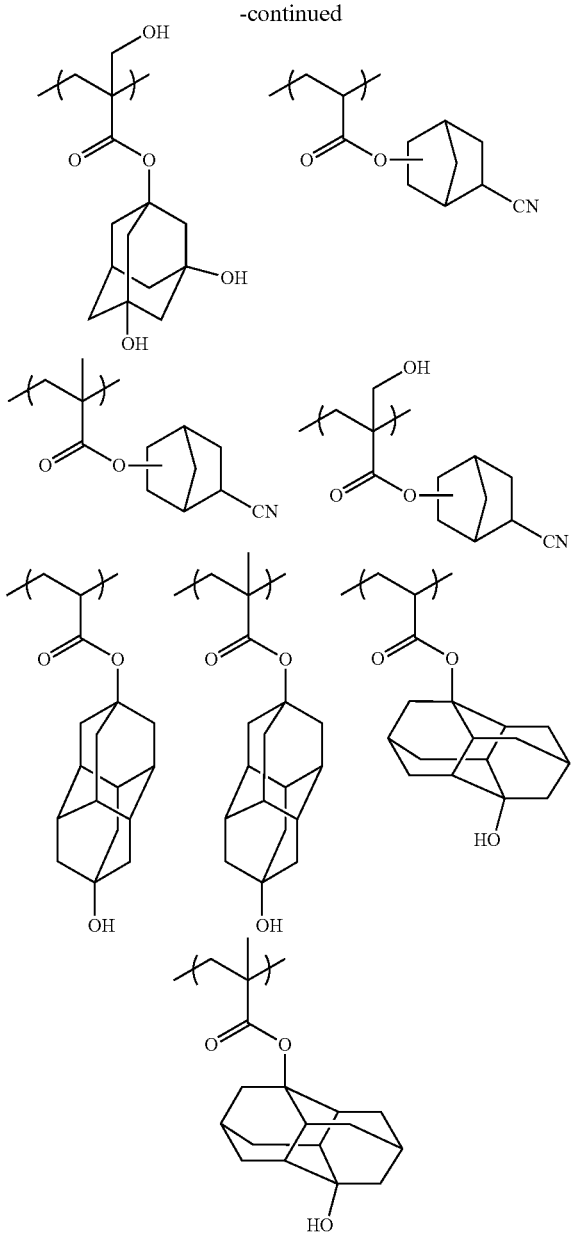

[Chem. 33]

$$\text{(IV)}$$

In the general formula (IV), $R_5$ represents a hydrocarbon group having at least one cyclic structure and having no polar group; and Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group, or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group or a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring system hydrocarbon group and a crosslinked cyclic hydrocarbon group. Examples of the ring system hydrocarbon group include a bicyclohexyl group and a perhydronaphthalenyl group. Examples of the crosslinked cyclic hydrocarbon ring include a bicyclic hydrocarbon ring such as a pinane ring, a bornane ring, a norpinane ring, a norbornane ring or a bicyclooctane ring (for example, a bicyclo[2.2.2]octane ring, or a bicyclo[3.2.1]octane ring), a tricyclic hydrocarbon ring such as a homobrendane ring, an adamantane ring, a tricyclo[5.2.1.0$^{2,6}$]decane ring or a tricyclo[4.3.1.1$^{2,5}$]undecane ring, and a tetracyclic hydrocarbon ring such as a tetracyclo[4.4.0.1$^{2,5}$.1$^{7,10}$]dodecane ring and a perhydro-1,4-methano-5,8-methanonaphthalene ring. Further, the crosslinked cyclic hydrocarbon ring also includes a condensed cyclic hydrocarbon ring, for example, a condensed ring formed by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring and a perhydrophenalene ring.

Preferred examples of the crosslinked cyclic hydrocarbon ring include a norbornyl group, an adamantyl group, a bicyclooctanyl group and a tricyclo[5.2.1.0$^{2,6}$]decanyl group. More preferred examples of the crosslinked cyclic hydrocarbon ring include a norbornyl group and an adamantyl group.

These alicyclic hydrocarbon groups may have a substituent, and preferred examples of the substituent include a halogen atom, an alkyl group, a hydroxyl group substituted with a hydrogen atom, and an amino group substituted with a hydrogen atom. The halogen atom is preferably a bromine atom, a chlorine atom, or a fluorine atom, and the alkyl group is preferably a methyl group, an ethyl group, a butyl group, or a t-butyl group. The alkyl group may further have a substituent, and the substituent which the alkyl group may further have The resin (P) in the invention may or may not contain the repeating unit having a hydroxyl group or a cyano group, but in the case where the resin (P) contains the repeating unit (e), the content of the repeating unit having a hydroxyl group or a cyano group (e) is preferably from 1 to 50 mol %, more preferably from 3 to 50 mol %, still more preferably from 3 to 45 mol %, and particularly preferably from 5 to 45 mol %, based on all the repeating units in the resin (P).

The resin (P) in the invention may further contain a repeating unit having an alicyclic hydrocarbon structure free from a polar group (for example, the above-described acid group, a hydroxyl group, or a cyano group) and not exhibiting acid decomposability. In this way, elution of the low molecular components from the resist film to the liquid for liquid immersion during liquid-immersion exposure can be reduced, and the dissolution properties of the resin during development using a developer including an organic solvent can be appropriately adjusted. Examples of the repeating unit include a repeating unit represented by the general formula (IV).

includes a halogen atom, an alkyl group, a hydroxyl group substituted with a hydrogen atom, and an amino group substituted with a hydrogen atom.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having 1 to 4 carbon atoms; the substituted methyl group is preferably a methoxymethyl group, a methoxythiomethyl group, a benzyloxymethyl group, a t-butoxymethyl group, or a 2-methoxyethoxymethyl group; the substituted ethyl group is preferably a 1-ethoxyethyl group or a 1-methyl-1-methoxyethyl group; the acyl group is preferably an aliphatic acyl group having 1 to 6 carbon atoms, such as a formyl group, an acetyl group, a propionyl group, a butyryl group, an isobutyryl group, a valeryl group, and a pivaloyl group; and the alkoxycarbonyl group is preferably an alkoxycarbonyl group having 1 to 4 carbon atoms.

The resin (P) may or may not contain a repeating unit having an alicyclic hydrocarbon structure free from a polar group and not exhibiting acid decomposability, but in the case where the resin (P) contains the repeating unit having an alicyclic hydrocarbon structure free from a polar group and not exhibiting acid decomposability (f), the content of the repeating unit (f) is preferably from 1 to 40 mol %, and more preferably from 1 to 20 mol %, based on all the repeating units in the resin (P).

Specific examples of the repeating unit (f) are shown below, but the invention is not limited thereto. In the formulae, Ra represents H, $CH_3$, $CH_2OH$, or $CF_3$.

[Chem. 34]

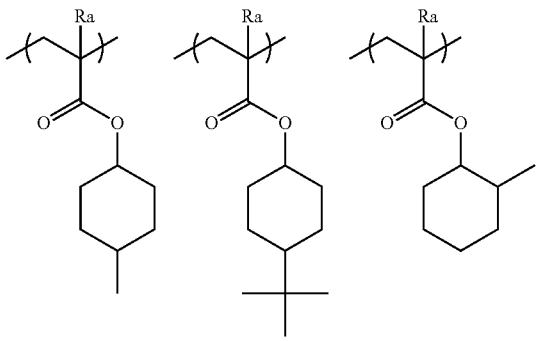

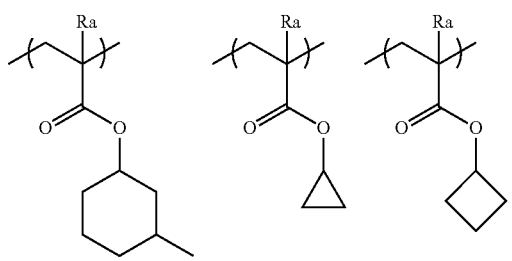

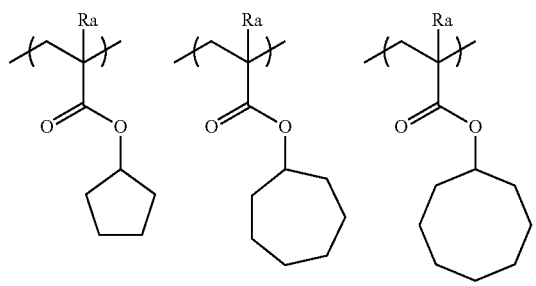

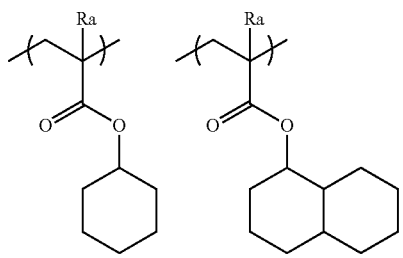

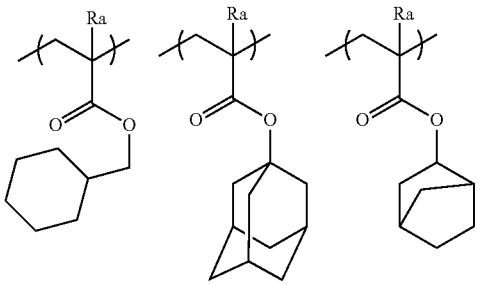

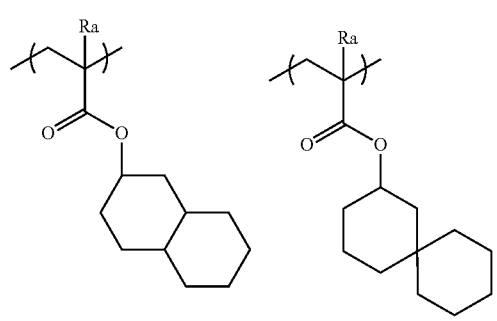

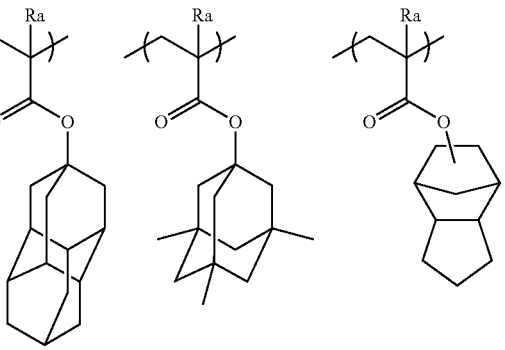

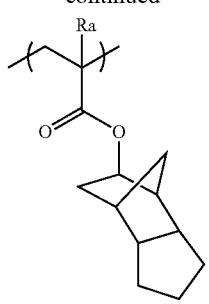

[Chem. 35]

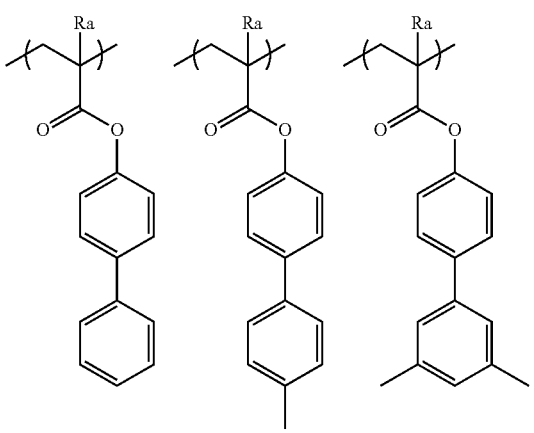

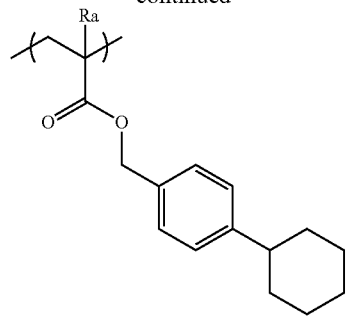

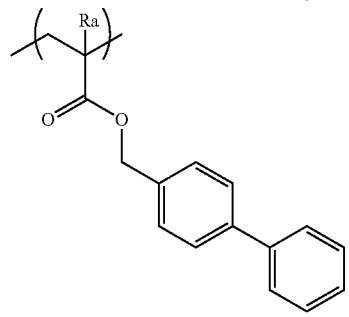

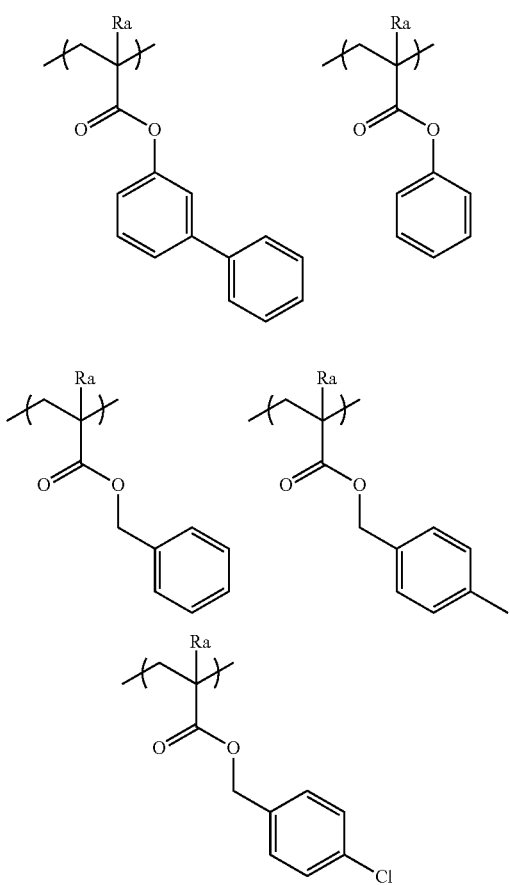

The resin (P) used in the composition of the invention may contain, in addition to the above-described repeating structural units, various repeating structural units for the purpose of controlling the dry etching resistance, suitability for standard developer, adhesion to a substrate, a resist profile, and characteristics generally required for an actinic ray-sensitive or radiation-sensitive resin composition, such as resolution, heat resistance, and sensitivity.

Examples of such a repeating structural unit include, but are not limited to, repeating structural units corresponding to the monomers described below.

The use of such a repeating structural unit enables fine regulation of the performance required of the resin used in the composition of the invention, particularly (1) solubility in a coating solvent,
(2) a film-forming property (glass transition point),
(3) alkaline developability,
(4) film loss (selection of hydrophilic, hydrophobic, or alkali-soluble group),
(5) adhesion of an unexposed area to a substrate,
(6) dry etching resistance, and the like.

Examples of the monomer include a compound having one addition-polymerizable unsaturated bond selected from acrylic acid esters, methacrylic acid esters, acrylamides, methacrylamides, allyl compounds, vinyl ethers, and vinyl esters.

Among these, an addition-polymerizable unsaturated compound copolymerizable with the monomers corresponding to the above-described various repeating structural units may be copolymerized.

In the resin (P) used in the composition of the invention, the molar ratio of the respective repeating structural units included in the resin, are appropriately set for the purpose of controlling the dry etching resistance or suitability for a standard developer of an actinic ray-sensitive or radiation-sensitive resin composition, adhesion to a substrate, resist profile, and properties generally required for a resist, such as resolution, heat resistance, and sensitivity.

The type of the resin (P) in the invention may be any one of a random type, a block type, a comb type, and a star type. The resin (P) can be synthesized by, for example, radical, cationic, or anionic polymerization of unsaturated monomers corresponding to the respective structures. Further, it is also possible that polymerization be carried out using unsaturated monomers corresponding to the precursors of the respective structures, and then a polymer reaction be carried out, thereby obtaining a desired resin.

In the case where the composition of the invention is used for ArF exposure, in view of transparency to ArF light, the resin (P) used in the composition of the invention preferably has substantially no aromatic groups (specifically, the ratio of an aromatic group-containing repeating unit in the resin is preferably 5 mol % or less, more preferably 3 mol % or less, and ideally 0 mol %, that is, the resin does not have an aromatic group).

Furthermore, the resin (P) preferably has an alicyclic hydrocarbon structure. The alicyclic hydrocarbon structure may be either monocyclic or polycyclic, and the alicyclic hydrocarbon structure may be included in any places of the resin (P). For example, the alicyclic hydrocarbon structure may be included in the above-described several repeating units (excluding the repeating unit (a) represented by the general formula (I)), or may be included as an additional repeating unit.

Furthermore, in the case where the composition of the invention contains a resin (E) as described later, it is preferable that the resin (P) contain neither a fluorine atom nor a silicon atom from the viewpoint of compatibility with the resin (E).

Furthermore, the resin (P) preferably has neither fluorine atoms nor silicon atoms, or if any, a small amount. Specifically, the content of the repeating unit having fluorine atoms or silicon atoms is preferably from 0 to 20 mol %, more preferably from 0 to 10 mol %, and particularly preferably from 0 to 5 mol %, based on all the repeating units of the resin (P), and ideally, it contains no repeating unit having fluorine atoms or silicon atoms. By this, such a content is preferable from the viewpoint of accomplishment of a suitable solubility of the resin (P) in a developer containing an organic solvent, or compatibility in the case where the composition of the invention contains the hydrophobic resin as described later.

The resin (P) preferably has a (meth)acrylate-based repeating unit as a main repeating unit. Specifically, the content of the (meth)acrylate-based repeating unit in all the repeating units of the resin (P) is preferably 50 mol % or more, more preferably 70 mol % or more, and still more preferably 90 mol % or more, and particularly preferably, all the repeating units are (meth)acrylate-based repeating units.

The resin (P) used in the invention is preferably a resin where all the repeating units are composed of a (meth)acrylate-based repeating unit. In this case, all the repeating units may be a methacrylate-based repeating unit, all the repeating units may be an acrylate-based repeating unit, or all the repeating units may be composed of a methacrylate-based repeating unit and an acrylate-based repeating unit, but the content of the acrylate-based repeating unit in the resin (B) is preferably 50 mol % or less based on all the repeating units. A copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted with a hydroxyl group or a cyano group, and from 0 to 20 mol % of other (meth)acrylate-based repeating units is also preferred.

In the case where the composition of the invention is irradiated with KrF excimer laser light, an electron beam, X rays, or a high-energy beam at a wavelength of 50 nm or less (for example, EUV), the acid-decomposable resin (P) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as a tertiary alkyl (meth)acrylate.

Preferred examples of the hydroxystyrene-based repeating unit having an acid-decomposable group include a repeating unit composed of a t-butoxycarbonyloxystyrene, a 1-alkoxyethoxystyrene or a tertiary alkyl (meth)acrylate. A repeating unit composed of a 2-alkyl-2-adamantyl (meth)acrylate or a dialkyl(1-adamantyl)methyl (meth)acrylate is more preferred.

The resin (P) of the invention may be commercially available if marketed or may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methylethyl ketone and methyl isobutyl ketone, an ester solvent such as ethyl acetate, an amide solvent such as dimethylformamide and dimethylacetamide, and the later-described solvents capable of dissolving the composition of the invention, such as propylene glycol monomethyl ether acetate, propylene glycol monomethyl ether, and cyclohexanone. The polymerization is more preferably carried out using the same solvent as the solvent used in the actinic ray-sensitive or radiation-sensitive resin composition of the invention. By the use of the same solvent, generation of particles during storage may be inhibited.

The polymerization reaction is preferably carried out in an inert gas atmosphere such as nitrogen and argon. Regarding the polymerization initiator, the polymerization is started using a commercially available radical initiator (for example, an azo-based initiator, or peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured into a solvent, and the desired polymer is collected by powder or solid recovery, or other methods. The concentration during the reaction is in the range of 5 to 50% by mass, preferably 10 to 30% by mass, and the reaction temperature is usually in the range of 10 to 150° C., preferably 30 to 120° C., more preferably 60 to 100° C.

After the completion of reaction, the reaction solution is allowed to cool to room temperature and purified. The purification may be carried out by a normal method, for example, a liquid-liquid extraction method of applying water washing or combining appropriate solvents to remove residual monomers or oligomer components; a purification method in a solution state, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin may be precipitated as a solid by contacting the reaction solution with a solvent in which the resin is sparingly soluble or insoluble (poor solvent) and which has a volumetric amount of 10 times or less, preferably from 10 to 5 times, the reaction solution.

The solvent used during the operation of precipitation or reprecipitation from the polymer solution (a precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer.

The amount of the precipitation or reprecipitation solvent used may be appropriately selected by taking into consideration the efficiency, yield and the like, but in general, the amount used is from 100 to 10,000 parts by mass, preferably from 200 to 2000 parts by mass, and more preferably from 300 to 1000 parts by mass, based on 100 parts by mass of the polymer solution.

The temperature during the precipitation or reprecipitation may be appropriately selected by taking into consideration the efficiency or operability but is usually on the order of 0 to 50° C., and preferably in the vicinity of room temperature (for example, approximately from 20 to 35° C.). The precipitation or reprecipitation operation may be carried out using a commonly employed mixing vessel such as stirring tank by a known method such as a batch system or a continuous system.

The precipitated or reprecipitated polymer is usually subjected to commonly employed solid-liquid separation such as filtration and centrifugation, then dried and used. The filtration is carried out using a solvent-resistant filter element preferably under pressure. The drying is carried out under atmospheric pressure or reduced pressure (preferably under reduced pressure) at a temperature of approximately from 30 to 100° C., preferably on the order of 30 to 50° C.

Incidentally, after the resin is once precipitated and separated, the resin may be dissolved again in a solvent and then put into contact with a solvent in which the resin is sparingly soluble or insoluble. That is, there may be used a method including, after the completion of radical polymerization reaction, bringing the polymer into contact with a solvent in which the polymer is sparingly soluble or insoluble, to precipitate a resin (step a), separating the resin from the solution (step b), dissolving the resin again in a solvent to prepare a resin solution A (step c), bringing the resin solution A into contact with a solvent in which the resin is sparingly soluble or insoluble and which has a volumetric amount of less than 10 times (preferably 5 times or less) the resin solution A, to precipitate a resin solid (step d), and separating the precipitated resin (step e).

Moreover, in order to inhibit the aggregation or the like of the resin after preparation of the composition, for example, as described in JP2009-037108A, dissolution of the synthesized resin in a solvent and heating the resulting solution at a temperature of about 30° C. to 90° C. for about 30 minutes to 4 hours may be added.

The weight average molecular weight of the resin (P) used in the composition of the invention is preferably from 1,000 to 200,000, more preferably from 2,000 to 100,000, still more preferably from 3,000 to 70,000, and particularly preferably from 5,000 to 50,000, in terms of polystyrene by a GPC method. When the weight average molecular weight is from 1,000 to 200,000, the deterioration of heat resistance and dry etching resistance, and the deterioration of developability or a film forming property due to an increase in viscosity may be prevented.

Furthermore, by tightly controlling the weight average molecular weight, the dissolution property of the resin (P) in an organic developer is controlled, and thus, the exposure latitude (EL), the local pattern dimensional uniformity (Local CDU), the rectangularity of the cross-sectional shape of the pattern and circularity of the pattern, and the like can be improved. The weight average molecular weight is most preferably 10,000 or more, and most preferably 14,000 or more, from the viewpoint of improvement of the EL, the Local CDU, and the rectangularity of the cross-sectional shape of the pattern and circularity of the pattern, as described above. The upper limit of the weight average molecular weight is preferably 50,000 or less, more preferably 40,000 or less, and still more preferably 30,000 or less.

The dispersity (molecular weight distribution, Mw/Mn) is usually in the range of 1.0 to 3.0, preferably 1.0 to 2.6, more preferably 1.1 to 2.5, still more preferably 1.2 to 2.4, even still more preferably from 1.3 to 2.2, and particularly preferably 1.4 to 2.0. When the molecular weight distribution is within the above-described ranges, the resolution and the resist shape are superior, the side wall of the resist pattern is smoother, and the roughness is more improved.

In the present specification, the weight average molecular weight (Mw) and the number average molecular weight (Mn) of the resin (P) can be calculated by using, for example, an HLC-8120 (manufactured by Tosoh Corporation) using TSK gel Multipore HXL-M columns (manufactured by Tosoh Corporation, 7.8 mm ID×30.0 cm) and THF (tetrahydrofuran) as an eluent.

In the actinic ray-sensitive or radiation-sensitive resin composition in the invention, the content of the resin (P) in the entire composition is preferably from 30 to 99% by mass, and more preferably from 60 to 95% by mass, based on the total solid content.

In addition, in the invention, the resin (P) may be used singly or in combination of a plurality of kinds thereof.

Further, the actinic ray-sensitive or radiation-sensitive resin composition in the invention may further contain the resin (P) as well as acid-decomposable resins (a resin which has increased polarity by the action of an acid and has reduced solubility in a developer including an organic solvent) other than resin (P). The acid-decomposable resin other than the resin (P) is an acid-decomposable resin including the same repeating units as those that may be included in the resin (P), and the preferred ranges or content in the resin of the repeating units are the same as described for the resin (P).

In the case where the acid-decomposable resin other than the resin (P) is included, the content of the acid-decomposable resin in the composition according to the invention may satisfy the condition that the total content of the resin (P) and the acid-decomposable resin other than the resin (P) is within the above-described ranges. The mass ratio of the resin (P) to the acid-decomposable resin other than the resin (P) can be suitably adjusted to a range in which a good effect of the invention is exhibited, but the range of [resin (P)/acid-decomposable resin other than the resin (P)] is preferably from 99.9/0.1 to 10/90, and more preferably from 99.9/0.1 to 60/40.

It is preferable that the actinic ray-sensitive or radiation-sensitive resin composition in the invention contain the resin (P) alone as the acid-decomposable resin, from the viewpoint of LWR, local pattern dimensional uniformity, and EL.

Specific examples of the resin (P) used in the invention are shown below, but the invention is not limited thereto.

[Chem. 36]
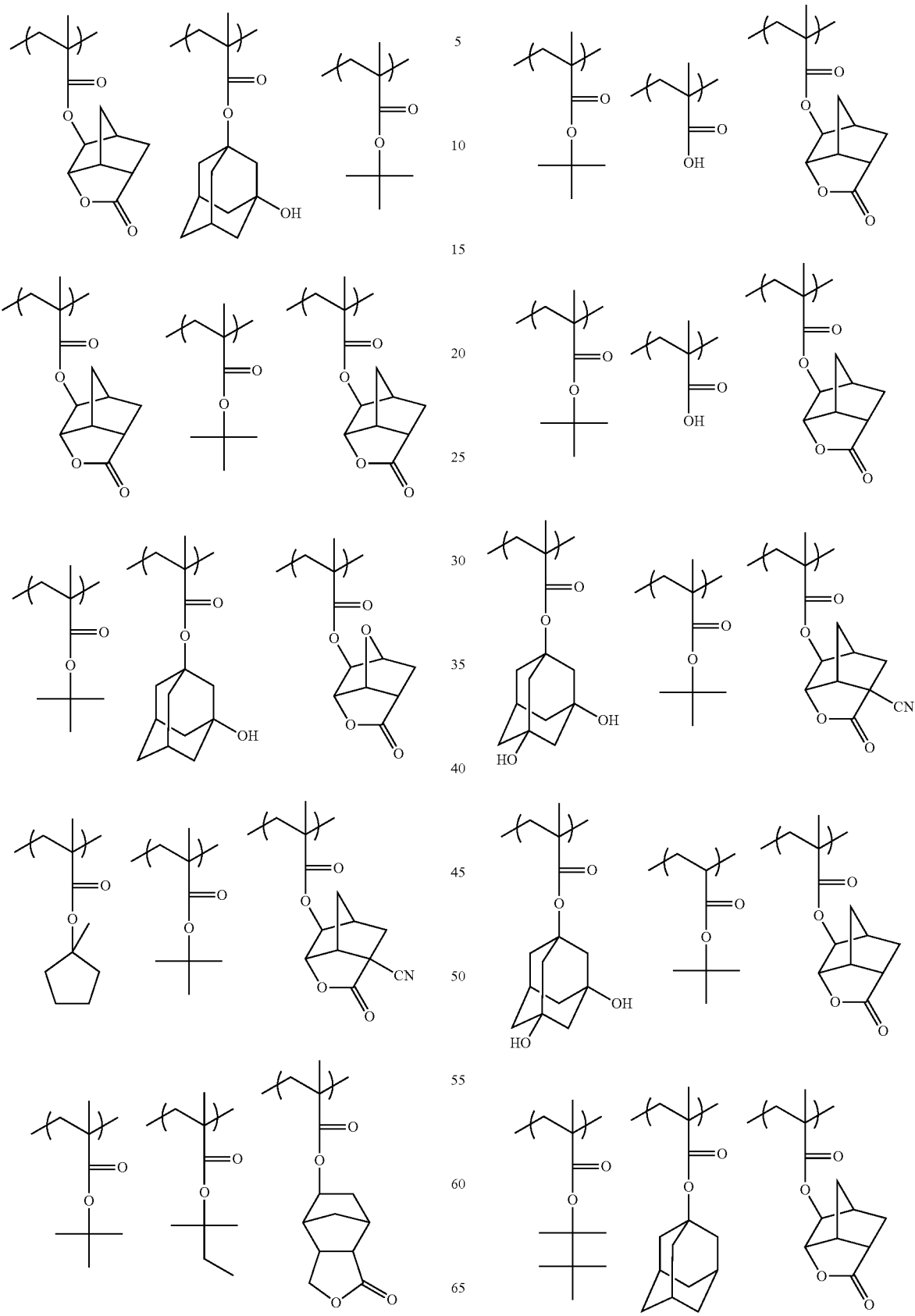

73
-continued
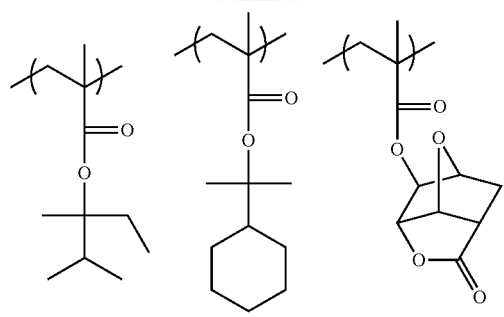
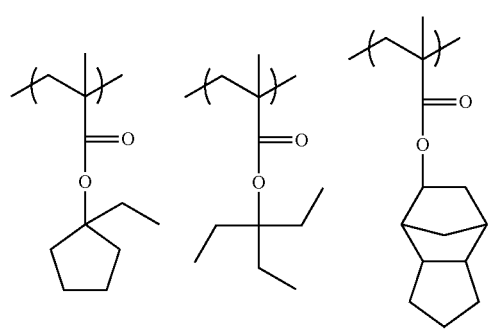
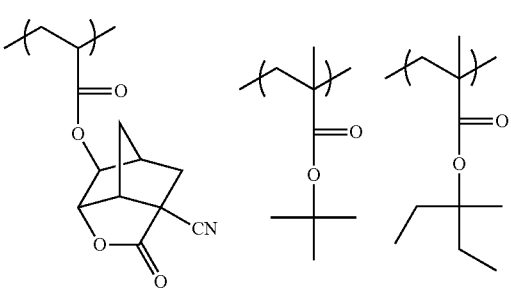
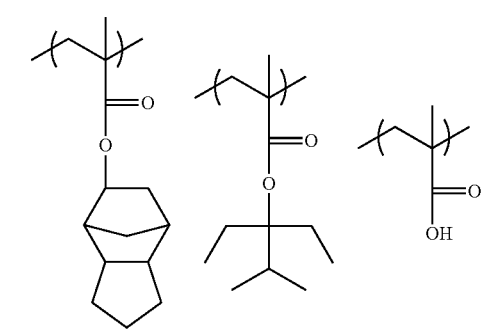
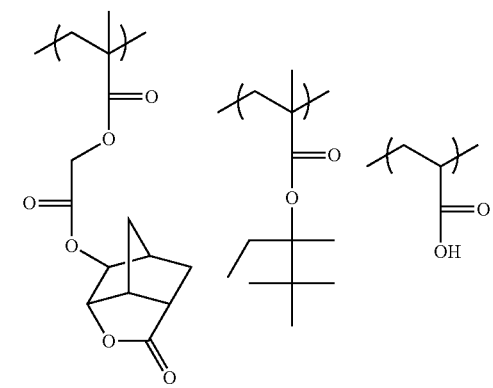
74
-continued
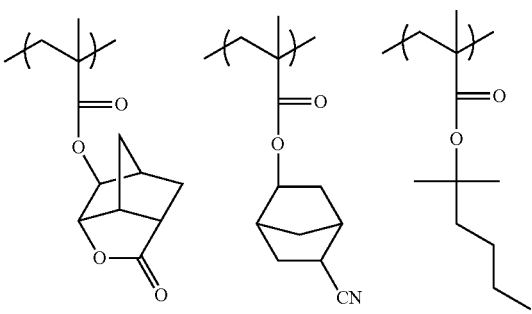
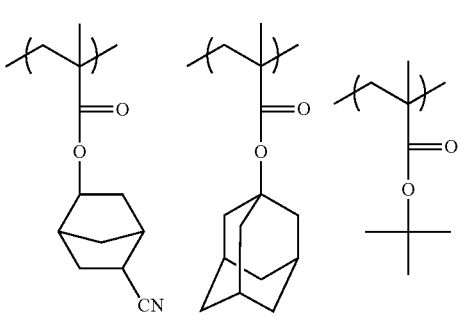
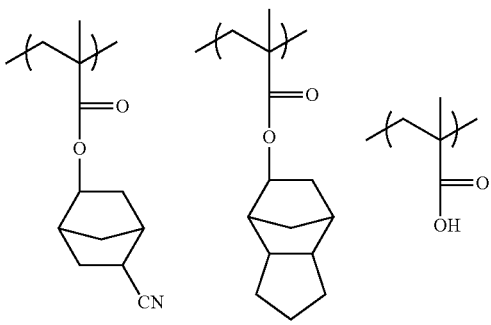
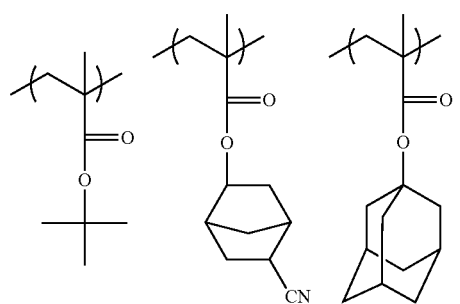
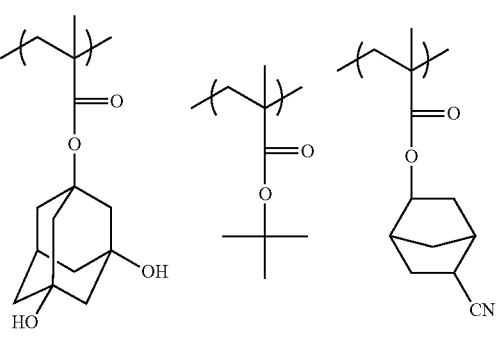

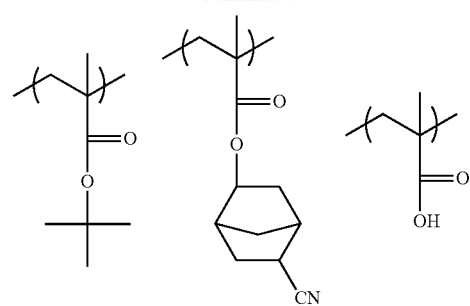
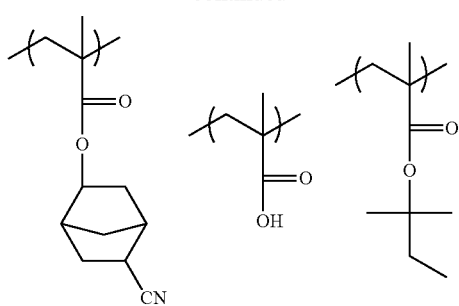
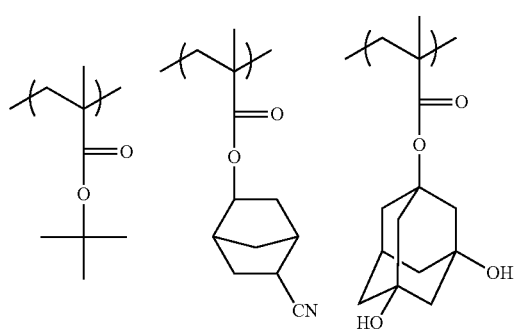
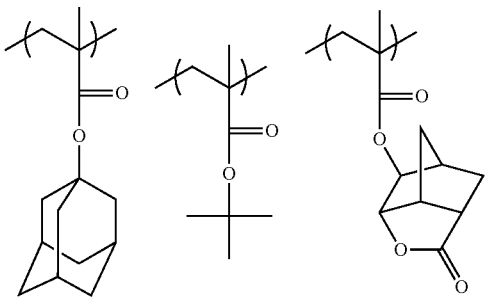
[Chem. 37]
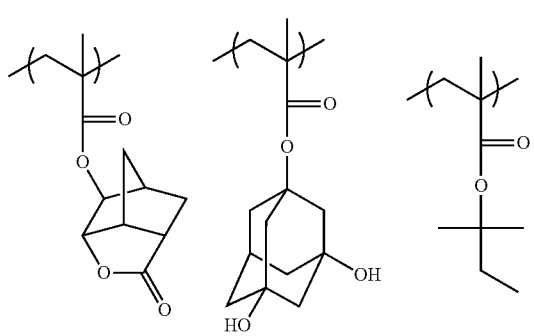
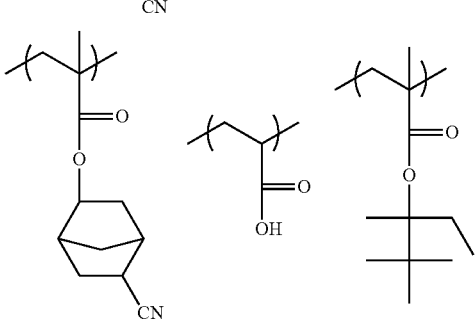

77
-continued
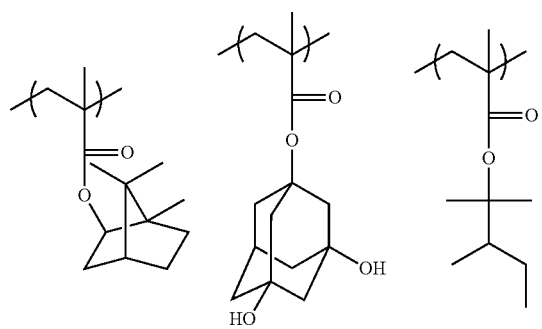
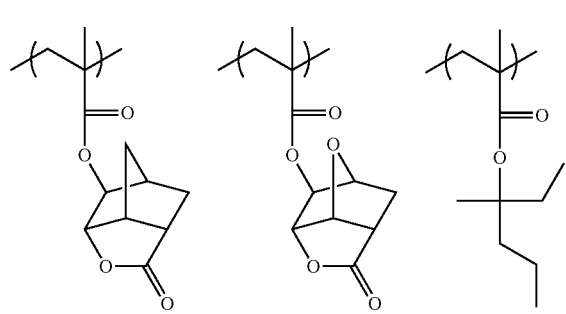
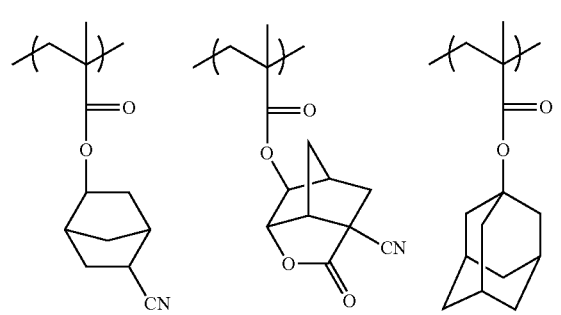
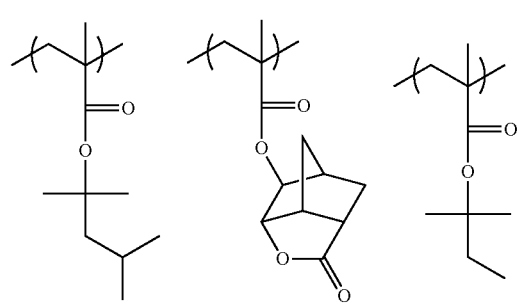
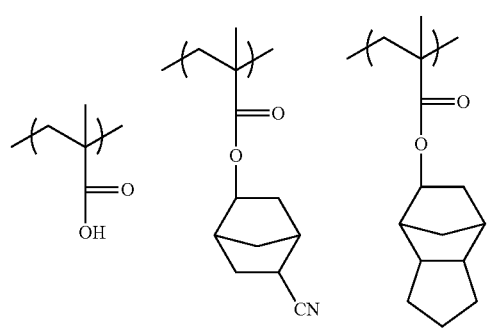
78
-continued
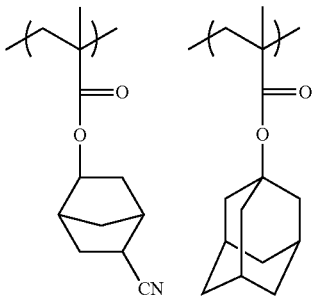
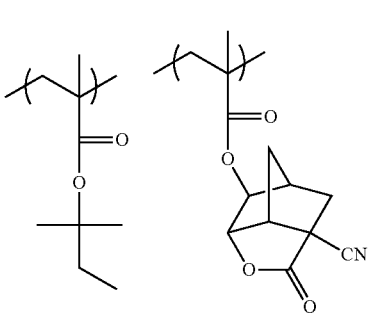
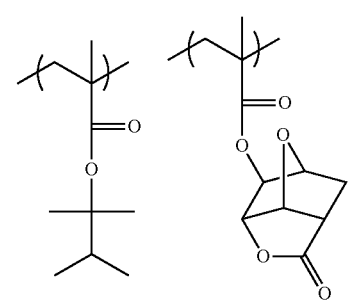
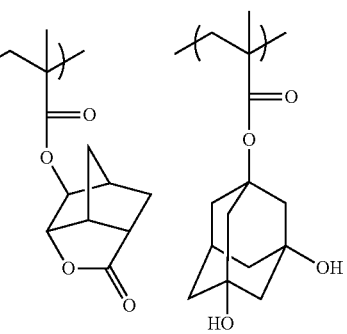
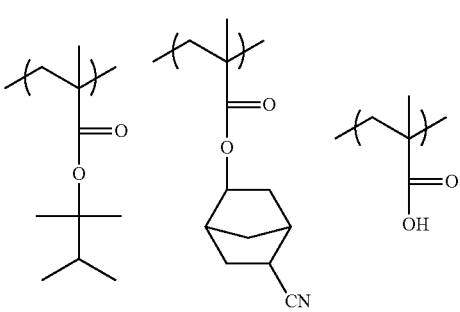

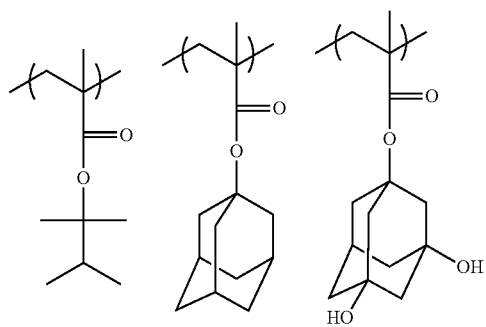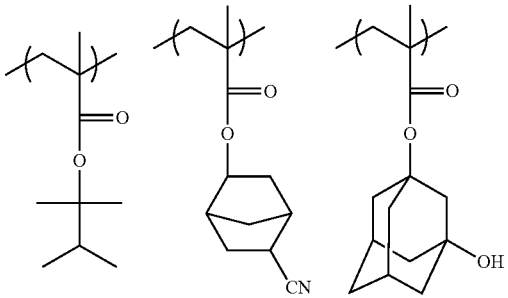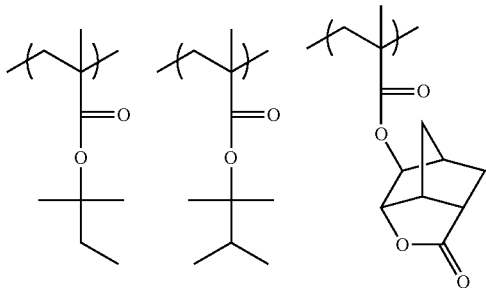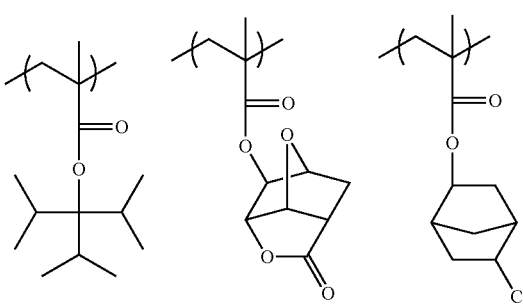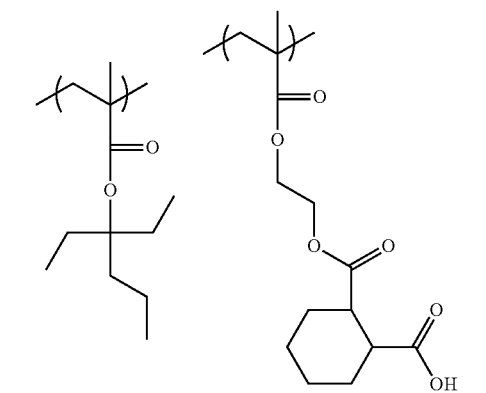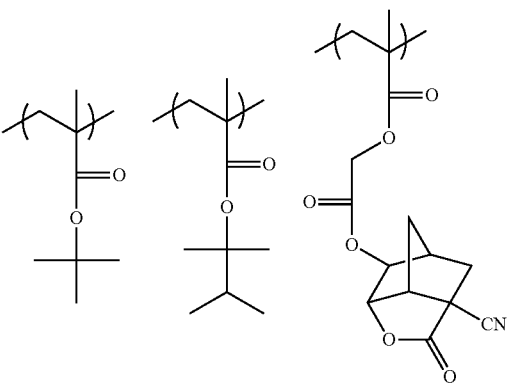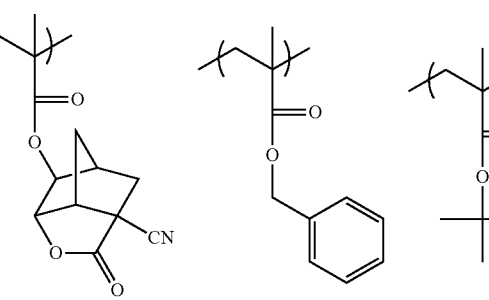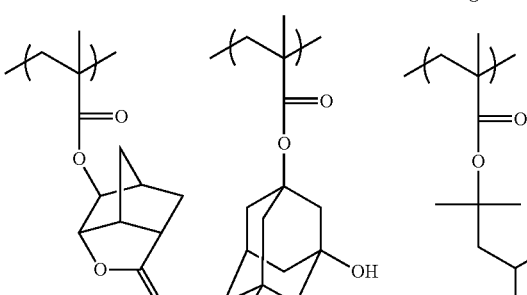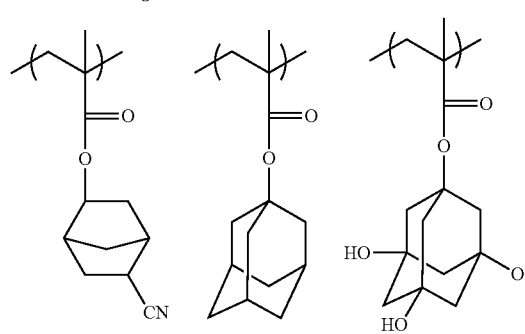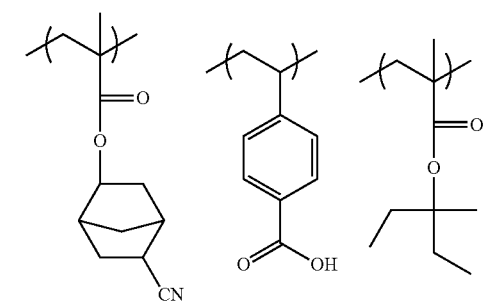

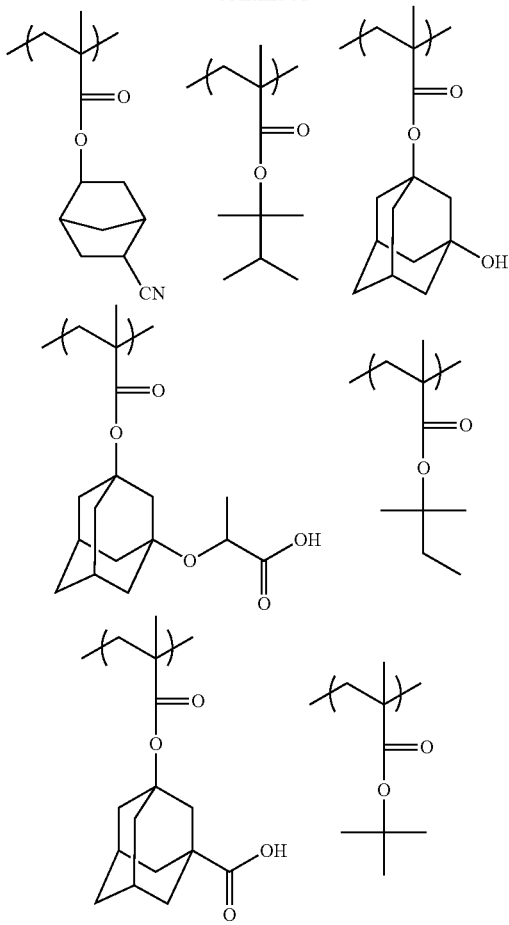

[2] Compound (B) Capable of Generating Organic Acid Upon Irradiation with Actinic Rays or Radiation The composition in the invention further contains a compound (B) capable of generating an organic acid by irradiation with actinic rays or radiation (hereinafter also referred to as a "acid generator").

As such an acid generator, photoinitiators for photo-cation polymerization, photoinitiators for photo-radical polymerization, photodecoloring agents of dyes, photo-discoloring agents, known compounds that generate an organic acid by irradiation with actinic rays or radiation, which are used in microresists, or the like, and mixtures thereof may be suitably selected and used.

Examples of the acid generator include diazonium salts, phosphonium salts, sulfonium salts, iodonium salts, imide sulfonates, oxime sulfonates, diazodisulfone, disulfone, and o-nitrobenzylsulfonate.

Examples of the preferred compounds among the acid generator (B) include the compounds represented by the following general formulae (ZI), (ZII), and (ZIII).

[Chem. 39]

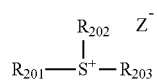

(ZI)

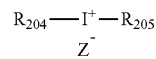

(ZII)

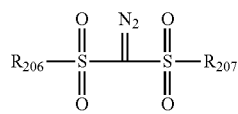

(ZIII)

In the general formula (ZI), $R_{201}$, $R_{202}$, and $R_{203}$ each independently represent an organic group.

The organic group as $R_{201}$, $R_{202}$, and $R_{203}$ generally has 1 to 30 carbon atoms, and preferably 1 to 20 carbon atoms.

Further, two members of $R_{201}$ to $R_{203}$ may be bonded to each other to form a ring structure, and the ring may contain an oxygen atom, a sulfur atom, an ester bond, an amide bond or a carbonyl group. Examples of the group formed by the combination of two members of $R_{201}$ to $R_{203}$ include an alkylene group (for example, a butylene group and a pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl) imide anion, and a tris(alkylsulfonyl)methyl anion.

The non-nucleophilic anion is an anion having an exceedingly low ability for causing a nucleophilic reaction, and is also an anion capable of suppressing the decomposition with aging by the nucleophilic reaction in the molecule, which thus leads to improvement of the stability with aging of the resist composition.

Examples of the sulfonate anion include an aliphatic sulfonate anion, an aromatic sulfonate anion, and a camphor sulfonate anion.

Examples of the carboxylate anion include an aliphatic carboxylate anion, an aromatic carboxylate anion, and an aralkylcarboxylate anion.

The aliphatic moiety in the aliphatic sulfonate anion and the aliphatic carboxylate anion may be an alkyl group or a cycloalkyl group. It is preferably an alkyl group having 1 to 30 carbon atoms and a cycloalkyl group having 3 to 30 carbon atoms, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

The aromatic group in the aromatic sulfonate anion and the aromatic carboxylate anion is preferably an aryl group having 6 to 14 carbon atoms, and examples thereof include a phenyl group, a tolyl group, and a naphthyl group.

Examples of the substituent of the alkyl group, the cycloalkyl group, and the aryl group of the aliphatic sulfonate anion and the aromatic sulfonate anion include a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). The aryl group or ring structure of these groups may further have an alkyl group (preferably having 1 to 15 carbon atoms) and a cycloalkyl group (preferably having 3 to 15 carbon atoms) as its substituent.

The aralkyl group in the aralkylcarboxylate anion is preferably an aralkyl group having 7 to 12 carbon atoms, and examples thereof include a benzyl group, a phenethyl group, a naphthylmethyl group, a naphthylethyl group, and a naphthylbutyl group.

The alkyl group, the cycloalkyl group, the aryl group, and the aralkyl group in the aliphatic carboxylate anion, the aromatic carboxylate anion, and the aralkylcarboxylate anion may have a substituent. Examples of the substituent include halogen atoms, alkyl groups, cycloalkyl groups, alkoxy groups, and alkylthio groups as described for the aromatic sulfonic acid anion.

Examples of the sulfonylimide anion include a saccharin anion.

The alkyl group in the bis(alkylsulfonyl) imide anion and the tris(alkylsulfonyl)methide anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, and a neopentyl group. Examples of the substituent for the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and an alkyl group substituted with a fluorine atom is preferred.

The non-nucleophilic anion for $Z^-$ is preferably an aliphatic sulfonate anion substituted at at least its α-position of sulfonic acid with a fluorine atom, an aromatic sulfonate anion substituted with a fluorine atom, or a group having a fluorine atom, a bis(alkylsulfonyl)imido anion in which an alkyl group is substituted with a fluorine atom, or a tris(alkylsulfonyl)methide anion in which an alkyl group is substituted with a fluorine atom. The nonnucleophilic anion is more preferably a perfluorinated aliphatic sulfonate anion (more preferably having 4 to 8 carbon atoms) or a benzenesulfonate anion having a fluorine atom, and still more preferably a nonafluorobutanesulfonate anion, a perfluorooctanesulfonate anion, a pentafluorobenzenesulfonate anion, or a 3,5-bis(trifluoromethyl)benzenesulfonate anion.

The acid generator is preferably a compound capable of generating an organic acid, represented by the following general formula (II) or (III). When the acid generator is the compound capable of generating an organic acid, represented by the following general formula (II) or (III), it has a cyclic organic group, and therefore, resolution and roughness performance can be further improved.

The non-nucleophilic anion may be an anion capable of generating an organic acid, represented by the following general formula (II) or (III).

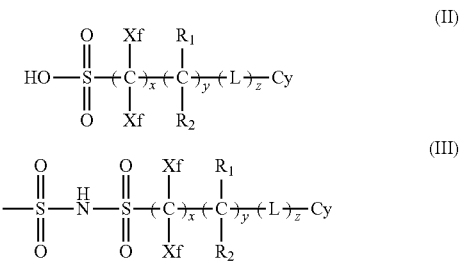

In the general formula, Xf's each independently represent a fluorine atom, or an alkyl group substituted with at least one fluorine atom;

each of $R_1$ and $R_2$ independently represents a hydrogen atom, a fluorine atom, or an alkyl group, and in case of y≥2, each of $R_1$'s and $R_2$'s independently represents a hydrogen atom, a fluorine atom, or an alkyl group;

L represents a divalent linking group, and in case of z≥2, a plurality of L's may be the same as or different from each other;

Cy represents a cyclic organic group;

Rf represents a group containing a fluorine atom;

x represents an integer of 1 to 20;

y represents an integer of 0 to 10; and z represents an integer of 0 to 10.

Xf represents a fluorine atom, or an alkyl group substituted with at least one fluorine atom. The alkyl group preferably contains 1 to 10 carbon atoms, and more preferably 1 to 4 carbon atoms. Further, the alkyl group substituted with at least one fluorine atom is preferably a perfluoroalkyl group.

Xf is preferably a fluorine atom or a perfluoroalkyl group having 1 to 4 carbon atoms. Specific preferred examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom and $CF_3$ are preferred. It is particularly preferable that both Xf's be fluorine atoms.

$R_1$ and $R_2$ each independently represent a hydrogen atom, a fluorine atom, or an alkyl group. The alkyl group may have a substituent (preferably a fluorine atom), and preferably contains 1 to 4 carbon atoms. A perfluoroalkyl group having 1 to 4 carbon atoms is more preferred. Specific examples of the alkyl group having a substituent for $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferred.

L is a divalent linking group. Examples of the divalent linking group include —COO—, —COO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), and a linking group formed by a plurality of these groups. Among these, —COO—, —COO—, —CONH—, —NHCO—, —CO—, —O—, —SO$_2$—, —COO-alkylene group-, —OCO-alkylene group-, —CONH-alkylene group-, or —NHCO-alkylene group- is preferred, and —COO—, —COO—, —CONH—, —SO$_2$—, —COO-alkylene group-, or —OCO-alkylene group- is more preferred.

Cy represents a cyclic organic group. Examples of the cyclic organic group include an alicyclic group, an aryl group, and a heterocyclic group.

The alicyclic group may be monocyclic or polycyclic, and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among these, an alicyclic group having a bulky structure containing 7 or more carbon atoms, such as a norbornyl group, a tricyclodecanyl group, a tetracyclodecanyl group, a tetracyclododecanyl group, and an adamantyl group, is preferred since diffusion of counter anions into a film during a post-exposure baking (PEB) step is inhibited and a MEEF (Mask Error Enhancement Factor) is improved.

The aryl group may be monocyclic or polycyclic. Examples of the aryl group include a phenyl group, a naphthyl group, a phenanthryl group, and an anthryl group. Among these, a naphthyl group with a relatively low light absorbance at 193 nm is preferred.

The heterocyclic group may be monocyclic or polycyclic, and the polycyclic heterocyclic group can inhibit the diffusion of an acid. Further, the heterocyclic group may be aromatic or non-aromatic. Examples of the aromatic heterocycle include a furan ring, a thiophene ring, a benzofuran ring, a benzothiophene ring, a dibenzofuran ring, a dibenzothiophene ring, and a pyridine ring. Examples of the non-aromatic heterocycle include a tetrahydropyran ring, a lactone ring, and a decahydroisoquinoline ring. As the heterocycle in the heterocyclic group, a furan ring, a thiophene ring, a pyridine ring, or a decahydroisoquinoline ring are particularly preferred. Further, examples of the lactone ring include the lactone structures exemplified in the above-described resin (P).

The cyclic organic group may have a substituent. Examples of the substituent include an alkyl group (may be linear, branched, or cyclic, preferably having 1 to 12 carbon atoms), a cycloalkyl group (may be monocyclic, polycyclic or spirocyclic, preferably having 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, and a sulfonic acid ester group. Incidentally, the carbon constituting the cyclic organic group (carbon contributing to ring formation) may be carbonyl carbon.

x is preferably from 1 to 8, more preferably from 1 to 4, and particularly preferably 1. y is preferably from 0 to 4, and more preferably 0. z is preferably from 0 to 8, and more preferably from 0 to 4.

Examples of the group containing a fluorine atom as Rf include an alkyl group having at least one fluorine atom, a cycloalkyl group having at least one fluorine atom, and an aryl group having at least one fluorine atom.

These alkyl group, cycloalkyl group, and aryl group may be substituted with fluorine atoms, or with the substituents containing fluorine atoms. In the case where Rf is a cycloalkyl group having at least one fluorine atom or an aryl group having at least one fluorine atom, examples of the other substituent containing a fluorine atom include an alkyl group substituted with at least one fluorine atom.

Furthermore, these alkyl group, cycloalkyl group, and aryl group may be further substituted with substituents containing no fluorine atoms. Examples of the substituent include those containing no fluorine atoms particularly among those described above for Cy.

Examples of the alkyl group having at least one fluorine atom represented by Rf include those described above for the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

Examples of the organic group represented by $R_{201}$, $R_{202}$, and $R_{203}$ include the corresponding groups in the compounds (ZI-1), (ZI-2), (ZI-3), and (ZI-4) as described later.

Moreover, the compound may be a compound having a plurality of structures represented by the general formula (ZI). For example, the compound may be a compound having a structure where at least one of $R_{201}$ to $R_{203}$ in the compound represented by the general formula (ZI) is bonded to at least one of $R_{201}$ to $R_{203}$ in another compound represented by the general formula (ZI) through a single bond or a linking group.

More preferred examples of the component (ZI) include the compounds (ZI-1), (ZI-2), (ZI-3), and (ZI-4) as described below.

The compound (ZI-1) is an arylsulfonium compound where at least one of $R_{201}$ to $R_{203}$ in the general formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining ones being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, these two or more aryl groups may be the same as or different from each other.

The alkyl group or the cycloalkyl group which is present, if desired, in the arylsulfonium compound is preferably a linear or branched alkyl group having 1 to 15 carbon atoms or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group or a phenylthio group. The substituent is preferably a linear or branched alkyl group having 1 to 12 carbon atoms, a cycloalkyl group having 3 to 12 carbon atoms, or a linear, branched, or cyclic alkoxy group having 1 to 12 carbon atoms, more preferably an alkyl group having 1 to 4 carbon atoms, or an alkoxy group having 1 to 4 carbon atoms. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

Next, the compound (ZI-2) will be described.

The compound (ZI-2) is a compound in which $R_{201}$ to $R_{203}$ in the formula (ZI) each independently represent an organic group having no aromatic ring. Here, the aromatic ring also includes an aromatic ring containing a heteroatom.

The organic group containing no aromatic ring as $R_{201}$ to $R_{203}$ generally contains 1 to 30 carbon atoms, and preferably 1 to 20 carbon atoms.

$R_{201}$ to $R_{203}$ each independently preferably represent an alkyl group, a cycloalkyl group, an allyl group, or a vinyl group, still more preferably a linear or branched 2-oxoalkyl group, a 2-oxocycloalkyl group, or an alkoxycarbonylmethyl group, and particularly preferably a linear or branched 2-oxoalkyl group.

Preferable examples of the alkyl group and the cycloalkyl group of $R_{201}$ to $R_{203}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group). More preferable examples of the alkyl group include a 2-oxoalkyl group and an alkoxycarbonylmethyl group, and more preferable examples of the cycloalkyl group include a 2-oxocycloalkyl group.

The 2-oxoalkyl group may be either linear or branched, and examples thereof include a group containing >C=O at the 2-position of the alkyl group.

The 2-oxocycloalkyl group is preferably the group containing >C=O at the 2-position of the cycloalkyl group.

Examples of the alkoxy group in the alkoxycarbonylmethyl group preferably include an alkoxy group having 1 to 5 carbon atoms (a methoxy group, an ethoxy group, a propoxy group, a butoxy group, and a pentoxy group).

$R_{201}$ to $R_{203}$ may be further substituted with a halogen atom, an alkoxyl group (for example, having 1 to 5 carbon atoms), a hydroxyl group, a cyano group, or a nitro group.

Next, the compound (ZI-3) will be described.

The compound (ZI-3) is a compound represented by the following general formula (ZI-3), which is a compound having a phenacylsulfonium structure.

[Chem. 41]

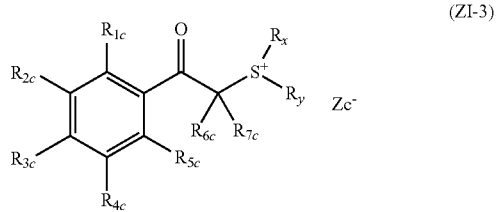

(ZI-3)

In the general formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group;

$R_{6c}$ and $R_{7c}$ each independently represent a hydrogen atom, an alkyl group, a cycloalkyl group, a halogen atom, a cyano group, or an aryl group; and $R_x$ and $R_y$ each independently represent an alkyl group, a cycloalkyl group, a 2-oxoalkyl group, a 2-oxocycloalkyl group, an alkoxycarbonylalkyl group, an allyl group, or vinyl group.

Any two or more members of $R_{1c}$ to $R_{5c}$, $R_{5c}$ and $R_{6c}$, $R_{6c}$ and $R_{7c}$, $R_{5c}$ and $R_x$, and $R_x$ and $R_y$ may be bonded to each other to form a ring structure, and this ring structure may contain an oxygen atom, a sulfur atom, a ketone group, an ester bond, or an amide bond.

The ring structure includes an aromatic or non-aromatic hydrocarbon ring, an aromatic or non-aromatic heterocyclic ring, and a polycyclic condensed ring formed by combination of two or more of these rings. The ring structure includes a 3- to 10-membered ring, and is preferably a 4- to 8-membered ring, and more preferably a 5- or 6-membered ring.

Examples of the group formed by the mutual bonding of any two or more members of $R_{1c}$ to $R_{5c}$, $R_{6c}$ and $R_{7c}$, and $R_x$ and $R_y$ include a butylene group and a pentylene group.

The group formed by the mutual bonding of $R_{5c}$ and $R_{6c}$, and $R_{5c}$ and $R_x$ is preferably a single bond or an alkylene group, and examples of the alkylene group include a methylene group and an ethylene group.

$Z_c^-$ represents a non-nucleophilic anion, and examples thereof include the same non-nucleophilic anions as mentioned above as examples of $Z^-$ in the general formula (ZI).

The alkyl group as $R_{1c}$ to $R_{7c}$ may be either linear or branched, and examples thereof include an alkyl group having 1 to 20 carbon atoms, and preferably a linear or branched alkyl group having 1 to 12 carbon atoms (for example, a methyl group, an ethyl group, a linear or branched propyl group, a linear or branched butyl group, and a linear or branched pentyl group), and examples of the cycloalkyl group include a cycloalkyl group having 3 to 10 carbon atoms (for example, a cyclopentyl group and a cyclohexyl group).

The aryl group as $R_{1c}$ to $R_{7c}$ preferably has 5 to 15 carbon atoms, and examples thereof include a phenyl group and a naphthyl group.

The alkoxy group as $R_{1c}$ to $R_{5c}$ may be any of linear, branched, and cyclic, and examples thereof include an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group, and a linear or branched pentoxy group), and a cyclic alkoxy group having 3 to 10 carbon atoms (for example, a cyclopentyloxy group and a cyclohexyloxy group).

Specific examples of the alkoxy group in the alkoxycarbonyl group as $R_{1c}$ to $R_5$ include the same as those of the alkoxy group as $R_{1c}$ to $R_{5c}$.

Specific examples of the alkyl group in the alkylcarbonyloxy group and the alkylthio group as $R_{1c}$ to $R_{5c}$ include the same as those of the alkyl group as $R_{1c}$ to $R_{5c}$.

Specific examples of the cycloalkyl group in the cycloalkylcarbonyloxy group as $R_{1c}$ to $R_{5c}$ include the same as those of the cycloalkyl group as $R_{1c}$ to $R_{5c}$.

Specific examples of the aryl group in the aryloxy group and the arylthio group as $R_{1c}$ to $R_{5c}$ include the same as those of the aryl group as $R_{1c}$ to $R_{5c}$.

Preferably, any one of $R_{1c}$ to $R_{5c}$ is a linear or branched alkyl group, a cycloalkyl group, or a linear, branched, or cyclic alkoxy group, and $R_{1c}$ to $R_{5c}$ more preferably has 2 to 15 carbon atoms, due to which the solvent solubility is more enhanced and production of particles during storage is be inhibited.

The ring structure formed by the mutual bonding of any two or more of $R_{1c}$ to $R_{5c}$ preferably includes a 5- or 6-membered ring, and particularly preferably a 6-membered ring (such as a phenyl ring).

The ring structure formed by the mutual bonding of $R_{5c}$ and $R_{6c}$ preferably includes a 4 or more-membered ring (preferably a 5- or 6-membered ring) formed with the carbonyl carbon atom and carbon atom in the general formula (I) by the mutual bonding of $R_{5c}$ and $R_{6c}$ to constitute a single bond or an alkylene group (a methylene group, an ethylene group, and the like).

The aryl group as any of $R_{6c}$ and $R_{7c}$ is an alkyl group having 5 to 15 carbon atoms, and examples thereof include a phenyl group and a naphthyl group.

In one embodiment of $R_{6c}$ and $R_{7c}$, a case where both of $R_{6c}$ and $R_{7c}$ are alkyl groups is preferred. Particularly, a case where $R_{6c}$ and $R_{7c}$ are each a linear or branched alkyl group having 1 to 4 carbon atoms is preferred, and a case where both of them are methyl groups is particularly preferred.

Furthermore, in the case where $R_{6c}$ and $R_{7c}$ are combined to form a ring, the group formed by the mutual bonding of $R_{6c}$ and $R_{7c}$ is preferably an alkylene group having 2 to 10 carbon atoms, and examples thereof include an ethylene group, a propylene group, a butylene group, a pentylene group, and a hexylene group. Further, the ring formed by the mutual bonding of $R_{6c}$ and $R_{7c}$ may contain a heteroatom such as an oxygen atom in the ring.

Examples of the alkyl group and the cycloalkyl group as $R_x$ and $R_y$ include the same as those of the alkyl group and the cycloalkyl group as in $R_{1c}$ to $R_{7c}$.

Examples of the 2-oxoalkyl group and the 2-oxocycloalkyl group as $R_x$ and $R_y$ include a group containing >C=O at the 2-position of the alkyl group and the cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. Examples of the alkyl group include an alkyl group having 1 to 12 carbon atoms, and preferably a linear alkyl group having 1 to 5 carbon atoms (for example, a methyl group and an ethyl group).

The allyl group as $R_x$ and $R_y$ is not particularly limited, but is preferably an unsubstituted allyl group or an allyl group substituted with a monocyclic or polycyclic cycloalkyl group (preferably a cycloalkyl group having 3 to 10 carbon atoms).

The vinyl group as $R_x$ and $R_y$ is not particularly limited, but is preferably an unsubstituted vinyl group or a vinyl group substituted with a monocyclic or polycyclic cycloalkyl group (preferably a cycloalkyl group having 3 to 10 carbon atoms).

The ring structure which may be formed by the mutual bonding of $R_{5c}$ and $R_x$ includes a 5-membered or higher ring (particularly preferably a 5-membered ring), formed together with a sulfur atom and a carbonyl carbon atom in the general formula (I) by the mutual boding of $R_{5c}$ and $R_x$ to constitute a single bond or an alkylene group (a methylene group, an ethylene group, a propylene group, and the like).

The ring structure which may be formed by the mutual bonding of $R_x$ and $R_y$ includes a 5- or 6-membered ring, and preferably a 5-membered ring (that is, a tetraydrothiophene ring), formed together with the sulfur atom in the general formula (ZI-3) by divalent $R_x$ and $R_y$ (for example, a methylene group, an ethylene group, and a propylene group).

$R_x$ and $R_y$ are each preferably an alkyl group or cycloalkyl group having 4 or more carbon atoms, more preferably an alkyl group or cycloalkyl group having 6 or more carbon atoms, and still more preferably an alkyl group or cycloalkyl group having 8 or more carbon atoms.

$R_{1c}$ to $R_{7c}$, $R_x$ and $R_y$ may further contain a substituent, and examples of such a substituent include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

In the general formula (ZI-3), more preferably, $R_{1c}$, $R_{2c}$, $R_{4c}$, and $R_{5c}$ each independently represent a hydrogen atom, and $R_{1c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, Specific examples of the cations of the compounds (ZI-2) or (ZI-3) in the invention are shown below.

[Chem. 42]

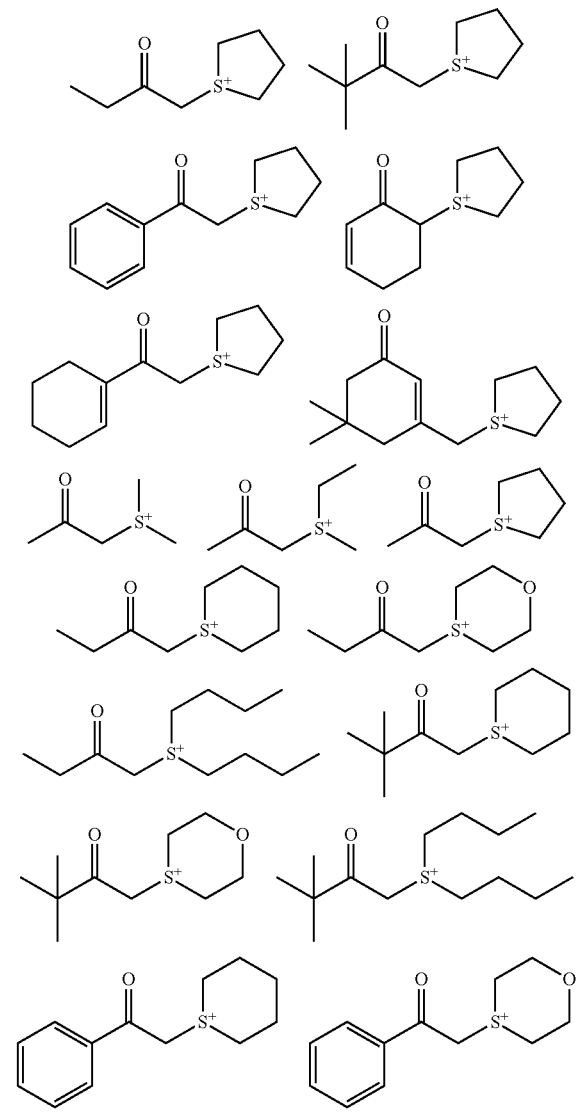

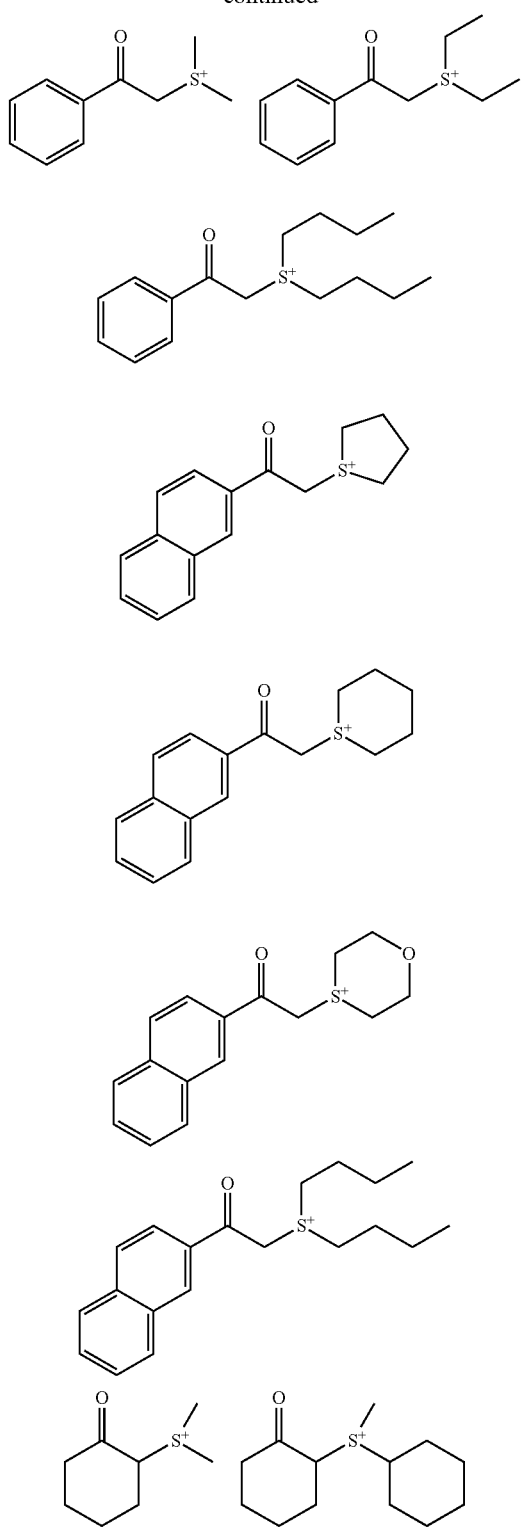
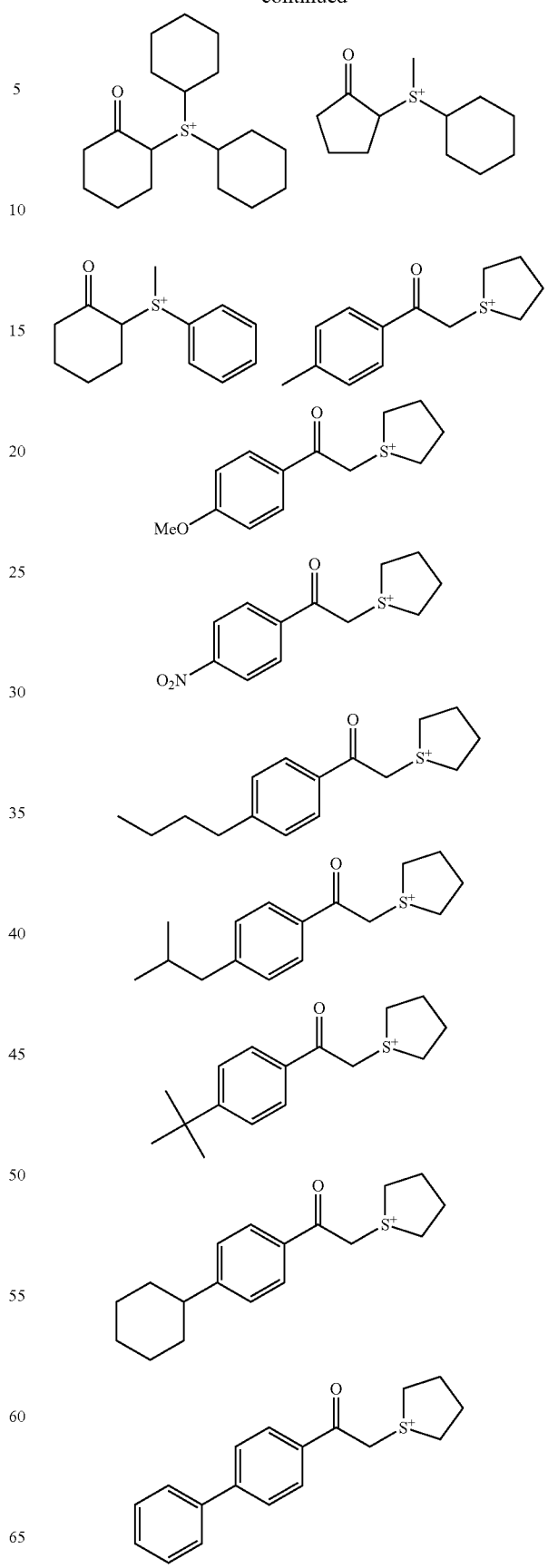
[Chem. 43]

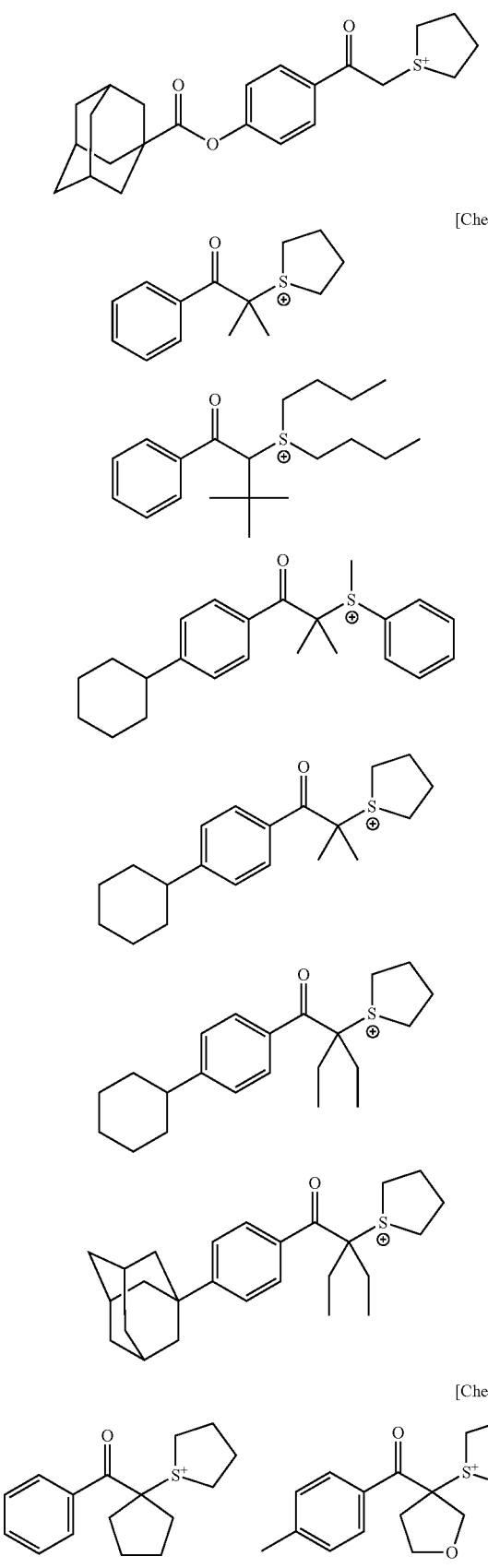
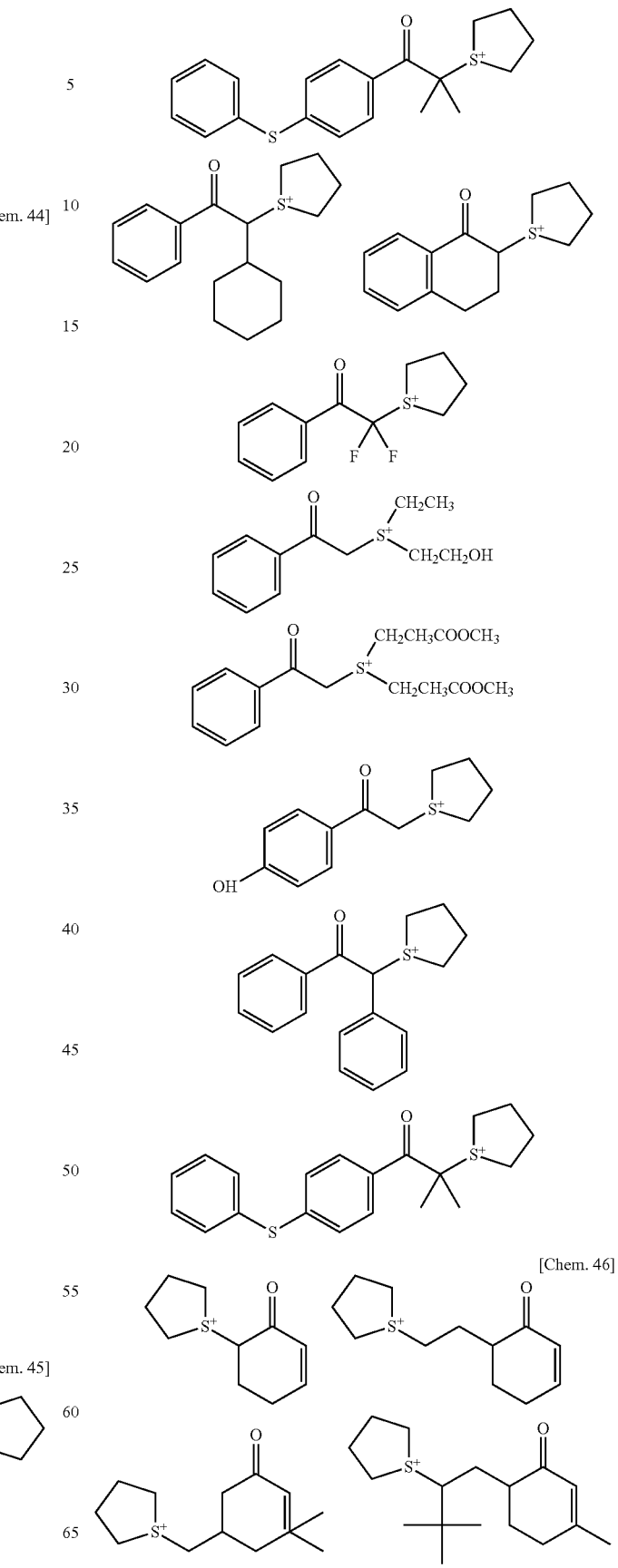

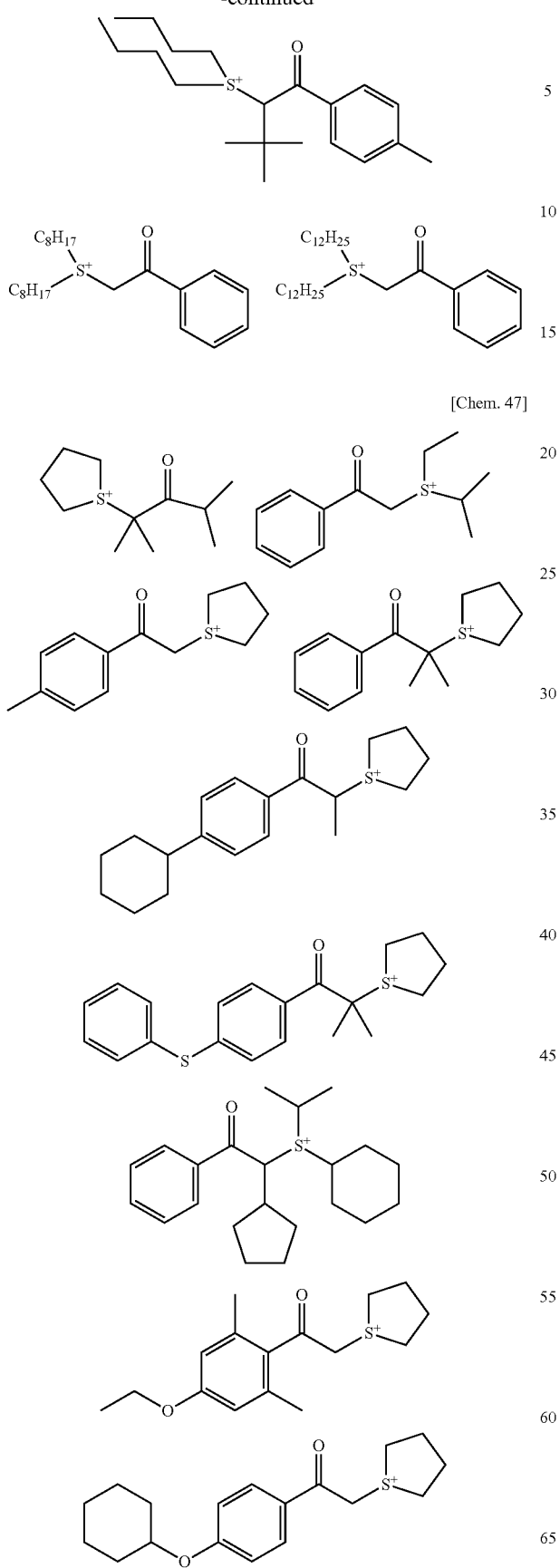

[Chem. 47]

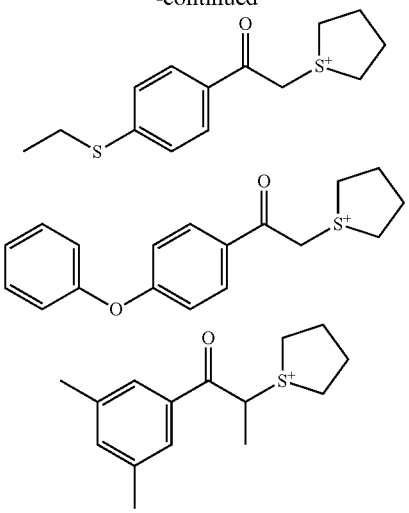

Next, the compound (ZI-4) will be described.

The compound (ZI-4) is represented by the following general formula (ZI-4).

[Chem. 48]

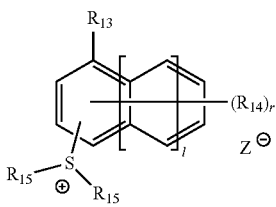

(ZI-4)

In the general formula (ZI-4), $R_{13}$ represents a group containing a hydrogen atom, a fluorine atom, a hydroxyl group, an alkyl group, a cycloalkyl group, an alkoxy group, an alkoxycarbonyl group, or a cycloalkyl group, and these groups may have a substituent;

when a plurality of $R_{14}$'s are present, they each independently represent a group containing a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group, and these groups may have a substituent;

$R_{15}$'s each independently represent an alkyl group, a cycloalkyl group, or a naphthyl group, or two $R_{15}$'s may be bonded to each other to form a ring, and these groups may have a substituent;

l represents an integer of 0 to 2;

r represents an integer of 0 to 8; and $Z^-$ represents a non-nucleophilic anion, and examples thereof include the same non-nucleophilic anions as mentioned above as $Z^-$ in the general formula (ZI).

In the general formula (ZI-4), the alkyl group of $R_{13}$, $R_{14}$, and $R_{15}$ is linear or branched, preferably has 1 to 10 carbon atoms, and preferred examples thereof include a methyl group, an ethyl group, an n-butyl group, and a t-butyl group.

Examples of the cycloalkyl group of $R_{13}$, $R_{14}$, and $R_{15}$ include a monocyclic or polycyclic cycloalkyl group (preferably a cycloalkyl group having 3 to 20 carbon atoms), and particularly preferred examples thereof include cyclopropyl, cyclopentyl, cyclohexyl, cycloheptyl, and cyclooctyl.

The alkoxy group of $R_{13}$ and $R_{14}$ is linear or branched, preferably has 1 to 10 carbon atoms, and preferred examples thereof include a methoxy group, an ethoxy group, an n-propoxy group, and an n-butoxy group.

The alkoxycarbonyl group of $R_{13}$ and $R_{14}$ is linear or branched, preferably has 2 to 11 carbon atoms, and preferred examples thereof include a methoxycarbonyl group, an ethoxycarbonyl group, and an n-butoxycarbonyl group.

Examples of the group having a cycloalkyl group of $R_{13}$ and $R_{14}$ include a monocyclic or polycyclic cycloalkyloxy group (preferably a cycloalkyl group having of 3 to 20 carbon atoms), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total number of carbon atoms of 7 or more, more preferably a total number of carbon atoms of 7 to 15, and preferably has a monocyclic cycloalkyl group. The monocyclic cycloalkyloxy group having a total number of carbon atoms of 7 or more indicates a monocyclic cycloalkyloxy group where a cycloalkyloxy group such as a cyclopropyloxy group, a cyclobutyloxy group, a cyclopentyloxy group, a cyclohexyloxy group, a cycloheptyloxy group, a cyclooctyloxy group, and a cyclododecanyloxy group arbitrarily has a substituent such as an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, and an iso-amyl group; a hydroxyl group; a halogen atom (fluorine, chlorine, bromine, and iodine); a nitro group; a cyano group; an amido group; a sulfonamido group; an alkoxy group such as a methoxy group, an ethoxy group, a hydroxyethoxy group, a propoxy group, a hydroxypropoxy group, and a butoxy group; an alkoxycarbonyl group such as a methoxycarbonyl group and an ethoxycarbonyl group; an acyl group such as a formyl group, an acetyl group, and a benzoyl group; and an acyloxy group such as an acetoxy group and a butyryloxy group; and a carboxy group, and where the total number of carbon atoms inclusive of the number of carbon atoms of an arbitrary substituent on the cycloalkyl group is 7 or more.

Furthermore, examples of the polycyclic cycloalkyloxy group having a total number of carbon atoms of 7 or more include a norbornyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total number of carbon atoms of 7 or more, and more preferably a total number of carbon atoms of 7 to 15, and is preferably an alkoxy group having a monocyclic cycloalkyl group. The alkoxy group having a total number of carbon atoms of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, and iso-amyloxy, in which where the total number of carbon atoms inclusive of the number of carbon atoms of the substituent is 7 or more. Examples thereof include a cyclohexylmethoxy group, a cyclopentylethoxy group, and a cyclohexylethoxy group, with a cyclohexylmethoxy group being preferred.

Furthermore, examples of the alkoxy group having a total number of carbon atoms of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl group or the cycloalkylsulfonyl group of $R_{14}$ is linear, branched, or cyclic, preferably has 1 to 10 carbon atoms, and preferred examples thereof include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which each of the groups above may have include a halogen atom (for example, a fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched, or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include a linear, branched, or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include a linear, branched, or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl.

Examples of the alkoxycarbonyloxy group include a linear, branched, or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and a cyclohexyloxycarbonyloxy group.

Examples of the ring structure which may be formed by the mutual bonding of two $R_{15}$'s include a 5- or 6-membered ring, preferably a 5-membered ring (that is, a tetrahydrothiophene ring), formed together with the sulfur atom in the general formula (ZI-4) by two divalent $R_{15}$'s and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. As for the substituent on the ring structure, a plurality of substituents may be present, and they may be combined with each other to form a ring (an aromatic or non-aromatic hydrocarbon ring, an aromatic or non-aromatic heterocyclic ring, a polycyclic condensed ring formed by combination of two or more of these rings, or the like).

In the general formula (ZI-4), $R_{15}$ is preferably, for example, a methyl group, an ethyl group, a naphthyl group, or a divalent group for forming a tetrahydrothiophene ring structure together with the sulfur atom when two $R_{15}$'s are bonded to each other, or the like.

The substituent which $R_{13}$ and $R_{14}$ may have is preferably a hydroxyl group, an alkoxy group, an alkoxycarbonyl group, or a halogen atom (particularly a fluorine atom).

l is preferably 0 or 1, and more preferably 1.

r is preferably from 0 to 2.

Specific examples of the cation in the compound represented by the general formula (ZI-4) in the invention are shown below.

[Chem. 49]

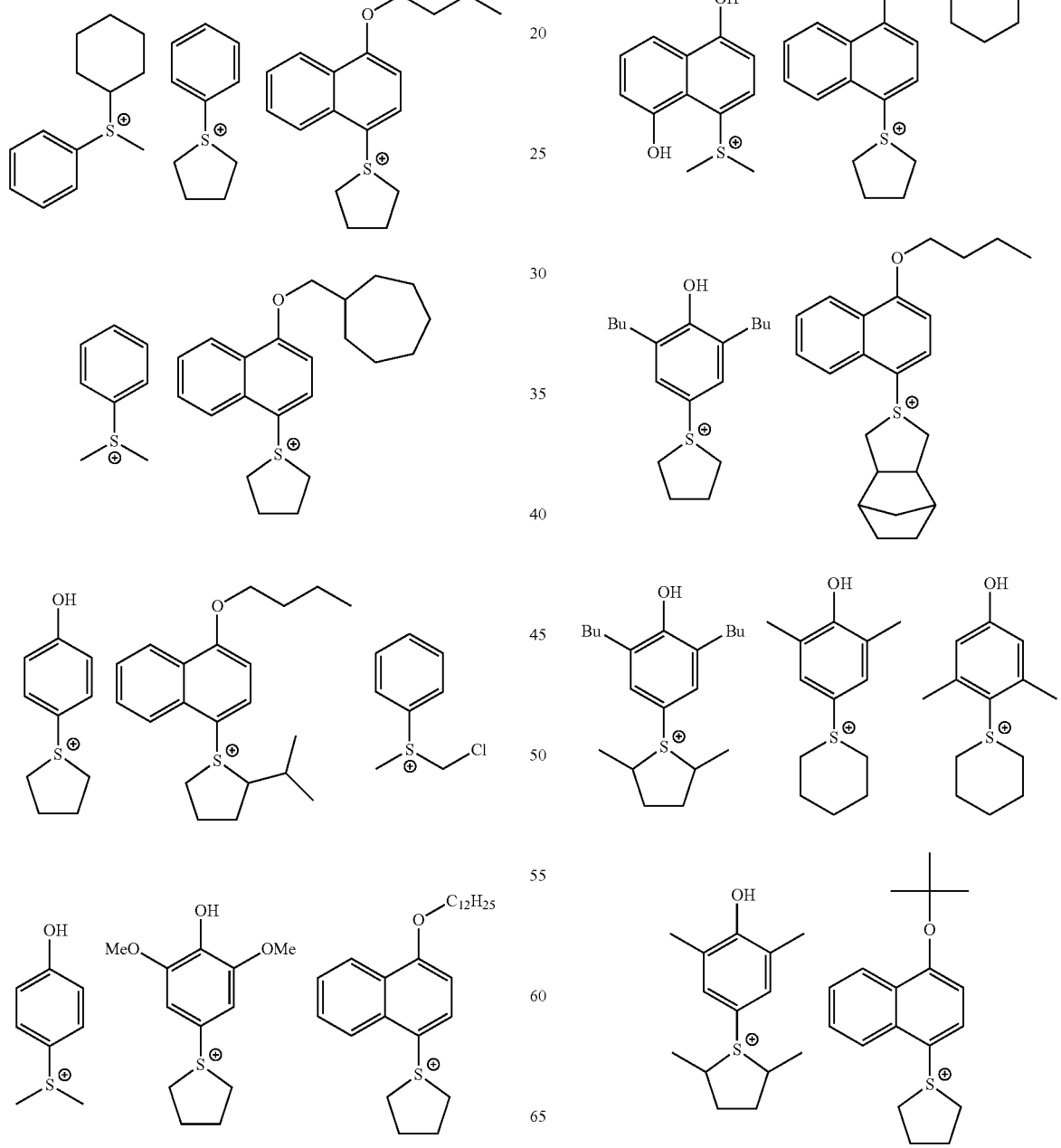

101
-continued
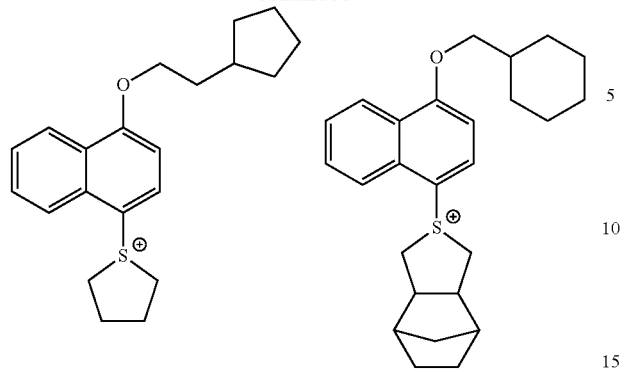
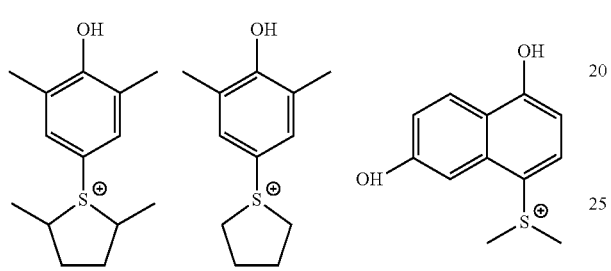
[Chem. 50]
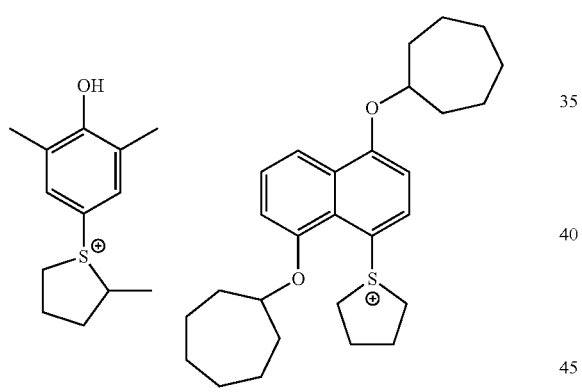
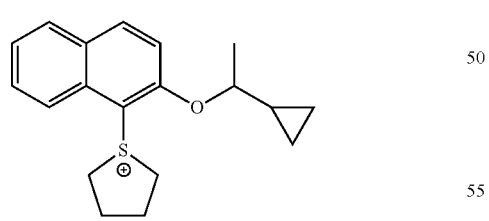
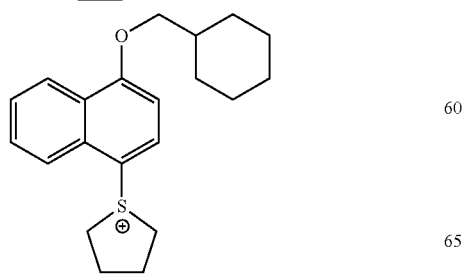
102
-continued
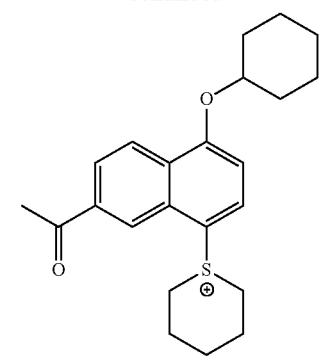
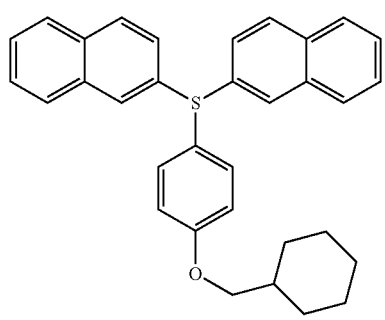
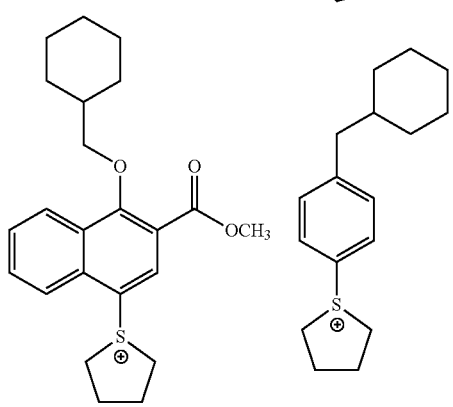
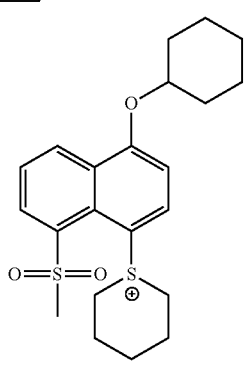
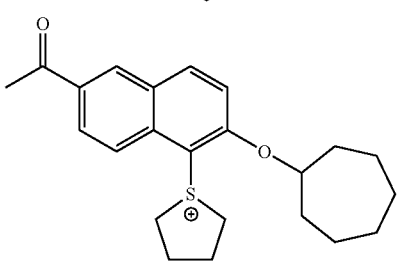

-continued

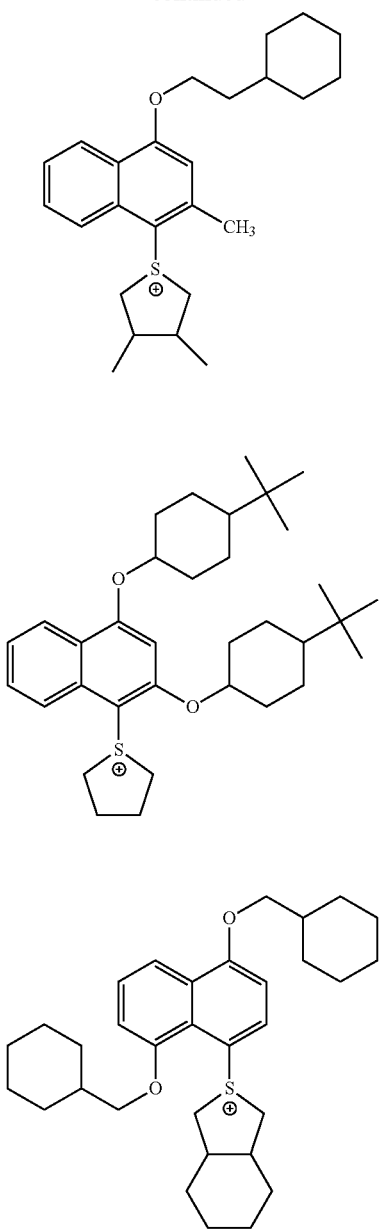

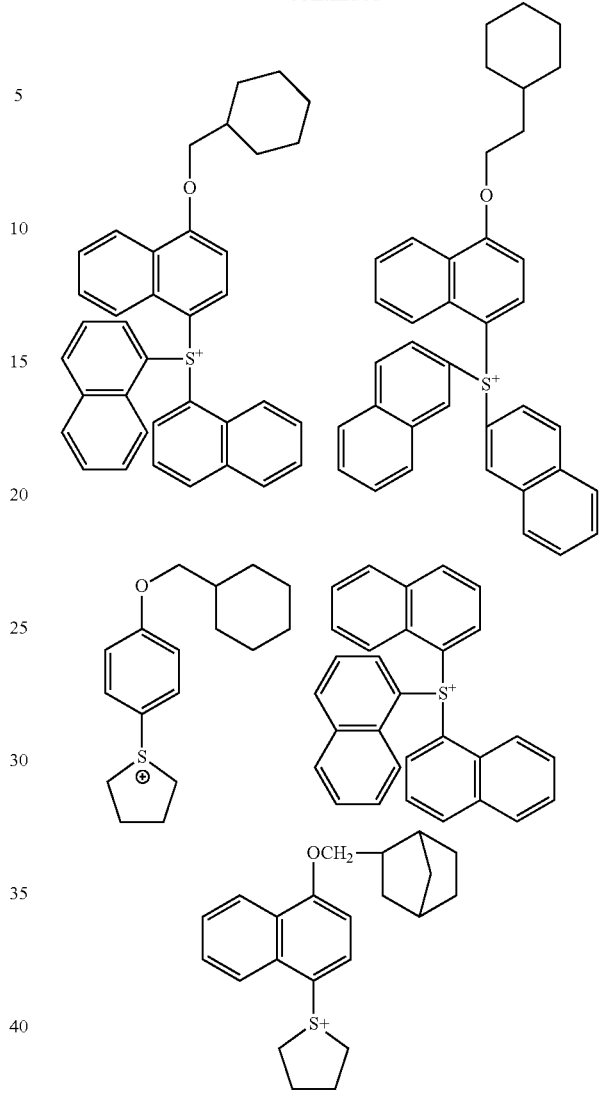

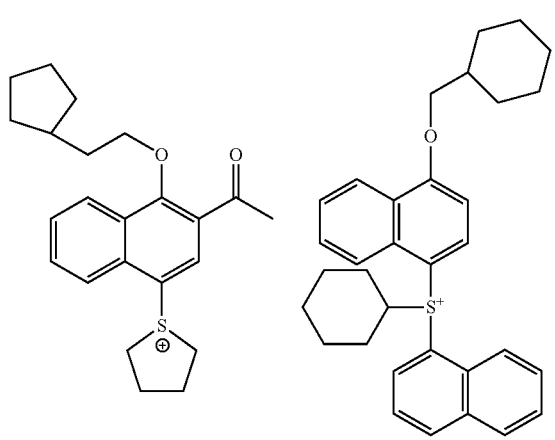

Next, the general formulae (ZII) and (ZIII) will be described.

In the general formulae (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom or the like. Examples of the skeleton of the aryl group having a heterocyclic structure include pyrrole, furan, thiophene, indole, benzofuran, and benzothiophene.

Preferred examples of the alkyl group and cycloalkyl group in $R_{204}$ to $R_{207}$ include a linear or branched alkyl group having 1 to 10 carbon atoms (for example, a methyl group, an ethyl group, a propyl group, a butyl group, a pentyl group), and a cycloalkyl group having 3 to 10 carbon atoms (a cyclopentyl group, a cyclohexyl group, or a norbornyl group).

The aryl group, the alkyl group, and the cycloalkyl group of $R_{204}$ to $R_{207}$ may have a substituent. Examples of the substituent that the aryl group, the alkyl group, and the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents a non-nucleophilic anion, and examples thereof include the same non-nucleophilic anions as mentioned above as $Z^-$ in general formula ZI.

Further examples of the acid generator include compounds represented by the following general formulae (ZIV), (ZV), and (ZVI).

[Chem. 51]

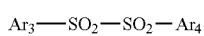
(ZIV)

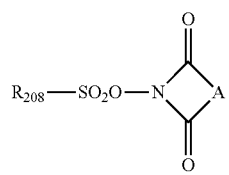
(ZV)

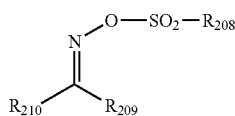
(ZVI)

In the general formulae (ZIV) to (ZVI), $Ar_3$ and $Ar_4$ each independently represent an aryl group;
$R_{208}$, $R_{209}$, and $R_{210}$ each independently represent an alkyl group, a cycloalkyl group, or an aryl group; and
A represents an alkylene group, an alkenylene group, or an arylene group.

Specific examples of the aryl group of $Ar_3$, $Ar_4$, $R_{208}$, $R_{209}$, and $R_{210}$ are the same as specific examples of the aryl group of $R_{201}$, $R_{202}$, and $R_{203}$ in the general formula (ZI-1).

Specific examples of the alkyl group and cycloalkyl group of $R_{208}$, $R_{209}$, and $R_{210}$ are the same as specific examples of the alkyl group and cycloalkyl group of $R_{201}$, $R_{202}$, and $R_{203}$ in the general formula (ZI-2), respectively.

Examples of the alkylene group of A include an alkylene group having 1 to 12 carbon atoms (for example, a methylene group, an ethylene group, a propylene group, an isopropylene group, a butylene group, and an isobutylene group); examples of the alkenylene group of A include an alkenylene group having 2 to 12 carbon atoms (for example, an ethenylene group, a propenylene group, and a butenylene group); and examples of the arylene group of A include an arylene group having 6 to 10 carbon atoms (for example, a phenylene group, a tolylene group, and a naphthylene group).

Among the acid generators, compounds represented by the general formulae (ZI) to (ZIII) are more preferred.

Furthermore, the acid generator is preferably a compound capable of generating an acid having one sulfonic acid group or imide group, more preferably a compound capable of generating a monovalent perfluoroalkanesulfonic acid, a compound capable of generating an aromatic sulfonic acid substituted with a monovalent fluorine atom or a fluorine atom-containing group, or a compound capable of generating an imide acid substituted with a monovalent fluorine atom or a fluorine atom-containing group, and still more preferably a sulfonium salt of a fluoro-substituted alkanesulfonic acid, fluorine-substituted benzenesulfonic acid, fluorine-substituted imide acid or fluorine-substituted methide acid. The acid generator which can be used is particularly preferably a compound capable of generating a fluoro-substituted alkanesulfonic acid, a fluoro-substituted benzenesulfonic acid, or a fluoro-substituted imide acid, wherein pKa of the acid generated is −1 or less, and in this case, the sensitivity of the resin composition can be enhanced.

Particularly preferred examples of the acid generator are shown below.

[Chem. 52]

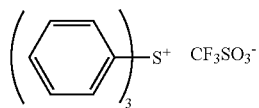
(z1)

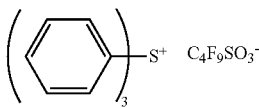
(z2)

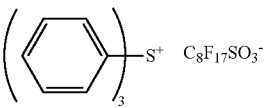
(z3)

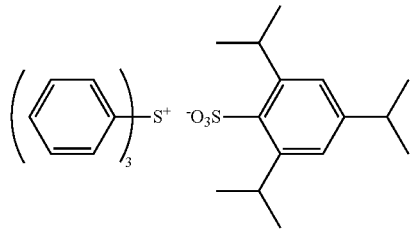
(z4)

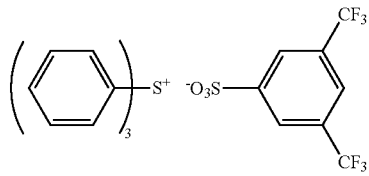
(z5)

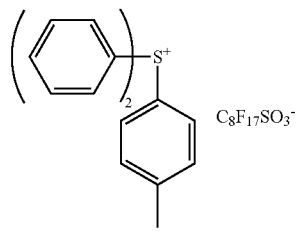
(z6)

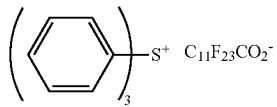
(z7)

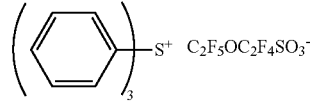
(z8)

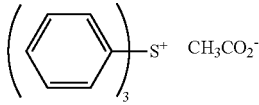
(z9)

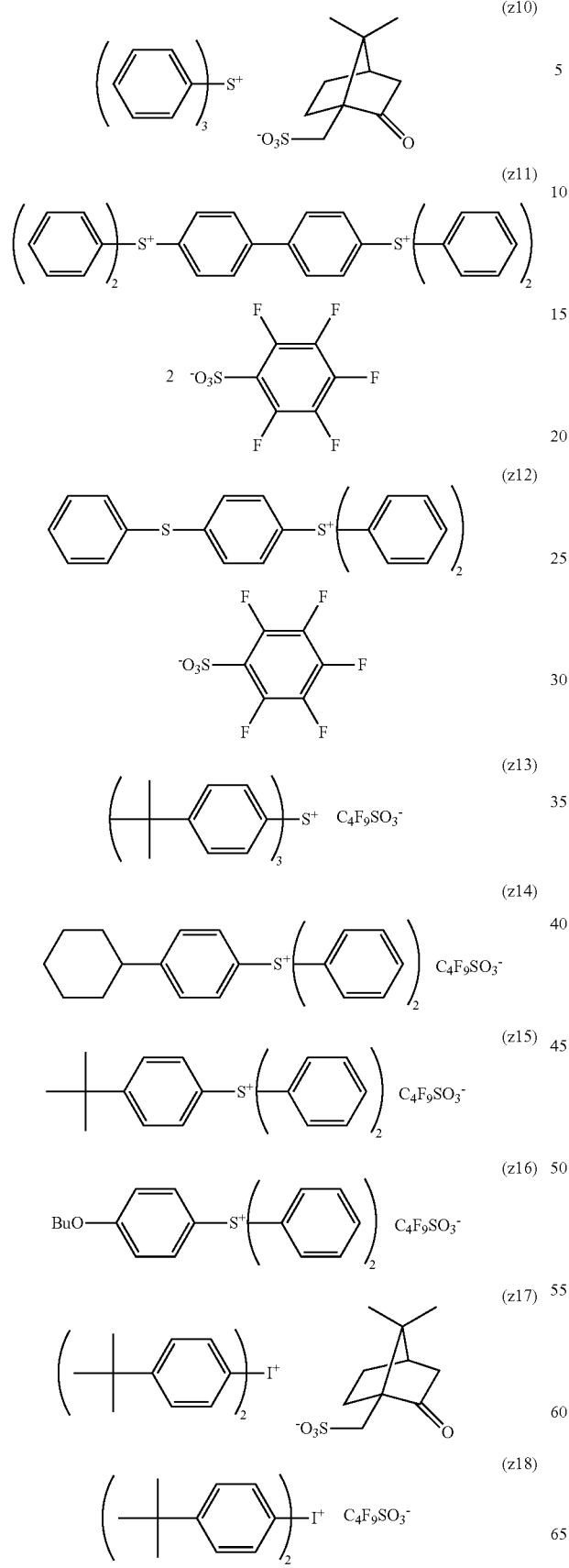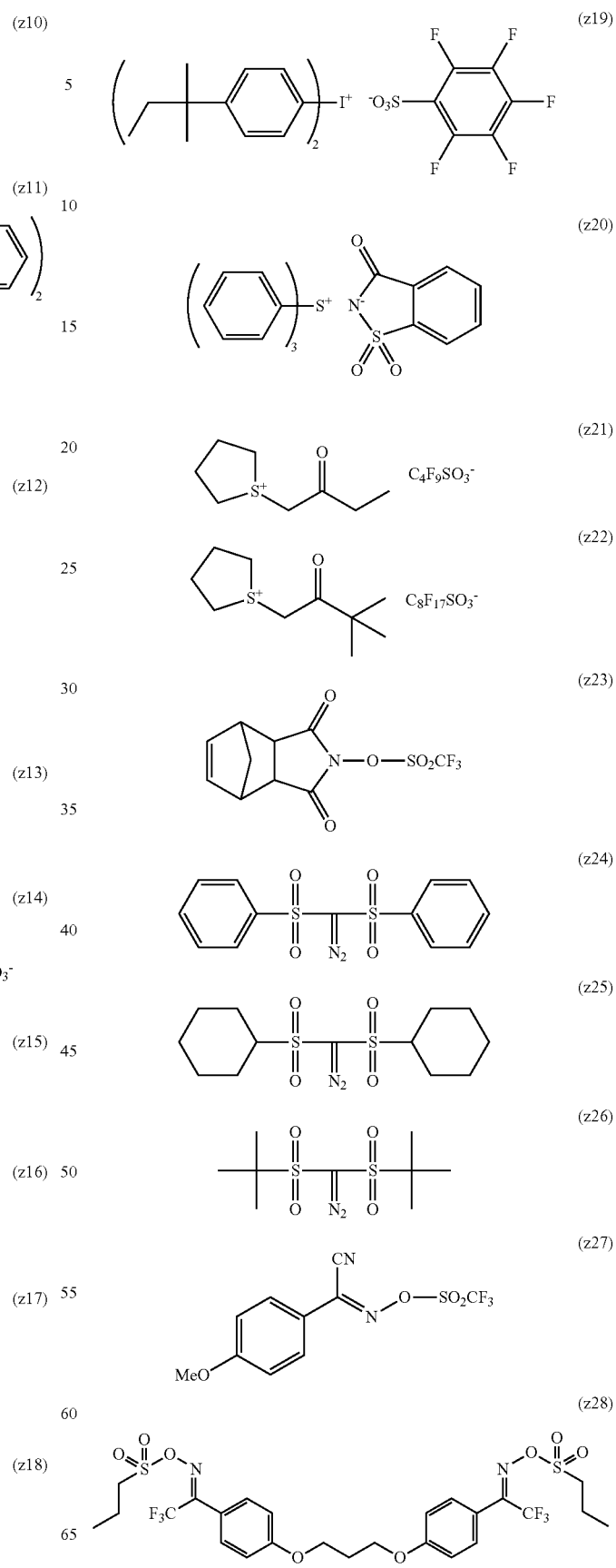

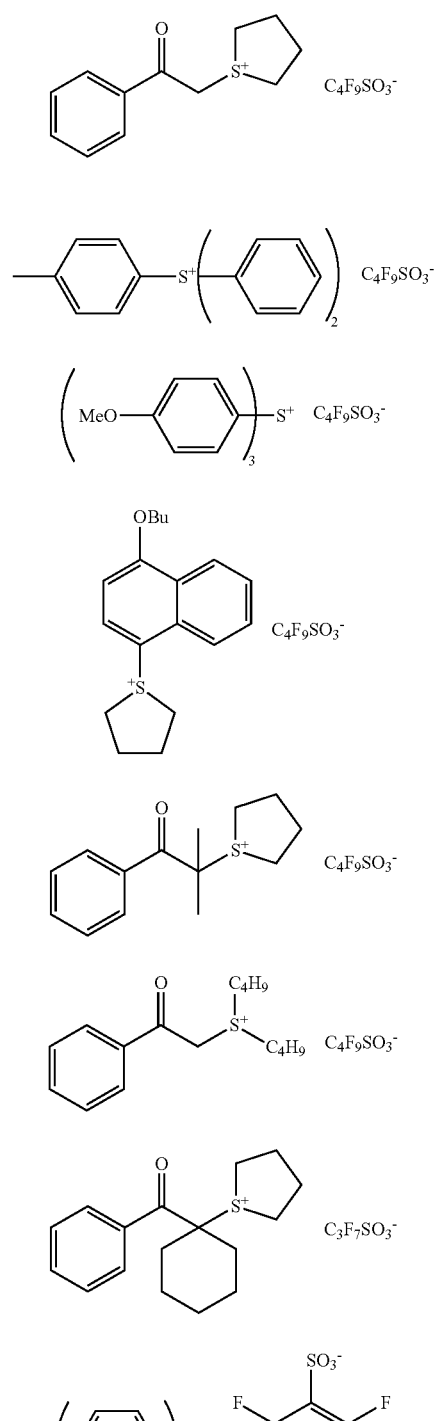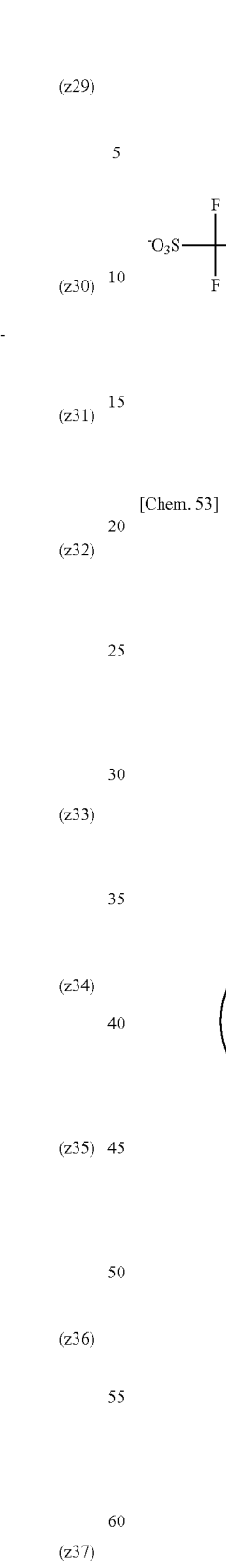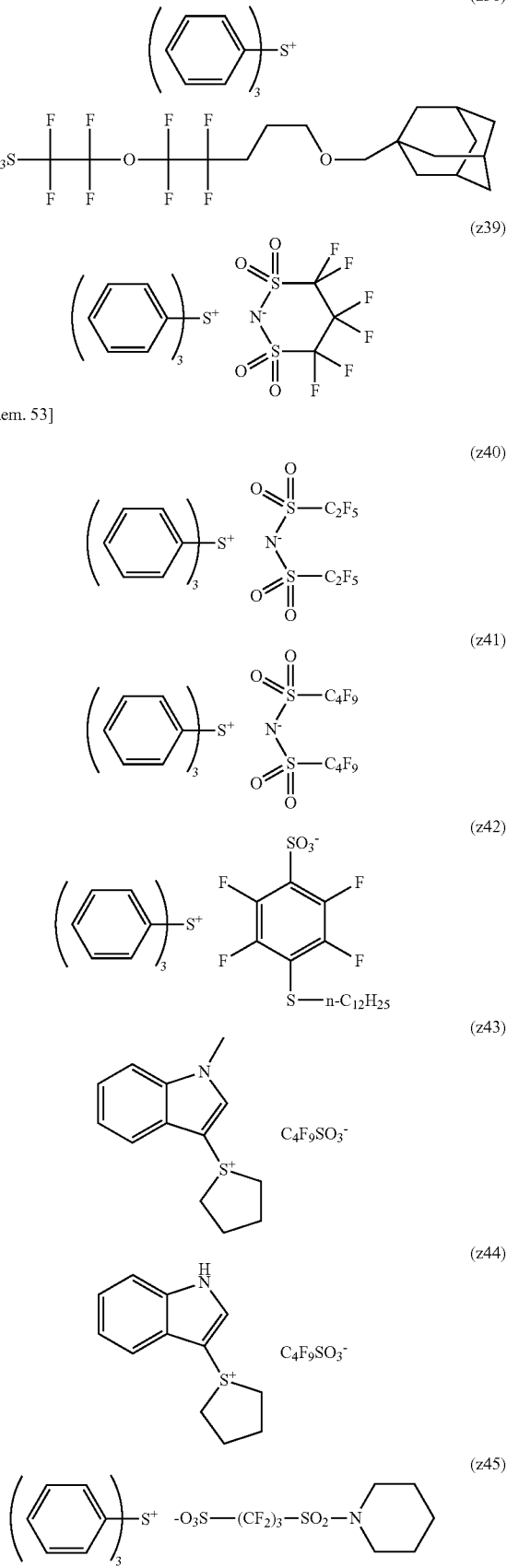

111
-continued
(z46) 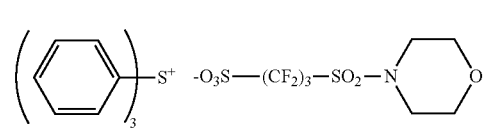
(z47) 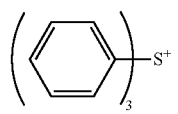
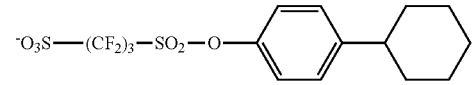
(z48) 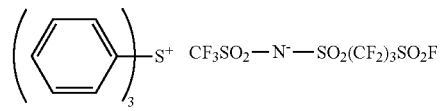
(z49) 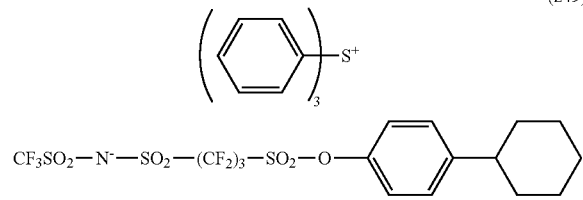
(z50) 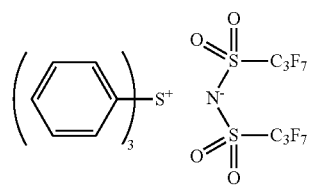
(z51) 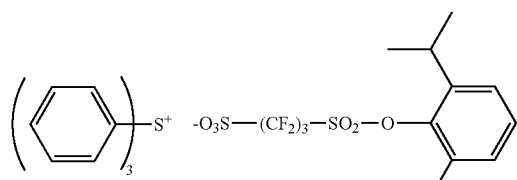
(z52) 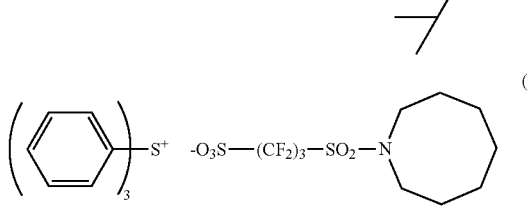
(z53) 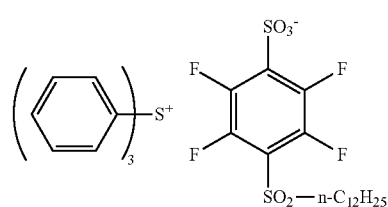
(z54) 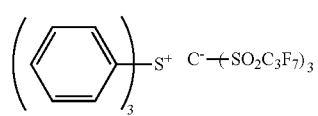
112
-continued
(z55) 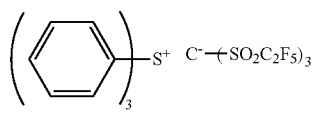
(z56) 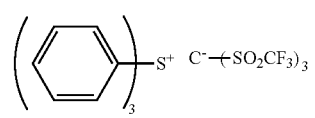
(z57) 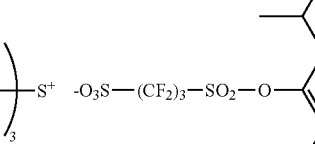
(z58) 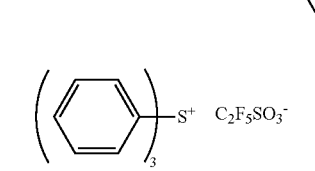
(z59) 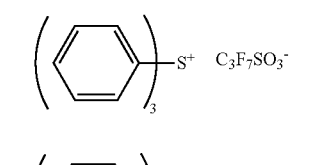
(z60) 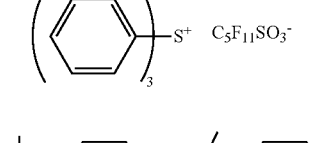
(z61) 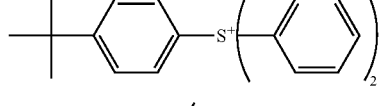
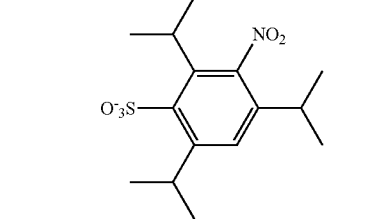
(z62) 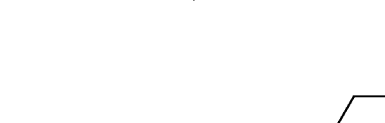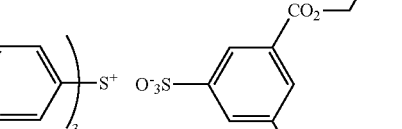

[Chem. 54]

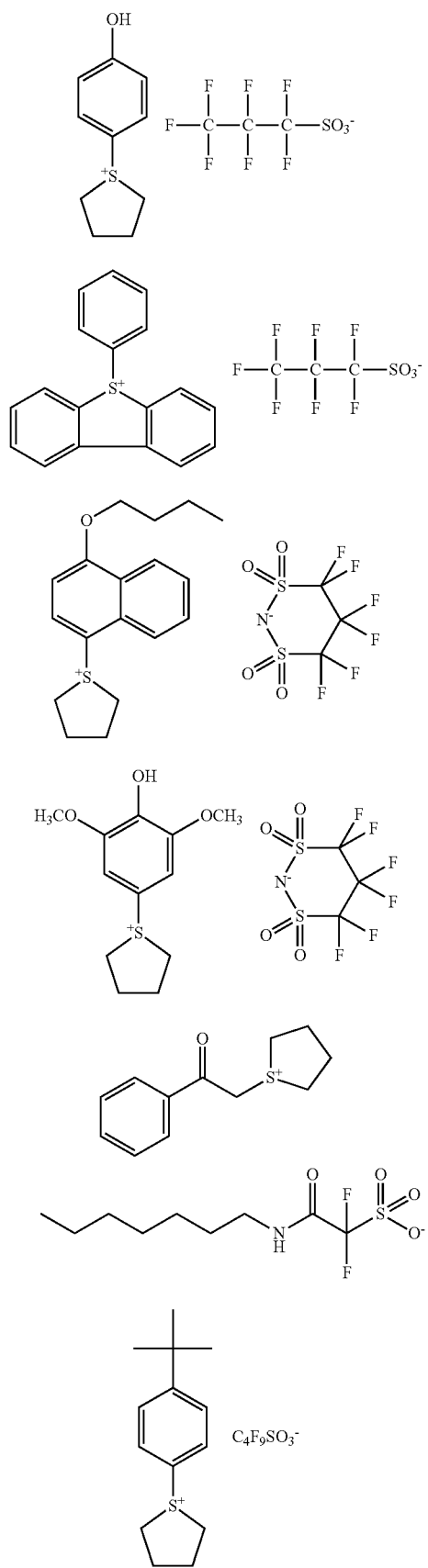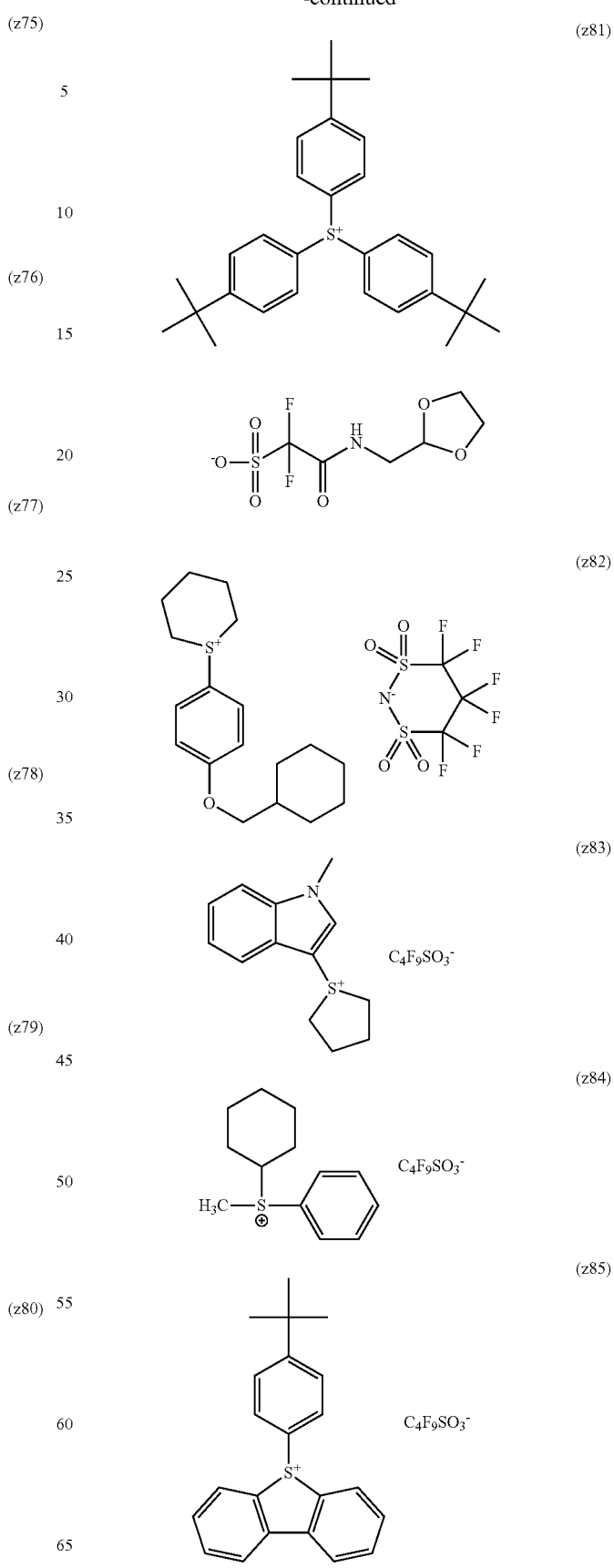

(z86)
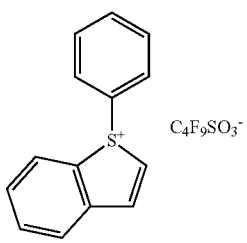
(z87)
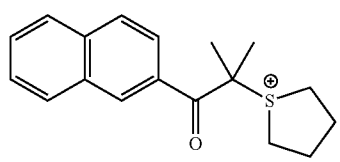
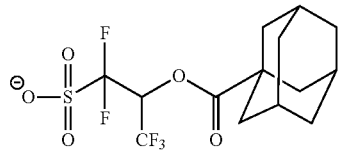
(z88)
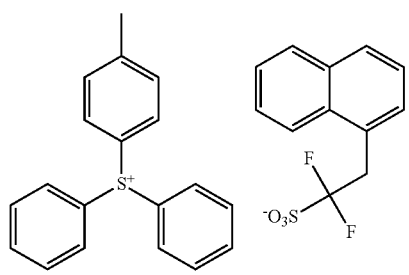
[Chem. 55]
(z89)
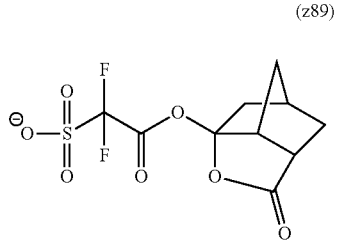
(z90)
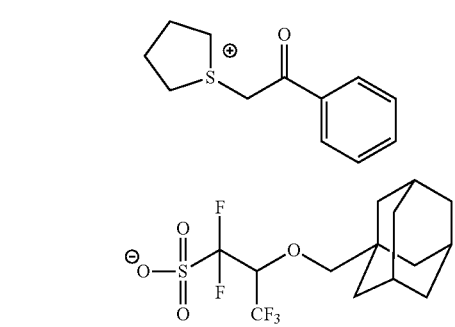
(z91)
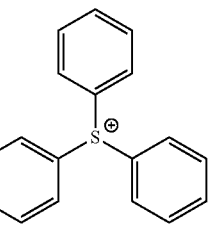
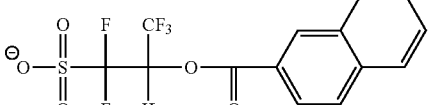
(z92)
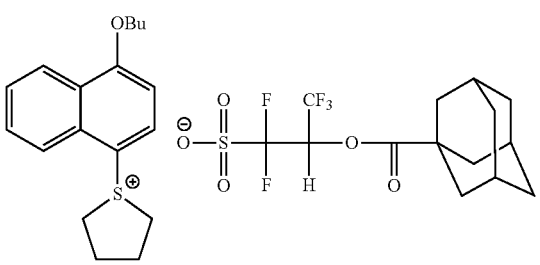
[Chem. 56]
(z93)
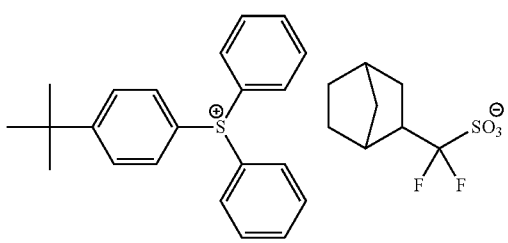
(z94)
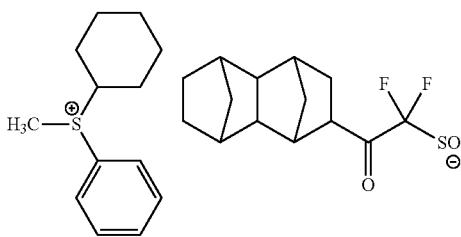
(z95)
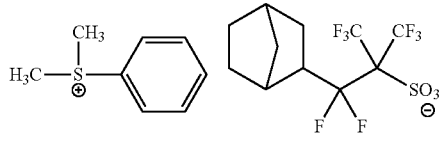
(z96)
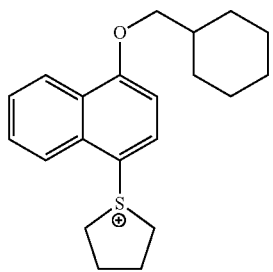

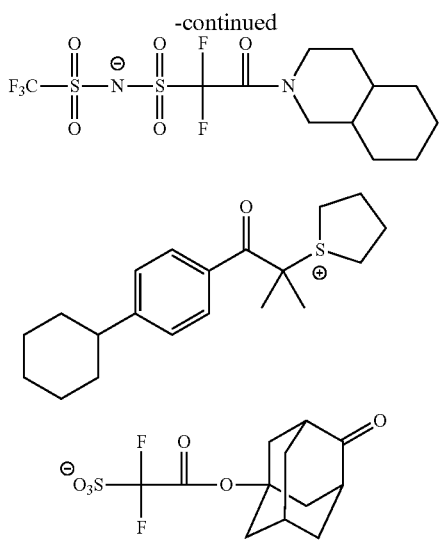

(z97)

(z98)

(z99)

(z100)

(z101)

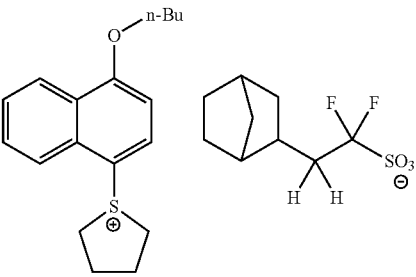

(z102)

The acid generator can be synthesized by a known method, for example, can be synthesized in accordance with the method described in JP2007-161707A.

As for the acid generator, one kind may be used, or two or more kinds may be used in combination.

The content of the compound capable of generating an organic acid upon irradiation with actinic rays or radiation in the composition is preferably from 0.1 to 30% by mass, more preferably from 0.5 to 25% by mass, still more preferably from 3 to 20% by mass, and particularly preferably from 3 to 15% by mass, based on the total solid contents of the actinic ray-sensitive or radiation-sensitive resin composition.

Furthermore, in the case where the acid generator is represented by the general formula (ZI-3) or (ZI-4), the content thereof is preferably from 5 to 35% by mass, more preferably from 8 to 30% by mass, still more preferably from 10 to 30% by mass, and particularly preferably from 10 to 25% by mass, based on the total solid contents of the composition.

[3] Nitrogen-Containing Organic Compound (NA) Having Group Capable of Leaving by Action of Acid The actinic ray-sensitive or radiation-sensitive resin composition used in the invention contains a nitrogen-containing organic compound (NA) having a group capable of leaving by the action of an acid.

The nitrogen-containing organic compound having a group capable of leaving by the action of an acid means a nitrogen-containing organic compound, which exhibits effective basicity in the system when a group capable of leaving by the action of an acid leaves.

The nitrogen-containing organic compound (NA) inhibits the diffusion of the generated acids in the exposed area, and thus, although the reason is not clear, the EL, the local pattern dimensional uniformity, and the rectangularity and circularity of the cross-sectional shape are improved in the formation of a fine pattern such as a hole pattern with a pore diameter of 45 nm or less, and in particular, in the formation of a fine pattern in a liquid-immersion exposure system, the rectangularity and circularity of the cross-sectional shape can be remarkably improved.

The nitrogen-containing organic compound is not particularly limited, but is preferably a compound represented by the following general formula (F).

[Chem. 57]

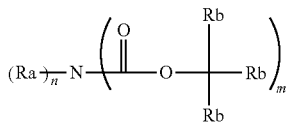

(F)

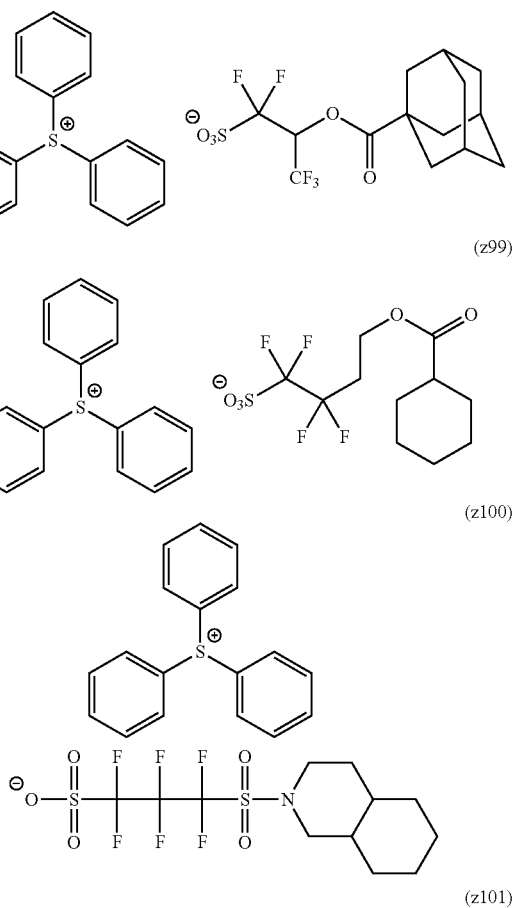

In the general formula (F), Ra independently represents a hydrogen atom, an alkyl group, a cycloalkyl group, an aryl group, an aralkyl group, or a group represented by the following general formula (a1). When n is 2, two Ra's may be the same as or different from each other and the two Ra's may be bonded to each other to form a divalent heterocyclic hydrocarbon group or a derivative thereof.

When m is 2 or 3, plural —C(Rb)(Rb)(Rb)'s may be the same as or different from each other.

Further, the nitrogen-containing organic compound may be a compound having plural structures represented by the general formula (F). For example, the nitrogen-containing organic compound may be a compound having a structure wherein at least one Ra of a compound represented by the general formula (F) is bonded to at least one Ra of another compound represented by the general formula (F).

[Chem. 58]

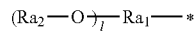

(a1)

In the general formula (a1), $Ra_1$ is a (l+1)-valent aliphatic hydrocarbon group, a benzene ring group, or a group formed by combination of these groups, and $Ra_2$ represents a monovalent group capable of leaving by the action of an acid;

l represents 1 or 2, and when l is 2, two $Ra_2$'s may be the same as or different from each other; and The monovalent group capable of leaving by the action of an acid represented by $Ra_2$ is not particularly limited as long as it is a group capable of leaving by the action of an acid to convert —$ORa_2$ into —OH, but is preferably a group represented by the following general formulae (a4-1) to (a4-3).

[Chem. 59]

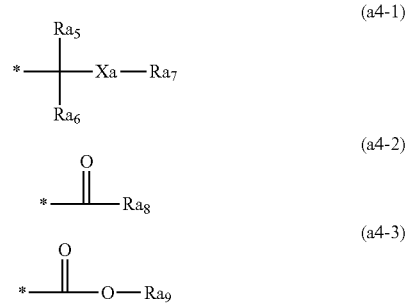

In the formulae (a4-1) to (a4-3), Xa represents an oxygen atom or a sulfur atom. $Ra_5$ and $Ra_6$ each independently represent a hydrogen atom, an alkyl group, or an alkoxyl group. $Ra_7$, $Ra_8$, and $Ra_9$ each independently represent an alkyl group, an alkoxyalkyl group, a cycloalkyl group, an aryl group, or an aralkyl group. In the formula (a4-1), $Ra_5$ and $Ra_7$ may be bonded to each other to form a ring structure.

Rb's each independently represent a hydrogen atom, an alkyl group, a cycloalkyl group, an aryl group, or an aralkyl group, provided that a when one or more Rb's are hydrogen atoms in —C(Rb)(Rb)(Rb), at least one of the remaining Rb's is a cyclopropyl group, an aryl group, or a 1-alkoxyalkyl group. Further, two Rb's may be bonded to each other to form a ring.

n represents an integer of 0 to 2, m represents an integer of 1 to 3, and n+m=3. n=1 and m=2, or n=2 and m=1 is preferred, and n=2 and m=1 is more preferred.

In the general formula (F), each of the alkyl group, the cycloalkyl group, the aryl group, and the aralkyl group represented by Ra and Rb may be substituted with a functional group such as a hydroxyl group, a cyano group, an amino group, a pyrrolidino group, a piperidino group, a morpholino group, and an oxo group, an alkoxy group, or a halogen atom.

The alkyl group represented by Ra may be either linear or branched, but it is preferably an alkyl group having 1 to 15 carbon atoms (for example, a methyl group, an ethyl group, an n-propyl group, an isopropyl group, an n-butyl group, a tert-butyl group, a hexyl group, an octyl group, a decanyl group, and a dodecyl group), more preferably an alkyl group having 2 to 10 carbon atoms (for example, an ethyl group, an n-propyl group, an isopropyl group, an n-butyl group, a tert-butyl group, a hexyl group, an octyl group, and a decanyl group), and still more preferably an alkyl group having 4 to 8 carbon atoms (for example, an n-butyl group, a tert-butyl group, a hexyl group, and an octyl group).

Furthermore, the alkyl group represented by Ra may be a branched alkyl group having plural hydroxyl groups at the end of the branch of a branched alkyl group (for example, an isopropyl group and a tert-butyl group), and a linear alkyl group having plural hydroxyl groups such as a 2,3,4,5,6-pentahydroxyhexyl group.

In addition, at least one carbon atom in the alkyl group may be substituted with a heteroatom such as an oxygen atom.

The cycloalkyl group represented by Ra may be either monocyclic or polycyclic. The monocyclic cycloalkyl group is preferably a cycloalkyl group having 3 to 8 carbon atoms (for example, a cyclopropyl group, a cyclobutyl group, a cyclopentyl group, a cyclohexyl group, and a cyclooctyl group), and more preferably a cycloalkyl group having 5 to 6 carbon atoms (for example, a cyclopentyl group and a cyclohexyl group). The polycyclic cycloalkyl group is preferably a cycloalkyl group having 6 to 20 carbon atoms (for example, an adamantyl group, a norbornyl group, an isobornyl group, a camphanyl group, a dicyclopentyl group, an α-pinel group, a tricyclodecanyl group, a tetracyclododecyl group, and an androstanyl group), and more preferably a cycloalkyl group having 7 to 15 (for example, an adamantyl group, a norbornyl group, an isobornyl group, a camphanyl group, a dicyclopentyl group, an α-pinel group, and a tricyclodecanyl group). Further, at least one carbon atom in the cycloalkyl group may be substituted with a heteroatom such as an oxygen atom.

Examples of the aryl group represented by Ra include a phenyl group, a naphthyl group, and an anthracenyl group.

Examples of the aralkyl group represented by Ra include a benzyl group, and a phenylethyl group.

Furthermore, examples of the divalent heterocyclic hydrocarbon group (preferably having 1 to 20 carbon atoms) formed by the mutual bonding of Ra's, or a derivative thereof include heterocyclic compounds such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, and 1,5,9-triazacyclododecane.

As Ra in the general formula (F), a hydrogen atom, an alkyl group, a cycloalkyl group, an aryl group, an aralkyl group, a group represented by the general formula (a1), and a divalent heterocyclic hydrocarbon group formed by the mutual bonding of two Ra's are preferred, an alkyl group, an aryl group, an aralkyl group, a group represented by the general formula (a1), and a divalent heterocyclic hydrocarbon group formed by the mutual bonding of two Ra's are more preferred, and an alkyl group, and a divalent heterocyclic hydrocarbon group formed by the mutual bonding of two Ra's are still more preferred.

The alkyl group represented by Rb may be either linear or branched, but it is preferably an alkyl group having 1 to 15 carbon atoms (for example, a methyl group, an ethyl group, a propyl group, an n-butyl group, a tert-butyl group, a hexyl group, an octyl group, a decanyl group, and a dodecyl group), more preferably an alkyl group having 1 to 8 carbon atoms (for example, a methyl group, an ethyl group, a propyl group, an n-butyl group, a tert-butyl group, a hexyl group, and an octyl group), and still more preferably an alkyl group having 1 to 4 carbon atoms (for example, a methyl group, an ethyl group, an n-propyl group, an iso-propyl group, an n-butyl group, a tert-butyl group, and a sec-butyl group).

The cycloalkyl group represented by Rb may be either monocyclic or polycyclic. The monocyclic cycloalkyl group is preferably a cycloalkyl group having 3 to 8 carbon atoms (for example, a cyclopropyl group, a cyclobutyl group, a cyclopentyl group, a cyclohexyl group, and a cyclooctyl group), and more preferably a cycloalkyl group having 5 to 6 carbon atoms (for example, a cyclopentyl group and a cyclohexyl group). The polycyclic cycloalkyl group is preferably a cycloalkyl group having 6 to 20 carbon atoms (for example, an adamantyl group, a norbornyl group, an isobornyl group, a camphanyl group, a dicyclopentyl group, an α-pinel group, a tricyclodecanyl group, a tetracyclododecyl group, and an androstanyl group), and more preferably a cycloalkyl group having 7 to 15 (for example, an adamantyl group, a norbornyl group, an isobornyl group, a camphanyl group, a dicyclopentyl group, an α-pinel group, and a tricyclodecanyl group). Further, at least one carbon atom in the cycloalkyl group may be substituted with a heteroatom such as an oxygen atom.

Examples of the aryl group represented by Rb include a phenyl group, a naphthyl group, and an anthracenyl group.

Examples of the aralkyl group represented by Rb include a benzyl group a phenylethyl group.

The ring formed by the mutual bonding of at least 2 two Rb's preferably has 3 to 20 carbon atoms, may be a monocycle such as a cyclopentyl group and a cyclohexyl group, or may be a polycycle such as a norbornyl group, an adamantyl group, a tetracyclodecanyl group, and a tetracyclododecanyl group. In the case where two Rb's are bonded to each other to form a ring, the remaining Rb's is preferably an alkyl group having 1 to 4 carbon atoms, and more preferably an alkyl group having 1 to 2 carbon atoms.

As Rb in the general formula (F), an alkyl group, a cycloalkyl group, and a group formed by the mutual bonding of two Rb's are preferred, and as —C(Rb)(Rb)(Rb), groups represented by —C(alkyl group)(alkyl group)(alkyl group), —C(alkyl group)(alkyl group)(cycloalkyl group), and —C(alkyl group)(ring formed by the mutual bonding of two Rb's) are more preferred, and —C(alkyl group)(alkyl group)(alkyl group) is most preferred.

Examples of the (l+1)-valent aliphatic hydrocarbon group for Ra₁ include alkylene groups as a divalent aliphatic hydrocarbon group, and aliphatic hydrocarbon groups formed by removing one hydrogen atom from an alkylene group as a trivalent aliphatic hydrocarbon group. As the alkylene group, an alkylene group having 1 to 15 carbon atoms is preferred, examples thereof include a methylene group, an ethylene group, and a propylene group, and examples of the trivalent aliphatic hydrocarbon group include the groups formed by removing one hydrogen atom from those groups.

Examples of the (l+1)-valent benzene ring group for Ra₁ include a phenylene group as a divalent benzene ring group, and examples of the trivalent benzene ring group include the groups formed by removing one hydrogen atom from a phenylene group.

Specific examples of the nitrogen-containing organic compound having a group capable of leaving by the action of an acid in the invention are shown below.

[Chem. 60]

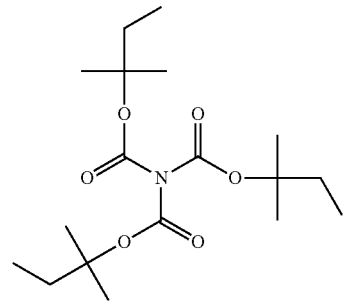

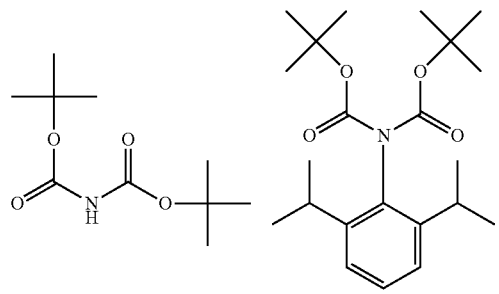

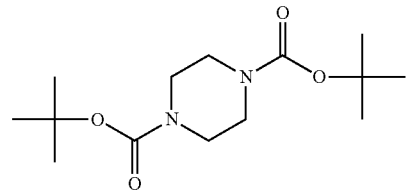

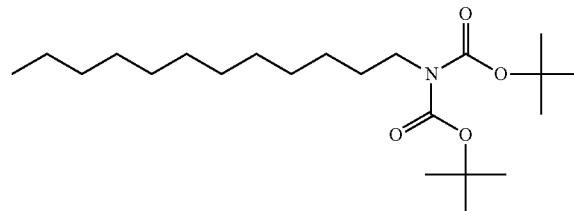

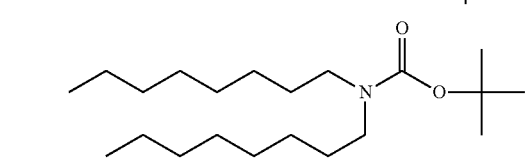

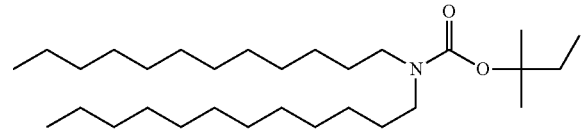

125
-continued
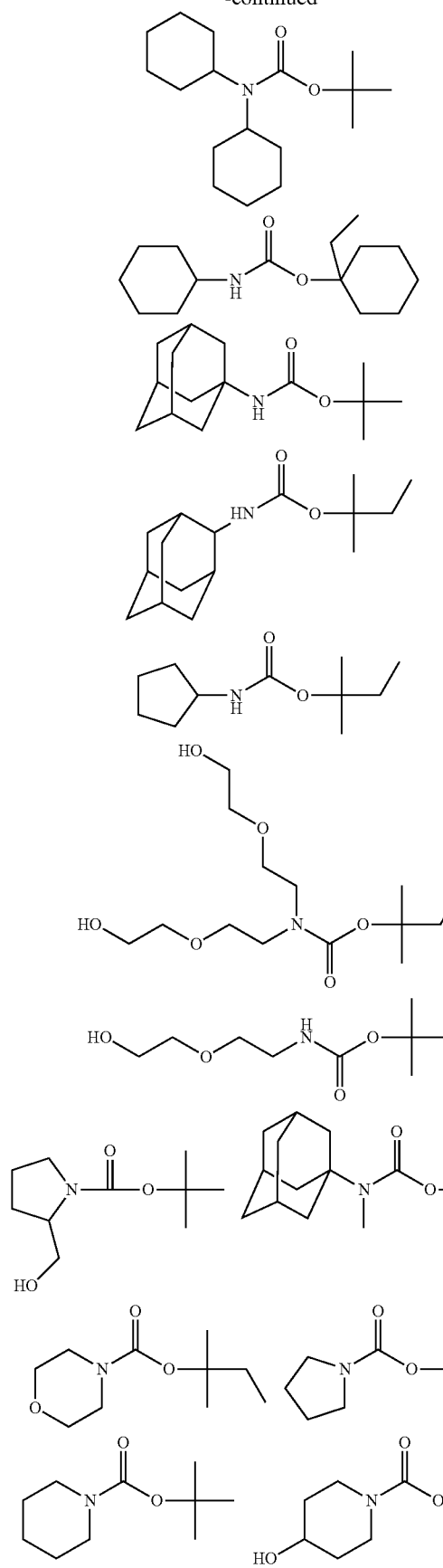
126
-continued
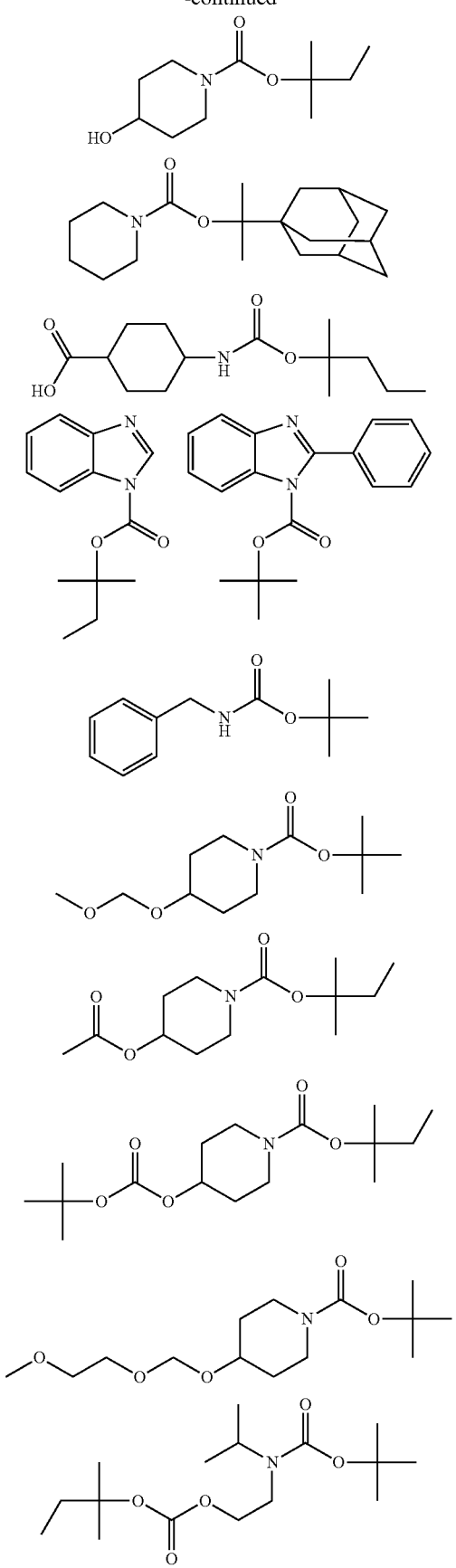

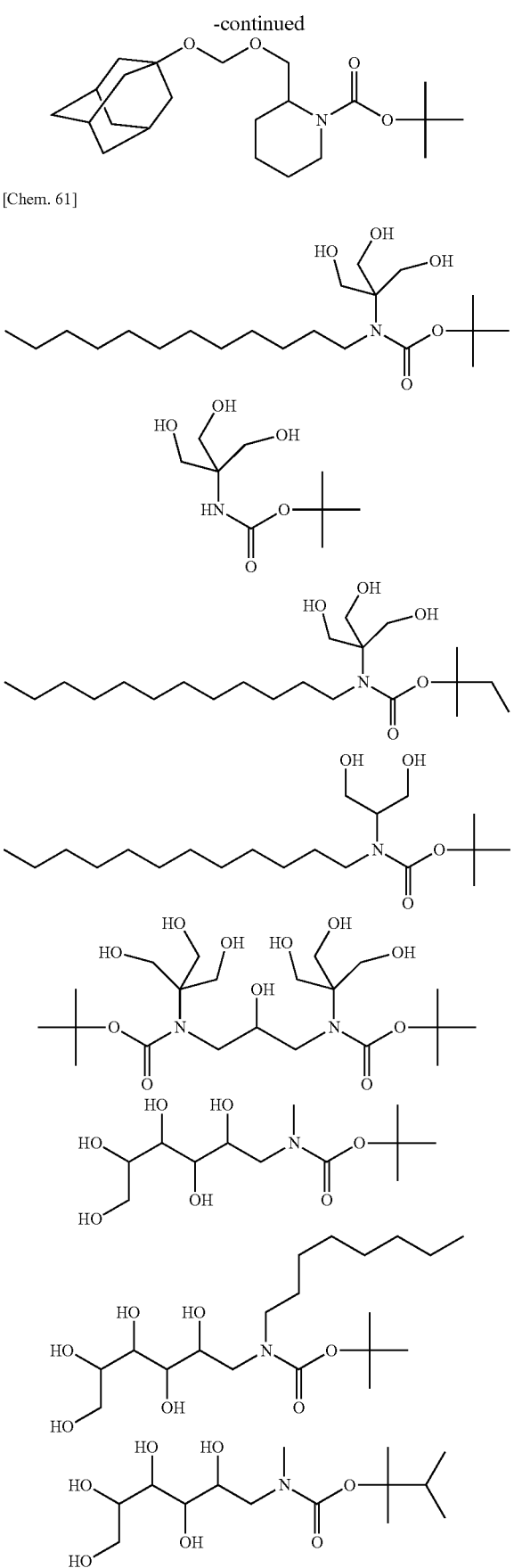

[Chem. 61]

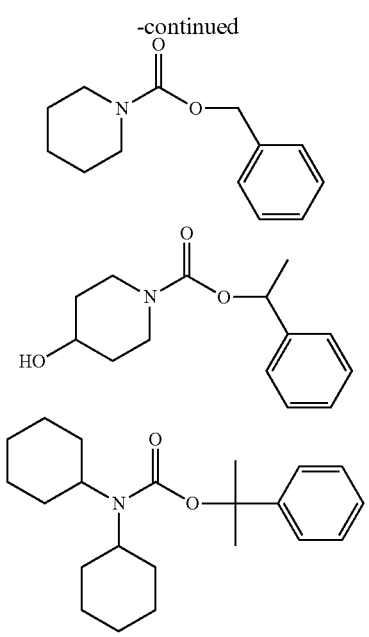

The compound represented by the general formula (F) to be used may be commercially available or may be synthesized, for example, from a commercially available amine by the method described in Protective Groups in Organic Synthesis, $4^{th}$ edition, and the like. In particular, it may also be synthesized in accordance with, for example, a method described in JP2009-199021A as a general method.

In the invention, the nitrogen-containing organic compound (NA) having a group capable of leaving by the action of an acid may be used singly or in combination of two or more kinds thereof.

The content of the nitrogen-containing organic compound (NA) having a group capable of leaving by the action of an acid in the actinic ray-sensitive or radiation-sensitive resin composition of the invention is preferably from 0.001 to 20% by mass, more preferably from 0.001 to 10% by mass, and still more preferably from 0.01 to 5% by mass, based on the total solid contents of the composition.

[4-1] Basic Compound or Ammonium Salt Compound Capable of Decreasing Basicity Upon Irradiation with Actinic Ray or Radiation (C)

The actinic ray-sensitive or radiation-sensitive resin composition in the invention preferably contains a basic compound or ammonium salt compound capable of decreasing the basicity upon irradiation with actinic rays or radiation (hereinafter also referred to as a "compound (C)").

The compound (C) is preferably a compound (C-1) having a basic functional group or a group capable of generating an acidic functional group upon irradiation with actinic rays or radiation together ammonium. That is, the compound (C) is preferably a basic compound having a basic functional group and a group capable of generating an acidic functional group upon irradiation with actinic rays or radiation, or an ammonium salt compound having a group capable of generating an acidic functional group upon irradiation with actinic rays or radiation together ammonium.

Specific examples of the compound include compounds in which an anion resulting from elimination of a proton from an acidic functional group of a compound having a basic functional group or an ammonium group is combined with an onium cation to form a salt.

Here, examples of the basic functional group include atomic groups including a structure such as a crown ether structure, a primary to tertiary amine structure, and a nitrogen-containing heterocyclic structure (for example, pyridine, imidazole, and pyrazine). Further, as the basic functional group, a functional group containing a nitrogen atom is preferred, and a structure having a primary to tertiary amine group or a nitrogen-containing heterocyclic structure is more preferred. In these structures, it is preferable that all the atoms adjacent to the nitrogen atom contained in the structure be carbon atoms or hydrogen atoms, from the viewpoint of improvement of basicity. In addition, it is preferable that an electron-withdrawing functional group (for example, a carbonyl group, a sulfonyl group, a cyano group, and a halogen atom) be not directly bonded to the nitrogen atom, from the viewpoint of improvement of basicity.

Examples of the acidic functional group include a carboxyl acid group, a sulfonic acid group, and a group having an —X—NH—X— (X=CO or $SO_2$).

Examples of the onium cation include a sulfonium cation and an iodonium cation, more specifically those described as the cation portions of the general formulae (ZI) and (ZII) of the B) acid generator.

The compound which is generated due to decomposition of the compound (C) or (C-1) upon irradiation with actinic rays or radiation and decreased in basicity includes compounds represented by the following general formulae (PA-I), (PA-II), and (PA-III), and from the viewpoint that excellent effects can be attained in a high level in terms of both LWR and local critical dimensional uniformity and (DOF), compounds represented by the general formulae (PA-II) and (PA-III) are preferred.

First, the compound represented by the general formula (PA-I) will be described.

Q-A₁—(X)ₙ—B—R     (PA-I)

In the general formula (PA-I), $A_1$ represents a single bond or a divalent linking group;

Q represents —$SO_3H$ or —$CO_2H$;

Q corresponds to an acidic functional group that is generated upon irradiation with actinic rays or radiation;

X represents —$SO_2$— or —CO—;

n represents 0 or 1;

B represents a single bond, an oxygen atom, or —N(Rx)-;

Rx represents a hydrogen atom or a monovalent organic group; and

R represents a monovalent organic group having a basic functional group, or a monovalent organic group having an ammonium group.

The divalent linking group in $A_1$ is preferably a divalent linking group having 2 to 12 carbon atoms, and examples thereof include an alkylene group and a phenylene group. The divalent linking group is more preferably an alkylene group having at least one fluorine atom, preferably having 2 to 6 carbon atoms, and more preferably 2 to 4 carbon atoms. The alkylene chain may contain a linking group such as an oxygen atom and a sulfur atom. The alkylene group is particularly preferably an alkylene group where from 30 to 100% by number of the hydrogen atoms are substituted with a fluorine atom, more preferably an alkylene group where the carbon atom bonded to the Q site has a fluorine atom, still more preferably a perfluoroalkylene group, and even still more preferably a perfluoroethylene group, a perfluoropropylene group, or a perfluorobutylene group.

The monovalent organic group in Rx is preferably a monovalent organic group having 4 to 30 carbon atoms, and examples thereof include an alkyl group, a cycloalkyl group, an aryl group, an aralkyl group, and an alkenyl group.

The alkyl group in Rx may have a substituent and is preferably a linear or branched alkyl group having 1 to 20 carbon atoms, and the alkyl chain may contain an oxygen atom, a sulfur atom, or a nitrogen atom.

Further, the alkyl group having a substituent includes a group where a cycloalkyl group is substituted particularly on a linear or branched alkyl group (for example, an adamantylmethyl group, an adamantylethyl group, a cyclohexylethyl group, and a camphor residue).

The cycloalkyl group in Rx may have a substituent and is preferably a cycloalkyl group having 3 to 20 carbon atoms, and the cycloalkyl group may contain an oxygen atom in the ring.

The aryl group in Rx may have a substituent and is preferably an aryl group having 6 to 14 carbon atoms.

The aralkyl group in Rx may have a substituent and is preferably an aralkyl group having 7 to 20 carbon atoms.

The alkenyl group in Rx may have a substituent and includes, for example, a group having a double bond at an arbitrary position of the alkyl group described as Rx.

Preferred examples of the partial structure of the basic functional group include a crown ether structure, a primary to tertiary amine structure, and a nitrogen-containing heterocyclic structure (for example, pyridine, imidazole, pyrazine).

Preferred examples of the partial structure of the ammonium group include a primary to tertiary ammonium structure, a pyridinium structure, an imidazolinium structure and a pyrazinium structure.

The basic functional group is preferably a functional group having a nitrogen atom, more preferably a structure having a primary to tertiary amino group or a nitrogen-containing heterocyclic structure. In these structures, from the viewpoint of enhancing the basicity, it is preferred that all atoms adjacent to a nitrogen atom contained in the structure be a carbon atom or a hydrogen atom. Further, in view of enhancing the basicity, an electron-withdrawing functional group (for example, carbonyl group, sulfonyl group, cyano group, halogen atom) is preferably not bonded directly to the nitrogen atom.

The monovalent organic group in the monovalent organic group (group R) containing such a structure is preferably an organic group having 4 to 30 carbon atoms, and examples thereof include an alkyl group, a cycloalkyl group, an aryl group, an aralkyl group and an alkenyl group. These groups each may have a substituent.

The alkyl group, cycloalkyl group, aryl group, aralkyl group and alkenyl group in the basic functional group- or ammonium group-containing alkyl, cycloalkyl, aryl, aralkyl and alkenyl groups of R are the same as the alkyl group, the cycloalkyl group, the aryl group, the aralkyl group, and the alkenyl group described for Rx.

Examples of the substituent which the respective groups above may have include a halogen atom, a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). As for the cyclic structure in the aryl group, the cycloalkyl group, and the like, the substituent further includes an alkyl group (preferably having 1 to 20 carbon atoms). As for the aminoacyl group, the substituent further includes one or two alkyl groups (preferably having 1 to 20 carbon atoms).

In the case where B is —N(Rx)-, R and Rx preferably are bonded to each other to form a ring. By virtue of forming a ring structure, the stability is enhanced and the composition using this compound is also enhanced in the storage stability. The number of carbon atoms constituting the ring is preferably from 4 to 20, and the ring may be monocyclic or polycyclic and may contain an oxygen atom, a sulfur atom, or a nitrogen atom in the ring.

Examples of the monocyclic structure include a 4- to 8-membered ring containing a nitrogen atom. Examples of the polycyclic structure include a structure composed of a combination of two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), and an aminoacyl group (preferably having 2 to 20 carbon atoms). As for the cyclic structure in the aryl group, cycloalkyl group and the like, the substituent further includes an alkyl group (preferably having 1 to 15 carbon atoms). As for the aminoacyl group, the substituent includes one or two alkyl groups (preferably having 1 to 15 carbon atoms).

Out of the compounds represented by the general formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

Next, the compound represented by the general formula (PA-II) is described.

$Q_1\text{-}X_1\text{—NH—}X_2\text{-}Q_2$ (PA-II)

In the general formula (PA-II), $Q_1$ and $Q_2$ each independently represent a monovalent organic group, provided that any one of $Q_1$ and $Q_2$ has a basic functional group, and it also possible that $Q_1$ and $Q_2$ be bonded to each other to form a ring and the ring formed have a basic functional group; and $X_1$ and $X_2$ each independently represent —CO— or —SO$_2$—.

Here, —NH— corresponds to the acidic functional group generated upon irradiation with actinic rays or radiation.

The monovalent organic group as $Q_1$ and $Q_2$ in the general formula (PA-II) is preferably a monovalent organic group having 1 to 40 carbon atoms, and examples thereof include an alkyl group, a cycloalkyl group, an aryl group, an aralkyl group, and an alkenyl group.

The alkyl group in $Q_1$ and $Q_2$ may have a substituent and is preferably a linear or branched alkyl group having 1 to 30 carbon atoms, and the alkyl chain may contain an oxygen atom, a sulfur atom, or a nitrogen atom.

The cycloalkyl group in $Q_1$ and $Q_2$ may have a substituent and is preferably a cycloalkyl group having 3 to 20 carbon atoms, and the ring may contain an oxygen atom or a nitrogen atom.

The aryl group in $Q_1$ and $Q_2$ may have a substituent and is preferably an aryl group having 6 to 14 carbon atoms.

The aralkyl group in $Q_1$ and $Q_2$ may have a substituent and is preferably an aralkyl group having 7 to 20 carbon atoms.

The alkenyl group in $Q_1$ and $Q_2$ may have a substituent and includes a group having a double bond at an arbitrary position of the alkyl group above.

Examples of the substituent which each of these groups may have include a halogen atom, a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 10 carbon atoms). As for the cyclic structure in the aryl group, cycloalkyl group and the like, examples of the substituent further include an alkyl group (preferably having 1 to 10 carbon atoms). As for the aminoacyl group, examples of the substituent further include an alkyl group (preferably having 1 to 10 carbon atoms). Examples of the alkyl group having a substituent include a perfluoroalkyl group such as a perfluoromethyl group, a perfluoroethyl group, a perfluoropropyl group, and a perfluorobutyl group.

Preferred examples of the partial structure of the basic functional group which at least either $Q_1$ and $Q_2$ has are the same as those of the basic functional group in R of the general formula (PA-I).

In the case where $Q_1$ and $Q_2$ are bonded to each other to form a ring and the ring formed has a basic functional group, examples of the structure thereof include a structure where the organic group of $Q_1$ or $Q_2$ is further bonded to an alkylene group, an oxy group, an imino group, or the like.

In the general formula (PA-II), at least one of $X_1$ and $X_2$ is preferably —SO$_2$—.

Next, the compound represented by the general formula (PA-III) will be described.

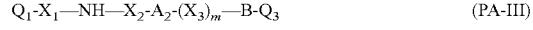

$Q_1\text{-}X_1\text{—NH—}X_2\text{-}A_2\text{-}(X_3)_m\text{—B-}Q_3$ (PA-III)

In the general formula (PA-III), $Q_1$ and $Q_3$ each independently represent a monovalent organic group, provided that any one of $Q_1$ and $Q_3$ has a basic functional group. It is also possible that $Q_1$ and $Q_3$ be bonded to each other to form a ring and the ring formed have a basic functional group;

$X_1$, $X_2$, and $X_3$ each independently represent —CO— or —SO$_2$—;

$A_2$ represents a divalent linking group;

B represents a single bond, an oxygen atom or —N(Qx)-; and

Qx represents a hydrogen atom or a monovalent organic group.

In the case where B is —N(Qx)-, $Q_3$ and Qx may are bonded to each other to form a ring.

m represents 0 or 1.

Here, —NH— corresponds to the acidic functional group generated upon irradiation with actinic rays or radiation.

$Q_1$ has the same meaning as $Q_1$ in the general formula (PA-II).

Examples of the organic group of $Q_3$ are the same as those of the organic group of $Q_1$ and $Q_2$ in the general formula (PA-II).

Incidentally, in the case where $Q_1$ and $Q_3$ are bonded to each other to form a ring and the ring formed has a basic functional group, examples of the structure thereof include a structure where the organic group of $Q_1$ or $Q_3$ is further bonded to an alkylene group, an oxy group, an imino group or the like.

The divalent linking group in $A_2$ is preferably a divalent linking group having 1 to 8 carbon atoms and containing a fluorine atom, and examples thereof include a fluorine atom-containing alkylene group having 1 to 8 carbon atoms, and a fluorine atom-containing phenylene group. A fluorine atom-containing alkylene group is more preferred, and the carbon number thereof is preferably from 2 to 6, more preferably from 2 to 4. The alkylene chain may contain a linking group such as an oxygen atom and a sulfur atom. The alkylene group is preferably an alkylene group where from 30 to 100% by number of the hydrogen atom is substituted with a fluorine atom, more preferably a perfluoroalkylene group, and still more preferably a perfluoroethylene group having 2 to 4 carbon atoms.

The monovalent organic group in Qx is preferably an organic group having 4 to 30 carbon atoms, and examples thereof include an alkyl group, a cycloalkyl group, an aryl group, an aralkyl group and an alkenyl group. Examples of the alkyl group, the cycloalkyl group, the aryl group, the aralkyl group, and the alkenyl group are the same as those for Rx in the general formula (PA-I).

In the general formula (PA-III), each of $X_1$, $X_2$, and $X_3$ is preferably —$SO_2$—.

The compound (C) is preferably a sulfonium salt compound of the compound represented by the general formula (PA-I), (PA-II), or (PA-III), or an iodonium salt compound of the compound represented by the general formula (PA-I), (PA-II), or (PA-III), and more preferably a compound represented by the following formula (PA1) or (PA2).

[Chem. 62]

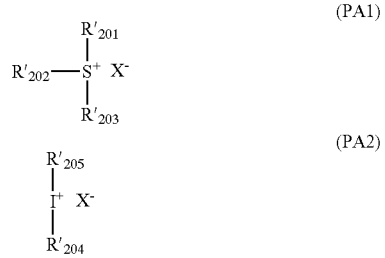

(PA1)

(PA2)

In the general formula (PA1), $R'_{201}$, $R'_{202}$, and $R'_{203}$ each independently represent an organic group, and specific examples thereof are the same as those for $R'_{201}$, $R'_{202}$, and $R'_{203}$ of the general formula ZI in the component (B).

$X^-$ represents a sulfonate or carboxylate anion resulting from elimination of a hydrogen atom in the —$SO_3H$ moiety or —COOH moiety of the compound represented by the general formula (PA-I), or an anion resulting from elimination of a hydrogen atom in the —NH— moiety of the compound represented by the general formula (PA-II) or (PA-III).

In the general formula (PA2), $R'_{204}$ and $R'_{205}$ each independently represent an aryl group, an alkyl group, or a cycloalkyl group, and specific examples thereof are the same as those for $R_{204}$ and $R_{205}$ of the formula ZII in the component (B).

$X^-$ represents a sulfonate or carboxylate anion resulting from elimination of a hydrogen atom in the —$SO_3H$ moiety or —COOH moiety of the compound represented by the general formula (PA-I), or an anion resulting from elimination of a hydrogen atom in the —NH— moiety of the compound represented by the general formula (PA-II) or (PA-III).

The compound (C) decomposes upon irradiation with actinic rays or radiation to generate, for example, a compound represented by the general formula (PA-I), (PA-II), or (PA-III).

The compound represented by the general formula (PA-I) is a compound having a sulfonic or carboxylic acid group together with a basic functional group or an ammonium group and thereby being reduced in or deprived of the basicity or changed from basic to acidic as compared with the compound (C).

The compound represented by the general formula (PA-II) or (PA-III) is a compound having an organic sulfonylimino or organic carbonylimino group together with a basic functional group and thereby being reduced in or deprived of the basicity or changed from basic to acidic as compared with the compound (C).

In the invention, the expression "reduced in basicity upon irradiation with actinic rays or radiation" means that the acceptor property for a proton (an acid generated upon irradiation with actinic rays or radiation) of the compound (C) is decreased upon irradiation with actinic rays or radiation. The expression "the acceptor property is decreased" means that when an equilibrium reaction of producing a non-covalent bond complex as a proton adduct from a basic functional group-containing compound and a proton takes place or when an equilibrium reaction of causing the counter cation of the ammonium group-containing compound to be exchanged with a proton takes place, the equilibrium constant in the chemical equilibrium decreases.

In this way, the resist film contains a compound (C) capable of decreasing the basicity upon irradiation with actinic rays or radiation, so that in the unexposed area, the acceptor property of the compound (C) is sufficiently brought out and an unintended reaction between an acid diffused from the exposed area or the like and the resin (P) can be inhibited, whereas in the exposed area, the acceptor property of the compound (C) decreases and the intended reaction of an acid with the resin (P) unfailingly occurs. Such an operation mechanism is considered to contribute to obtaining a pattern excellent in terms of line width variation (LWR), focus latitude (DOF), and pattern profile.

Incidentally, the basicity can be confirmed by measuring the pH, or a calculated value can be computed using commercially available software.

Specific examples of the compound (C) capable of generating a compound represented by the general formula (PA-I) upon irradiation with actinic rays or radiation are illustrated below, but the invention is not limited thereto.

[Chem. 63]

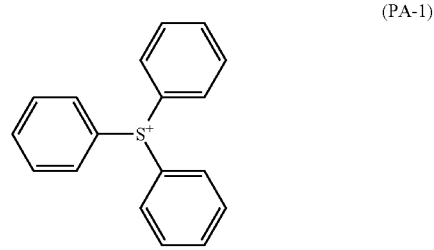

(PA-1)

-continued
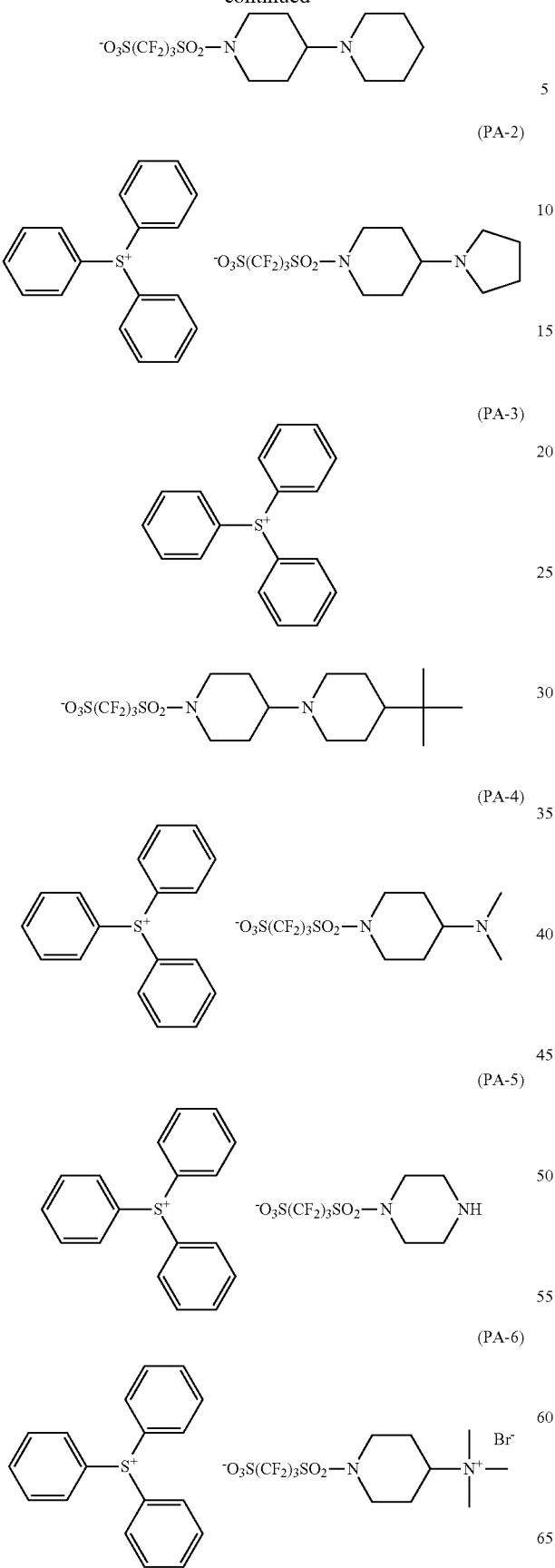
(PA-2)
(PA-3)
(PA-4)
(PA-5)
(PA-6)
-continued
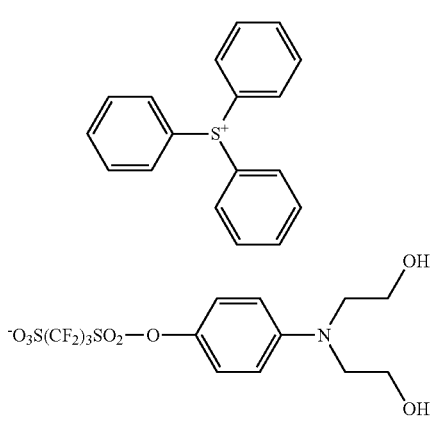
(PA-7)
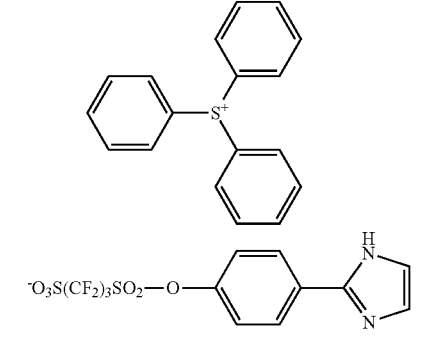
(PA-8)
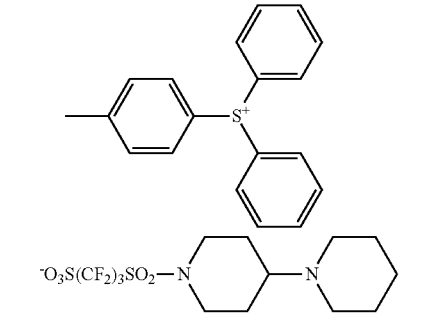
(PA-9)
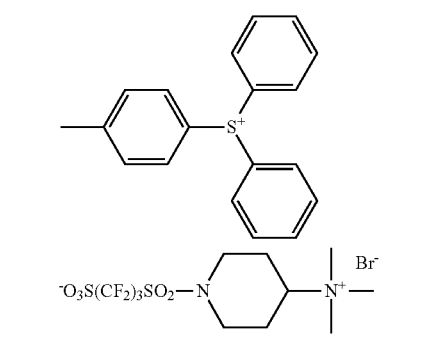
(PA-10)
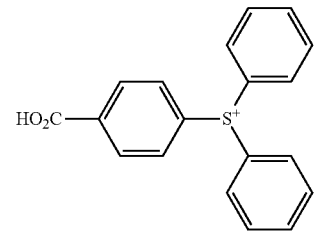
(PA-11)

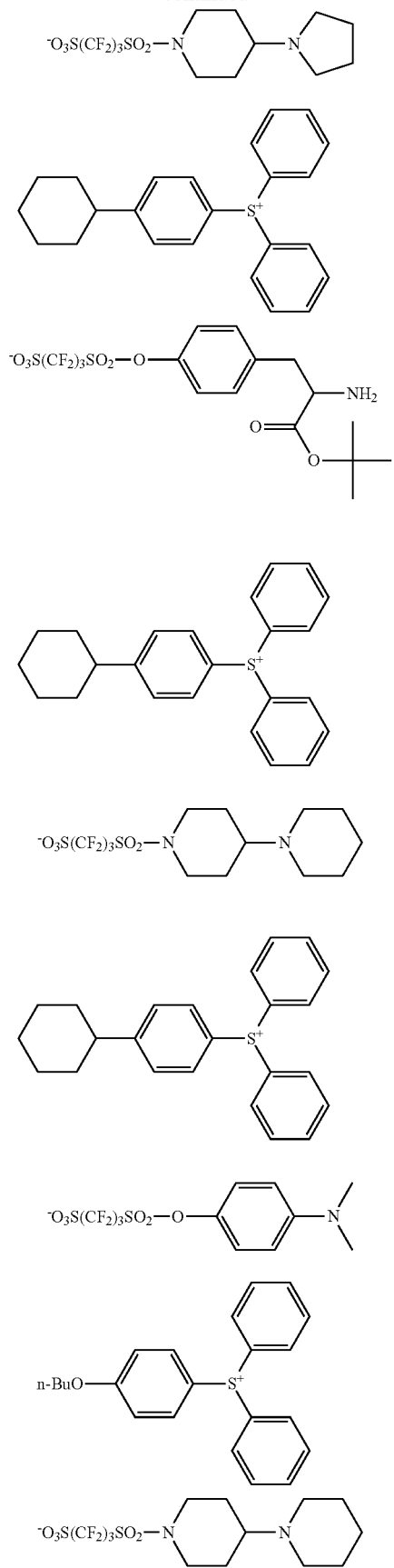
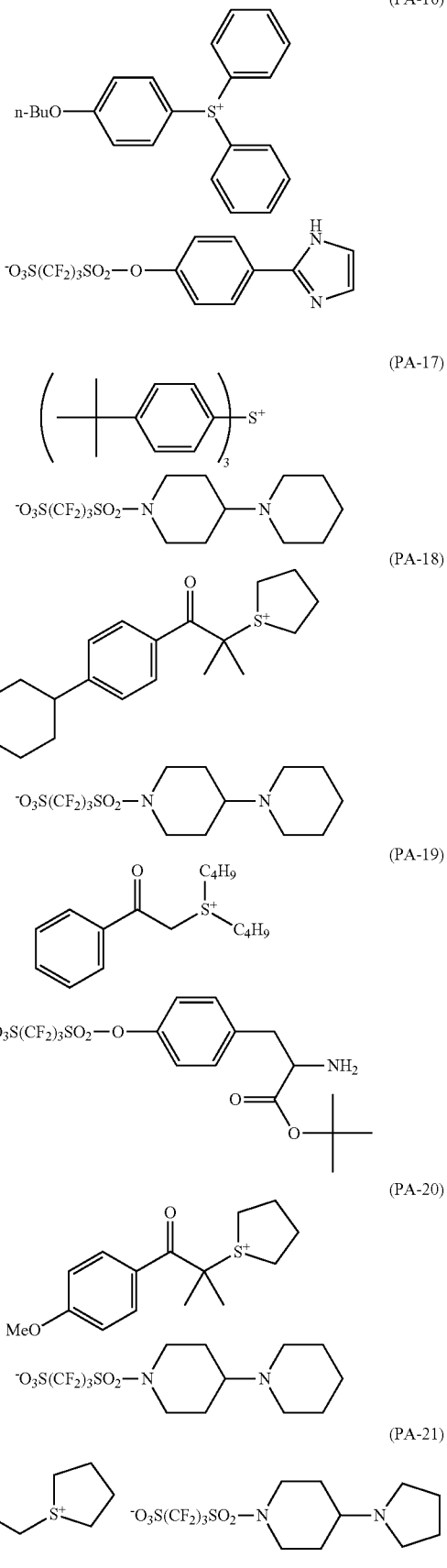

(PA-22)
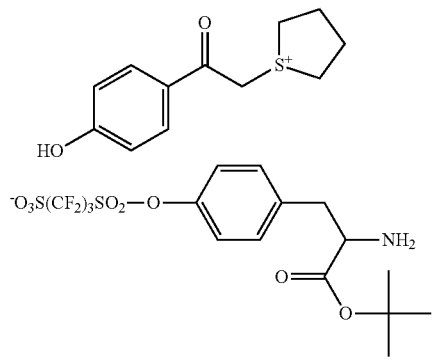
(PA-23)
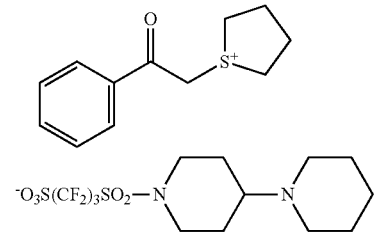
(PA-24)
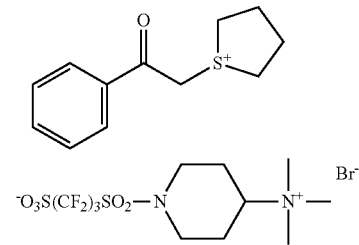
(PA-25)
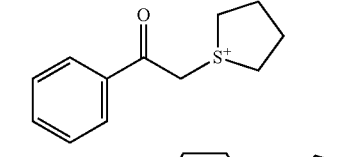
(PA-26)
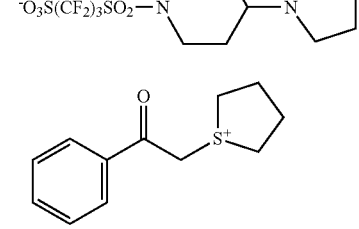
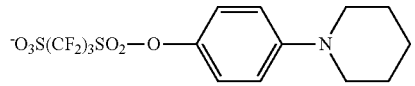
(PA-27)
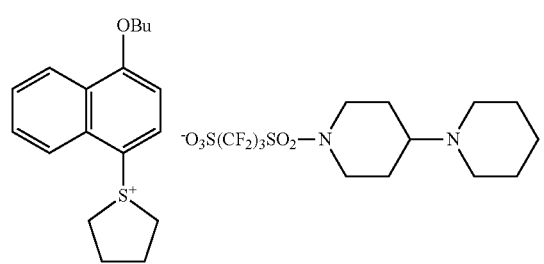
(PA-28)
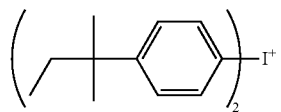
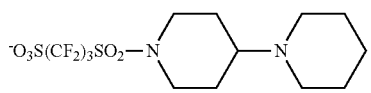
(PA-29)
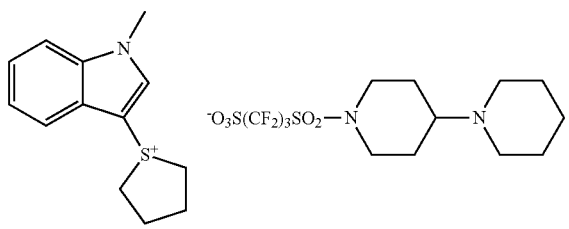
(PA-30)
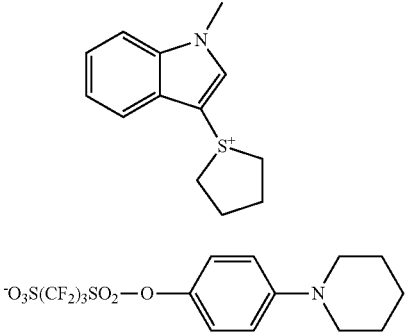
(PA-31)
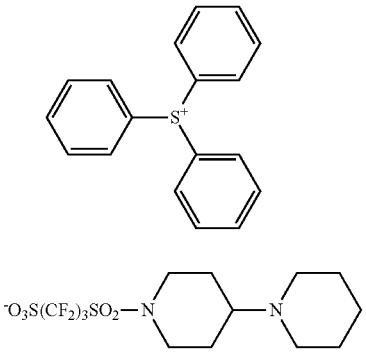
(PA-32)
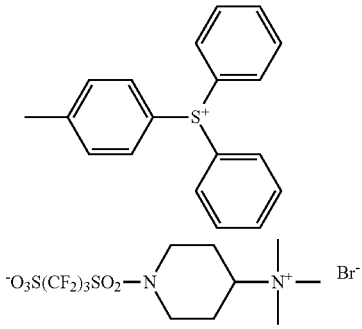

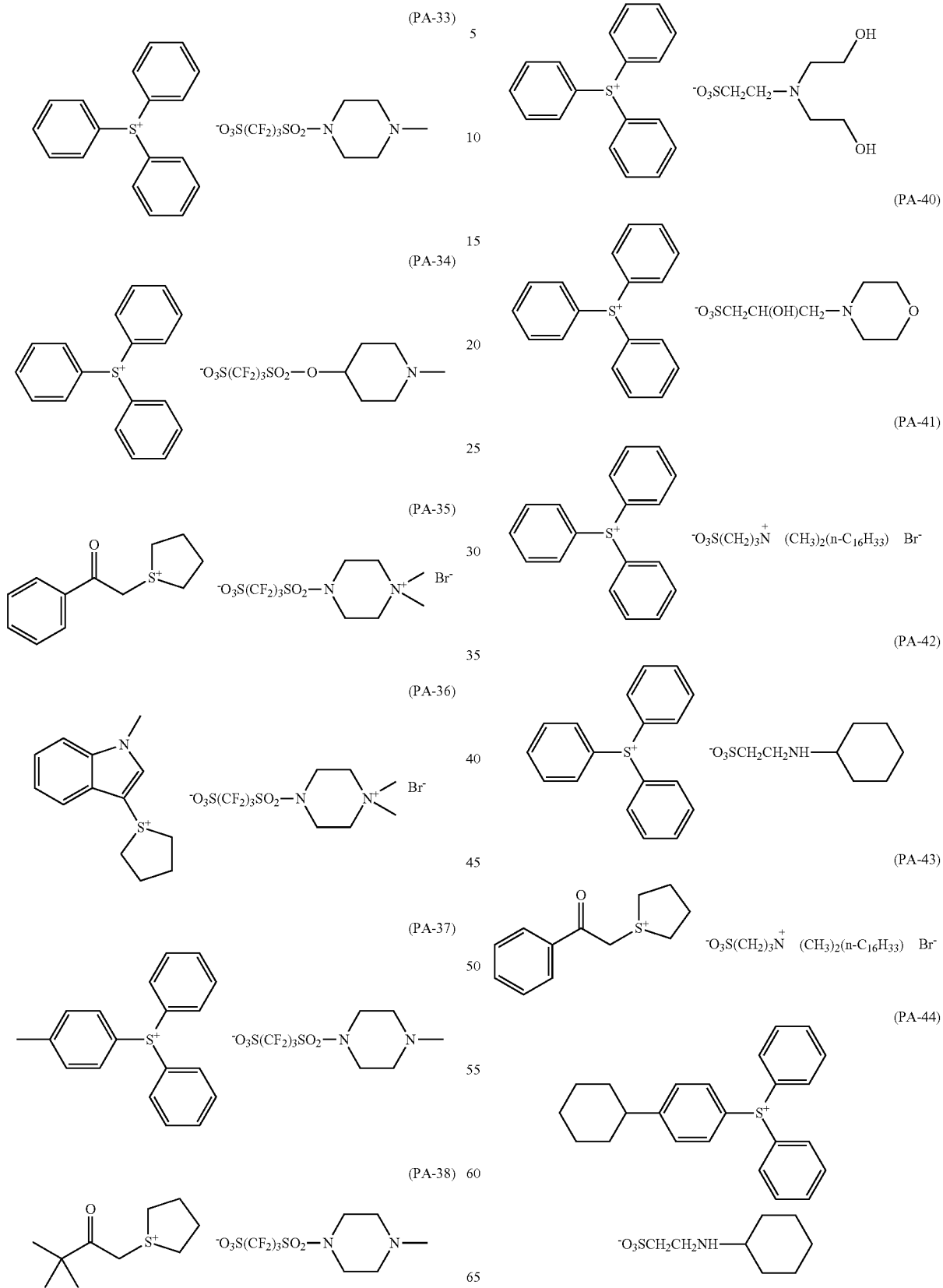

(PA-45)
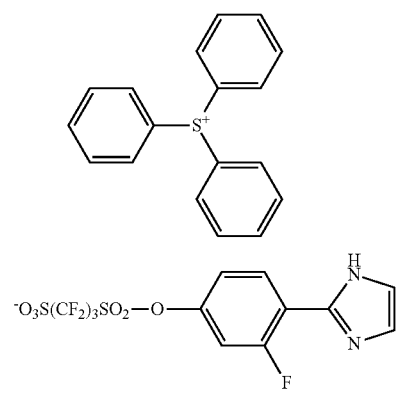
(PA-46)
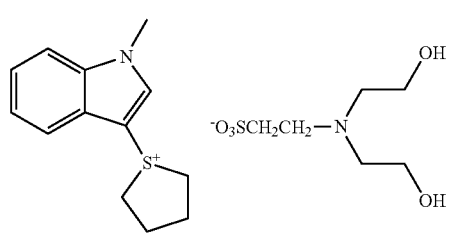
(PA-47)
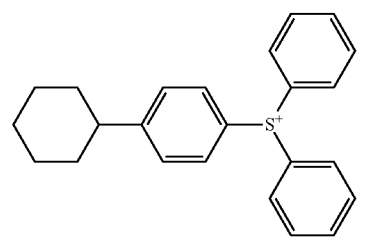
(PA-48)
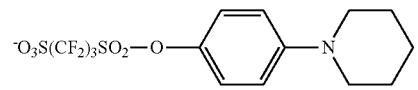
[Chem. 66]
(PA-49)
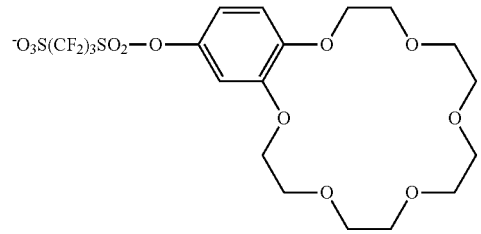
(PA-50)
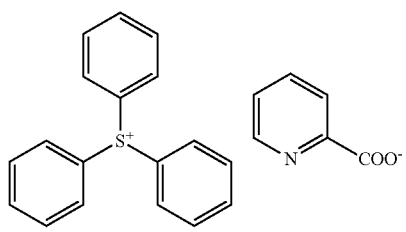
(PA-51)
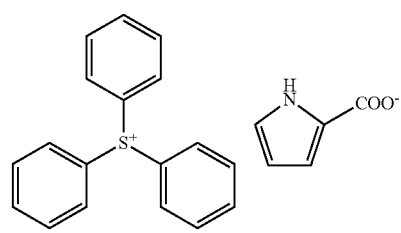
(PA-52)
(PA-53)
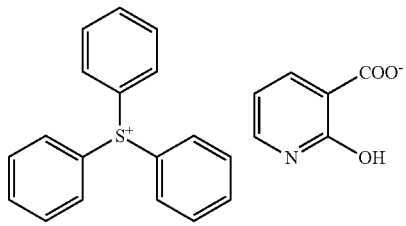
(PA-54)
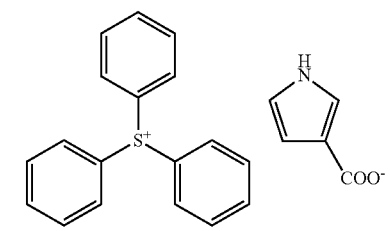
(PA-55)
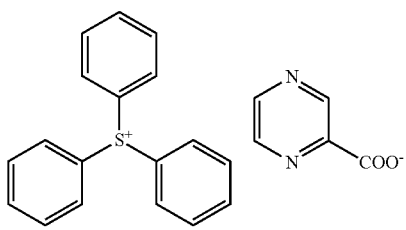

(PA-56) 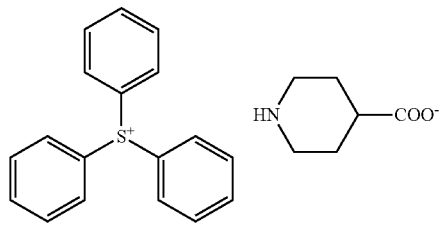

(PA-57) 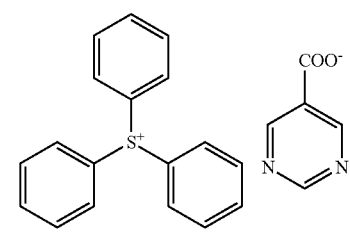

(PA-58) 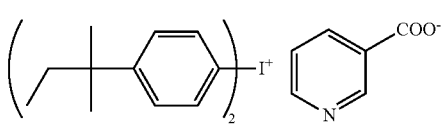

(PA-59) 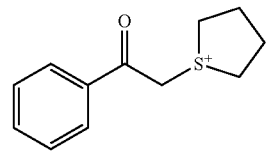

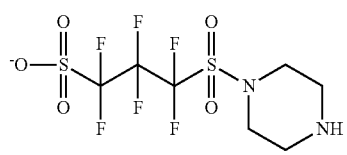

(PA-60) 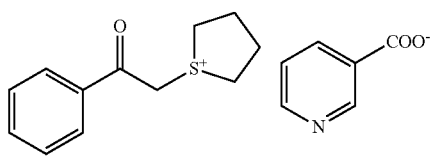

[Chem. 67]

(PA-61) 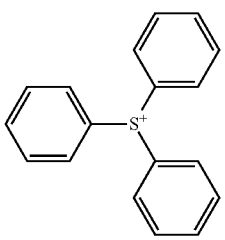

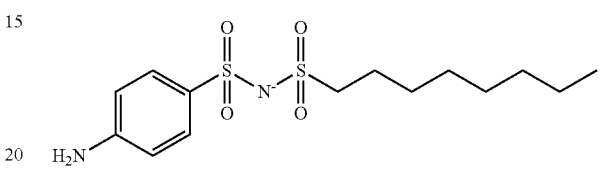

(PA-62) 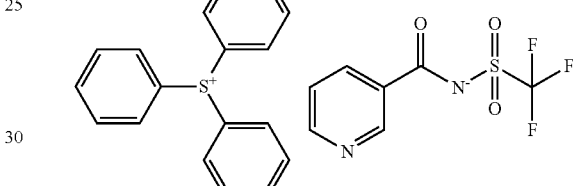

(PA-63) 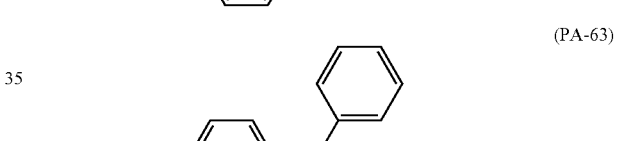

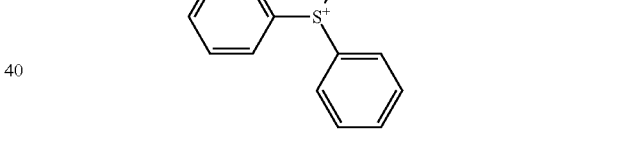

(PA-64) 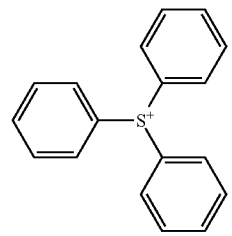

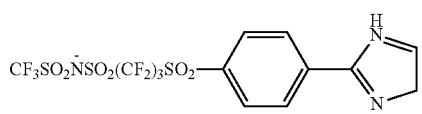

These compounds can be easily synthesized from a compound represented by the general formula (PA-I) or a lithium, sodium or potassium salt thereof and a hydroxide, bromide, chloride or the like of iodonium or sulfonium, by utilizing the salt exchange method described in JP1999-501909T (JP-H11-501909T) or JP2003-246786A. The synthesis may also be performed in accordance with the synthesis method described in JP1995-333851A (JP-H07-333851A).

Specific examples of the compound (C) capable of generating a compound represented by the general formula (PA-II) or (PA-III) upon irradiation with actinic rays or radiation are illustrated below, but the invention is not limited thereto.

(PA-65)
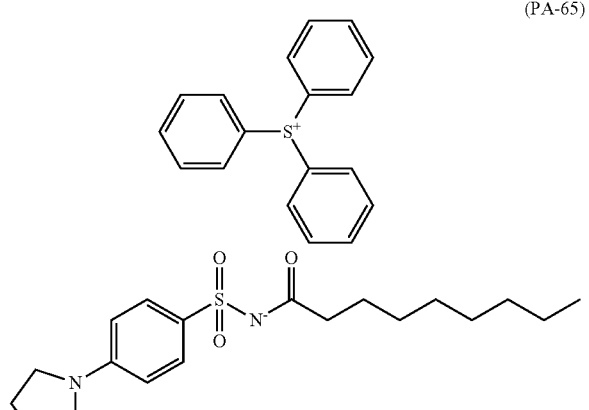
(PA-66)
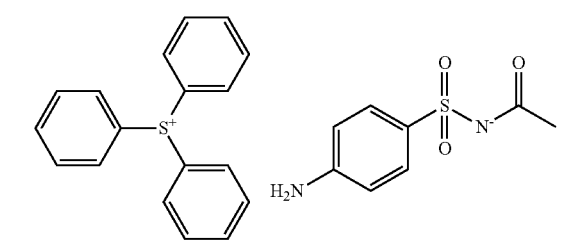
(PA-67)
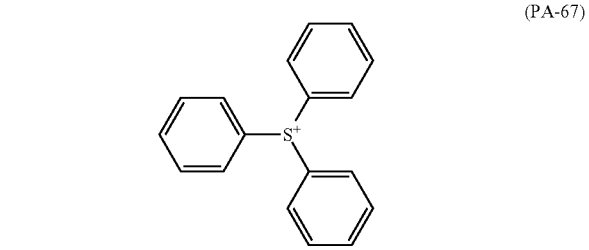
(PA-68)
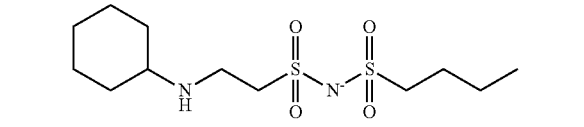
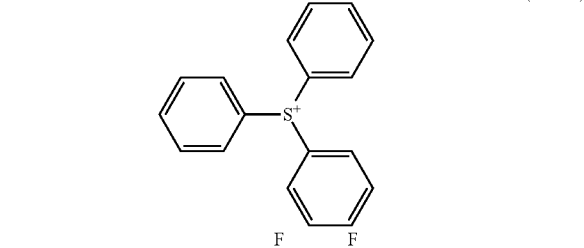
(PA-69)
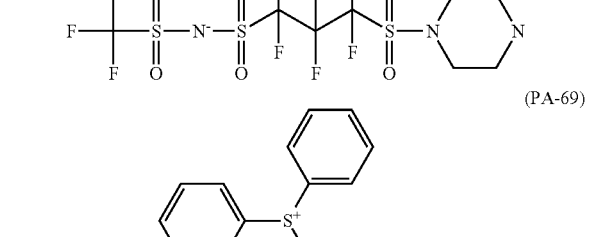
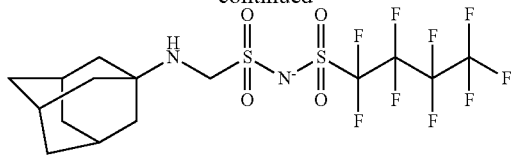
(PA-70)
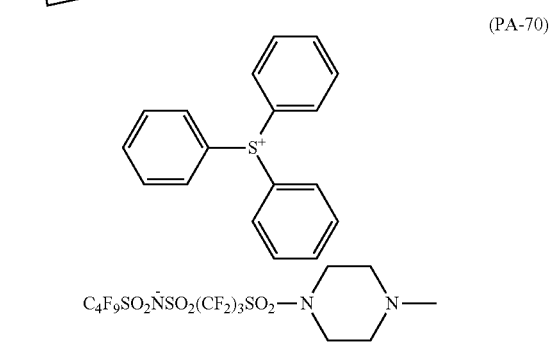
C₄F₉SO₂ṄSO₂(CF₂)₃SO₂—
(PA-71)
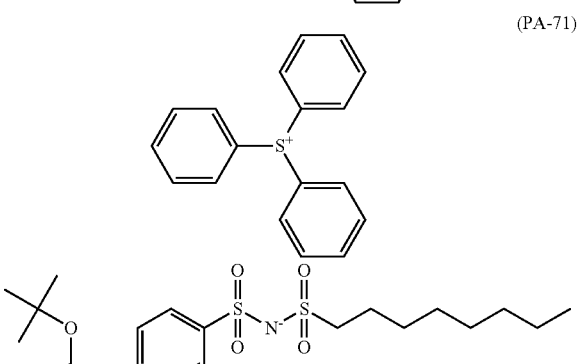
(PA-72)
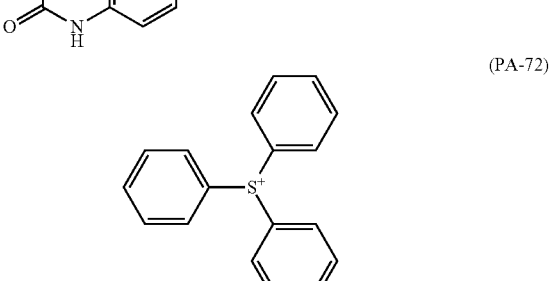
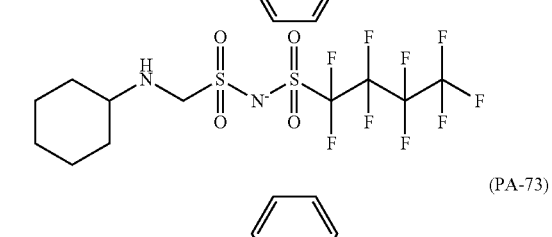
(PA-73)
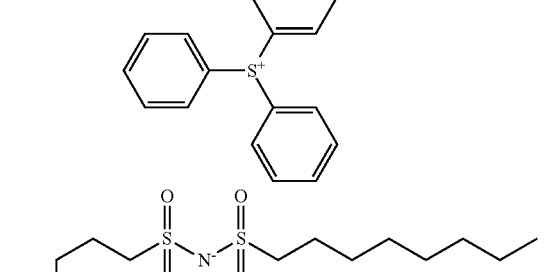

(PA-74)
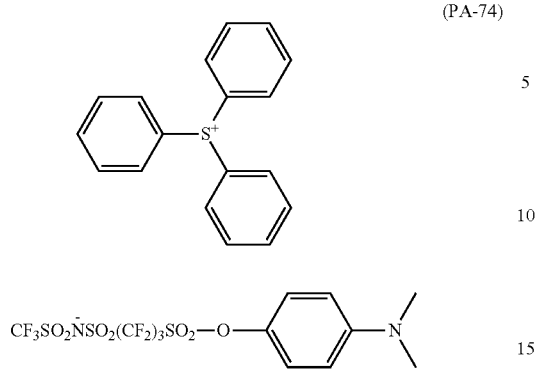
(PA-75)
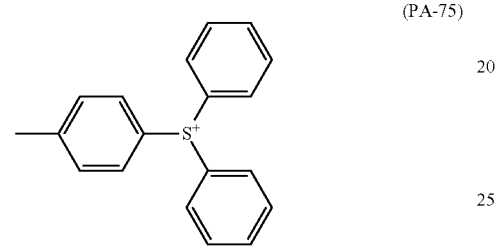
(PA-76)
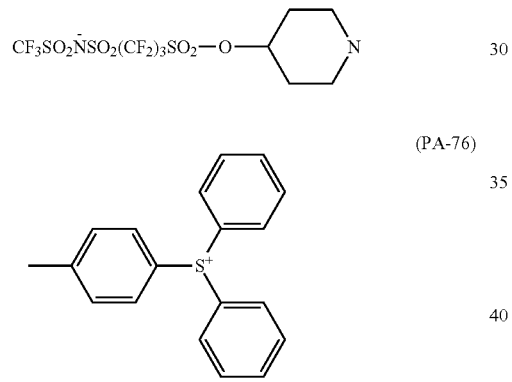
[Chem. 68]
(PA-77)
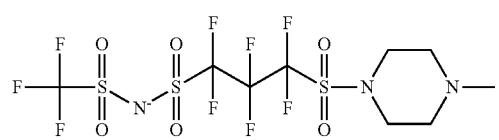
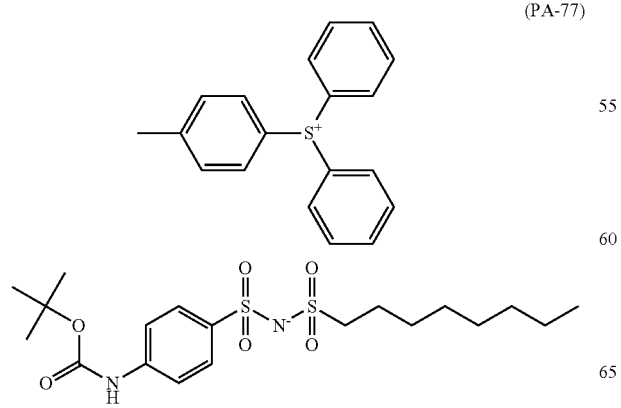
(PA-78)
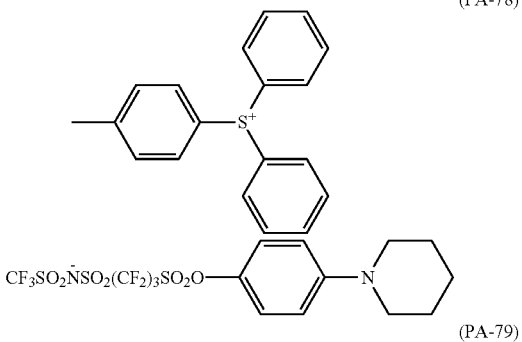
(PA-79)
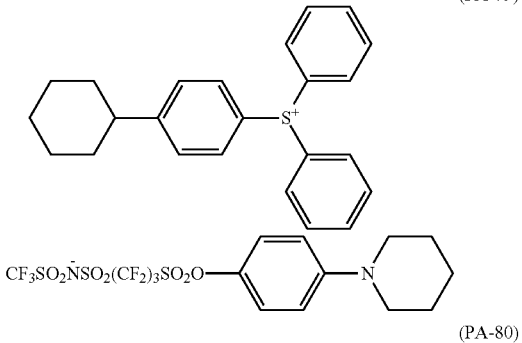
(PA-80)
(PA-81)
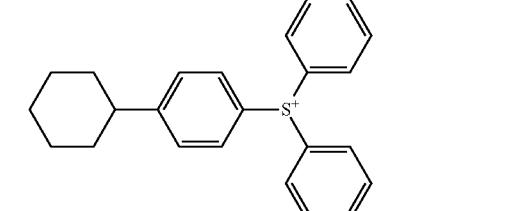
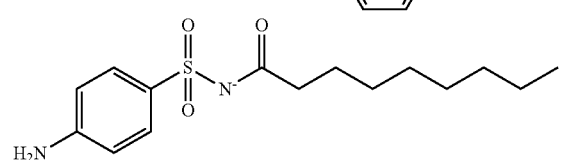
(PA-82)
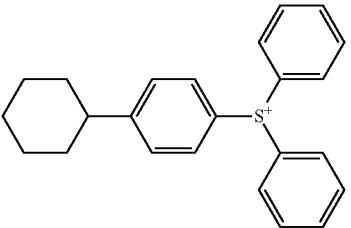

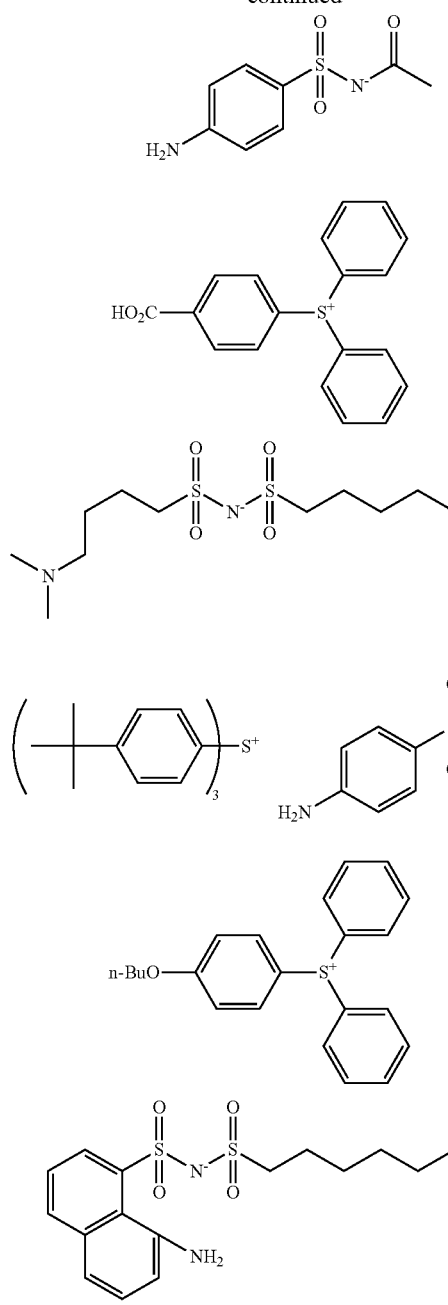

(PA-92)
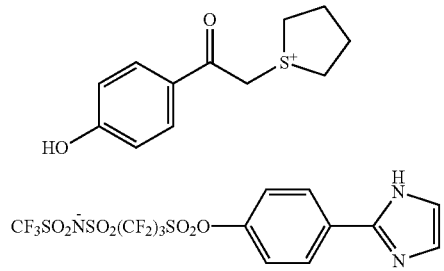
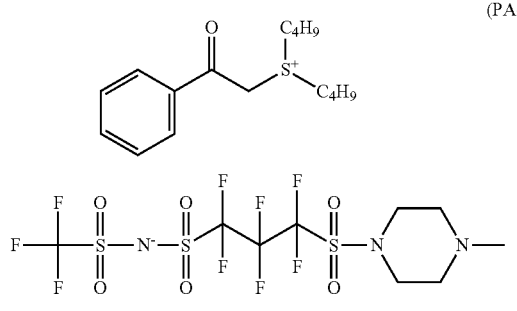
[Chem. 69]
(PA-93)
(PA-94)
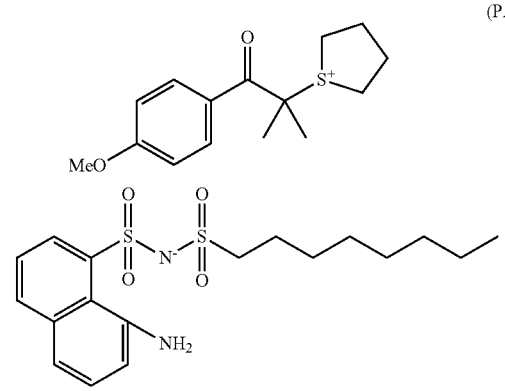
(PA-95)
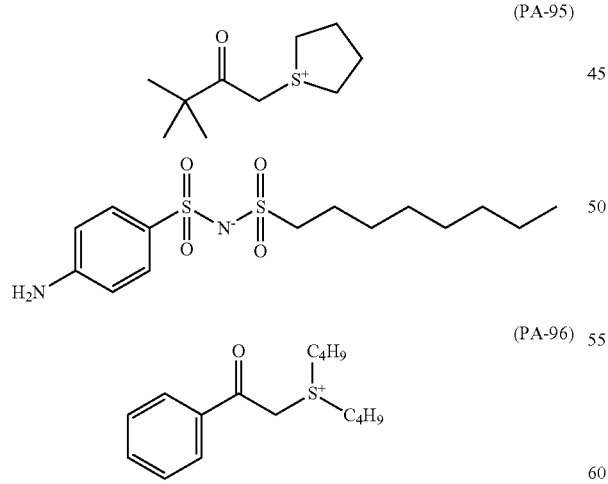
(PA-96)
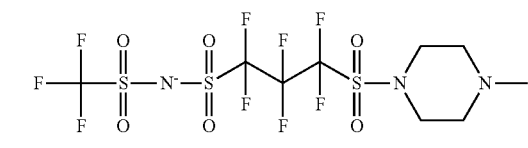
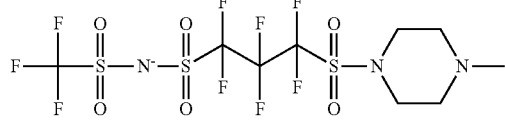
(PA-97)
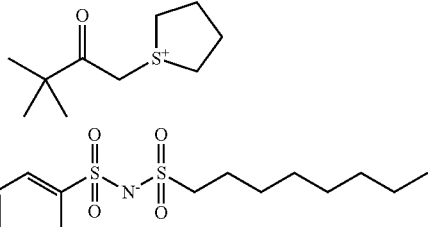
(PA-98)
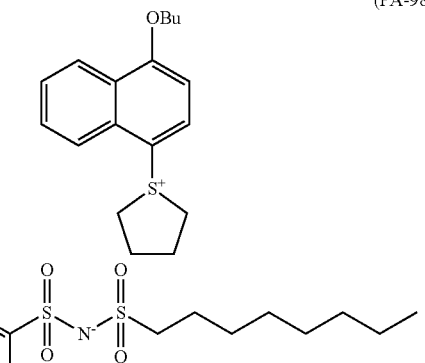
(PA-99)
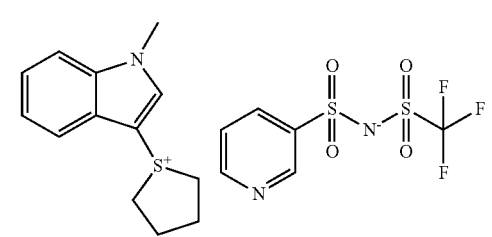
(PA-100)
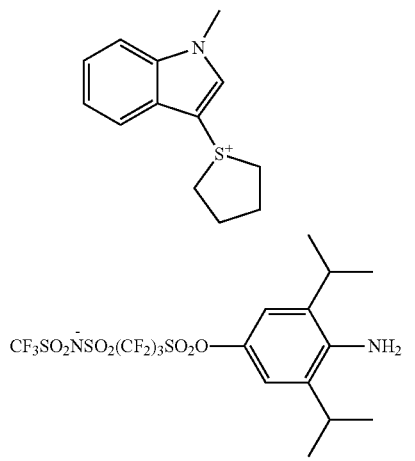
(PA-101)
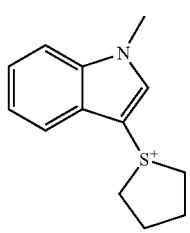

(PA-102)
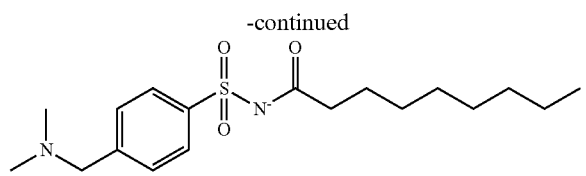
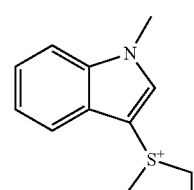
(PA-103)
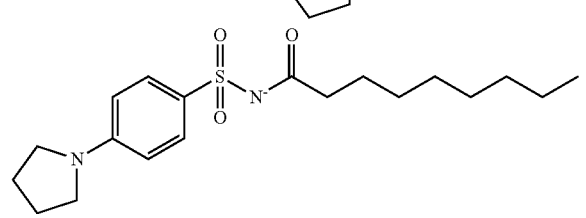
(PA-104)
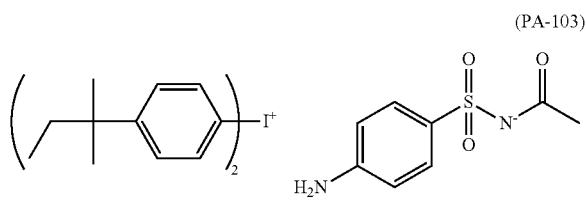
[Chem. 70]
(PA-105)
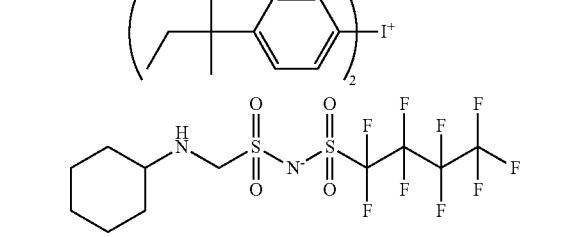
(PA-106)
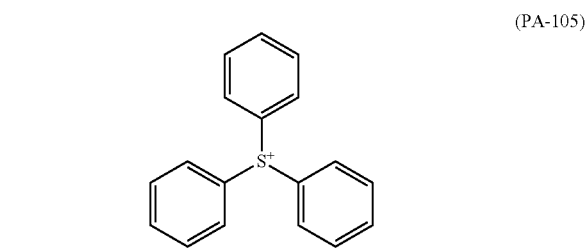
(PA-107)
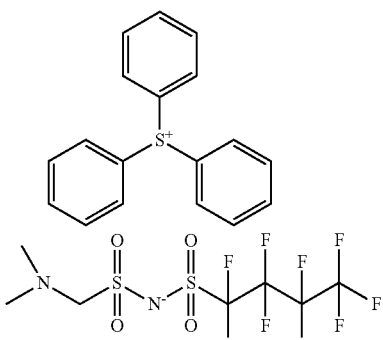
(PA-108)
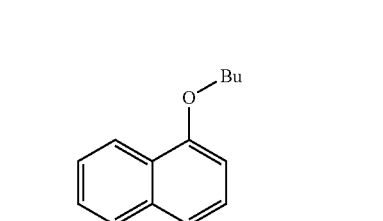
(PA-109)
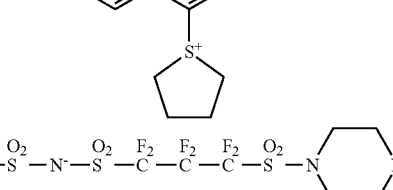
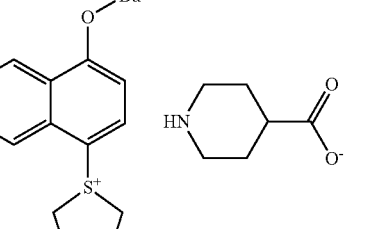
(PA-110)
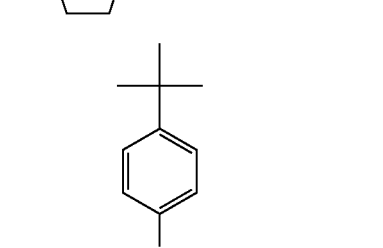
(PA-111)
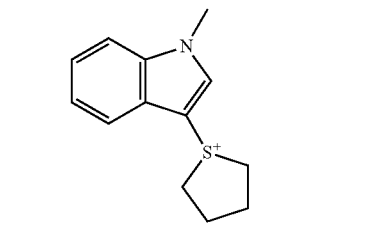

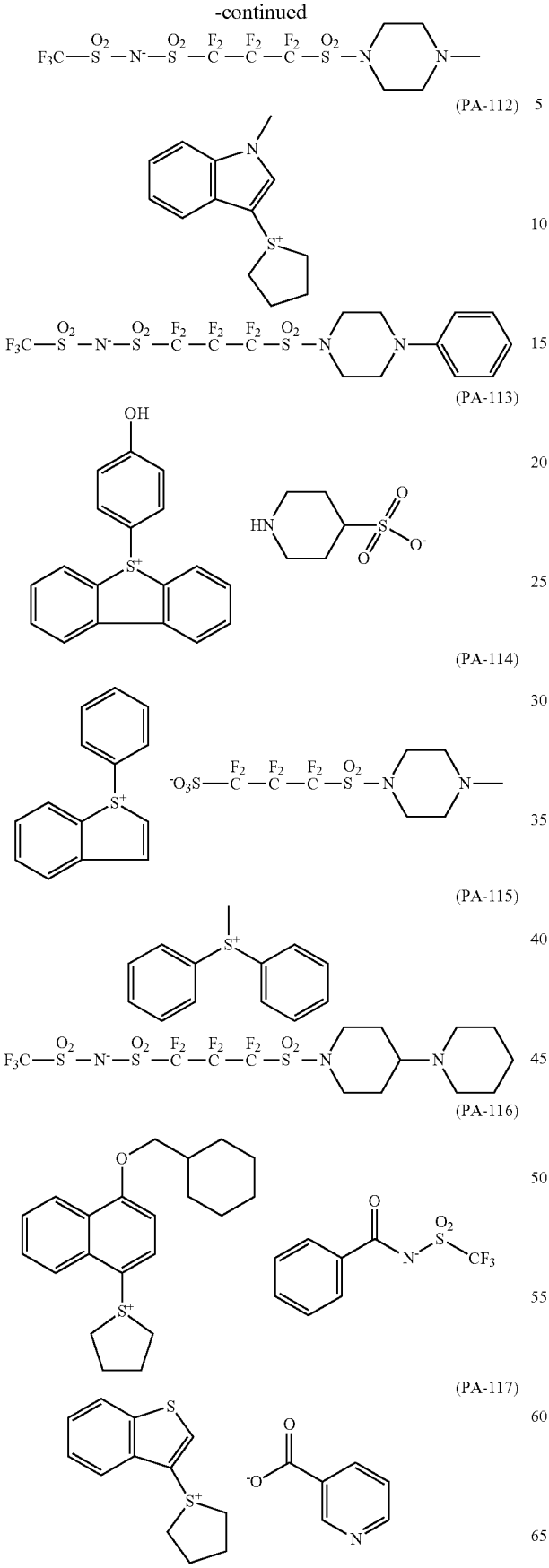
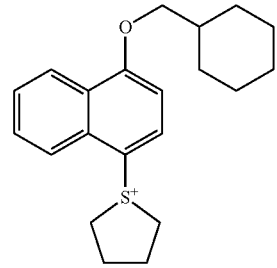
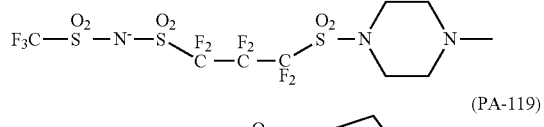
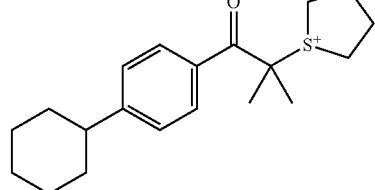
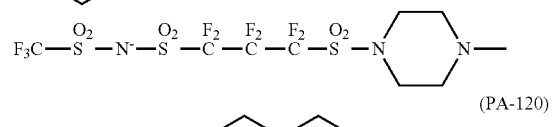
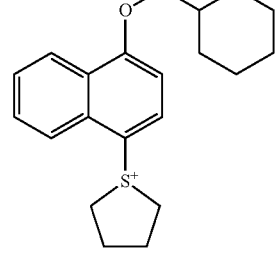
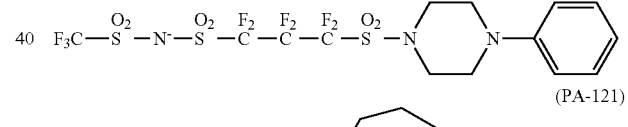
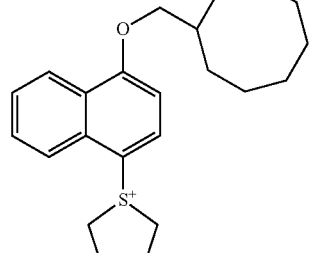
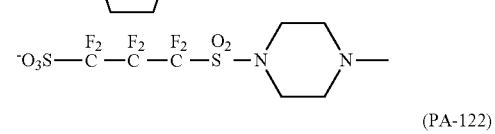
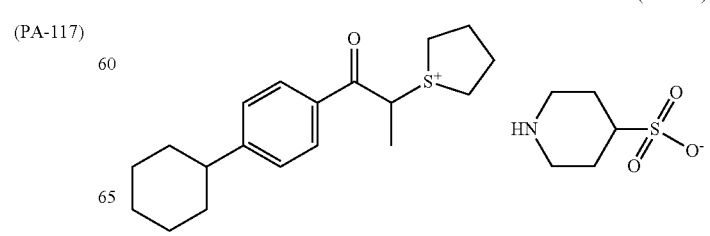

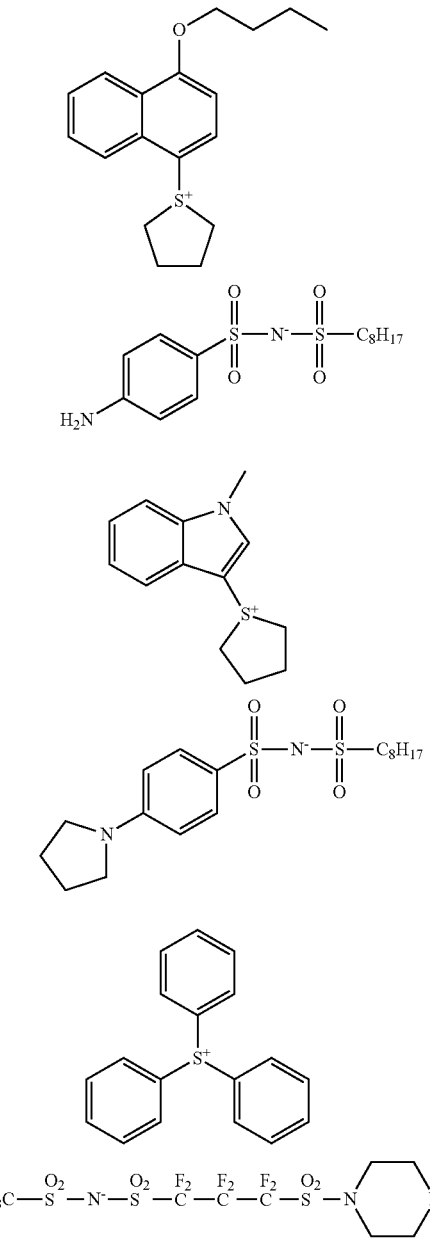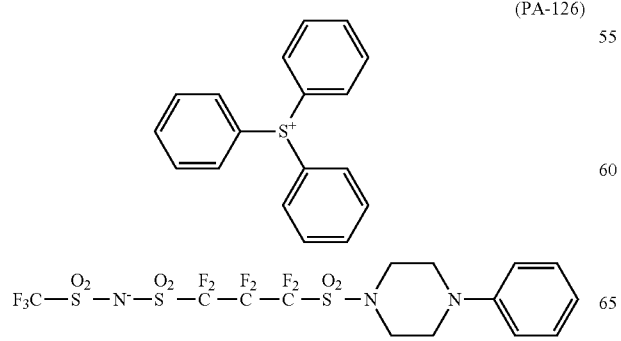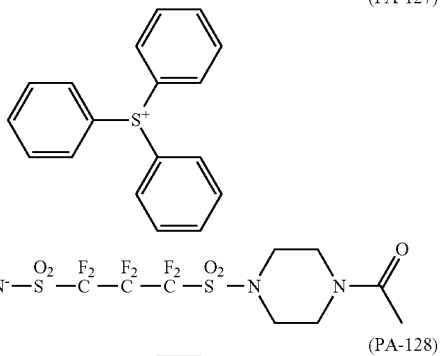

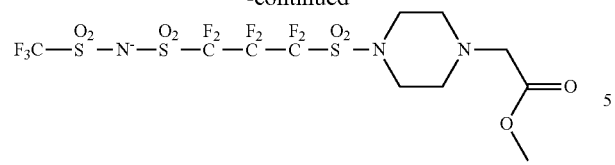
(PA-132)
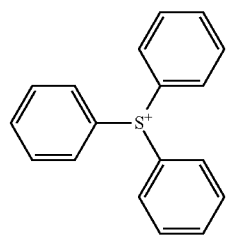
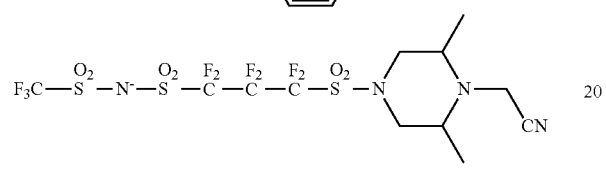
(PA-133)
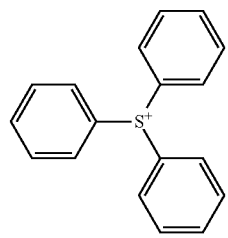
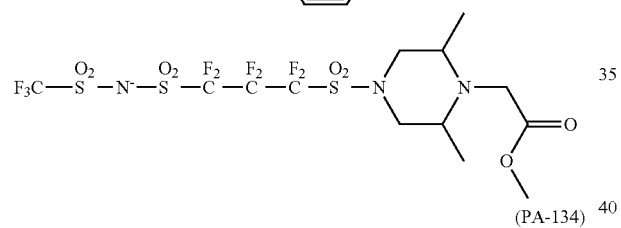
(PA-134)
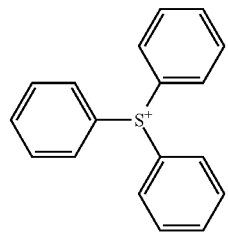
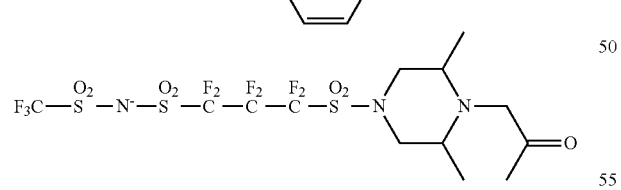
[Chem. 73]
(PA-135)
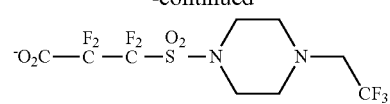
(PA-136)
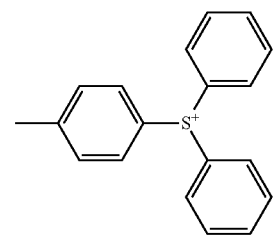
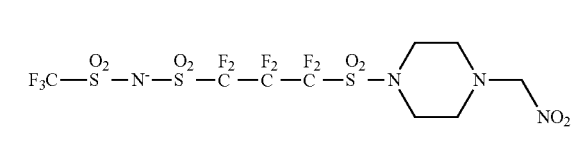
(PA-137)
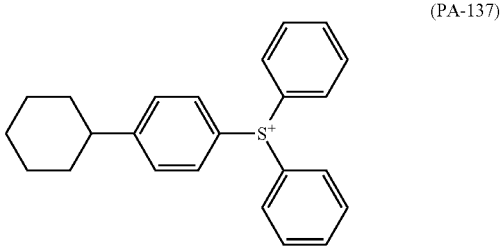
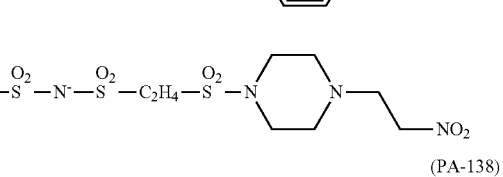
(PA-138)
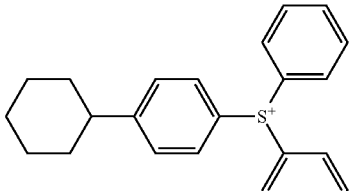
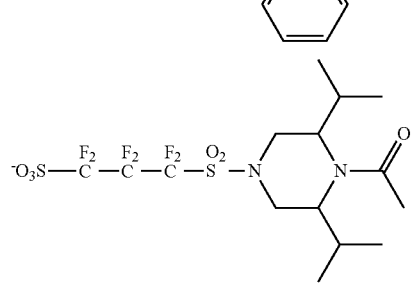
(PA-139)
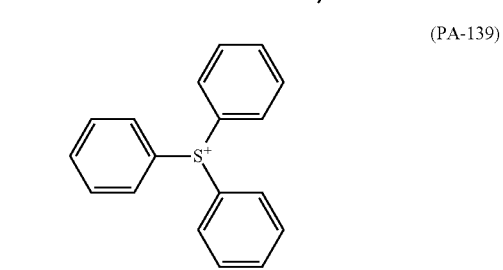

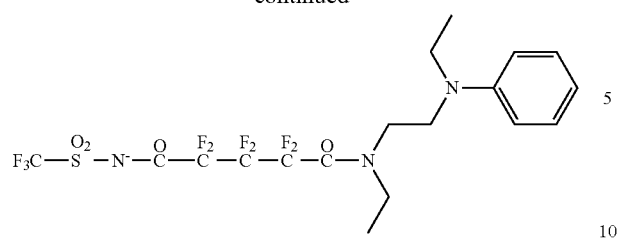
(PA-140)
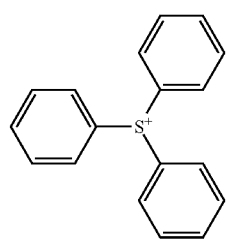
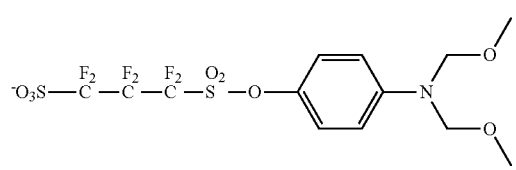
(PA-141)
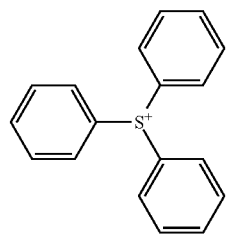
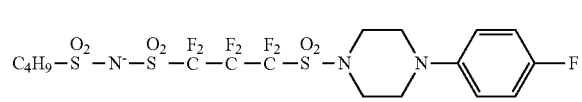
(PA-142)
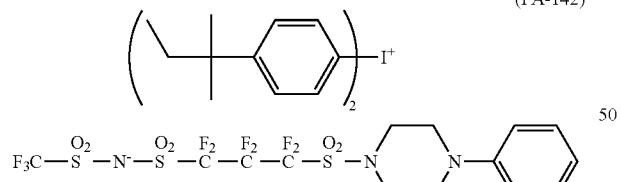
(PA-143)
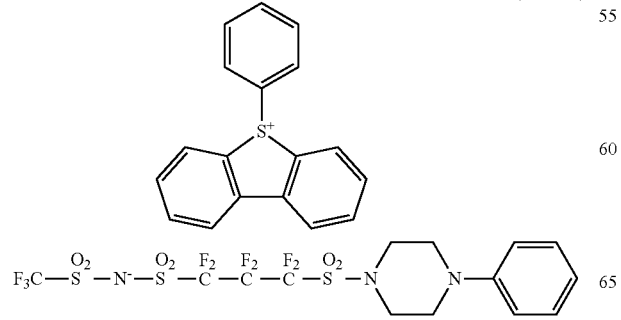
(PA-144)
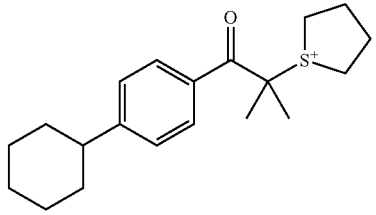
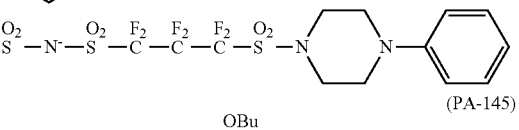
(PA-145)
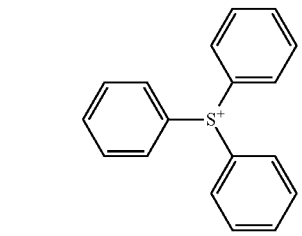
[Chem. 74]
(PA-146)
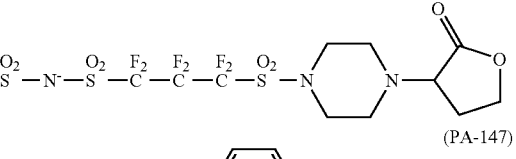
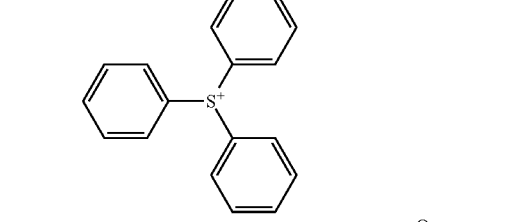
(PA-147)
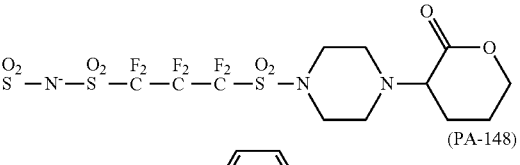
(PA-148)
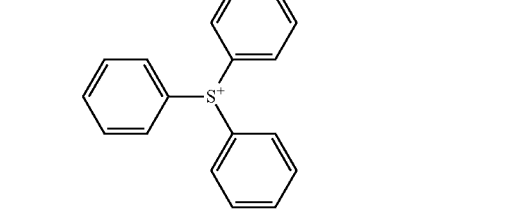

-continued

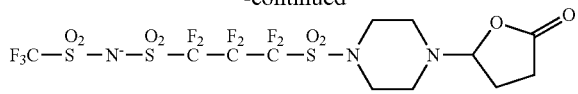

These compounds can be easily synthesized using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by the general formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by the general formula (PA-II). The amine or alcohol containing a partial structure represented by the general formula (PA-II) or (PA-III) can be synthesized by reacting an amine or an alcohol with an anhydride (for example, $(R'O_2C)_2O$ or $(R'SO_2)_2O$) or an acid chloride compound (for example, $R'O_2CCl$ or $R'SO_2Cl$) (R' is, for example, a methyl group, an n-octyl group or a trifluoromethyl group) under basic conditions. In particular, the synthesis may be performed in accordance with synthesis examples and the like in JP2006-330098A.

The molecular weight of the compound (C) is preferably from 500 to 1000.

The actinic ray-sensitive or radiation-sensitive resin composition in the invention may or may not contain the compound (C), but in the case where the composition contains the compound (C), the content thereof is preferably from 0.1 to 20% by mass, and more preferably from 0.1 to 10% by mass, based on the solid content of the actinic ray-sensitive or radiation-sensitive resin composition.

[4-2] Basic Compound (C')

The actinic ray-sensitive or radiation-sensitive resin composition in the invention may contain a basic compound (C') in order to reduce the change in performance with aging from exposure to heating.

Preferred examples of the basic compound include compounds having structures represented by the following formulae (A) to (E).

[Chem. 75]

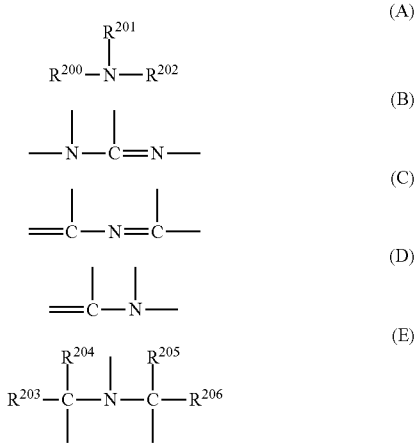

In the general formulae (A) and (E),
$R^{200}$, $R^{201}$, and $R^{202}$ may be the same as or different from each other, and each independently represents a hydrogen atom, an alkyl group (preferably having 1 to 20 carbon atoms), a cycloalkyl group (preferably 3 to 20 carbon atoms), or an aryl group (having 6 to 20 carbon atoms), in which $R^{201}$ and $R^{202}$ may be bonded to each other to form a ring; and $R^{203}$, $R^{204}$, $R^{205}$, and $R^{206}$ may be the same as or different from each other, and each independently represents an alkyl group having 1 to 20 carbon atoms.

The alkyl group having a substituent as the alkyl group is preferably an aminoalkyl group having 1 to 20 carbon atoms, a hydroxyalkyl group having 1 to 20 carbon atoms, or a cycloalkyl group having 1 to 20 carbon atoms.

The alkyl group in the general formulae (A) and (E) is more preferably unsubstituted.

Preferred examples of the compound include guanidine, aminopyrrolidine, pyrazole, pyrazoline, piperazine, aminomorpholine, aminoalkylmorpholine, and piperidine; and more preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide, and 2-oxopropylthiophenium hydroxide. The compound having an onium carboxylate structure is a compound where the anion moiety of the compound having an onium hydroxide structure becomes a carboxylate, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl) aniline.

Preferred examples of the basic compound include a phenoxy group-containing amine compound, a phenoxy group-containing ammonium salt compound, a sulfonic acid ester group-containing amine compound, and a sulfonic acid ester group-containing ammonium salt compound.

As for the phenoxy group-containing amine compound, the phenoxy group-containing ammonium salt compound, the sulfonic acid ester group-containing amine compound, and the sulfonic acid ester group-containing ammonium salt compound, it is preferable that at least one alkyl group be bonded to the nitrogen atom. Further, it is preferable that the compound have an oxygen atom in the alkyl chain to form an oxyalkylene group. The number of the oxyalkylene groups within the molecule is 1 or more, preferably from 3 to 9, and more preferably from 4 to 6. Among the oxyalkylene groups, the structures of —CH$_2$CH$_2$O—, —CH(CH$_3$)CH$_2$O—, or —CH$_2$CH$_2$CH$_2$O— are preferred.

Specific examples of the ammonium salt compound having the phenoxy group-containing amine compound, the phenoxy group-containing ammonium salt compound, the sulfonic acid ester group-containing amine compound, and the sulfonic acid ester group-containing ammonium salt compound include, but are not limited to, Compounds (C1-1) to (C3-3) illustrated in paragraph [0066] in the specification of US Patent App. No. 2007/0224539.

The molecular weight of the basic compound is preferably from 250 to 2000, and more preferably from 400 to 1000. From the viewpoints of further reduction of LWR and local pattern dimensional uniformity, the molecular weight of the basic compound is preferably 400 or more, more preferably 500 or more, and still more preferably 600 or more.

This basic compound may be used in combination with the organic compound (NA) or the compound (C), or may be used singly or in combination of two or more kinds thereof.

The actinic ray-sensitive or radiation-sensitive resin composition in the invention may or may not contain the basic compound, but in the case of the basic compound being contained, the amount of the basic compound used is usually from 0.001 to 10% by mass, and preferably from 0.01 to 5% by mass, based on the solid content of the actinic ray-sensitive or radiation-sensitive resin composition.

The ratio between the acid generator and the basic compound used in the composition is preferably a ratio of acid generator/basic compound (molar ratio)=2.5 to 300. That is, the molar ratio is preferably 2.5 or more from the viewpoint of sensitivity and resolution, and preferably 300 or less from the viewpoint of suppressing the reduction in resolution due to thickening of the resist pattern with aging after exposure until heat treatment. The acid generator/basic compound (molar ratio) is more preferably from 5.0 to 200, and still more preferably from 7.0 to 150.

[5] Solvent (D)

Examples of the solvent which can be used at the time of preparing the actinic ray-sensitive or radiation-sensitive resin composition in the invention include an organic solvent such as alkylene glycol monoalkyl ether carboxylate, alkylene glycol monoalkyl ether, alkyl lactate, alkyl alkoxypropionate, cyclic lactone (preferably having 4 to 10 carbon atoms), monoketone compound (preferably having 4 to 10 carbon atoms) which may contain a ring, alkylene carbonate, alkyl alkoxyacetate, and alkyl pyruvate.

Specific examples of these solvents are the same as those described in paragraphs [0441] to [0455] of US Patent App. No. 2008/0187860.

In the invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably, for example, an alkylene glycol monoalkyl ether or an alkyl lactate, more preferably propylene glycol monomethyl ether (PGME, alternative name, 1-methoxy-2-propanol), or ethyl lactate. Further, the solvent not containing a hydroxyl group is preferably, for example, an alkylene glycol monoalkyl ether acetate, an alkyl alkoxypropionate, a monoketone compound which may contain a ring, a cyclic lactone or an alkyl acetate, more preferably propylene glycol monomethyl ether acetate (PGME, alternative name, 1-methoxy-2-propanol), ethyl ethoxypropionate, 2-heptanone, γ-butyrolactone, cyclohexanone, or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, and more preferably from 20/80 to 60/40. A mixed solvent in which the solvent not containing a hydroxyl group is contained in an amount of 50% by mass or more is particularly preferred in view of coating uniformity.

The solvent is preferably a mixed solvent of two or more kinds of solvent containing propylene glycol monomethyl ether acetate, and more preferably a solvent of propylene glycol monomethyl ether acetate alone, or a mixed solvent of two or more kinds, containing propylene glycol monomethyl ether acetate.

[6] Hydrophobic Resin (E)

The actinic ray-sensitive or radiation-sensitive resin composition in the invention may contain a hydrophobic resin containing at least one of a fluorine atom and a silicon atom (hereinafter also referred to as a "hydrophobic resin (E)" or simply a "resin (E)"), particularly when the composition is applied to liquid-immersion exposure. By this, the hydrophobic resin (E) is unevenly distributed to the surface layer of the film and when the immersion medium is water, the static/dynamic contact angle on the resist film surface for water as well as the followability of liquid for liquid immersion can be enhanced.

The hydrophobic resin (E) is preferably unevenly distributed to the interface, as described above, but unlike a surfactant, need not necessarily have a hydrophilic group in the molecule and may not contribute to uniform mixing of polar/nonpolar substances.

The hydrophobic resin (E) typically contains a fluorine atom and/or a silicon atom. Such a fluorine atom and/or a silicon atom in the hydrophobic resin (E) may be contained in the main chain of the resin or contained in the side chain.

In the case where the hydrophobic resin (E) contains a fluorine atom, the resin preferably contains, as the fluorine atom-containing partial structure, a fluorine atom-containing alkyl group, a fluorine atom-containing cycloalkyl group or a fluorine atom-containing aryl group.

The fluorine atom-containing alkyl group is a linear or branched alkyl group with at least one hydrogen atom being substituted by a fluorine atom. This alkyl group preferably has 1 to 10 carbon atoms, and more preferably 1 to 4 carbon atoms. The fluorine atom-containing alkyl group may further have a substituent other than fluorine atom.

The fluorine atom-containing cycloalkyl group is a monocyclic or polycyclic cycloalkyl group with at least one hydrogen atom being substituted by a fluorine atom. This fluorine atom-containing cycloalkyl group may further have a substituent other than fluorine atoms.

The fluorine atom-containing aryl group is an aryl group with at least one hydrogen atom being substituted by a fluorine atom. Examples of this aryl group include a phenyl group and a naphthyl group. The fluorine atom-containing aryl group may further have a substituent other than fluorine atoms.

Examples of the fluorine atom-containing alkyl group, the fluorine atom-containing cycloalkyl group, and the fluorine atom-containing aryl group include the groups represented by the following general formulae (F2) to (F4), but the invention is not limited thereto.

[Chem. 76]

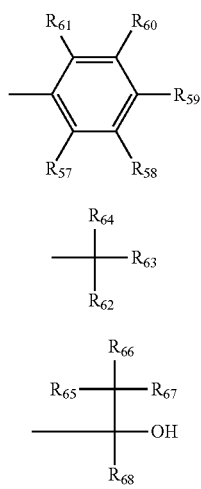

(F2)

(F3)

(F4)

In the general formulae (F2) to (F4), $R_{57}$ to $R_{68}$ each independently represent a hydrogen atom, a fluorine atom, or an (linear or branched) alkyl group, provided that at least one of $R_{57}$ to $R_{61}$, at least one of $R_{62}$ to $R_{64}$, and at least one of $R_{65}$ to $R_{68}$ each independently represent a fluorine atom or an alkyl group (preferably 1 to 4 carbon atoms) with at least one hydrogen atom substituted with a fluorine atom.

It is preferable that all of $R_{57}$ to $R_{61}$ and $R_{65}$ to $R_{67}$ be each a fluorine atom. $R_{62}$, $R_{63}$, and $R_{68}$ are each preferably an alkyl group (preferably 1 to 4 carbon atoms) with at least one hydrogen atom substituted with a fluorine atom, and more preferably a perfluoroalkyl group having 1 to 4 carbon atoms. $R_{62}$ and $R_{63}$ may be linked to each other to form a ring.

Specific examples of the group represented by the general formula (F2) include a p-fluorophenyl group, a pentafluorophenyl group, and a 3,5-di(trifluoromethyl)phenyl group.

Specific examples of the group represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Among these, a hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferred, and a hexafluoroisopropyl group and a heptafluoroisopropyl group are more preferred.

Specific examples of the group represented by the general formula (F4) include —$C(CF_3)_2OH$, —$C(C_2F_5)_2OH$, —$C(CF_3)(CH_3)OH$, and —$CH(CF_3)OH$, and among these, —$C(CF_3)_2OH$ is preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by the combination of two or more thereof.

Preferred examples of the repeating units having a fluorine atom are shown below.

[Chem. 77]

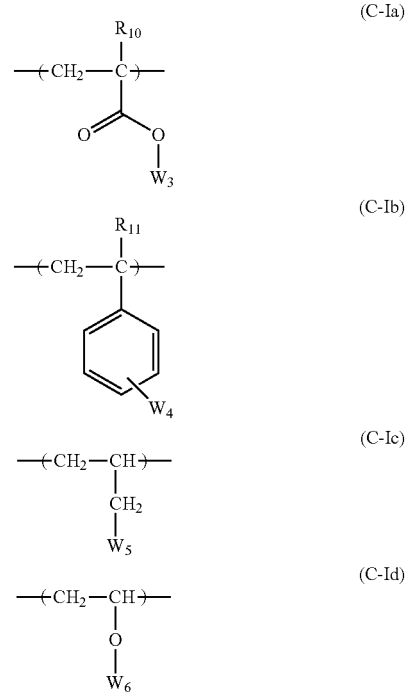

In the formulae, $R_{10}$ and $R_{11}$ each independently represent a hydrogen atom, a fluorine atom, or an alkyl group. The alkyl group is preferably a linear or branched alkyl group having 1 to 4 carbon atoms and may have a substituent, and the alkyl group having a substituent includes, in particular, a fluorinated alkyl group.

$W_3$ to $W_6$ each independently represent an organic group having at least one or more fluorine atoms and specifically includes the atomic groups of (F2) to (F4) above.

Furthermore, other than these, the hydrophobic resin (E) may contain a unit as shown below as the repeating units having a fluorine atom.

[Chem. 78]

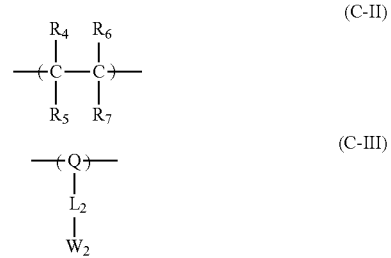

In the formulae, $R_4$ to $R_7$ each independently represent a hydrogen atom, a fluorine atom or an alkyl group. The alkyl group is preferably a linear or branched alkyl group having 1 to 4 carbon atoms and may have a substituent, and the alkyl group having a substituent includes, in particular, a fluorinated alkyl group.

Incidentally, at least one of $R_4$ to $R_7$ represents a fluorine atom. $R_4$ and $R_5$, or $R_6$ and $R_7$ may form a ring.

$W_2$ represents an organic group having at least one fluorine atom and specifically includes the atomic groups of (F2) to (F4) above.

$L_2$ represents a single bond or a divalent linking group. The divalent linking group is a substituted or unsubstituted arylene group, a substituted or unsubstituted alkylene group, a substituted or unsubstituted cycloalkylene group, —O—, —$SO_2$—, —CO—, —N(R)— (wherein R represents a hydrogen atom or an alkyl group), —$NHSO_2$—, or a divalent linking group formed by the combination of a plurality of these groups.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having 3 to 8 carbon atoms, and examples thereof include a cyclopentyl group, a cyclohexyl group, a cyclobutyl group and a cyclooctyl group. Examples of the polycyclic structure include a group containing a bicyclo, tricyclo or tetracyclo structure having 5 or more carbon atoms. A cycloalkyl group having 6 to 20 carbon atoms is preferred, and examples thereof include an adamantyl group, a norbornyl group, a dicyclopentyl group, a tricyclodecanyl group and a tetracyclododecyl group. At least one of carbon atoms in the cycloalkyl group may be substituted with a heteroatom such as an oxygen atom. In particular, preferred examples of Q include a norbornyl group, a tricyclodecanyl group, and a tetracyclododecyl group.

Specific examples of the repeating units having a fluorine atom are shown below, but the invention is not limited thereto.

In the specific examples, $X_1$ represents a hydrogen atom, —$CH_3$, —F, or —$CF_3$, and $X_2$ represents —F or —$CF_3$.

[Chem. 79]

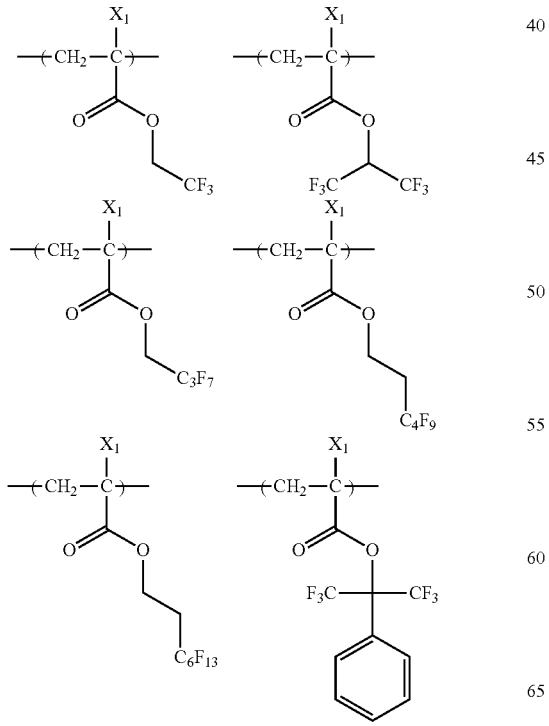

-continued

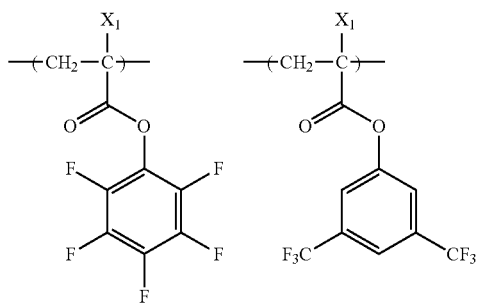

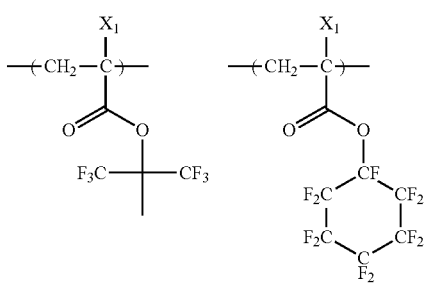

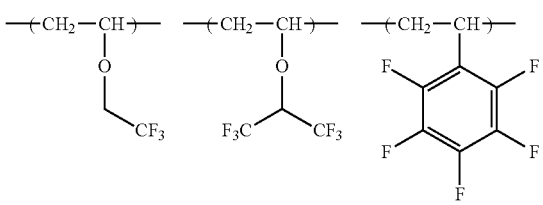

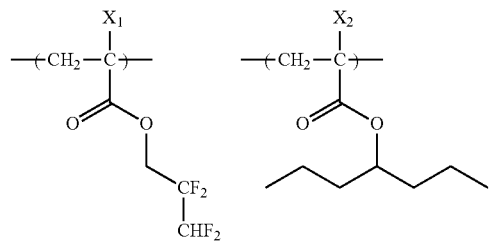

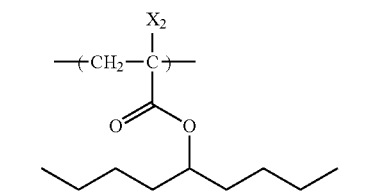

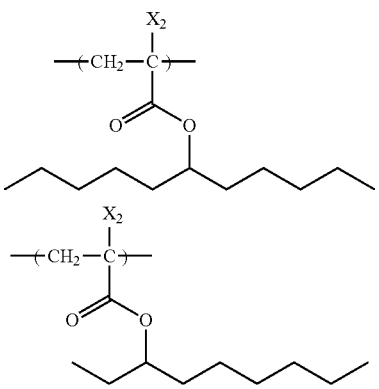

-continued

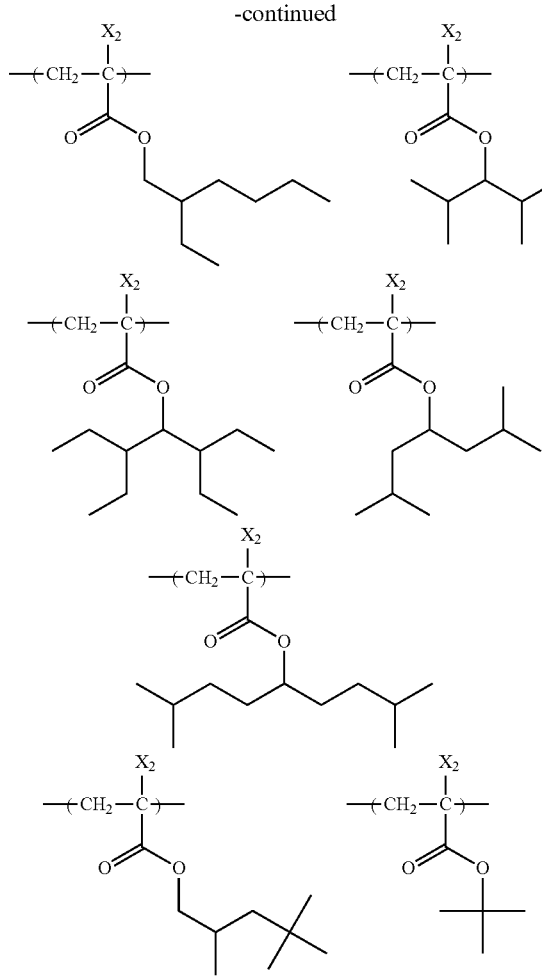

[Chem. 80]

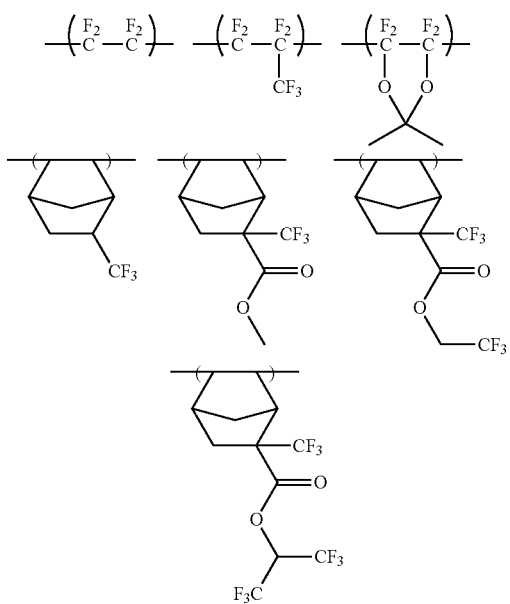

The hydrophobic resin (E) may contain a silicon atom. It is preferably a resin having an alkylsilyl structure (preferably a trialkylsilyl group) or a cyclosiloxane structure as a partial structure having a silicon atom.

Specific examples of the alkylsilyl structure and cyclosiloxane structure include groups represented by the following formulae (CS-1) to (CS-3):

[Chem. 81]

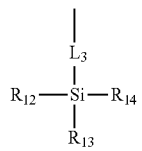

(CS-1)

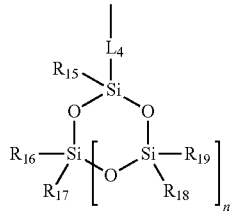

(CS-2)

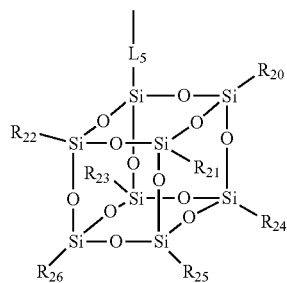

(CS-3)

In the general formulae (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms);

$L_3$ to $L_5$ each represent a single bond or a divalent linking group, and the divalent linking group is a single group or a combination of two or more groups selected from the group consisting of an alkylene group, a phenylene group, an ether bond, a thioether bond, a carbonyl group, an ester bond, an amide bond, a urethane bond, and a urea bond; and n represents an integer of 1 to 5, and is preferably an integer of 2 to 4.

Specific examples of the repeating unit having the groups represented by the following formulae (CS-1) to (CS-3) are shown below, but the invention is not limited thereto. Further, in specific examples, $X_1$ represents a hydrogen atom, —$CH_3$, —F, or —$CF_3$.

[Chem. 82]

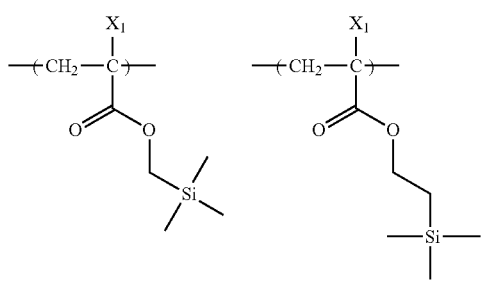

-continued

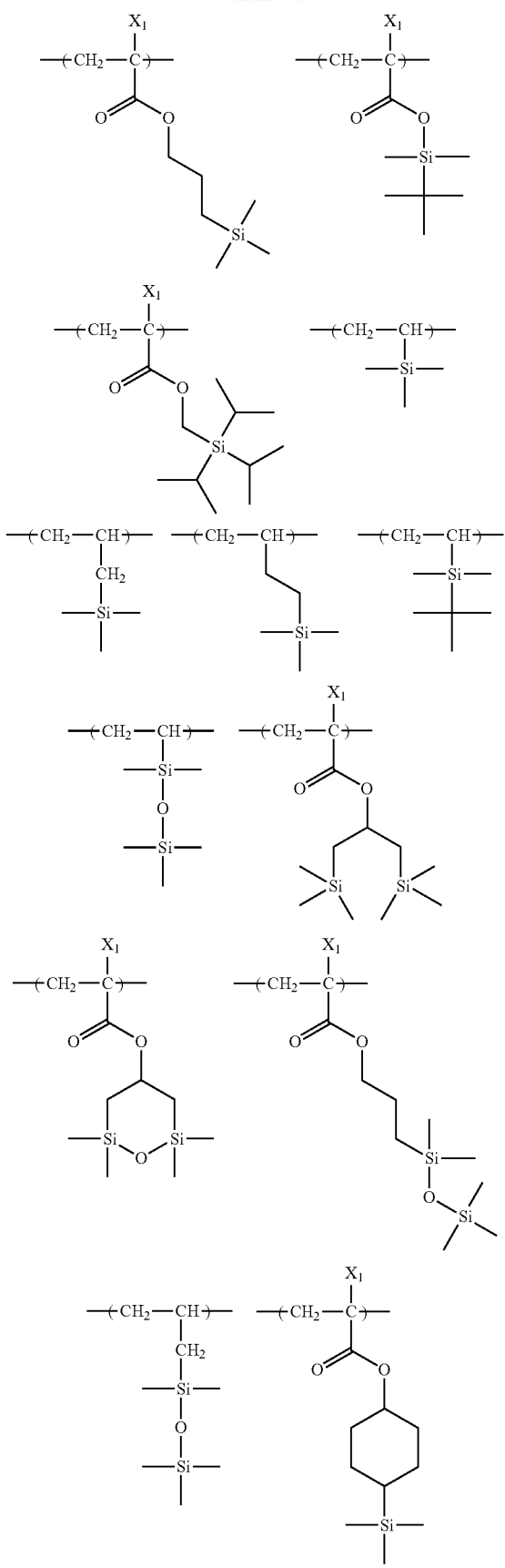

-continued

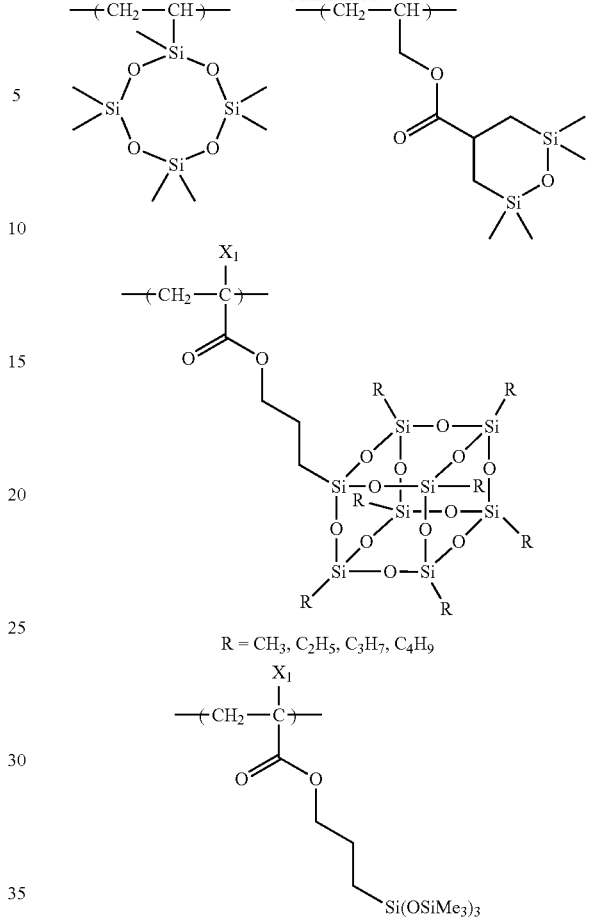

Moreover, the hydrophobic resin (E) may further contain at least one group selected from the group consisting of the following (x) to (z):

(x) an acid group,
(y) a group having a lactone structure, an acid anhydride, or an acid imide group, and
(z) a group capable of decomposing by the action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred acid groups include a fluorinated alcohol group (preferably a hexafluoroisopropanol group), a sulfonimide group, and a bis(alkylsulfonyl)methylene group.

Examples of the repeating unit having the acid group (x) include a repeating unit in which an acid group is directly bonded to the main chain of the resin, such as a repeating unit by an acrylic acid or a methacrylic acid, and a repeating unit in which an acid group is bonded to the main chain of the resin through a linking group. Alternatively, in this repeating unit, an acid group is preferably introduced into the terminal of the resin by using a polymerization initiator having an acid group or a chain transfer agent during the polymerization. The repeating unit having the acid group (x) may have at least one of a fluorine atom and a silicon atom.

The content of the repeating unit having the acid group (x) is preferably from 1 to 50 mol %, more preferably from 3 to 35 mol %, still more preferably from 5 to 20 mol %, based on all the repeating units in the hydrophobic resin (E).

Specific examples of the repeating unit having an acid group (x) are shown below. In the formulae, Rx represents a hydrogen atom, $CH_3$, $CF_3$, or $CH_2OH$.

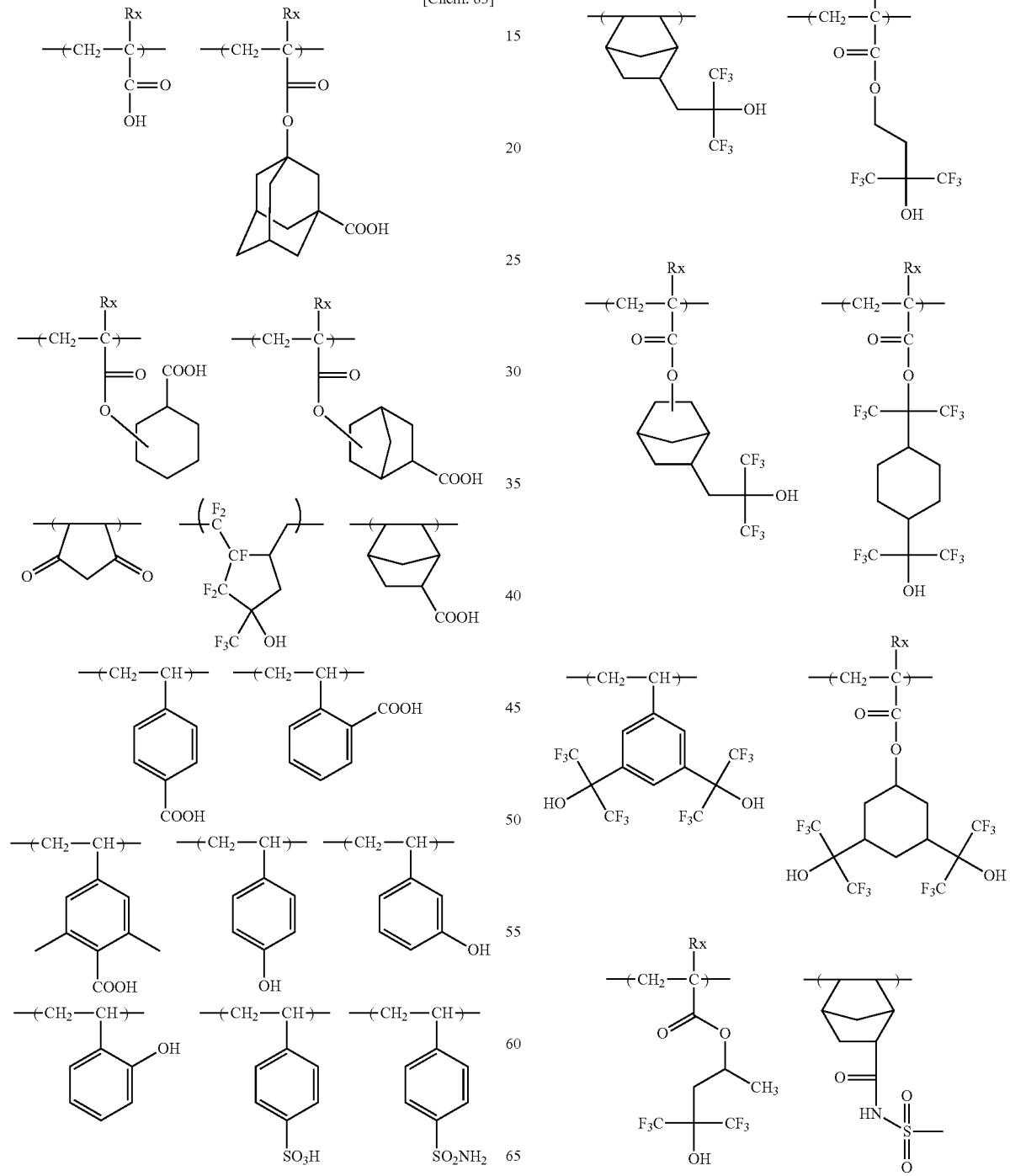

-continued

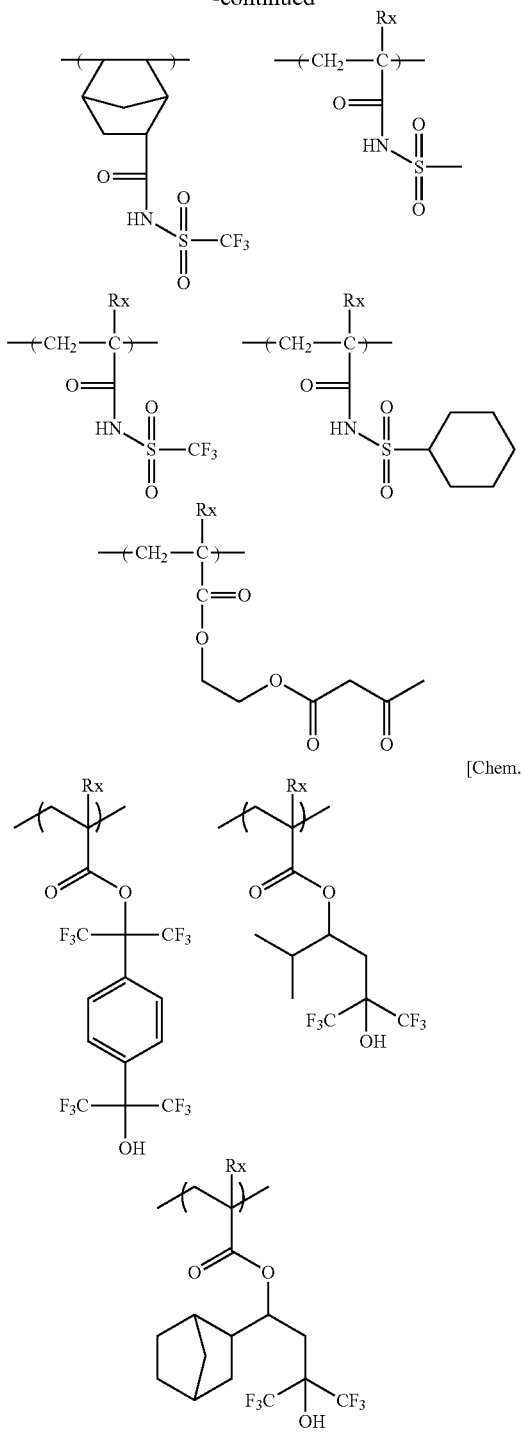

As the group having a lactone structure, the acid anhydride group, or the acid imide group (y), a group having a lactone structure is particularly preferred.

The repeating unit having such a group is a repeating unit in which the group is directly bonded to the main chain of the resin, such as a repeating unit by an acrylic acid ester or a methacrylic acid ester. This repeating unit may also be a repeating unit in which the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a group having a lactone structure are the same as those of the repeating unit having a lactone structure described above in the paragraph of the acid-decomposable resin (P).

The content of the repeating unit having a group having a lactone structure, the acid group, or the acid imide group is preferably from 1 to 100 mol %, more preferably from 3 to 98 mol %, and still more preferably from 5 to 95 mol %, based on all the repeating units in the hydrophobic resin.

In the hydrophobic resin (E), examples of the repeating unit having a group capable of decomposing by the action of an acid (z) include those described above for the repeating unit having an acid-decomposable group in the resin (P). The repeating unit having a group capable of decomposing by the action of an acid (z) may have at least one of a fluorine atom and a silicon atom. In the hydrophobic resin (E), the content of the repeating unit having a group capable of decomposing by the action of an acid (z) is preferably from 1 to 80 mol %, more preferably from 10 to 80 mol %, and still more preferably from 20 to 60 mol %, based on all the repeating units in the resin (E).

The hydrophobic resin (E) may further contain a repeating unit represented by the following general formula (III).

[Chem. 85]

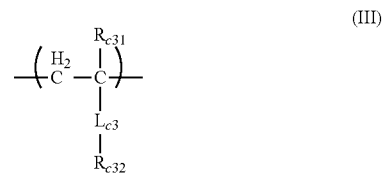

(III)

In the general formula (III), $R_{c31}$ represents a hydrogen atom, an alkyl group (which may be substituted with a fluorine atom or the like), a cyano group or a —$CH_2$—O—$Ra_{c2}$ group, wherein $Ra_{c2}$ represents a hydrogen atom, an alkyl group, or an acyl group, and $R_{c31}$ is preferably a hydrogen atom, a methyl group, a hydroxymethyl group, or a trifluoromethyl group, and particularly preferably a hydrogen atom or a methyl group;

$R_{c32}$ represents a group containing an alkyl group, a cycloalkyl group, an alkenyl group, a cycloalkenyl group, or an aryl group. These groups may be substituted with a group containing a fluorine atom or a silicon atom; and $L_{c3}$ represents a single bond or a divalent linking group.

In the general formula (III), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and more preferably a phenyl group or a naphthyl group, each of which may have a substituent.

$R_{c32}$ is preferably an unsubstituted alkyl group or an alkyl group substituted with a fluorine atom.

The divalent linking group of $L_{c3}$ is preferably an alkylene group (preferably having 1 to 5 carbon atoms), an ether bond, a phenylene group, or an ester bond (a group represented by —COO—).

The content of the repeating unit represented by the general formula (III) is preferably from 1 to 100 mol %, more preferably from 10 to 90 mol %, and still more preferably from 30 to 70 mol %, based on all the repeating resins in the hydrophobic resin.

The hydrophobic resin (E) preferably further contains a repeating unit represented by the following general formula (CII-AB).

[Chem. 86]

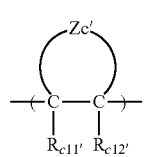

(CII-AB)

In the formula (CII-AB), $R_{c11}'$ and $R_{c12}'$ each independently represent a hydrogen atom, a cyano group, a halogen atom, or an alkyl group; and $Z_c'$ represents an atomic group for forming an alicyclic structure containing two carbon atoms (C—C) to which $Z_c'$ is bonded.

The content of the repeating unit represented by the following general formula (CII-AB) is preferably from 1 to 100 mol %, more preferably from 10 to 90 mol %, and still more preferably from 30 to 70 mol %, based on all the repeating resins in the hydrophobic resin.

Specific examples of the repeating units represented by the general formulae (III) and (CII-AB) are shown below, but the invention is not limited thereto. In the formulae, Ra represents H, $CH_3$, $CH_2OH$, $CF_3$, or CN.

[Chem. 87]

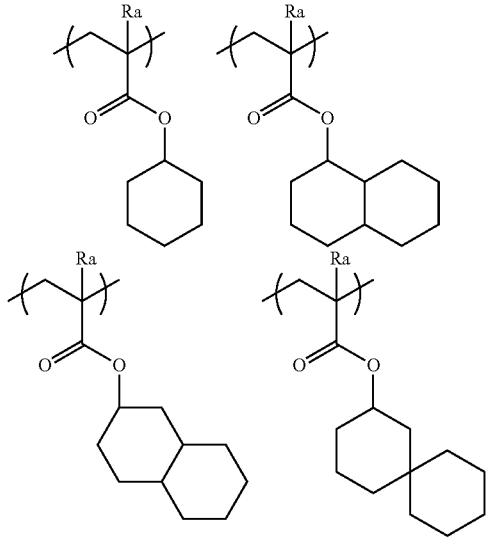

-continued

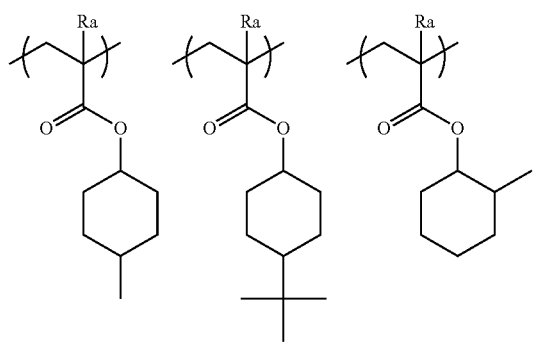

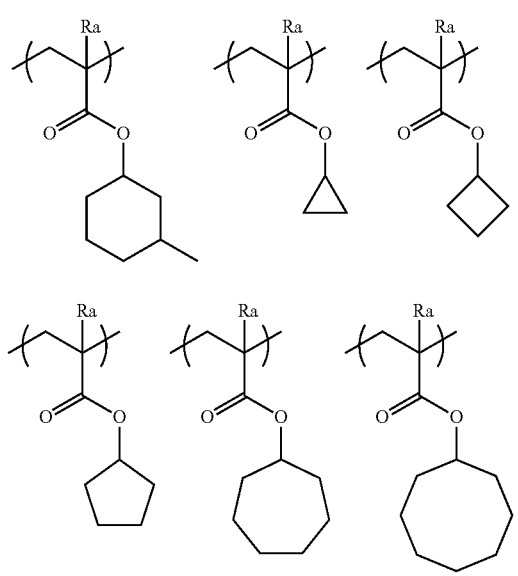

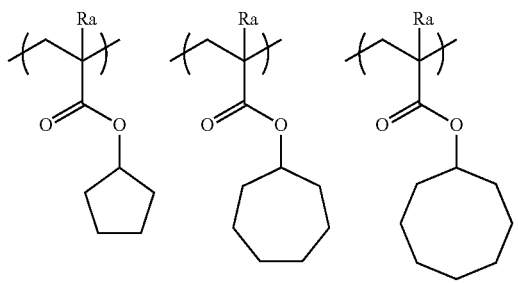

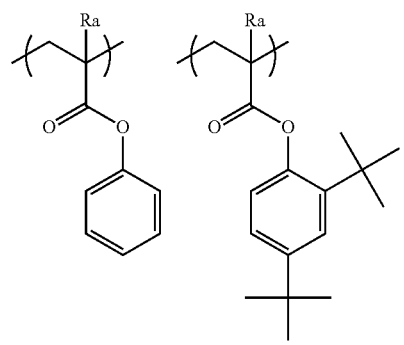

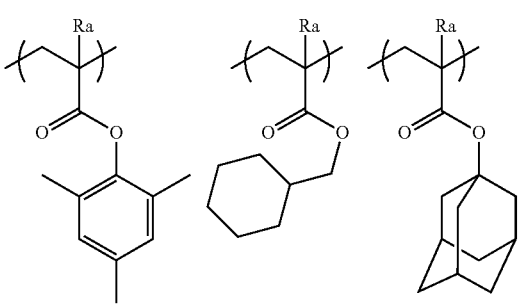

-continued

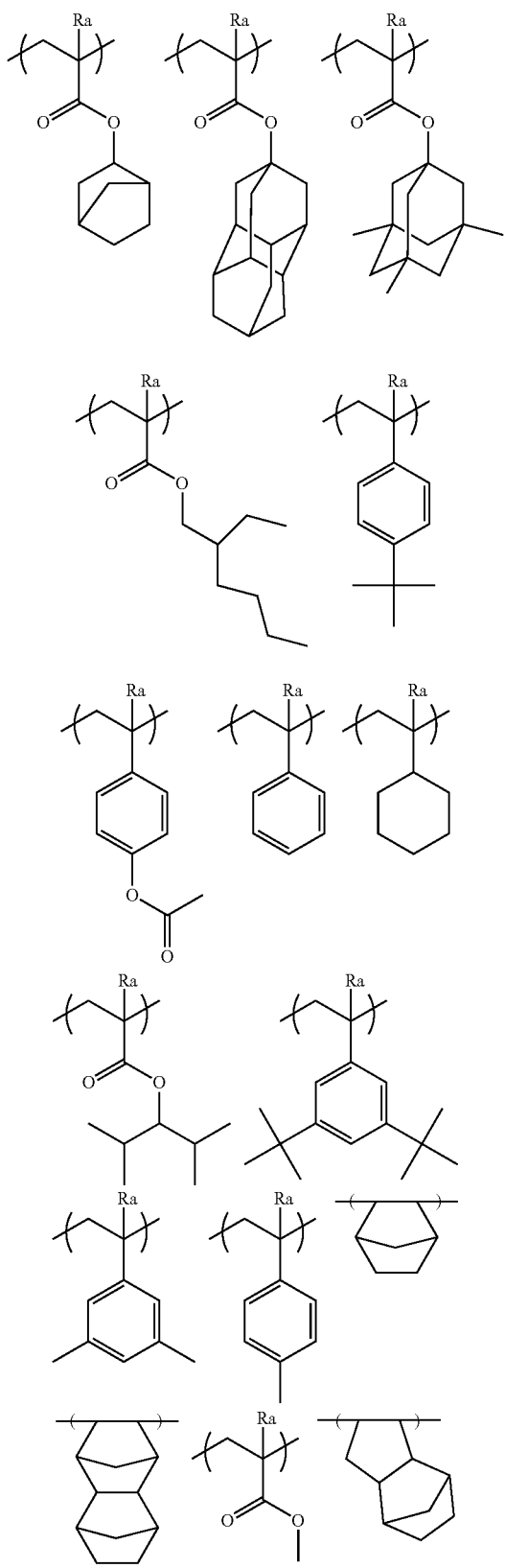

In the case where the hydrophobic resin (E) contains fluorine atoms, the content of the fluorine atoms is preferably from 5 to 80% by mass, and more preferably from 10 to 80% by mass, based on the weight average molecular weight of the hydrophobic resin (E). Further, the fluorine atom-containing repeating unit preferably occupies from 10 to 100 mol %, and more preferably from 30 to 100 mol %, based on all the repeating units contained in the hydrophobic resin (E).

In the case where the hydrophobic resin (E) contains silicon atoms, the content of the silicon atoms is preferably from 2 to 50% by mass, and more preferably from 2 to 30% by mass, based on the weight average molecular weight of the hydrophobic resin (E). Further, the silicon atom-containing repeating unit preferably occupies from 10 to 100 mol %, and more preferably from 20 to 100 mol %, based on all the repeating units in the hydrophobic resin (E).

The standard polystyrene-equivalent weight average molecular of the hydrophobic resin (E) is preferably from 1,000 to 100,000, more preferably from 1,000 to 50,000, and still more preferably from 2,000 to 15,000.

Furthermore, the hydrophobic resin (E) may be used singly or in combination of plural kinds thereof.

The content of the hydrophobic resin (E) in the composition is preferably from 0.01 to 10% by mass, more preferably from 0.05 to 8% by mass, and still more preferably from 0.1 to 5% by mass, based on the total solid contents of the composition of the invention.

In the hydrophobic resin (E), similarly to the resin (P), it is of course preferred that the content of impurities such as metals be low, but also, the content of residual monomers or oligomer components is preferably from 0.01 to 5% by mass, more preferably from 0.01 to 3% by mass, and still more preferably from 0.05 to 1% by mass. When these conditions are satisfied, an actinic ray-sensitive or radiation-sensitive resin composition free of extraneous substances in liquid or change with aging of sensitivity or the like can be obtained. Furthermore, from the viewpoint of resolution, resist profile, the side wall of a resist pattern, roughness, and the like, the molecular weight distribution (Mw/Mn, also referred to as "dispersity") is preferably in the range of 1 to 5, more preferably 1 to 3, and still more preferably 1 to 2.

As for the hydrophobic resin (E), various commercially available products may be used or the resin may be synthesized by an ordinary method (for example, radical polymerization). Examples of the general synthetic method include a batch polymerization method in which a monomer species and an initiator are dissolved in a solvent and heated so as to accomplish polymerization and a dropping polymerization method in which a solution of monomer species and initiator is added by dropwise addition to a heated solvent over a period of 1 to 10 hours. The dropping polymerization method is preferred.

The reaction solvent, the polymerization initiator, the reaction conditions (for example, temperature and concentration), and the purification method after reaction are the same as those described for the resin (P), but the concentration for the reaction is preferably from 30 to 50% by mass in the synthesis of the hydrophobic resin (E).

Specific examples of the hydrophobic resin (E) are shown below. Further, the molar ratio of the repeating units (corresponding to the respective repeating units starting from the left), the weight average molecular weight, and the dispersity in the respective resins are shown in the table below.

[Chem. 88]
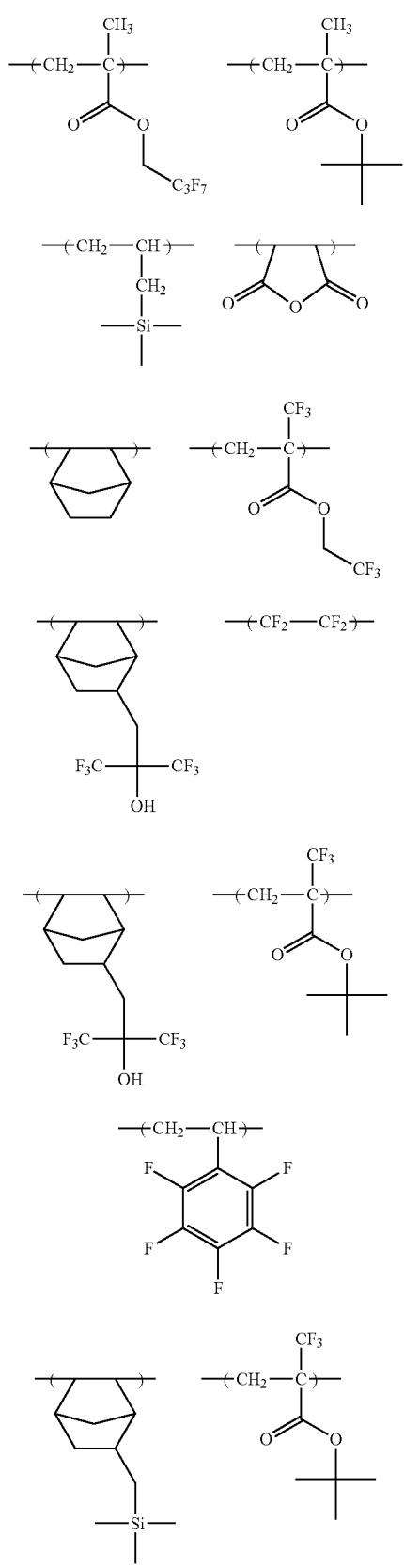
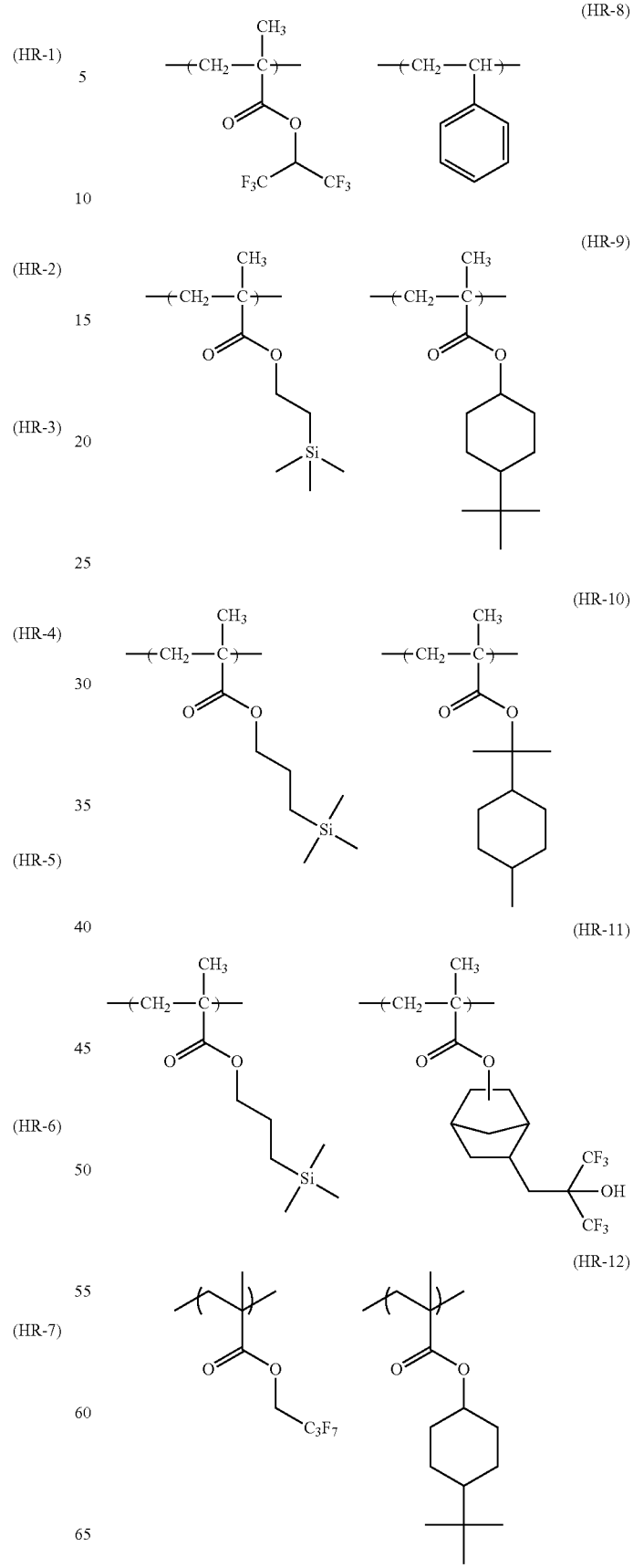

(HR-13) 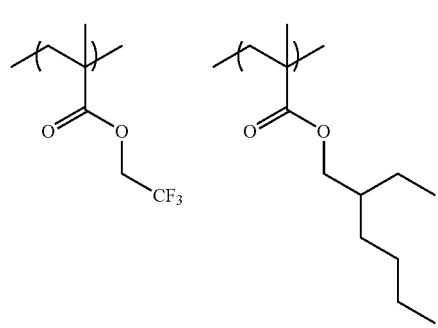
(HR-14) 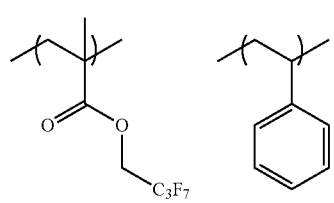
(HR-15) 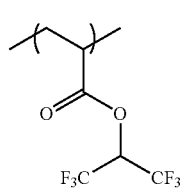
(HR-16) 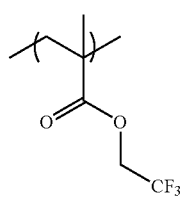
(HR-17) 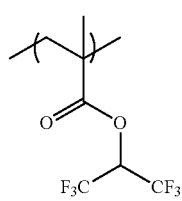
(HR-18) 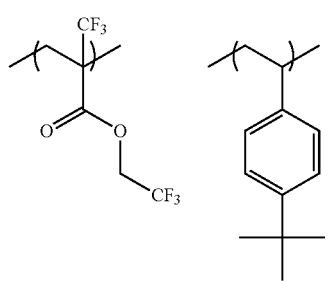
(HR-19) 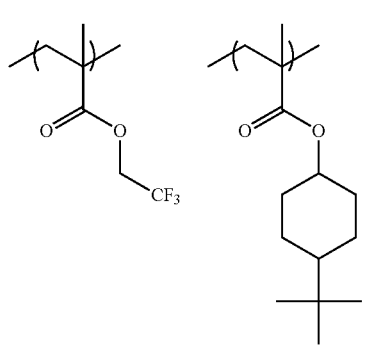
(HR-20) 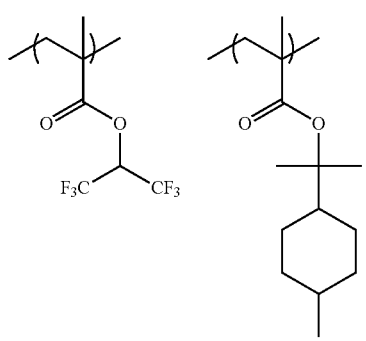
(HR-21) 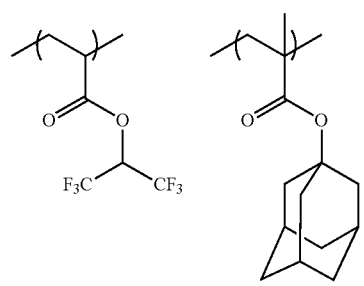
(HR-22) 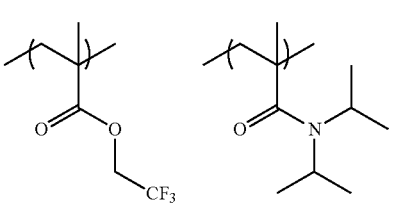
(HR-23) 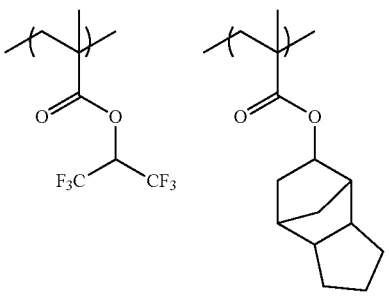

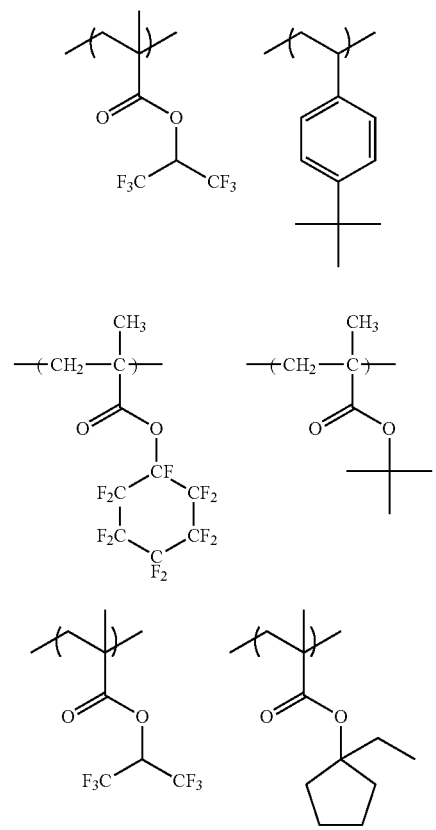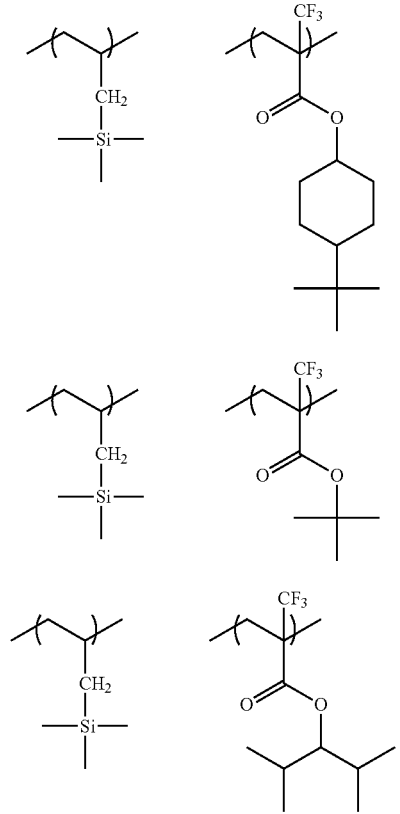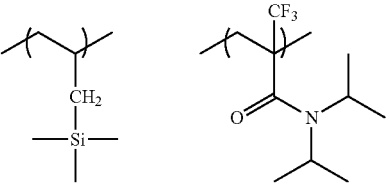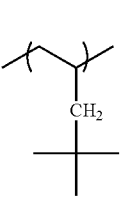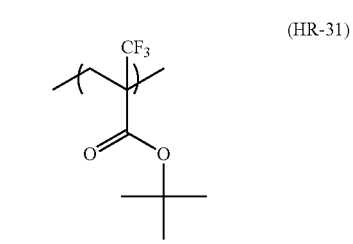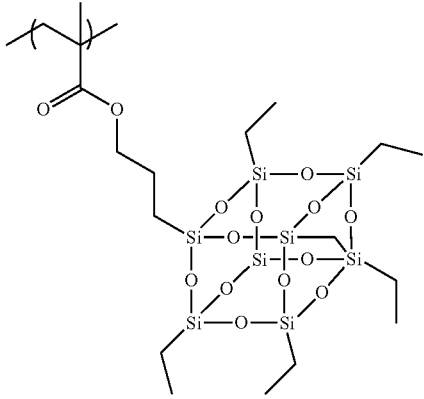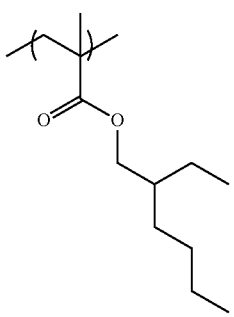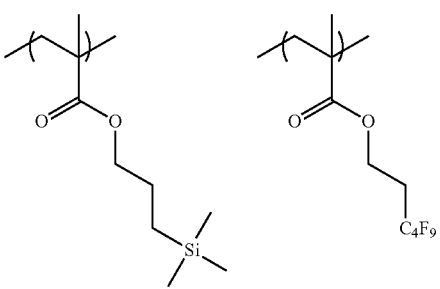

-continued
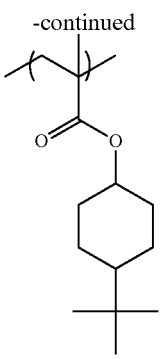
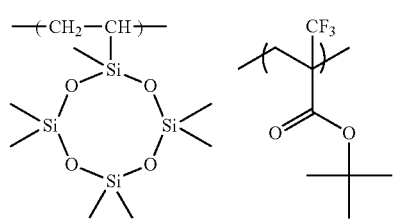
(HR-34)
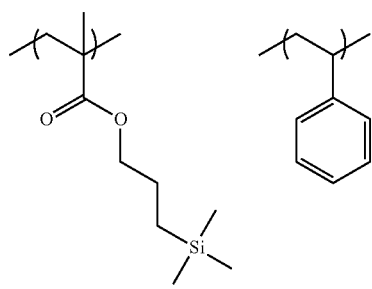
(HR-35)
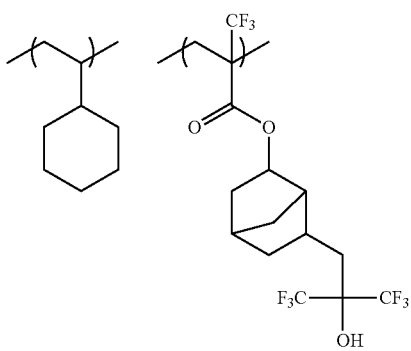
(HR-36)
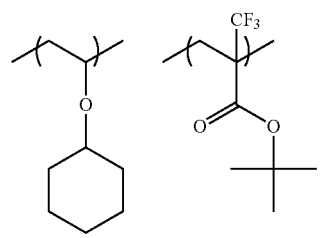
(HR-37)
-continued
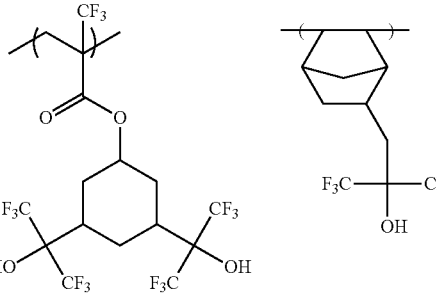
(HR-38)
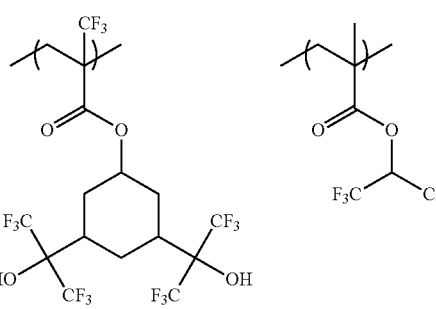
(HR-39)
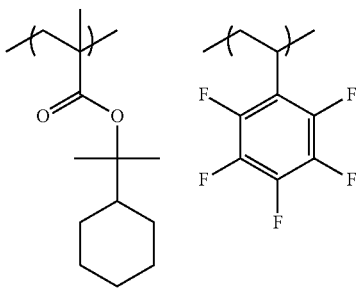
(HR-40)
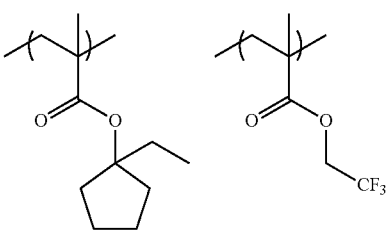
(HR-41)
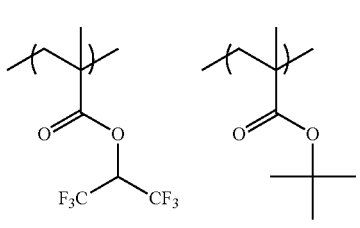
(HR-42)

(HR-43) 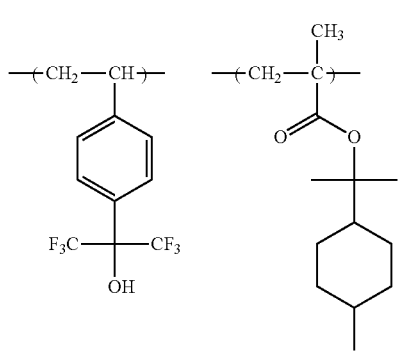
(HR-44) 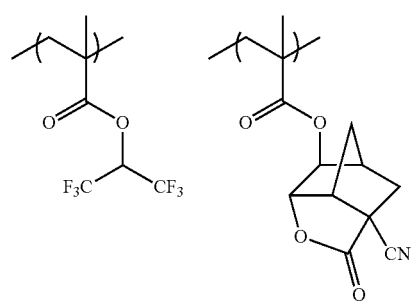
(HR-45) 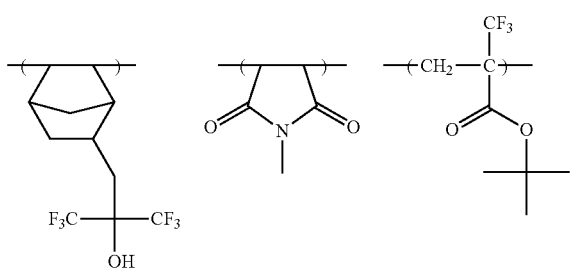
(HR-46) 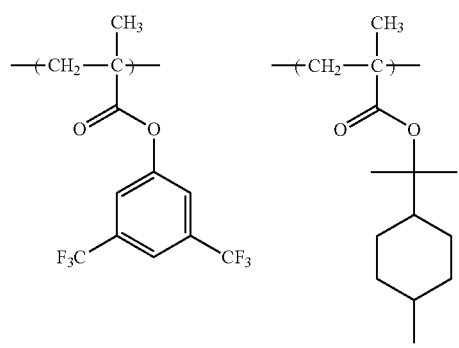
(HR-47) 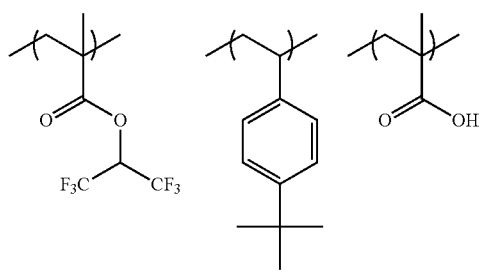
(HR-48) 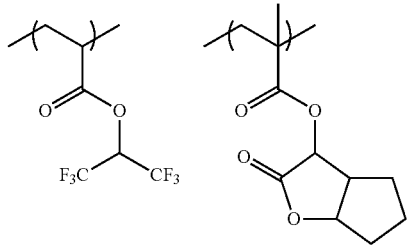
[Chem. 90]
(HR-49) 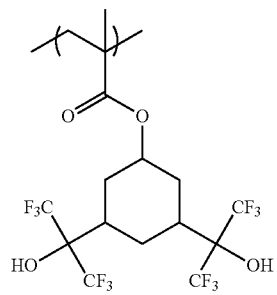
(HR-50) 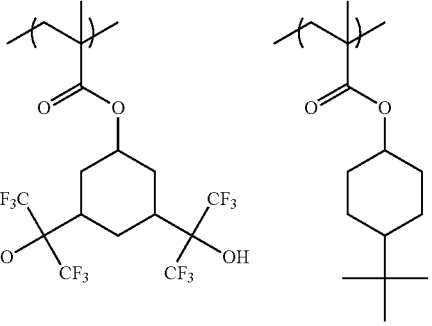
(HR-51) 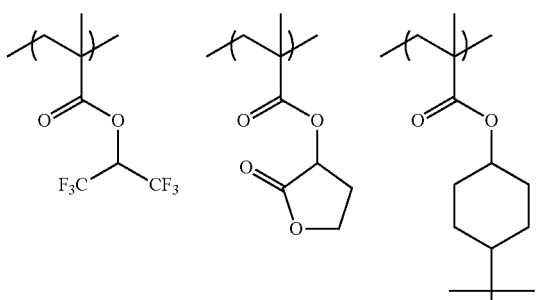
(HR-52) 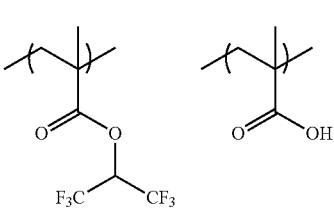

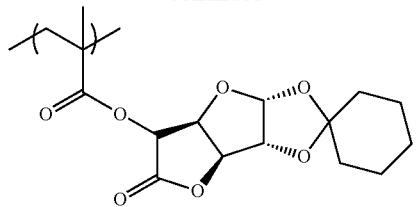
(HR-53)
(HR-54)
(HR-55)
(HR-56)
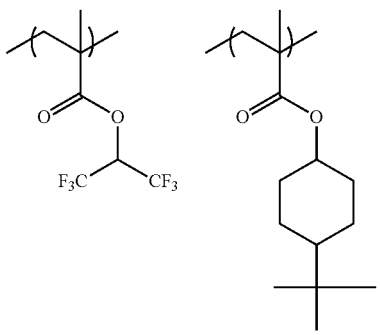
(HR-57)
(HR-58)
(HR-59)
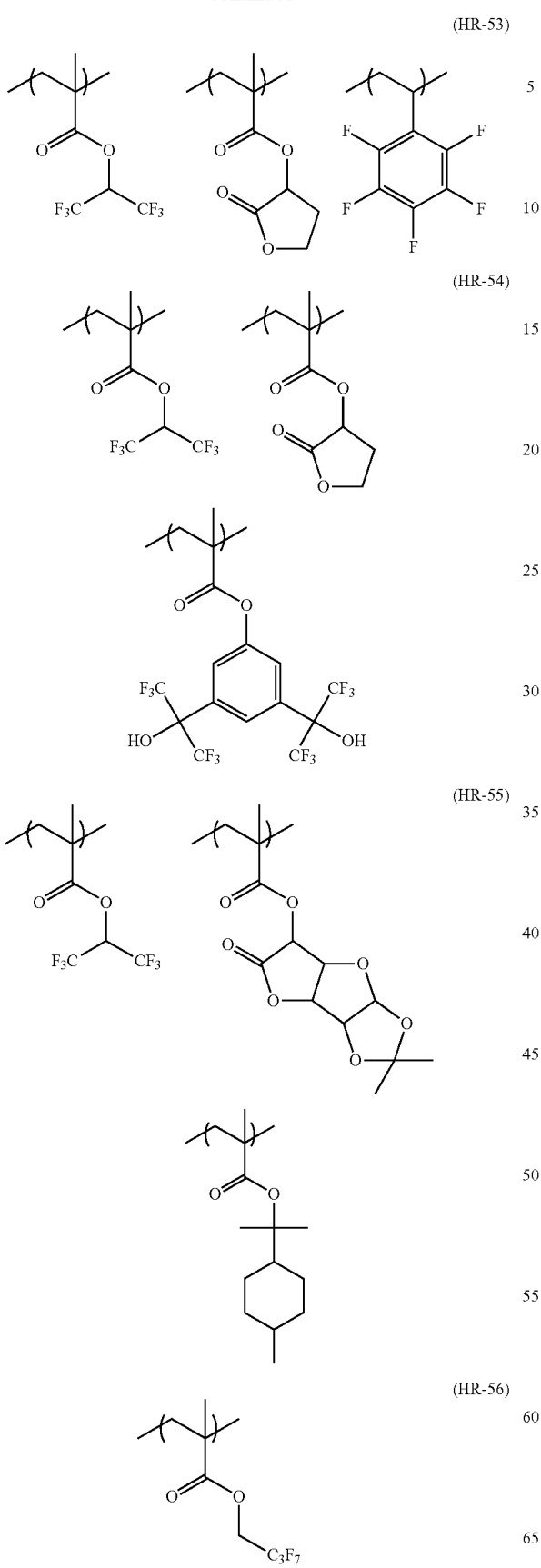

-continued
(HR-60)
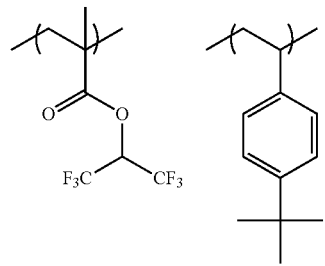
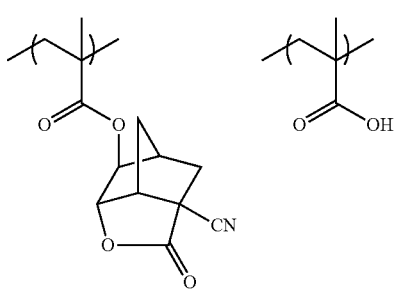
(HR-61)
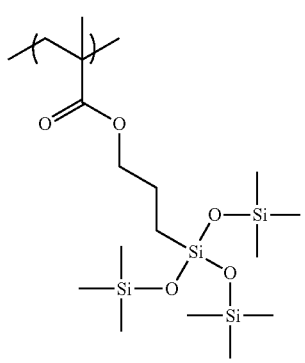 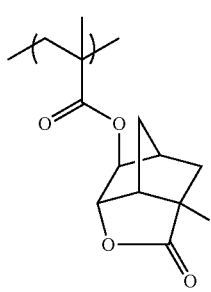
(HR-62)
(HR-63)
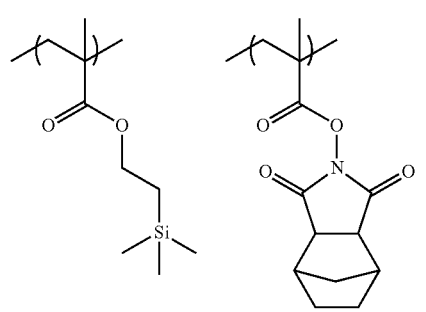
-continued
(HR-64)
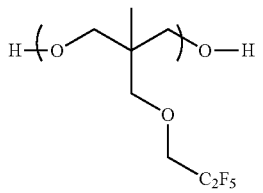
(HR-65)
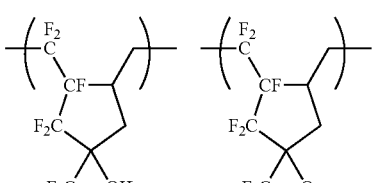
[Chem. 91]
(HR-66)
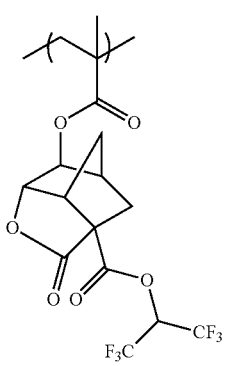
(HR-67)
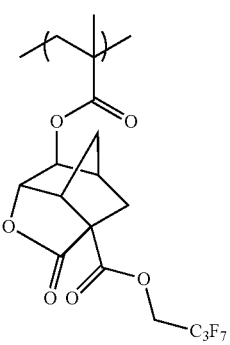
(HR-68)
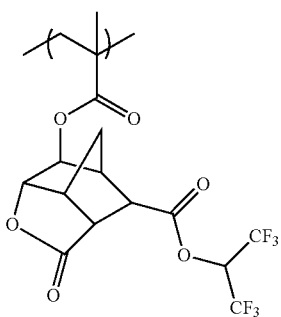

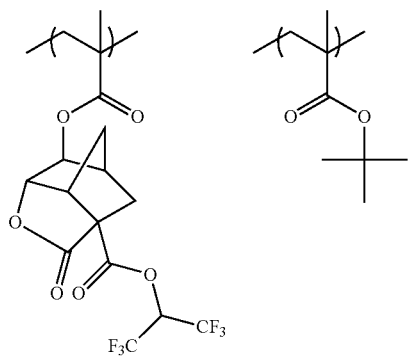 (HR-69)
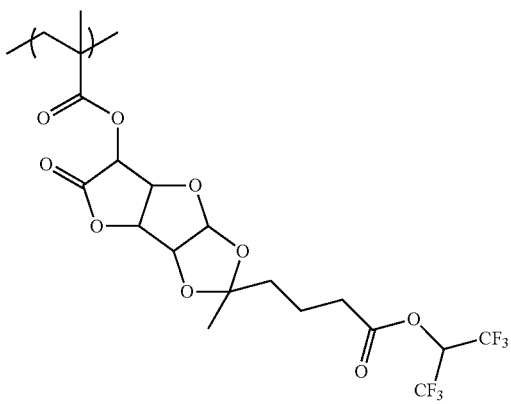 (HR-73)
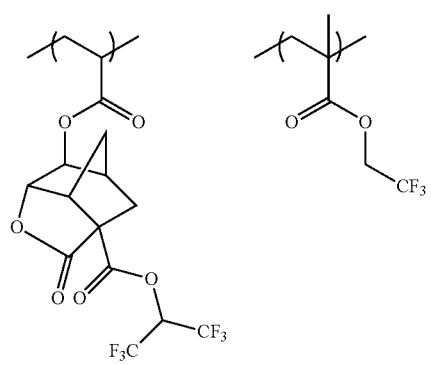 (HR-70)
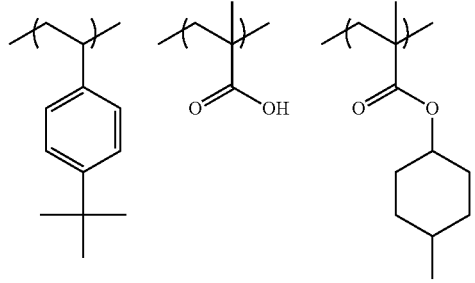
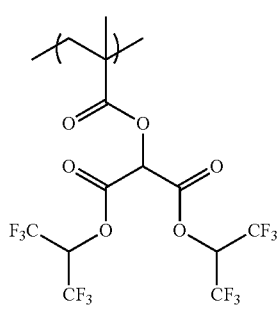 (HR-71)
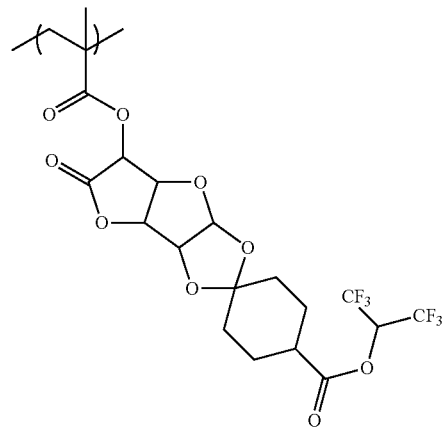 (HR-74)
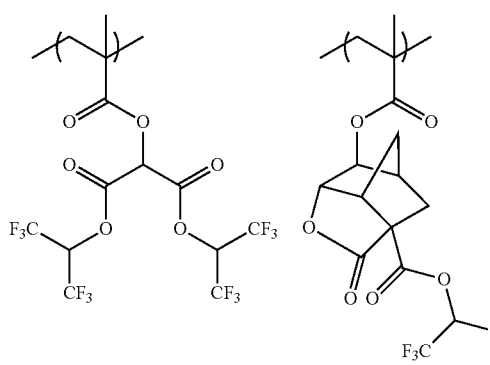 (HR-72)
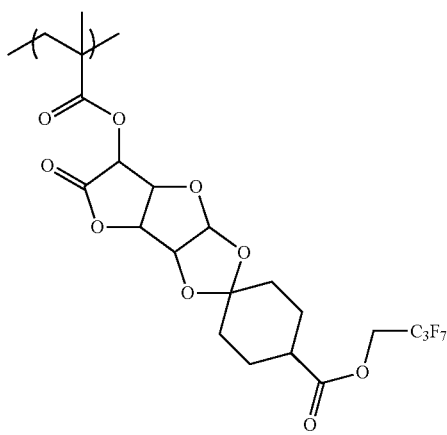 (HR-75)

(HR-76)
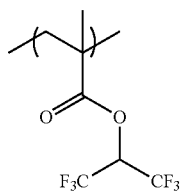
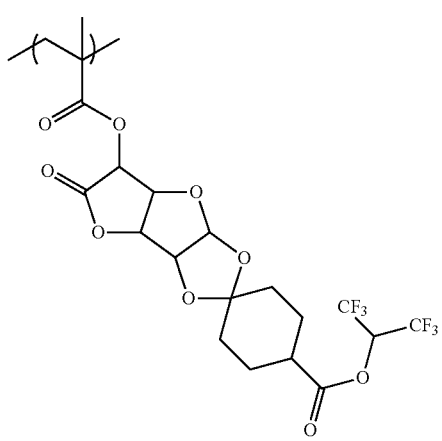
(HR-77)
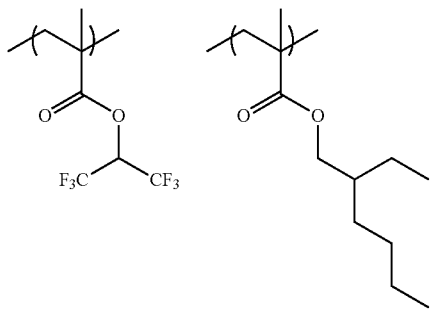
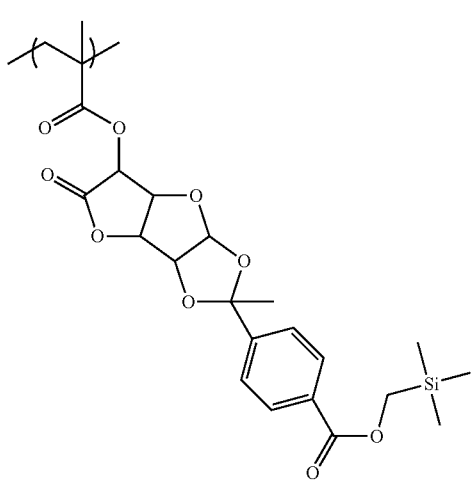
(HR-78)
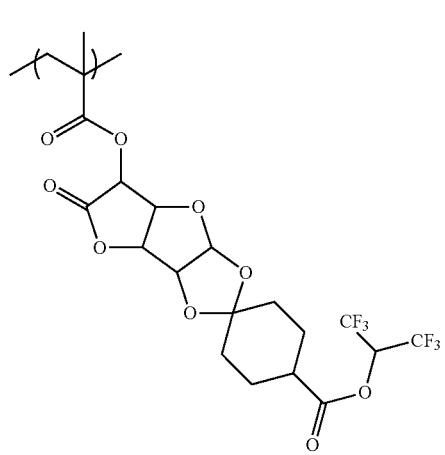
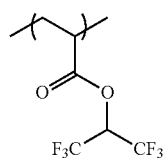
(HR-79)
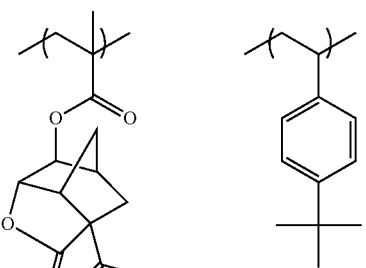
(HR-80)
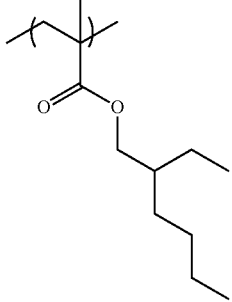
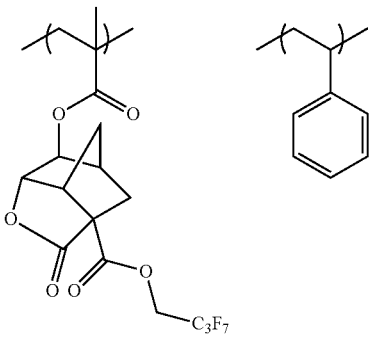

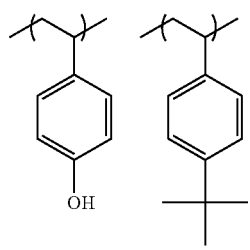
(HR-83)
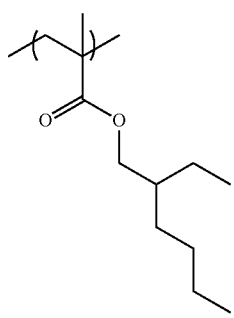
[Chem. 92]
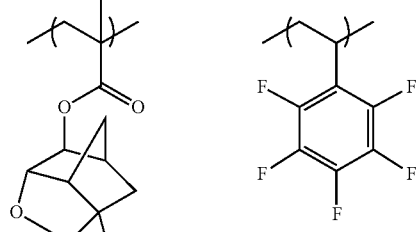
(HR-81)
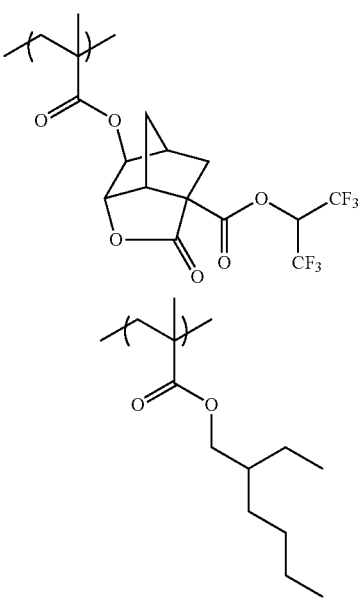
(HR-84)
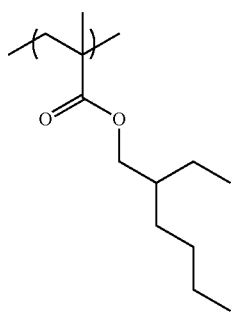
(HR-82)
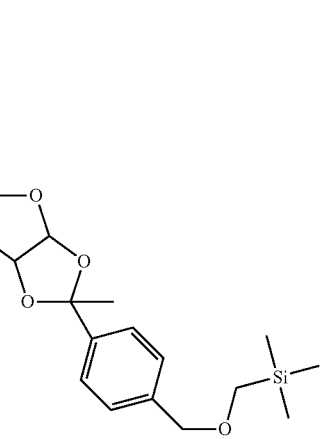
(HR-85)
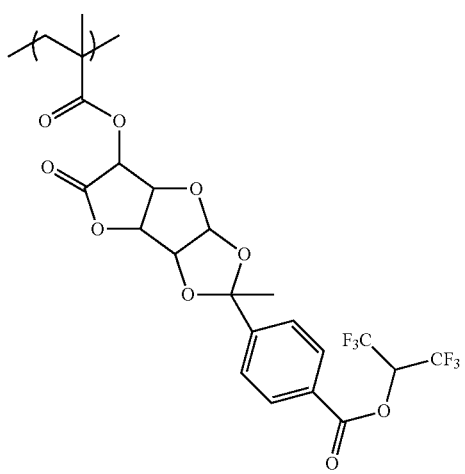
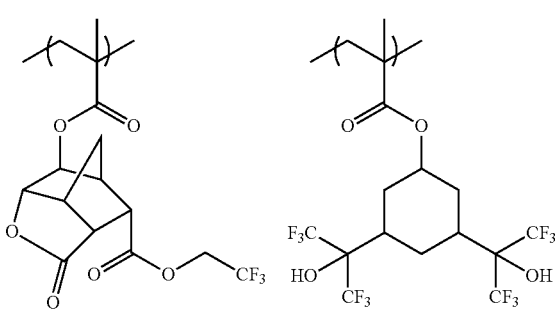

-continued
(HR-86)
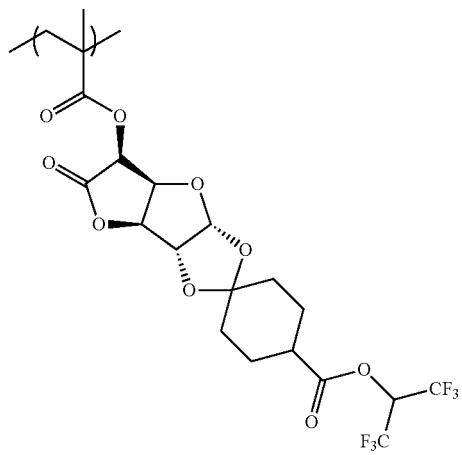
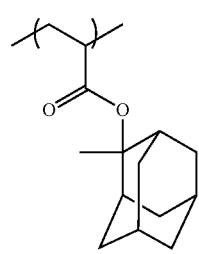
(HR-87)
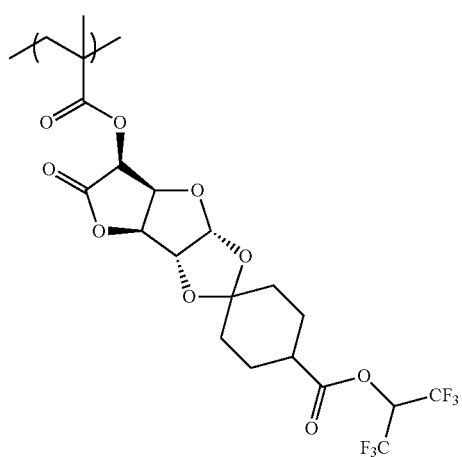
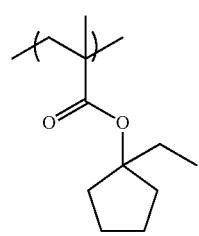
-continued
(HR-88)
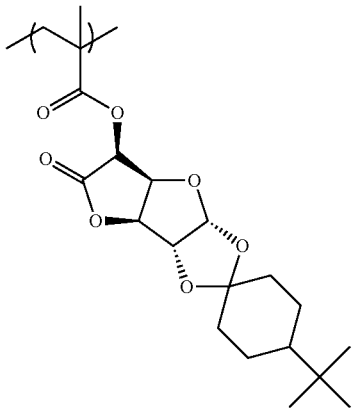
(HR-89)
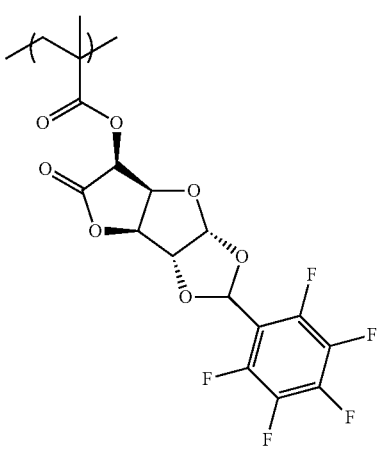
(HR-90)
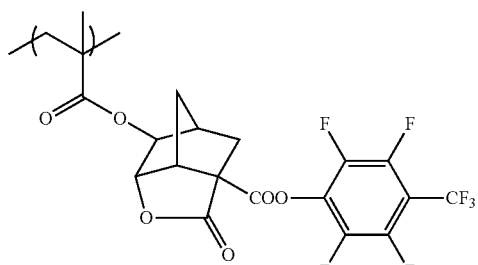
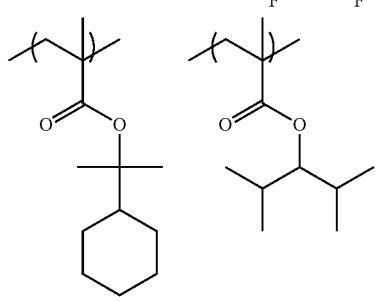
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |

TABLE 1-continued

| Resin | Composition | Mw | Mw/Mn |
|---|---|---|---|
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |

TABLE 2-continued

| Resin | Composition | Mw | Mw/Mn |
|---|---|---|---|
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[7] Surfactant (F)

The actinic ray-sensitive or radiation-sensitive resin composition in the invention may or may not further contain a surfactant, and in the case where it contains a surfactant, it is preferable to include any one fluorine-based and/or silicon-based surfactant (a fluorine-based surfactant, a silicon-based surfactant or a surfactant containing both fluorine atoms and silicon atoms) or two or more kinds thereof.

When the actinic ray-sensitive or radiation-sensitive resin composition in the invention contains the surfactant, a resist pattern with good sensitivity, resolution and adherence as well as few development defects can be obtained in using an exposure light source of 250 nm or less, and in particular, 220 nm or less.

Examples of the fluorine-based and/or silicon-based surfactant include the surfactants described in paragraph [0276] in the specification of US Patent App. No. 2008/0248425, such as EFtop EF301 and EF303 (manufactured by Shin-Akita Kasei K. K.); Florad FC430, 431, and 4430 (manufactured by Sumitomo 3M Inc.); Megaface F171, F173, F176, F189, F113, F110, F177, F120, and R08 (manufactured by Dainippon Ink & Chemicals, Inc.); Surflon S-382, SC101, 102, 103, 104, 105, and 106, and KH-20 (manufactured by Asahi Glass Co., Ltd.); Troysol S-366 (manufactured by Troy Chemical); GF-300, and GF-150 (manufactured by Toagosei Chemical Industry Co., Ltd.); Surflon S-393 (manufactured by Seimi Chemical Co., Ltd.); EFtop EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA); and FTX-204G, 208G, 218G, 230G, 204D, 208D, 212D, 218D, and 222D (manufactured by NEOS Co., Ltd.). In addition, a polysiloxane polymer KP-341 (manufactured by Shin-Etsu Chemical Co., Ltd.) may also be used as the silicon-based surfactant.

Furthermore, other than those known surfactants above, a surfactant using a polymer having a fluoro-aliphatic group derived from a fluoro-aliphatic compound which is produced by a telomerization method (also called a telomer method) or an oligomerization method (also called an oligomer method), may also be used. The fluoro-aliphatic compound can be synthesized by the method described in JP2002-90991A.

Examples of the above-described type of surfactant include Megaface F178, F-470, F-473, F-475, F-476, and F-472 (manufactured by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene))acrylate (or methacrylate), and a (poly(oxypropylene))acrylate (or methacrylate).

Moreover, a surfactant other than the fluorine-based and/or silicon-based surfactant, described in paragraph [0280] in the specification of US Patent App. No. 2008/0248425, may also be used in the invention.

The surfactants may be used singly or in combination of several kinds thereof.

In the case where the actinic ray-sensitive or radiation-sensitive resin composition contains the surfactant, the amount of the surfactant used is preferably from 0.0001 to 2% by mass, and more preferably from 0.0005 to 1% by mass, based on the total amount of the actinic ray-sensitive or radiation-sensitive resin composition (excluding the solvent).

On the other hand, by setting the addition amount of the surfactant to 10 ppm or less based on the total amount of the actinic ray-sensitive or radiation-sensitive resin composition (excluding the solvent), the hydrophobic resin is more unevenly distributed to the surface, so that the resist film surface can be made more hydrophobic and the followability of water at the immersion exposure can be enhanced.

[8] Other Additives (G)

The actinic ray-sensitive or radiation-sensitive resin composition in the invention may or may not contain an onium carboxylate. Examples of the onium carboxylate include those described in paragraphs [0605] to [0606] in the specification of US Patent App. No. 2008/0187860.

The onium carboxylate can be synthesized by reacting sulfonium hydroxide, iodonium hydroxide, ammonium hydroxide, and carboxylic acid with silver oxide in a suitable solvent.

In the case where the actinic ray-sensitive or radiation-sensitive resin composition contains onium carboxylate, the content of the onium carboxylate is generally from 0.1 to 20% by mass, preferably 0.5 to 10% by mass, and still more preferably 1 to 7% by mass, based on the total solid contents of the composition.

The actinic ray-sensitive or radiation-sensitive resin composition of the invention may further contain, for example, a dye, a plasticizer, a photosensitizer, a light absorber, an alkali-soluble resin, a dissolution inhibitor, a compound for accelerating dissolution in a developer (for example, a phenol compound having a molecular weight of 1000 or less, or a carboxyl group-containing alicyclic or aliphatic compound), or the like, if desired.

The phenol compound having a molecular weight of 1000 or less can be easily synthesized by referring to the methods described, for example, in JP1992-122938A (JP-H04-122938A), JP1990-28531A (JP-H02-28531A), U.S. Pat. No. 4,916,210B, EP219,294B, and the like.

Examples of the carboxyl group-containing alicyclic or aliphatic compound include a carboxylic acid derivative having a steroid structure, such as cholic acid, deoxycholic acid, and lithocholic acid, an adamantanecarboxylic acid derivative, adamantanedicarboxylic acid, cyclohexanecarboxylic acid, and cyclohexanedicarboxylic acid.

The actinic ray-sensitive or radiation-sensitive resin composition in the invention is preferably used in a film thickness of 30 to 250 nm, and more preferably from 30 to 200 nm, from the viewpoint of enhancing the resolving power. Such a film thickness can be obtained by setting the solid concentration in the actinic ray-sensitive or radiation-sensitive resin composition to an appropriate range, thereby imparting an appropriate viscosity and enhancing the coatability and the film-forming property.

The solid content concentration of the actinic ray-sensitive or radiation-sensitive resin composition for use in the invention is usually from 1.0 to 10% by mass, preferably from 2.0 to 5.7% by mass, and more preferably from 2.0 to 5.3% by mass. When the solid content concentration is in this range, the resist solution can be uniformly applied on a substrate, and in addition, a resist pattern with excellent line edge roughness can be formed. The reasons therefor are not clearly know, but it is considered that by setting the solid content concentration to 10% by mass or less, and preferably 5.7% by mass or less, the materials, particularly the photo-acid generator, in the resist solution are prevented from aggregation, and as a result, a uniform resist film can be formed.

The solid content concentration is a weight percentage of the weight of the resist components excluding the solvents, based on the total weight of the actinic ray-sensitive or radiation-sensitive resin composition.

The actinic ray-sensitive or radiation-sensitive resin composition of the invention is used, for example, after the above components are dissolved in a predetermined organic solvent, filtered using a filter, and then applied onto a predetermined support (substrate). The filter is preferably made of polytetrafluoroethylene, polyethylene, or nylon having a pore size of 0.1 µm or less, more preferably 0.05 µm or less, and still more preferably 0.03 µm or less. In the filtration using a filter, for example, cyclic filtration may be carried out as described in JP2002-62667A or filtration with serial or parallel connection of plural kinds of filters may be carried out. Further, the composition may be filtered plural times. In addition to the filtration using a filter, the composition may be subjected to a deaeration treatment or the like.

[9] Pattern Forming Method

The pattern forming method of the invention (negative type pattern forming method) includes at least:
(i) forming a film (resist film) using an actinic ray-sensitive or radiation-sensitive resin composition;
(ii) exposing the film; and
(iii) developing the film after the exposure using a developer.

The exposure in (ii) may be liquid-immersion exposure.

The pattern forming method of the invention preferably includes (iv) heating after the (ii) exposure.

The pattern forming method of the invention may further include (v) developing using an alkali developer.

The pattern forming method of the invention may include (ii) exposure plural times.

The pattern forming method of the invention may include (v) heating plural times.

The resist film is formed from the actinic ray-sensitive or radiation-sensitive resin composition according to the invention, and more specifically, it is preferably formed on a substrate. In the pattern forming method of the invention, the processes of forming a film from the actinic ray-sensitive or radiation-sensitive resin composition on a substrate; exposing the film; and developing may be carried out by a generally known method.

After preparing the film and before the exposure step, a prebake process (PB; Prebake) is also preferably included.

In addition, after the exposure step and before the development step, a heating step (PEB; Post Exposure Bake) is also preferably included.

Regarding the heating temperature, heating of any of PB and PEB is preferably at a temperature of 70 to 130° C., and more preferably at a temperature of 80 to 120° C.

The heating time is preferably 30 to 300 seconds, more preferably 30 to 180 seconds, and still more preferably 30 to 90 seconds.

Heating may be carried out by a unit included in an exposure/development apparatus, and may also be carried out using a hot plate or the like.

By the baking, the reaction of the exposed portion is accelerated and the sensitivity or pattern profile is improved.

The light source wavelength used in the exposure apparatus in the invention is not limited, but examples thereof infrared radiation, visible light, ultraviolet rays, far ultraviolet rays, X rays, and an electron beam. The far ultraviolet rays have a wavelength of preferably 250 nm or shorter, more preferably 220 nm or less, and particularly preferably 1 to 200 nm, specifically, a KrF excimer laser (248 nm), an ArF excimer laser (193 nm), an $F_2$ excimer laser (157 nm), X rays, EUV radiation (13 nm), and an electron beam, with a KrF excimer laser, an ArF excimer laser, EUV radiation, or an electron beam being preferred, and an ArF excimer laser being more preferred.

Moreover, in the exposure of the invention, a liquid-immersion exposure method may be applied.

The liquid-immersion exposure method is a technique for improving the resolution, in which a high refractive-index liquid (hereinafter also referred to as a "liquid for liquid immersion") is filled between a projection lens and a sample to carry out exposure.

As described above, with regard to the "effect of the liquid immersion", taking $\lambda_0$ as the wavelength of exposure light in air, n as the refractive index of the liquid for liquid immersion to air and θ as the convergent half angle of the light beam, where $NA_0 = \sin \theta$, the resolving power and the focal depth in the event of liquid immersion can be expressed by the following formulae. Here, $k_1$ and $k_2$ are coefficients involved in the process.

(Resolving power)=$k_1 \cdot (\lambda_0/n)/NA_0$ (Focal depth)=$\pm k_2 \cdot (\lambda_0/n)/NA_0^2$ That is, the effect of the liquid immersion is equivalent to the use of an exposure wavelength of 1/n. In other words, in projection optical systems of identical NA, liquid immersion enables the focal depth to be n-fold. This is effective in all pattern configurations. Further, this can be combined with a super-resolution technology, such as a phase shift method or a modified illumination method, now under study.

In the case of carrying out liquid-immersion exposure, the washing of the surface of a film with an aqueous chemical liquid may be carried out (1) after forming a film on a substrate, and then exposing the film through a liquid for liquid immersion, and/or (2) after exposing a film through a liquid for liquid immersion and before heating the film.

The liquid for liquid immersion is preferably a liquid which is transparent in exposure wavelength whose temperature coefficient of a refractive index is as low as possible so as to ensure minimization of any distortion of an optical image projected on the film. Particularly, in the use of an ArF excimer laser (wavelength: 193 nm) as an exposure light source, however, it is more preferable to use water from the viewpoints of easiness of availability and easiness of handling in addition to the above-described viewpoints.

In the case of using water, a slight proportion of an additive (liquid) that does not dissolve the resist film on a wafer and would have negligible influence on an optical coat for an under surface of a lens element may be added in order to not only decrease the surface tension of water but also increase a surface activating power.

The additive is preferably an aliphatic alcohol with a refractive index approximately equal to that of water, and specific examples thereof include methyl alcohol, ethyl alcohol, and isopropyl alcohol. The addition of an alcohol with a refractive index approximately equal to that of water is advantageous in that even when the alcohol component is evaporated from water, thereby causing a change in the concentration, the change in the refractive index of the liquid as a whole can be minimized.

On the other hand, when a substance being opaque in light at 193 nm or an impurity whose refractive index is greatly different from that of water is mixed therein, the mixing would invite a distortion of optical image projected on the resist. Accordingly, distilled water is preferred as the water used. Furthermore, pure water that has been filtered through an ion exchange filter or the like may be used.

For the water, used as a liquid for liquid immersion, the electric resistivity is preferably 18.3 MΩcm or more, and the TOC (total organic matter concentration) is preferably 20 ppb or less. Also, the water is preferably subjected to a deaeration treatment.

Furthermore, by increasing the refractive index of the liquid for liquid immersion, it is possible to enhance lithography performance. From such viewpoints, an additive capable of increasing a refractive index may be added to the water, or heavy water ($D_2O$) may be used in place of the water.

In the case where a film formed by using the composition of the invention is exposed through a liquid immersion medium, the above-described hydrophobic resin (E) may be added, if desired. By adding the hydrophobic resin (E), the receding contact angle of the surface is improved. The receding contact angle is preferably from 60° to 90°, and more preferably from 70° or more.

In the liquid immersion exposure step, the liquid for liquid immersion needs to move on a wafer following the movement of an exposure head that is scanning the wafer at a high speed and forming an exposure pattern. Therefore, the contact angle of the liquid for liquid immersion with the resist film in a dynamic state is important, and the resist is required to have a performance of allowing liquid droplets to follow the high-speed scanning of an exposure head without leaving any liquid droplet.

In order to prevent the film from directly contacting the liquid for liquid immersion, a film sparingly soluble in a liquid for liquid immersion (hereinafter also referred to as a "top coat") may be provided between the film formed using the composition of the invention and the liquid for liquid immersion. The functions required of the top coat are suitability for coating on the resist, transparency to radiation, particularly, radiation having a wavelength of 193 nm, and sparing solubility in the liquid for liquid immersion. The top coat is preferably unmixable with the resist and uniformly coatable on the resist.

In view of transparency to light at 193 nm, the top coat is preferably an aromatic-free polymer.

Specific examples of the polymer include a hydrocarbon polymer, an acrylic acid ester polymer, a polymethacrylic acid, a polyacrylic acid, a polyvinyl ether, a silicon-containing polymer, and a fluorine-containing polymer. The above-described hydrophobic resin (E) is suitable also as the top coat. If impurities are dissolved out into the liquid for liquid immersion from the top coat, the optical lens becomes contaminated, and therefore, it is preferable that little residual monomer components of the polymer be contained in the top coat.

On peeling off the top coat, a developer may be used or a release agent may be separately used. The release agent is preferably a solvent permeating the film to a lesser extent. From the viewpoint that the peeling step may be carried out simultaneously with the development step of the film, the top coat is preferably peelable with an alkaline developer. From the viewpoint of peeling with an alkaline developer, the top coat is preferably acidic, but from the viewpoint of non-intermixing with the film, the top coat may be neutral or alkaline.

The difference in the refractive index between the top coat and the liquid for liquid immersion is preferably zero or small. In this case, the resolution can be enhanced. In the case where the exposure light source is an ArF excimer laser (wavelength: 193 nm), water is preferably used as the liquid for liquid immersion and therefore, the top coat for ArF immersion exposure preferably has a refractive index close to the refractive index (1.44) of water. Also, from the viewpoints of transparency and a refractive index, the top coat is preferably a thin film.

The top coat is preferably unmixable with the film and further unmixable with the liquid for liquid immersion. From this point of view, when the liquid for liquid immersion is water, the solvent used for the top coat is preferably a medium that is sparingly soluble in the solvent used for the composition of the invention and is insoluble in water. Furthermore, when the liquid for liquid immersion is an organic solvent, the top coat may be either water-soluble or water-insoluble.

In the invention, the substrate on which the film is formed is not particularly limited, and a substrate generally used for lithography in the production of a semiconductor device, such as an IC, a liquid crystal device or a circuit board such as a thermal head and further in other photofabrication processes, such as an inorganic substrate, for example, silicon, SiN, $SiO_2$, and SiN and a coating-type inorganic substrate, for example, SOG, can be used. Further, if necessary, an organic antireflection film may be formed between the film and the substrate.

In the case where the pattern forming method of the invention further includes development using an alkali developer, examples of the alkali developer include alkaline aqueous solutions of inorganic alkali such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine.

Further, an alcohol and a surfactant may be each added in an appropriate amount to the alkaline aqueous solution.

The alkali concentration of the alkali developer is usually from 0.1 to 20% by mass.

The pH of the alkali developer is usually from 10.0 to 15.0.

In particular, a 2.38%-by-mass aqueous tetramethylammonium hydroxide solution is preferred.

As for the rinsing liquid in the rinsing treatment carried out after the alkali development, pure water is used, and the pure water may be used after adding a surfactant in an appropriate amount thereto.

Further, after the development treatment or the rinsing treatment, a treatment of removing the developer or the rinsing liquid adhering on the pattern by a supercritical fluid may be carried out.

As the developer (hereinafter also referred to as an organic developer) in the development with a developer including an organic solvent in the pattern forming method of the invention, a polar solvent such as a ketone-based solvent, an ester-based solvent, an alcohol-based solvent, an amide-based solvent, and an ether-based solvent, or a hydrocarbon-based solvent may be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, methyl amyl ketone, cyclohexanone, methylcyclohexanone, phenyl acetone, methylethyl ketone, methyl isobutyl ketone, acetylacetone, acetonylacetone, ionone, diacetonyl alcohol, acetylcarbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, in addition to the glycol ether-based solvents above, anisole, dioxane, and tetrahydrofuran.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be used by mixing with a solvent other than those described above or water. However, in order to sufficiently bring out the effects of the invention, the water content of the entire developer is preferably less than 10% by mass, and it is more preferred to include substantially no water.

That is, the content of the organic solvent in the organic developer is preferably from 90% by mass to 100% by mass, and more preferably from 95% by mass to 100% by mass, based on the total amount of the developer.

In particular, the organic developer is preferably a developer containing at least one organic solvent selected from a group consisting of a ketone-based solvent, an ester-based solvent, an alcohol-based solvent, an amide-based solvent, and an ether-based solvent.

The vapor pressure at 20° C. of the organic developer is preferably 5 kPa or less, more preferably 3 kPa or less, and particularly preferably 2 kPa or less. By setting the vapor pressure of the developer to 5 kPa or less, evaporation of the developer on a substrate or in a development cup is inhibited and the temperature uniformity in the wafer plane is enhanced, as a result, the dimensional uniformity in the wafer plane is improved.

Specific examples of the solvent having a vapor pressure of 5 kPa or less include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenyl acetone, and methylisobutyl ketone; ester-based solvents such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, and propyl lactate; alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol; ether-based solvents such as tetrahydrofuran; amide-based solvents such as N-methyl-2-pyrrolidone, N,N-dimethylacetamide, and N,N-dimethylformamide; aromatic hydrocarbon-based solvents such as toluene and xylene; and aliphatic hydrocarbon-based solvents such as octane and decane.

Specific examples of the solvent having a vapor pressure of 2 kPa or less include ketone-based solvents such as 1-octanone, 2-octanone, 1-nonanone, 2-nonanone, 4-heptanone, 2-hexanone, diisobutyl ketone, cyclohexanone, methylcyclohexanone, and phenyl acetone; ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate(ethyl 3-ethoxypropionate), 3-methoxybutyl acetate, 3-methyl-3-methoxybutyl acetate, ethyl lactate, butyl lactate, and propyl lactate; alcohol-based solvents such as n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol; amide-based solvents such as N-methyl-2-pyrrolidone, N,N-dimethylacetamide, and N,N-dimethylformamide; aromatic hydrocarbon-based solvents such as xylene; and aliphatic hydrocarbon-based solvents such as octane and decane.

An appropriate amount of a surfactant may be added to the organic developer, if desired.

The surfactant is not particularly limited but, for example, an ionic or nonionic fluorine-based and/or silicon-based surfactant can be used. Examples of such a fluorine-based and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. No. 5,405,720B, U.S. Pat. No. 5,360,692B, U.S. Pat. No. 5,529,881B, U.S. Pat. No. 5,296,330B, U.S. Pat. No. 5,436,098B, U.S. Pat. No. 5,576,143B, U.S. Pat. No. 5,294,511B, and U.S. Pat. No. 5,824,451B. A nonionic surfactant is preferred. The nonionic surfactant is not particularly limited, but use of a fluorine-based surfactant or a silicon-based surfactant is more preferred.

The amount of the surfactant used is usually from 0.001 to 5% by mass, preferably from 0.005 to 2% by mass, and more preferably from 0.01 to 0.5% by mass, based on the total amount of the developer.

Regarding the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on a substrate surface (spraying method), a method of continuously discharging the developer on the substrate spinning at a constant speed while scanning the developer discharging nozzle at a constant rate (dynamic dispense method), or the like may be applied.

In the case where the above-described various developing methods include a step of discharging the developer toward the resist film from a development nozzle of a developing apparatus, the discharge pressure of the developer discharged (the flow velocity per unit area of the developer discharged) is preferably 2 mL/sec/mm$^2$ or less, more preferably 1.5 mL/sec/mm$^2$ or less, and still more preferably 1 mL/sec/mm$^2$ or less. The flow velocity is not particularly limited in the lower limit, but from the viewpoint of throughput, is preferably 0.2 mL/sec/mm$^2$ or more.

By setting the discharge pressure of the discharged developer to the range above, pattern defects attributable to the resist residue after development can be greatly reduced.

Details of this mechanism are not clearly known, but it is considered that it is possible that due to the discharge pressure in the above-described range, the pressure imposed on the resist film by the developer is small and the resist film or resist pattern is kept from inadvertent chipping or collapse.

Here, the discharge pressure (mL/sec/mm$^2$) of the developer is a value at the outlet of a development nozzle in a developing apparatus.

Examples of the method for adjusting the discharge pressure of the developer include a method of adjusting the discharge pressure by a pump or the like, and a method of supplying the developer from a pressurized tank and adjusting the pressure to change the discharge pressure.

Further, after the development using a developer including an organic solvent, stopping of the development by replacement with another solvent may be carried out.

After the development using a developer including an organic solvent, washing with a rinsing liquid is preferably included.

The rinsing liquid used in the washing with a rinsing liquid including an organic solvent after the development using a developer including an organic solvent is not particularly limited as long as it does not dissolve the resist pattern, and a solution including an ordinary organic solvent may be used. As the rinsing liquid, a rinsing liquid including at least one organic solvent selected from a group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include those described above for the developer including an organic solvent.

After the development using a developer including an organic solvent, more preferably, washing with a rinsing liquid containing at least one organic solvent selected from the group consisting of a ketone-based solvent, an ester-based solvent, an alcohol-based solvent, and an amide-based solvent is carried out; still more preferably, washing with a rinsing liquid containing an alcohol-based solvent or an ester-based solvent is carried out after the development; particularly preferably, washing with a rinsing liquid containing a monohydric alcohol is carried out; and most preferably, washing with a rinsing liquid containing a monohydric alcohol having 5 or more carbon atoms is carried out.

Here, the monohydric alcohol used in the rinsing includes linear, branched, and cyclic monohydric alcohols, and specifically 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like may be used. As the particularly preferred monohydric alcohol having 5 or more carbon atoms, 1-hexanol, 2-hexanol, 4-methyl-2-pentanol, 1-pentanol, 3-methyl-1-butanol, or the like may be used.

A plurality of these respective components may be mixed or the solvent may be used by mixing it with an organic solvent other than those described above.

The water content in the rinsing liquid is preferably 10% by mass or less, more preferably 5% by mass or less, and particularly preferably 3% by mass or less. By setting the water content to 10% by mass or less, good development characteristics can be obtained.

The vapor pressure at 20° C. of the rinsing liquid used after the development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a value ranging from 0.05 kPa to 5 kPa, the temperature uniformity in the wafer plane is enhanced and moreover, swelling due to permeation of the rinsing liquid is inhibited, as a result, the dimensional uniformity in the wafer plane is improved.

The rinsing liquid may also be used after adding thereto a surfactant in an appropriate amount.

In the rinsing, the wafer that has been subjected to development using a developer including an organic solvent is washed using the above-described rinsing liquid including an organic solvent. The method for the washing treatment is not particularly limited, but examples of the method which can be applied include a method of continuously discharging the rinsing liquid on the substrate spinning at a fixed speed (spin coating method), a method of dipping the substrate in a bath filled with the rinsing liquid for a fixed time (dipping method), and a method of spraying the rinsing liquid on the substrate surface (spraying method). Above all, it is preferable to perform the washing treatment by the spin coating method and after the washing, remove the rinsing liquid from the substrate surface by spinning the substrate at a rotational speed of 2000 rpm to 4000 rpm. Further, it is also preferable to include heating (Post Bake) after the rinsing. The developer and the rinsing liquid remaining between the patterns and inside the patterns are removed by the baking. The heating after the rinsing is carried out at usually from 40 to 160° C., and preferably from 70 to 95° C., and for usually from 10 seconds to 3 minutes, and preferably from 30 seconds to 90 seconds.

In addition, the invention relates to a method for producing an electronic device, including the pattern forming method of the invention as described above, and an electronic device produced by the preparation method.

The electronic device of the invention is suitably mounted on an electric/electronic device (domestic appliances, OA•medium-related devices, optical devices, communication devices, and the like).

EXAMPLES

Hereinbelow, the invention will be described in detail with reference to Examples, but the content of the invention is not limited thereto.

Synthesis Example

Synthesis of Resin P-1

83.1 parts by mass of cyclohexanone was heated to 80° C. under a nitrogen air flow. A mixed solution of 11.1 parts by mass of monomers represented by the following structural formula A, 5.9 parts by mass of monomers represented by the following structural formula B, 24.9 parts by mass of monomers represented by the following structural formula C, 154.4 parts by mass of cyclohexanone, and 2.30 parts by mass of dimethyl 2,2'-azobisisobutyrate [V-601, manufactured by Wako Pure Chemical Industries, Ltd.] was added dropwise thereto over 4 hours while stirring the solution. After completion of dropwise addition, the solution was further stirred at 80° C. for 2 hours. After leaving the reaction liquid to cool, the reaction liquid was reprecipitated with a large amount of hexane/ethyl acetate (mass ratio 8:2), and filtered, and the obtained solid was dried under vacuum to obtain 35.8 parts by mass of a resin (P-1) of the invention.

[Chem. 93]

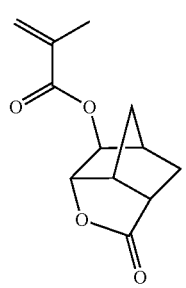

A

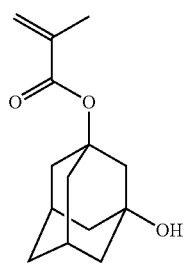

B

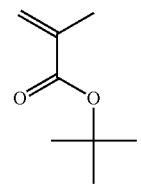

C

-continued

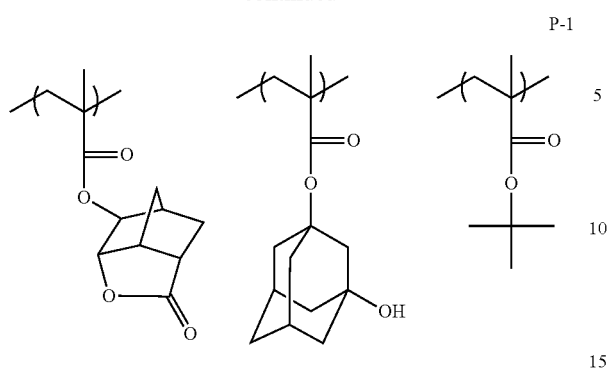
P-1

The weight average molecular weight (Mw: in terms of polystyrene) of the obtained resin determined by means of GPC (carrier: tetrahydrofuran (THF)) was as follows: Mw=10500 and dispersity, Mw/Mn=1.65. The compositional ratio measured by means of $^{13}$C-NMR was 20/10/70.

<Acid-Decomposable Resin>

Hereinbelow, in the similar manner, the resins P-2 to P-31 and RP-1 to RP-4 were synthesized. The synthesized polymer structures are described below.

[Chem. 94]

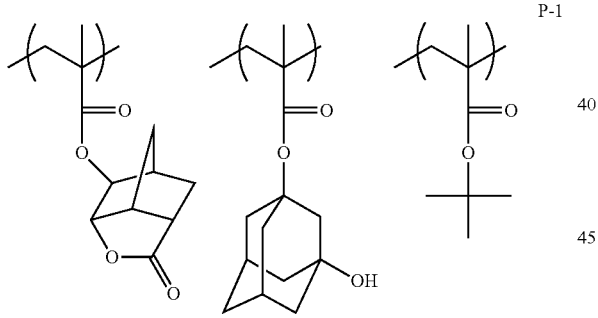
P-1

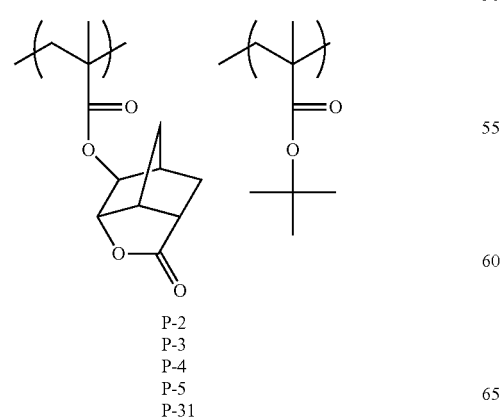

P-2
P-3
P-4
P-5
P-31

-continued

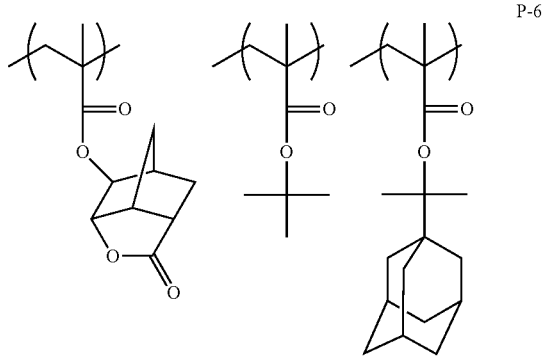
P-6

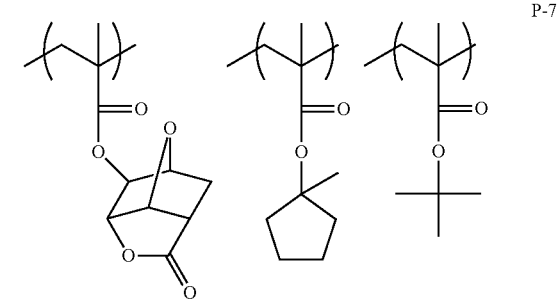
P-7

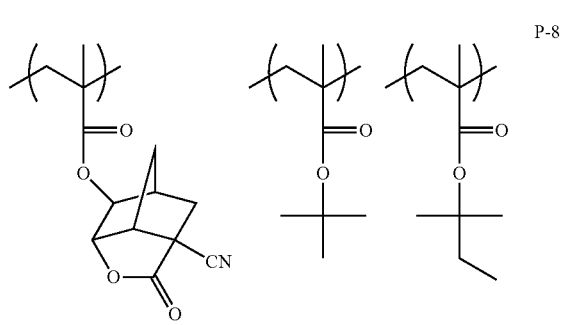
P-8

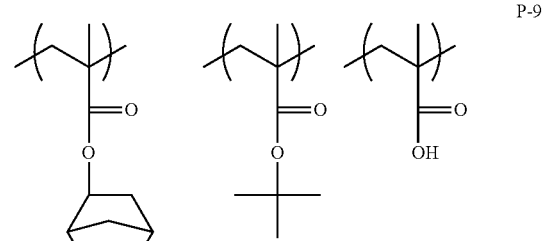
P-9

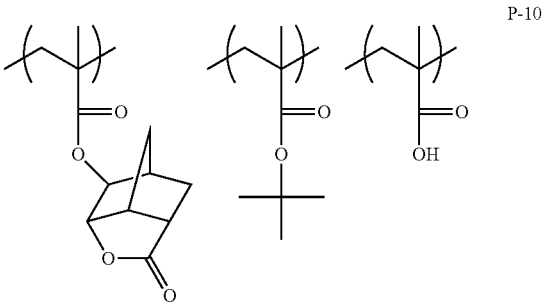
P-10

-continued
P-11
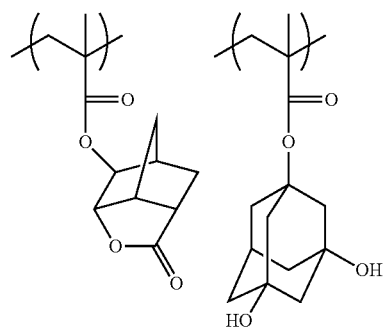
P-12
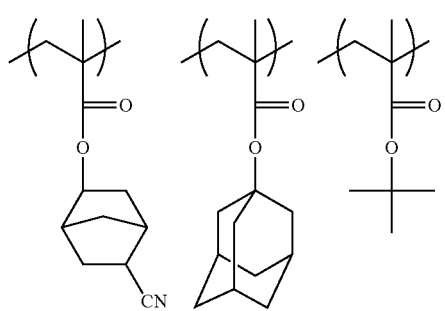
P-13
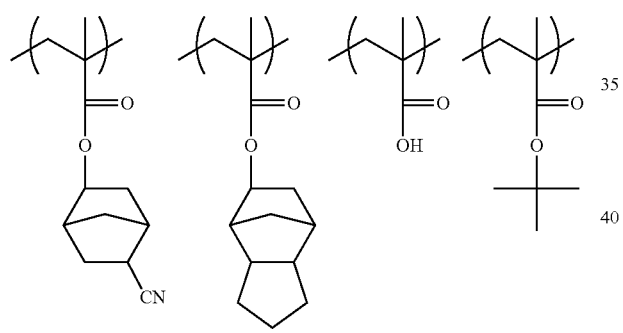
P-14
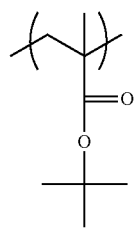
-continued
P-15
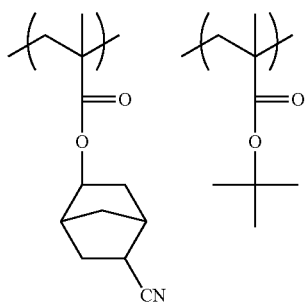
P-16
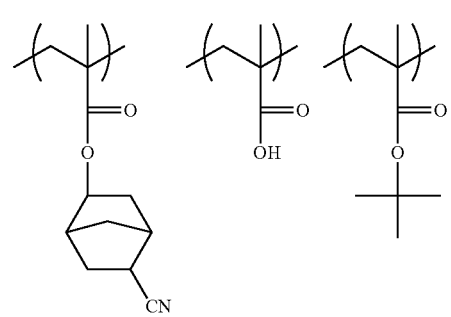
P-17
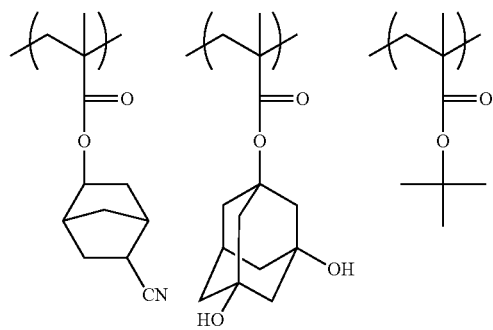
P-18
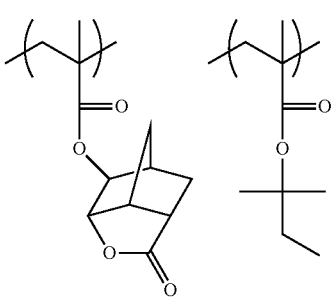
P-19
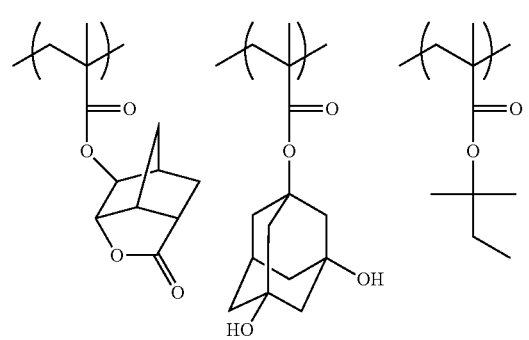

-continued
P-20
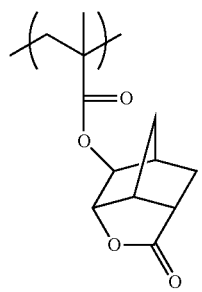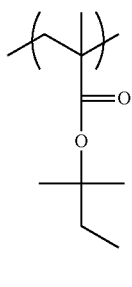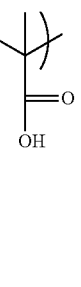
P-21
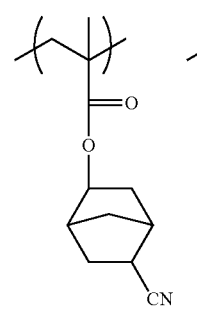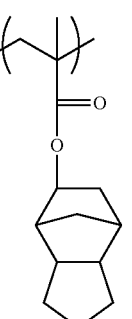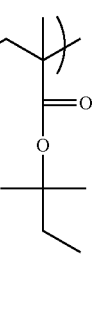
P-22
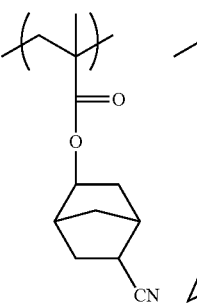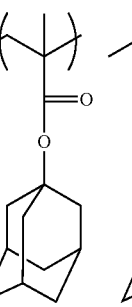
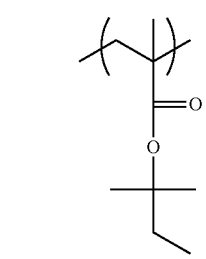
P-23
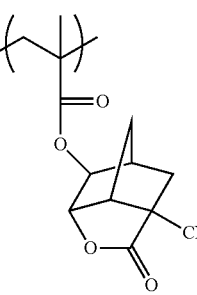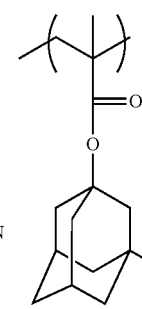
P-24
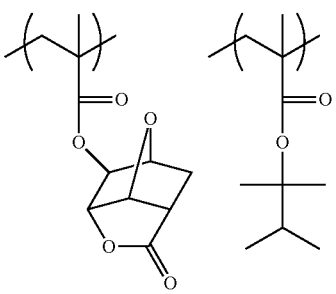
P-25
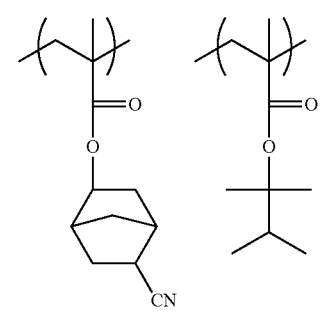
P-26
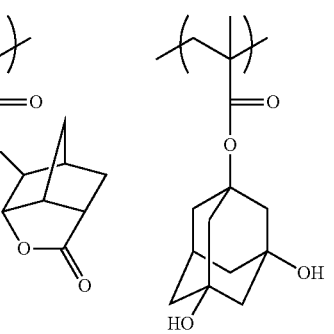
P-27
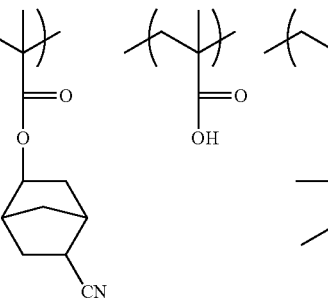
P-28
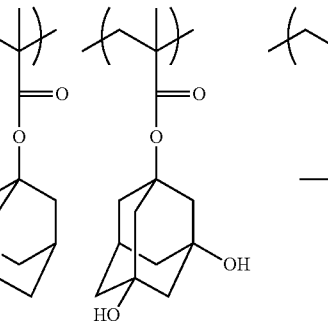

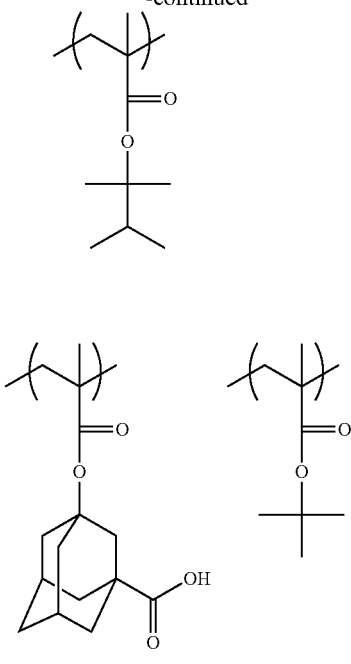
P-29
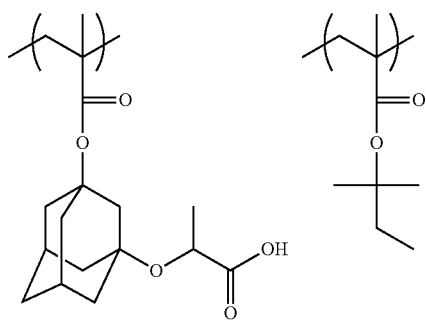
P-30
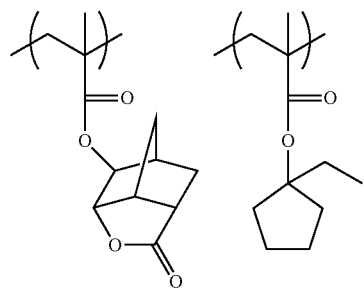
PR-1
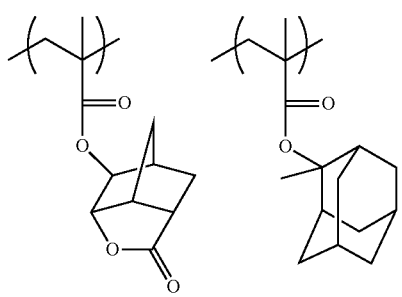
PR-2
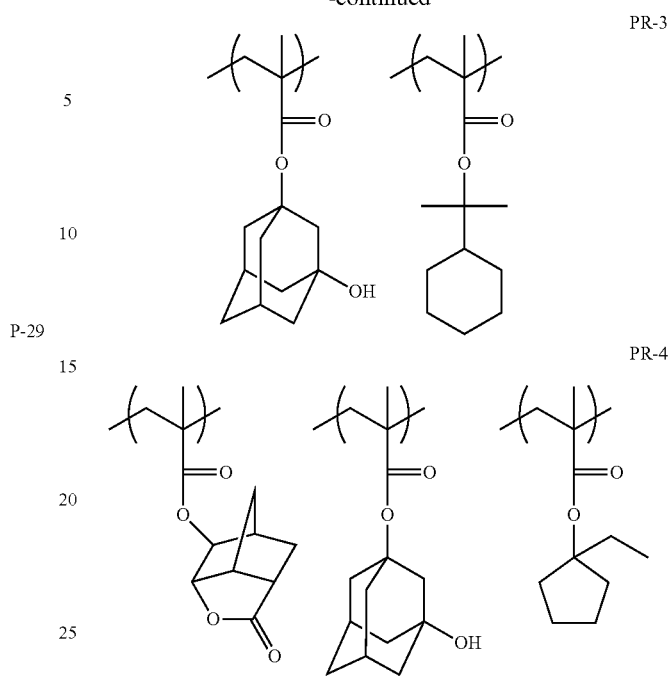
PR-3
PR-4
Furthermore, the compositional ratios (molar ratios; (corresponding to the respective repeating units starting from the left) of the respective repeating units, the weight average molecular weight, and the dispersity are shown below.
TABLE 3
| No. | Compositional ratio (mol %) | | | | Mw | Mw/Mn |
|---|---|---|---|---|---|---|
| P-1 | 20 | 10 | 70 | — | 10500 | 1.65 |
| P-2 | 60 | 40 | — | — | 11000 | 1.63 |
| P-3 | 45 | 55 | — | — | 10200 | 1.61 |
| P-4 | 40 | 60 | — | — | 11300 | 1.69 |
| P-5 | 35 | 65 | — | — | 29800 | 1.84 |
| P-6 | 40 | 50 | 10 | — | 10600 | 1.64 |
| P-7 | 40 | 10 | 50 | — | 10400 | 1.67 |
| P-8 | 40 | 30 | 30 | — | 20300 | 1.72 |
| P-9 | 30 | 55 | 15 | — | 10100 | 1.66 |
| P-10 | 35 | 55 | 10 | — | 10600 | 1.65 |
| P-11 | 30 | 10 | 60 | — | 19700 | 1.71 |
| P-12 | 30 | 15 | 55 | — | 20100 | 1.73 |
| P-13 | 25 | 15 | 5 | 55 | 10800 | 1.62 |
| P-14 | 25 | 10 | 5 | 60 | 10500 | 1.68 |
| P-15 | 45 | 55 | — | — | 20700 | 1.75 |
| P-16 | 35 | 10 | 55 | — | 10100 | 1.63 |
| P-17 | 30 | 10 | 60 | — | 11100 | 1.66 |
| P-18 | 40 | 60 | — | — | 20200 | 1.74 |
| P-19 | 25 | 5 | 70 | — | 10500 | 1.67 |
| P-20 | 35 | 55 | 10 | — | 10300 | 1.63 |
| P-21 | 25 | 20 | 55 | — | 30400 | 1.82 |
| P-22 | 20 | 5 | 15 | 60 | 10600 | 1.64 |
| P-23 | 25 | 10 | 65 | — | 10500 | 1.61 |
| P-24 | 35 | 65 | — | — | 10300 | 1.63 |
| P-25 | 40 | 60 | — | — | 30200 | 1.65 |
| P-26 | 20 | 15 | 65 | — | 10800 | 1.66 |
| P-27 | 30 | 10 | 60 | — | 10500 | 1.62 |
| P-28 | 15 | 15 | 35 | 35 | 21000 | 1.74 |
| P-29 | 30 | 70 | — | — | 22300 | 1.81 |
| P-30 | 35 | 65 | — | — | 24900 | 1.85 |
| P-31 | 45 | 55 | — | — | 9300 | 1.58 |
| PR-1 | 40 | 60 | — | — | 10400 | 1.65 |
| PR-2 | 50 | 50 | — | — | 10300 | 1.64 |
| PR-3 | 30 | 70 | — | — | 10600 | 1.63 |
| PR-4 | 10 | 20 | 70 | — | 10800 | 1.62 |

<Acid Generator>
As the acid generator, the following compounds were used.
[Chem. 95]
PAG-1
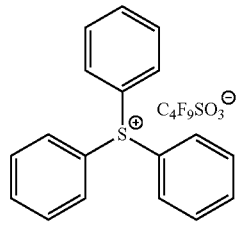
PAG-2
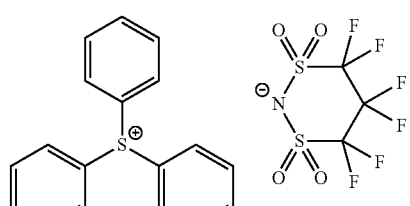
PAG-3
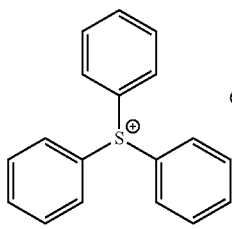
PAG-4
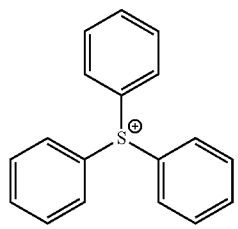
PAG-5
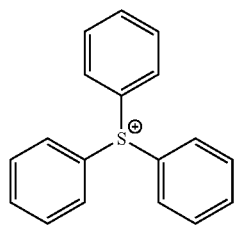
PAG-6
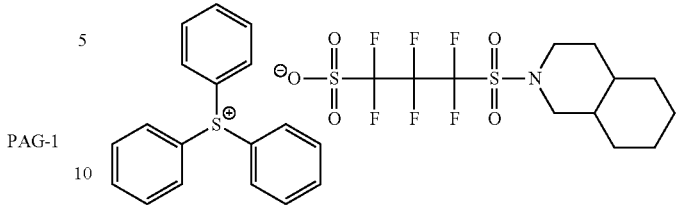
PAG-7
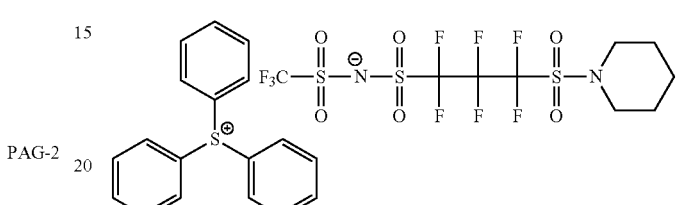
PAG-8
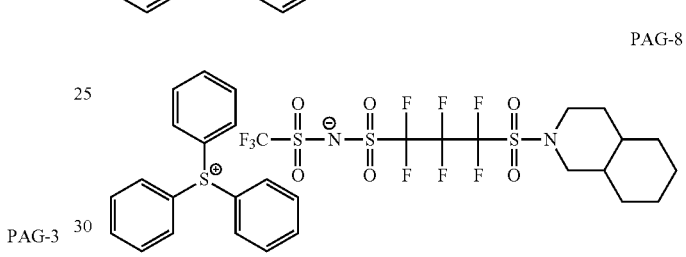
PAG-9
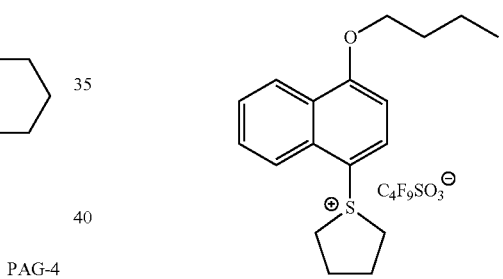
PAG-10
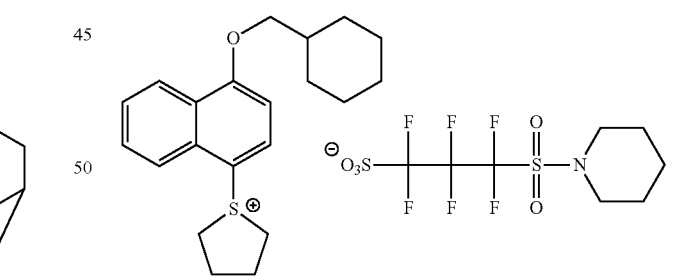
PAG-11
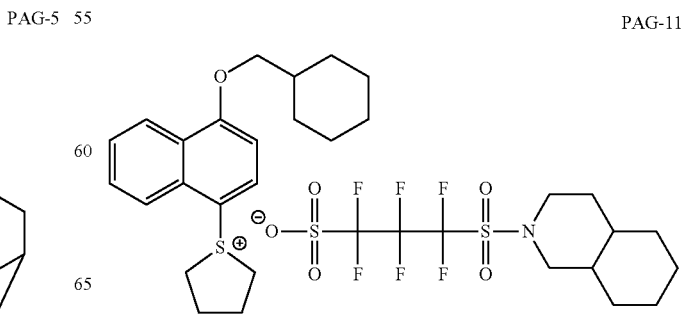

-continued

PAG-12

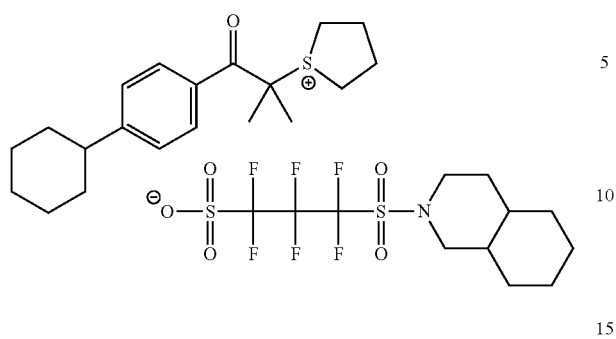

<Nitrogen-Containing Organic Compound (NA) Having Group Capable of Leaving by the Action of Acid>

As the nitrogen-containing organic compound having a group capable of leaving by the action of an acid, the following compounds were used.

[Chem. 96]

NA-1

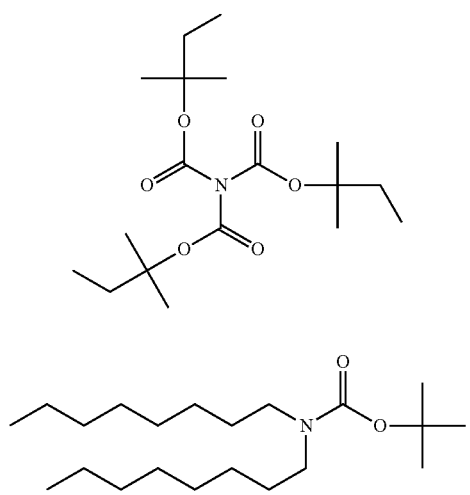

NA-2

NA-3

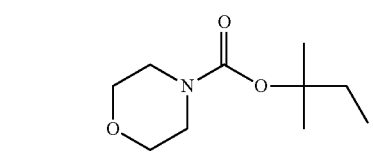

NA-4

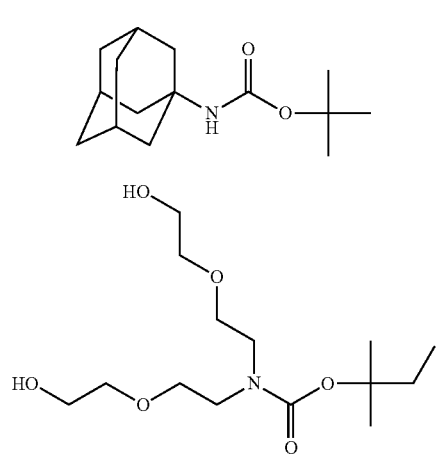

NA-5

-continued

NA-6

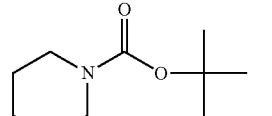

NA-7

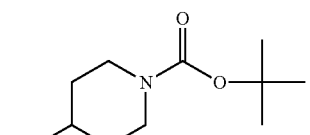

NA-8

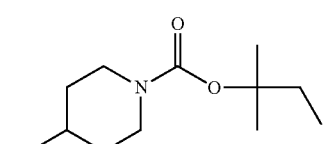

NA-9

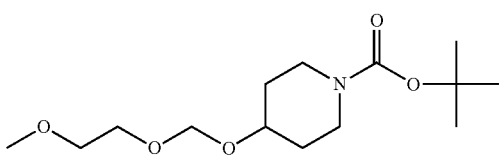

NA-10

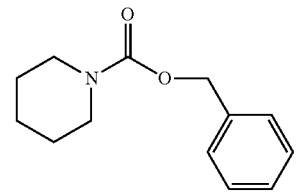

<Basic Compound (C) Capable of Decreasing Basicity Upon Irradiation with Actinic Rays or Radiation, and Basic Compound (C')>

As the basic compound (C) capable of decreasing the basicity upon irradiation with actinic rays or radiation, or the basic compound (C'), the following compounds were used.

[Chem. 97]

C-1

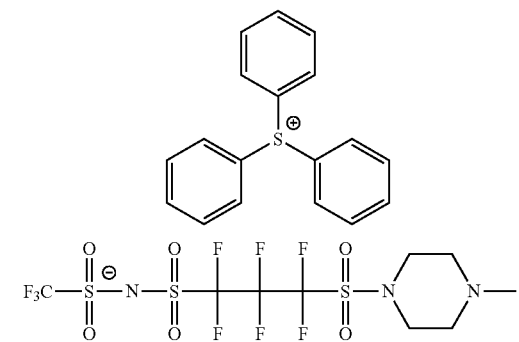

-continued

C-2

[structure: triphenylsulfonium cation with counter-anion shown as F₃C-S(O)₂-N⁻-S(O)₂-CF₂-CF₂-CF₂-S(O)₂-N(piperazine)-attached to butyrolactone]

C'-3

[structure: 2,6-diisopropylaniline]

C'-4

[structure: 2-phenylbenzimidazole]

<Hydrophobic Resin>

As the hydrophobic resin, one appropriately selected from the resins (HR-1) to (HR-90) as exemplified above was used.

Further, the hydrophobic resin (HR-79) was synthesized in accordance with the descriptions of US Patent App. Nos. 2010/0152400, WO 2010/067905, WO 2010/067898, and the like.

<Surfactant>

As the surfactant, the following ones were prepared.
W-1: Megaface F176 (manufactured by Dainippon Ink & Chemicals, Inc.; fluorine-based)
W-2: Megaface R08 (manufactured by Dainippon Ink & Chemicals, Inc.; fluorine- and silicone-based)
W-3: Polysiloxane Polymer KP-341 (manufactured by Shin-Etsu Chemical Co., Ltd.; silicone-based)
W-4: Troysol S-366 (manufactured by Troy Chemical Co., Ltd.)
W-5: KH-20 (manufactured by Asahi Glass Co., Ltd.)
W-6: PolyFox PF-6320 (manufactured by OMNOVA Solutions Inc.; fluorine-based)

<Solvent>

As the solvent, the following ones were prepared.
(Group a)
SL-1: Propylene glycol monomethyl ether acetate (PG-MEA)
SL-2: Propylene glycol monomethyl ether propionate
SL-3: 2-Heptanone
(Group b)
SL-4: Ethyl lactate
SL-5: Propylene glycol monomethyl ether (PGME)
SL-6: Cyclohexanone
(Group c)
SL-7: γ-Butyrolactone
SL-8: Propylene carbonate <Developer>

As the developer, the following ones were prepared.
SG-1: Butyl acetate
SG-2: Methyl amyl ketone
SG-3: Ethyl-3-ethoxypropionate
SG-4: Pentyl acetate
SG-5: Isopentyl acetate
SG-6: Propylene glycol monomethyl ether acetate (PG-MEA)
SG-7: Cyclohexanone <Rinsing Liquid>

As the rinsing liquid, the following ones were prepared.
SR-1: 4-Methyl-2-pentanol
SR-2: 1-Hexanol
SR-3: Butyl acetate
SR-4: Methyl amyl ketone
SR-5: Ethyl 3-ethoxypropionate <ArF Liquid-Immersion Exposure>

(Preparation of Resist)

The components shown in Table 4 below were dissolved in a solvent shown in the same table in a solid content of 3.8% by mass, and each was filtered through a polyethylene filter having a pore size of 0.03 μm to prepare an actinic ray-sensitive or radiation-sensitive resin composition (resist composition). ARC29A (manufactured by Nissan Chemical Industries, Ltd.) for forming an organic antireflection film was coated on a silicon wafer, and baked at 205° C. for 60 seconds to form an antireflection film having a film thickness of 95 nm. The actinic ray-sensitive or radiation-sensitive resin composition was coated thereon and baked (PB: Prebake) at 100° C. for 60 seconds to form a resist film having a film thickness of 100 nm.

The obtained wafer was subjected to pattern exposure through a square-array halftone mask with a hole portion of 60 nm and a pitch between patterns of 90 nm (wherein the portion corresponding to the hole is light-shielded for formation of a negative image), using an ArF excimer laser liquid-immersion scanner (manufactured by ASML, XT1700i, NA1.20, C-Quad, outer sigma 0.900, inner sigma 0.812, and XY deflection). As the liquid for liquid immersion, ultrapure water was used. Thereafter, the resist film was heated at 105° C. for 60 seconds (PEB: Post Exposure Bake). Subsequently, paddle development was carried out for 30 seconds using the organic solvent-based developer described in the table below, the rinsing liquid described in the table below was supplied to the wafer for 24 seconds while rotating the wafer at a rotation speed of 1000 rpm, and thereafter, the wafer was rotated at a rotation speed of 2000 rpm for 20 seconds to detach the chemical solution on the wafer. Thus, a hole pattern having a pore diameter of 45 nm was obtained.

[Exposure Latitude (EL, %)]

The hole size was observed by a pattern dimension scanning electron microscope (SEM, S-9380II manufactured by Hitachi Ltd.), and the optimal exposure dose upon resolution of a hole pattern with the hole portion having an average size of 45 nm was taken as sensitivity ($E_{opt}$) (mJ/cm²). Taking the determined optimal exposure dose ($E_{opt}$) as a standard, an exposure dose when the hole size reached a desired value, 45 nm±10% (that is, 40.5 nm to 49.5 nm) was determined. Further, the exposure latitude (EL, %) defined by the following formula was calculated. When the value of EL is larger, the change in the performance with the change in the exposure dose is smaller, which is thus preferable.

$$[EL (\%)] = \{[(\text{Exposure dose with the size of the hole portion of 40.5 nm}) - (\text{Exposure dose with the size of the hole portion of 49.5 nm})]/E_{opt}\} \times 100$$

[Local Pattern Dimensional Uniformity (Local CDU, nm)]

In twenty 1 μm-square areas within a range that has been exposed in one shot with the optimal exposure dose in the evaluation of the exposure latitude, the hole size of an arbitrary 25 holes (that is, 500 holes in total) in each area was measured, and the standard deviation thereof was determined to calculate 3σ. When the value is smaller, the variation in the dimension is smaller, indicating good performance.

[Pattern Shape 1 (Proportion (%) of Rectangular Shapes in Cross-Sectional Shapes)]

The cross-sectional shape of each of 10 patterns in the optimal exposure dose was observed by scanning electron microscope (S-4800 manufactured by Hitachi, Ltd.). For the portion having the resist remaining thereon in the hole pattern, the average size value (CD1) of the top of the patterns and the average size value (CD2) of the bottom of the patterns were determined. Further, the proportion (%) of the rectangular shapes in the cross-sectional shapes defined by the following formula was calculated. The cross-sectional shape of each hole pattern tends to be a T-top shape when the value of the proportion of the rectangular shape is above 100%, while the cross-sectional shape of each hole pattern tends to be a reversely tapered shape when the value of the proportion of the rectangular shape is below 100%, wherein the value of the ratio of the cross-sectional shape closer to 100% indicates that the cross-sectional shape is a rectangular shape, which is thus favorable.

[Proportion (%) of Rectangular Shapes]=[1+($CD1-CD2$)/$CD2$]×100

[Pattern Shape 2 (Circularity, nm)]

In twenty 1 μm-square areas within a range that has been exposed in one shot with the optimal exposure dose in the evaluation of the exposure latitude, the hole size of an arbitrary 25 holes (that is, 500 holes in total) in each area was measured in circular approximation mode, and the radius of the hole pattern in one hole was measured at 32 points. With the measurement, the imbalance (3σ) between the obtained hole radius and the radius in the circular approximation was calculated, and thus an average of the values was determined to calculate a circularity. When the value is smaller, the shape is closer to a circle, indicating good performance.

These evaluation results are shown in Table 4 below.

TABLE 4

| Ex. | Resin | (g) | Compound (B) | (g) | Compoud (C, C') | (g) | Compoud (NA) | (g) | Hydrophobic resin(E) | (g) | Solvent | Mass ratio |
|---|---|---|---|---|---|---|---|---|---|---|---|---|
| Ex. 1 | P-1/PR-1 | 9/1 | PAG-3 | 1.24 | | | NA-9 | 0.17 | HR-24 | 0.06 | SL-1/SL-5 | 60/40 |
| Ex. 2 | P-1 | 10 | PAG-4 | 1.04 | | | NA-7 | 0.16 | HR-3 | 0.06 | SL-1 | 100 |
| Ex. 3 | P-2 | 10 | PAG-3 | 1.18 | | | NA-1 | 0.18 | HR-24 | 0.06 | SL-1/SL-5 | 60/40 |
| Ex. 4 | P-3 | 10 | PAG-3 | 1.32 | | | NA-2 | 0.17 | HR-24 | 0.06 | SL-1/SL-5 | 60/40 |
| Ex. 5 | P-3 | 10 | PAG-6 | 1.06 | C-2 | 0.42 | NA-8 | 0.10 | HR-47 | 0.06 | SL-1/SL-2 | 90/10 |
| Ex. 6 | P-4 | 10 | PAG-3 | 1.48 | | | NA-5 | 0.22 | HR-24 | 0.06 | SL-1/SL-5 | 60/40 |
| Ex. 7 | P-4 | 10 | PAG-7 | 1.24 | | | NA-8 | 0.18 | HR-24 | 0.06 | SL-5/SL-6 | 30/70 |
| Ex. 8 | P-5 | 10 | PAG-3 | 1.40 | | | NA-3 | 0.16 | HR-24 | 0.06 | SL-1/SL-5 | 60/40 |
| Ex. 9 | P-5 | 10 | PAG-5 | 0.98 | | | NA-7 | 0.19 | HR-9 | 0.06 | SL-1/SL-5 | 70/30 |
| Ex. 10 | P-6 | 10 | PAG-2 | 1.00 | | | NA-4 | 0.16 | HR-24 | 0.06 | SL-1/SL-5 | 60/40 |
| Ex. 11 | P-6 | 10 | PAG-6 | 0.84 | C-1 | 0.27 | NA-8 | 0.09 | HR-26 | 0.06 | SL-1/SL-3 | 80/20 |
| Ex. 12 | P-7 | 10 | PAG-4 | 1.32 | | | NA-2 | 0.17 | HR-47 | 0.06 | SL-1/SL-5 | 60/40 |
| Ex. 13 | P-7 | 10 | PAG-8 | 1.46 | | | NA-6 | 0.19 | HR-24/HR-79 | 0.04/0.02 | SL-1/SL-5 | 70/30 |
| Ex. 14 | P-8 | 10 | PAG-1 | 1.00 | | | NA-10 | 0.20 | HR-24 | 0.06 | SL-1/SL-5 | 60/40 |
| Ex. 15 | P-8 | 10 | PAG-3 | 1.04 | | | NA-8 | 0.17 | HR-24 | 0.06 | SL-1 | 100 |
| Ex. 16 | P-9 | 10 | PAG-6 | 1.08 | | | NA-7 | 0.19 | HR-3 | 0.06 | SL-1/SL-5 | 60/40 |
| Ex. 17 | P-9 | 10 | PAG-9/PAG-6 | 1.0/1.0 | | | NA-5 | 0.18 | HR-47 | 0.06 | SL-1/SL-5 | 80/20 |
| Ex. 18 | P-2/P-10 | 5/5 | PAG-2 | 1.00 | | | NA-3 | 0.18 | HR-24 | 0.06 | SL-1/SL-5 | 60/40 |
| Ex. 19 | P-10 | 10 | PAG-7 | 1.28 | | | NA-8 | 0.17 | HR-26 | 0.06 | SL-1/SL-5 | 80/20 |
| Ex. 20 | P-11 | 10 | PAG-1/PAG-6 | 0.7/0.5 | C'-4 | 0.10 | NA-7 | 0.10 | HR-47 | 0.06 | SL-1/SL-5 | 60/40 |
| Ex. 21 | P-11 | 10 | PAG-4 | 1.32 | | | NA-6 | 0.16 | HR-24 | 0.06 | SL-1/SL-4 | 90/10 |
| Ex. 22 | P-12 | 10 | PAG-4 | 1.46 | | | NA-9 | 0.19 | HR-9 | 0.06 | SL-1/SL-5 | 60/40 |
| Ex. 23 | P-12 | 10 | PAG-8 | 1.48 | | | NA-8 | 0.18 | HR-24 | 0.06 | SL-1/SL-7 | 70/30 |
| Ex. 24 | P-13 | 10 | PAG-5 | 1.22 | C'-3 | 0.09 | NA-8 | 0.06 | HR-24 | 0.06 | SL-1/SL-5 | 60/40 |
| Ex. 25 | P-14 | 10 | PAG-6 | 1.00 | | | NA-8 | 0.18 | HR-47 | 0.06 | SL-1/SL-5 | 70/30 |
| Ex. 26 | P-14 | 10 | PAG-7 | 1.64 | | | NA-10 | 0.16 | HR-3 | 0.06 | SL-1/SL-5 | 60/40 |
| Ex. 27 | P-15 | 10 | PAG-3 | 1.20 | | | NA-7 | 0.20 | HR-24 | 0.06 | SL-1/SL-5 | 70/30 |
| Ex. 28 | P-16 | 10 | PAG-8 | 1.24 | C-1 | 0.29 | NA-8 | 0.15 | HR-47 | 0.06 | SL-1/SL-5 | 60/40 |
| Ex. 29 | P-17 | 10 | PAG-2 | 1.04 | | | NA-8/NA-10 | 0.1/0.08 | HR-24 | 0.06 | SL-5/SL-6 | 30/70 |
| Ex. 30 | P-17 | 10 | PAG-8 | 1.26 | | | NA-2 | 0.16 | HR-24 | 0.06 | SL-1/SL-5 | 60/40 |
| Ex. 31 | P-18 | 10 | PAG-6 | 1.12 | | | NA-8 | 0.17 | HR-47 | 0.06 | SL-1/SL-5 | 80/20 |
| Ex. 32 | P-18 | 10 | PAG-4 | 1.46 | | | NA-8/NA-5 | 0.05/0.11 | HR-24 | 0.06 | SL-1/SL-5 | 60/40 |
| Ex. 33 | P-19 | 10 | PAG-8 | 1.28 | | | NA-7 | 0.19 | HR-26 | 0.06 | SL-1 | 100 |
| Ex. 34 | P-19 | 10 | PAG-3/PAG-10 | 1.0/0.4 | | | NA-5 | 0.18 | HR-47 | 0.06 | SL-1/SL-5 | 60/40 |
| Ex. 35 | P-20 | 10 | PAG-7 | 1.28 | | | NA-6 | 0.16 | HR-9 | 0.06 | SL-6/SL-5 | 60/40 |
| Ex. 36 | P-20 | 10 | PAG-11 | 2.40 | | | NA-10 | 0.17 | HR-24 | 0.06 | SL-1/SL-5 | 60/40 |
| Ex. 37 | P-21 | 10 | PAG-5 | 1.44 | | | NA-3 | 0.20 | HR-3 | 0.06 | SL-1/SL-5 | 80/20 |
| Ex. 38 | P-21 | 10 | PAG-4 | 1.10 | | | NA-8 | 0.18 | HR-47 | 0.06 | SL-1/SL-5 | 60/40 |
| Ex. 39 | P-22 | 10 | PAG-6 | 1.04 | C-2 | 0.28 | NA-8 | 0.19 | HR-47 | 0.06 | SL-1 | 100 |
| Ex. 40 | P-22 | 10 | PAG-2 | 0.86 | | | NA-1 | 0.20 | HR-24 | 0.06 | SL-1/SL-5 | 60/40 |
| Ex. 41 | P-23 | 10 | PAG-7 | 1.32 | | | NA-9 | 0.17 | HR-47 | 0.06 | SL-1/SL-5 | 70/30 |
| Ex. 42 | P-23 | 10 | PAG-3 | 1.22 | | | NA-7 | 0.18 | HR-9 | 0.06 | SL-1/SL-5 | 60/40 |
| Ex. 43 | P-24 | 10 | PAG-5 | 1.48 | | | NA-4 | 0.17 | HR-47 | 0.06 | SL-1/SL-8 | 90/10 |
| Ex. 44 | P-24 | 10 | PAG-6 | 1.16 | | | NA-8 | 0.17 | HR-24 | 0.06 | SL-1/SL-5 | 60/40 |
| Ex. 45 | P-25 | 10 | PAG-4 | 1.32 | | | NA-4 | 0.18 | HR-26 | 0.06 | SL-1/SL-5 | 70/30 |
| Ex. 46 | P-26 | 10 | PAG-12 | 2.40 | C-1 | 0.52 | NA-6 | 0.10 | HR-24 | 0.06 | SL-1/SL-5 | 60/40 |
| Ex. 47 | P-26 | 10 | PAG-6 | 1.50 | | | NA-5 | 0.16 | HR-47 | 0.06 | SL-6/SL-5 | 60/40 |
| Ex. 48 | P-27 | 10 | PAG-3 | 1.44 | | | NA-2 | 0.19 | HR-24 | 0.06 | SL-1/SL-5 | 60/40 |
| Ex. 49 | P-27 | 10 | PAG-6 | 1.28 | | | NA-7 | 0.20 | HR-47 | 0.06 | SL-1/SL-5 | 80/20 |
| Ex. 50 | P-28 | 10 | PAG-4 | 1.18 | | | NA-3 | 0.18 | HR-3 | 0.06 | SL-1/SL-5 | 60/40 |
| Ex. 51 | P-29 | 10 | PAG-6 | 1.34 | C-1 | 0.33 | NA-7 | 0.20 | HR-47 | 0.03 | SL-1/SL-5 | 80/20 |
| Ex. 52 | P-30 | 10 | PAG-6 | 1.21 | | | NA-8 | 0.10 | HR-24 | 0.06 | SL-1/SL-5 | 80/20 |

TABLE 4-continued

| Ex. | | | | | | | | | | | |
|---|---|---|---|---|---|---|---|---|---|---|---|
| Ex. 53 | P-31 | 10 | PAG-3 | 1.32 | | | NA-2 | 0.17 | HR-24 | 0.06 | SL-1/SL-5 60/40 |
| Comp. Ex. 1 | PR-1 | 10 | PAG-3 | 1.50 | C'-4 | 0.15 | | | HR-24 | 0.06 | SL-1/SL-5 60/40 |
| Comp. Ex. 2 | PR-2 | 10 | PAG-3 | 1.44 | C'-4 | 0.15 | | | HR-24 | 0.06 | SL-1/SL-5 60/40 |
| Comp. Ex. 3 | PR-3 | 10 | PAG-3 | 1.48 | C'-4 | 0.13 | | | HR-24 | 0.06 | SL-1/SL-5 60/40 |
| Comp. Ex. 4 | PR-4 | 10 | PAG-3 | 1.38 | C'-4 | 0.13 | | | HR-24 | 0.06 | SL-1/SL-5 60/40 |
| Comp. Ex. 5 | PR-4 | 10 | PAG-3 | 1.50 | | | NA-8 | 0.18 | HR-24 | 0.06 | SL-1/SL-5 60/40 |

| Ex. | Surfactant | (g) | Developer | Mass ratio | Rinsing liquid | Mass ratio | EL (%) | Local CDU (nm) | Rectangularity (%) of cross-sectional shape | Circularity (nm) |
|---|---|---|---|---|---|---|---|---|---|---|
| Ex. 1 | W-1 | 0.003 | SG-1 | 100 | SR-1 | 100 | 17.9 | 5.6 | 141 | 3.1 |
| Ex. 2 | W-3 | 0.003 | SG-1 | 100 | SR-1 | 100 | 18 | 4.3 | 122 | 1.6 |
| Ex. 3 | W-1 | 0.003 | SG-1 | 100 | SR-1 | 100 | 13.7 | 6.3 | 150 | 3.5 |
| Ex. 4 | W-1 | 0.003 | SG-1 | 100 | SR-1 | 100 | 18.3 | 5.1 | 136 | 2.2 |
| Ex. 5 | W-2 | 0.003 | SG-1 | 100 | SR-1 | 100 | 19.1 | 4.3 | 115 | 1.5 |
| Ex. 6 | W-1 | 0.003 | SG-1 | 100 | SR-1 | 100 | 18.4 | 4.9 | 134 | 2.3 |
| Ex. 7 | None | 0 | SG-1/SG-4 | 50/50 | SR-1 | 100 | 18.2 | 4.2 | 116 | 1.5 |
| Ex. 8 | W-1 | 0.003 | SG-1 | 100 | SR-1 | 100 | 18.1 | 4.6 | 137 | 2.4 |
| Ex. 9 | W-5 | 0.003 | SG-1 | 100 | SR-1 | 100 | 17.9 | 4.1 | 118 | 1.4 |
| Ex. 10 | W-4 | 0.003 | SG-1 | 100 | SR-2 | 100 | 18.3 | 5.1 | 133 | 2.2 |
| Ex. 11 | W-1 | 0.003 | SG-1 | 100 | SR-1 | 100 | 19.5 | 4.2 | 123 | 1.5 |
| Ex. 12 | W-2 | 0.003 | SG-1 | 100 | SR-1 | 100 | 18.0 | 5.0 | 130 | 2.2 |
| Ex. 13 | W-3 | 0.001 | SG-1 | 100 | SR-1 | 100 | 19.2 | 4.2 | 124 | 1.5 |
| Ex. 14 | None | None | SG-1 | 100 | SR-1 | 100 | 13.9 | 5.7 | 140 | 3.1 |
| Ex. 15 | W-1 | 0.003 | SG-1 | 100 | SR-1 | 100 | 17.9 | 4.3 | 123 | 1.6 |
| Ex. 16 | W-6 | 0.003 | SG-2 | 100 | SR-1 | 100 | 19.2 | 4.2 | 114 | 1.5 |
| Ex. 17 | W-1 | 0.003 | SG-1 | 100 | SR-1 | 100 | 17.5 | 5.1 | 131 | 2.3 |
| Ex. 18 | None | 0.003 | SG-1 | 100 | SR-1/SR-3 | 90/10 | 18.1 | 5.2 | 133 | 2.5 |
| Ex. 19 | W-1 | 0.003 | SG-1 | 100 | SR-1 | 100 | 18.4 | 4.3 | 113 | 1.5 |
| Ex. 20 | W-4 | 0.003 | SG-1 | 100 | SR-1 | 100 | 17.3 | 5.5 | 141 | 3.2 |
| Ex. 21 | W-5 | 0.003 | SG-1 | 100 | SR-1 | 100 | 17.9 | 4.4 | 113 | 1.5 |
| Ex. 22 | W-2 | 0.003 | SG-1/SG-2 | 80/20 | SR-1 | 100 | 17.7 | 5.6 | 140 | 3.1 |
| Ex. 23 | W-1 | 0.003 | SG-1 | 100 | SR-1 | 100 | 19.1 | 4.2 | 122 | 1.4 |
| Ex. 24 | W-6 | 0.003 | SG-1 | 100 | SR-1 | 100 | 16.4 | 5.9 | 141 | 3.2 |
| Ex. 25 | W-3 | 0.003 | SG-1 | 100 | SR-1 | 100 | 19.2 | 4.2 | 113 | 1.4 |
| Ex. 26 | W-1/W-6 | 0.002/0.001 | SG-1 | 100 | SR-1 | 100 | 18.2 | 5.4 | 134 | 2.4 |
| Ex. 27 | W-1 | 0.003 | SG-1 | 100 | SR-1 | 100 | 16.9 | 4.3 | 125 | 1.5 |
| Ex. 28 | W-1 | 0.003 | SG-4 | 100 | SR-1 | 100 | 19.6 | 4.4 | 113 | 1.6 |
| Ex. 29 | W-2 | 0.003 | SG-1 | 100 | SR-1 | 100 | 17.5 | 5.1 | 132 | 2.3 |
| Ex. 30 | None | None | SG-1 | 100 | SR-1 | 100 | 19.3 | 4.2 | 120 | 1.5 |
| Ex. 31 | W-1 | 0.003 | SG-1 | 100 | SR-1 | 100 | 19.1 | 4.3 | 123 | 1.5 |
| Ex. 32 | W-6 | 0.002 | SG-5 | 100 | SR-1 | 100 | 18.4 | 5.1 | 131 | 2.2 |
| Ex. 33 | W-4 | 0.003 | SG-1 | 100 | SR-1 | 100 | 19.5 | 4.3 | 119 | 1.5 |
| Ex. 34 | W-5 | 0.003 | SG-1 | 100 | SR-1/SR-4 | 80/20 | 17.3 | 5 | 132 | 2.3 |
| Ex. 35 | W-1 | 0.003 | SG-1 | 100 | SR-1 | 100 | 18.3 | 4.3 | 113 | 1.5 |
| Ex. 36 | W-2 | 0.003 | SG-1/SG-7 | 90/10 | SR-1 | 100 | 19.2 | 5.3 | 125 | 3.1 |
| Ex. 37 | W-1 | 0.003 | SG-1 | 100 | SR-1 | 100 | 17.8 | 5.1 | 130 | 2.4 |
| Ex. 38 | W-1 | 0.003 | SG-1/SG-3 | 90/10 | SR-1 | 100 | 17.9 | 4.3 | 120 | 1.6 |
| Ex. 39 | W-6 | 0.003 | SG-1 | 100 | SR-1 | 100 | 18.8 | 4.2 | 118 | 1.6 |
| Ex. 40 | W-2/W-3 | 0.001/0.002 | SG-1 | 100 | SR-1 | 100 | 17.6 | 5.3 | 141 | 3.2 |
| Ex. 41 | W-1 | 0.003 | SG-1 | 100 | SR-1 | 100 | 18.9 | 5.1 | 134 | 2.3 |
| Ex. 42 | None | | SG-1 | 100 | SR-1 | 100 | 18.5 | 4.4 | 122 | 1.6 |
| Ex. 43 | W-3 | 0.001 | SG-1 | 100 | SR-1 | 100 | 17.6 | 5.1 | 133 | 2.2 |
| Ex. 44 | W-5 | 0.003 | SG-1 | 100 | SR-1 | 100 | 19.2 | 4.2 | 123 | 1.5 |
| Ex. 45 | W-1 | 0.003 | SG-1 | 100 | SR-1 | 100 | 16.9 | 5.3 | 135 | 2.3 |
| Ex. 46 | W-6 | 0.003 | SG-1/SG-6 | 90/10 | SR-1 | 100 | 19.5 | 4.3 | 120 | 1.5 |
| Ex. 47 | W-2 | 0.003 | SG-1 | 100 | SR-1 | 100 | 19.4 | 4.7 | 131 | 2.4 |
| Ex. 48 | W-4 | 0.003 | SG-1 | 100 | SR-1/SR-5 | 90/10 | 17.2 | 5.1 | 134 | 2.5 |
| Ex. 49 | W-1 | 0.002 | SG-1 | 100 | SR-1 | 100 | 19.3 | 4.3 | 113 | 1.5 |
| Ex. 50 | None | | SG-1 | 100 | SR-1 | 100 | 17.9 | 4.5 | 120 | 1.7 |
| Ex. 51 | W-1 | 0.003 | SG-1 | 100 | SR-3 | 100 | 19.2 | 4.2 | 115 | 1.4 |
| Ex. 52 | W-1 | 0.003 | SG-1 | 100 | SR-3 | 100 | 19.1 | 4.5 | 114 | 1.5 |
| Ex. 53 | W-1 | 0.003 | SG-1 | 100 | SR-1 | 100 | 16.4 | 5.5 | 137 | 3.1 |
| Comp. Ex. 1 | W-1 | 0.003 | SG-1 | 100 | SR-1 | 100 | 8.5 | 7.2 | 186 | 4.5 |
| Comp. Ex. 2 | W-1 | 0.003 | SG-1 | 100 | SR-1 | 100 | 9.8 | 10.1 | 172 | 4.7 |
| Comp. Ex. 3 | W-1 | 0.003 | SG-1 | 100 | SR-1 | 100 | 8.4 | 8.9 | 191 | 4.4 |
| Comp. Ex. 4 | W-1 | 0.003 | SG-1 | 100 | SR-1 | 100 | 6.5 | 7.3 | 195 | 4.8 |
| Comp. Ex. 5 | W-1 | 0.003 | SG-1 | 100 | SR-1 | 100 | 6.2 | 7.2 | 183 | 4.5 |

As clearly seen from the results shown in Table 4, it can be confirmed that in Comparative Examples 1 to 4, in which the acid-decomposable resin does not have the repeating unit represented by the general formula (I) and does not use the nitrogen-containing organic compound having a group capable of leaving by the action of an acid, and in Comparative Example 5, in which a nitrogen-containing organic compound having a group capable of leaving by the action of an acid is used, but the acid-decomposable resin does not have the repeating unit represented by the general formula (I), the exposure latitude (EL) is small, the local CDU is large, the value of the rectangularity in the cross-sectional shape is far lower than 100%, the value indicative of the imbalance for the circularity is large, both of EL and local CDU are low, the cross-section has an extreme T-top shape, and the circularity is low.

On the other hand, in Examples 1 to 53, in which the resin (P) having the repeating unit represented by the general formula (I), and the nitrogen-containing organic compound (NA) having a group capable of leaving by the action of an acid are used, the EL is large, the local CDU is small, the value of the rectangularity in the cross-sectional shape is close to 100%, the value indicative of the imbalance for the circularity is small, both of EL and local CDU are high, the rectangularity is high, and the circularity is high, in the liquid-immersion exposure.

This application claims priority under 35 U.S.C. §119 of Japanese Patent application JP 2011-207017, filed on Sep. 22, 2011, the entire contents of which are hereby incorporated by reference.

What is claimed is:

1. An actinic ray-sensitive or radiation-sensitive resin composition, comprising:
   a resin (P) with a weight average molecular weight of 10,000 or more, having the repeating unit (a) represented by the following general formula (I);
   a compound (B) capable of generating an organic acid upon irradiation with actinic rays or radiation; and
   a nitrogen-containing organic compound (NA) having a group capable of leaving by the action of an acid,
   wherein the resin (P) has no aromatic groups and contains 0 mol % to 20 mol % of a repeating unit having fluorine atoms or silicon atoms based on all the repeating units of the resin (P),
   the compound (B) is a compound capable of generating an organic acid represented by the following general formula (II) or (III),

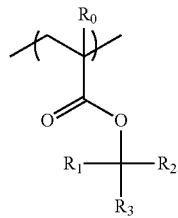

in the general formula (I), $R_0$ represents a hydrogen atom or a methyl group; and
each of $R_1$, $R_2$, and $R_3$ independently represents a linear or branched alkyl group;

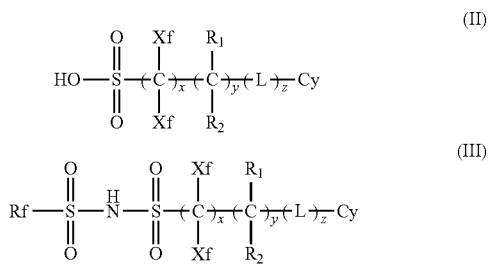

in the general formulae (II) and (III),
Xf's each independently represent a fluorine atom, or an alkyl group substituted with at least one fluorine atom;
each of $R_1$ and $R_2$ independently represents a hydrogen atom, a fluorine atom, or an alkyl group, and in case of y≥2, each of $R_1$'s and $R_2$'s independently represents a hydrogen atom, a fluorine atom, or an alkyl group;
L represents a divalent linking group selected from —COO—, —OCO—, —CONH—, —NHCO—, —CO—, —O—, —S—, —SO—, —SO$_2$—, a cycloalkylene group, an alkenylene group, a combination thereof, —COO-alkylene group-, —OCO-alkylene group-, —CONH-alkylene group-, and —NHCO-alkylene group-, and, in case of z≥2, a plurality of L's may be the same as or different from each other;
Cy represents a cyclic organic group;
Rf represents a group containing a fluorine atom; x represents an integer of 1 to 20;
y represents an integer of 0 to 10; and
z represents an integer of 1 to 10.

2. The actinic ray-sensitive or radiation-sensitive resin composition according to claim 1, wherein the resin (P) is a resin containing the repeating unit (a) in a proportion of 45 mol % or more based on all the repeating units in the resin (P).

3. The actinic ray-sensitive or radiation-sensitive resin composition according to claim 1, wherein the linear or branched alkyl group for $R_1$, $R_2$, and $R_3$ in the general formula (I) is an alkyl group having 1 to 4 carbon atoms.

4. The actinic ray-sensitive or radiation-sensitive resin composition according to claim 1, wherein the resin (P) is a resin having an alicyclic hydrocarbon structure.

5. The actinic ray-sensitive or radiation-sensitive resin composition according to claim 1, wherein the nitrogen-containing organic compound (NA) is represented by the following general formula (F),

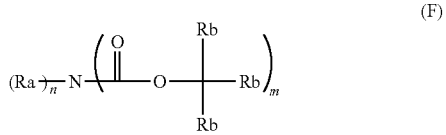

in the general formula (F), Ra represents a hydrogen atom, an alkyl group, a cycloalkyl group, an aryl group, an aralkyl group, or a group represented by the following general formula (a1);
n represents an integer of 0 to 2, m represents an integer of 1 to 3, and n+m=3;
when n is 2, two Ra's may be the same as or different from each other and the two Ra's may be bonded to each other to form a divalent heterocyclic hydrocarbon group or a derivative thereof; and when m is 2 or 3, plural —C(Rb)(Rb)(Rb)'s may be the same as or different from each other,

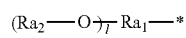 (a1)

in the general formula (a1), $Ra_1$ is a (l+1)-valent aliphatic hydrocarbon group, a benzene ring group, or a group formed by combination of these groups, and $Ra_2$ represents a monovalent group capable of leaving by the action of an acid;

l represents 1 or 2, and when l is 2, two $Ra_2$'s may be the same as or different from each other; and Rb's independently represent a hydrogen atom, an alkyl group, a cycloalkyl group, an aryl group, and an aralkyl group, provided that one or more Rb's in —C(Rb)(Rb)(Rb) are hydrogen atoms, at least one of the remaining Rb's is a cyclopropyl group, an aryl group, or a 1-alkoxyalkyl group, and two Rb's may be bonded to each other to form a ring.

6. The actinic ray-sensitive or radiation-sensitive resin composition according to claim 5, wherein two Rb's in —C(Rb)(Rb)(Rb) in the general formula (F) are methyl group, and the remaining Rb is ethyl group.

7. The actinic ray-sensitive or radiation-sensitive resin composition according to claim 1, further comprising a basic compound or ammonium salt compound (C), capable of decreasing basicity upon irradiation with actinic rays or radiation.

8. The actinic ray-sensitive or radiation-sensitive resin composition according to claim 1, further comprising a hydrophobic resin having a fluorine atom and/or a silicon atom.

9. The actinic ray-sensitive or radiation-sensitive resin composition according to claim 8, wherein the content of the hydrophobic resin from 0.05% by mass to 8% by mass, based on the total solid contents of the composition.

10. A resist film formed with the actinic ray-sensitive or radiation-sensitive resin composition according to claim 1.

11. The actinic ray-sensitive or radiation-sensitive resin composition according to claim 1, the nitrogen-containing organic compound (NA) is at least one selected from the group consisting of compounds represented by the following formulae (NA-6) to (NA-8)

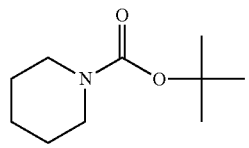 NA-6

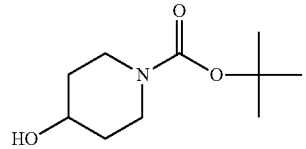 NA-7

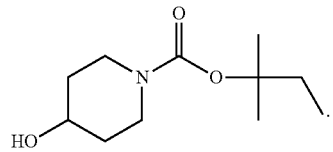 NA-8

12. The actinic ray-sensitive or radiation-sensitive resin composition according to claim 1, wherein the divalent linking group of L in the general formula (II) or (III) is selected from —COO—, —OCO—, —CONH—, —NHCO—, —CO—, —O—, —SO$_2$—, —COO-alkylene group-, —OCO-alkylene group-, —CONH-alkylene group-, or —NHCO— alkylene group-.

13. The actinic ray-sensitive or radiation-sensitive resin composition according to claim 1, wherein the divalent linking group of L in the general formula (II) or (III) is selected from —COO—, —OCO—, —CONH—, —SO$_2$—, —COO-alkylene group-, or —OCO-alkylene group-.

14. The actinic ray-sensitive or radiation-sensitive resin composition according to claim 1, wherein the compound (B) is a compound represented by the following general formula (ZI-4),

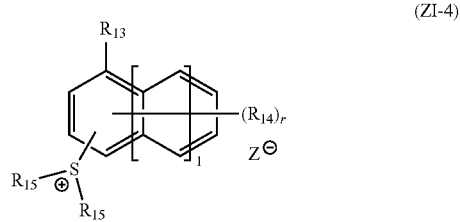 (ZI-4)

in the general formula (ZI-4), $R_{13}$ represents a group containing a hydrogen atom, a fluorine atom, a hydroxyl group, an alkyl group, a cycloalkyl group, an alkoxy group, an alkoxycarbonyl group, or a cycloalkyl group, and these groups may have a substituent;

$R_{14}$ represents a group containing a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group, and these groups may have a substituent, when a plurality of $R_{14}$'s are present, they may be same or different from each other;

$R_{15}$'s each independently represent an alkyl group, a cycloalkyl group, or a naphthyl group, or two $R_{15}$'s may be bonded to each other to form a ring, and these groups may have a substituent;

l represents an integer of 0 to 2;

r represents an integer of 0 to 8; and

Z$^-$ represents a non-nucleophilic anion capable of generating the organic acid represented by the general formula (II) or (III).

* * * * *